United States Patent
Iida et al.

(10) Patent No.: US 10,199,565 B2
(45) Date of Patent: Feb. 5, 2019

(54) DEVICE USING A PIEZOELECTRIC ELEMENT AND METHOD FOR MANUFACTURING THE SAME

(71) Applicant: ROHM CO., LTD., Kyoto (JP)

(72) Inventors: Kunio Iida, Kyoto (JP); Kinya Ashikaga, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 247 days.

(21) Appl. No.: 15/244,860

(22) Filed: Aug. 23, 2016

(65) Prior Publication Data

US 2017/0062696 A1     Mar. 2, 2017

(30) Foreign Application Priority Data

| Aug. 24, 2015 | (JP) | 2015-164921 |
| Aug. 24, 2015 | (JP) | 2015-164922 |
| Aug. 24, 2015 | (JP) | 2015-164923 |
| Aug. 24, 2015 | (JP) | 2015-164924 |
| Jun. 17, 2016 | (JP) | 2016-120978 |

(51) Int. Cl.
*H01L 41/09*     (2006.01)
*H01L 41/053*    (2006.01)
(Continued)

(52) U.S. Cl.
CPC ........ *H01L 41/332* (2013.01); *B41J 2/14233* (2013.01); *B41J 2/161* (2013.01); *B41J 2/1623* (2013.01); *B41J 2/1628* (2013.01); *B41J 2/1629* (2013.01); *B41J 2/1631* (2013.01); *B41J 2/1632* (2013.01); *B41J 2/1642* (2013.01); *B41J 2/1646* (2013.01); *H01L 41/0477* (2013.01);
(Continued)

(58) Field of Classification Search
CPC . H01L 41/332; H01L 41/0477; H01L 41/081; H01L 41/1876; H01L 41/314; B41J 2/14233; B41J 2/161; B41J 2/1623; B41J 2/1628; B41J 2/1629; B41J 2/1631; B41J 2/1632; B41J 2/1642; B41J 2/1646
USPC .......................... 310/324, 348, 365, 367, 368
See application file for complete search history.

(56) References Cited

U.S. PATENT DOCUMENTS

2016/0072039 A1*  3/2016  Iida ............... H01L 41/047
                                                    310/364
2017/0317660 A1* 11/2017  Kim ............... H03H 3/02

FOREIGN PATENT DOCUMENTS

| JP | 2013-119182 A | 6/2013 |
| JP | 2015-091668 A | 5/2015 |

* cited by examiner

*Primary Examiner* — Thomas Dougherty
(74) *Attorney, Agent, or Firm* — Rabin & Berdo, P.C.

(57) ABSTRACT

An inkjet printing head 1 includes an actuator substrate 2 having pressure chambers (cavities) 7, a movable film formation layer 10 including movable films 10A disposed above the pressure chambers 7 and defining top surface portions of the pressure chambers 7, and piezoelectric elements 9 formed above the movable films 10A. Each piezoelectric element 9 includes a lower electrode 11 formed above a movable film 10A, a piezoelectric film 12 formed above the lower electrode 11, and an upper electrode 13 formed above the piezoelectric film 12. The piezoelectric film 12 includes an active portion 12A with an upper surface in contact with a lower surface of an upper electrode 13 and an inactive portion 12B led out in a direction along a front surface of the movable film formation layer 10 from an entire periphery of a side portion of the active portion 12A and having a thickness thinner than that of the active portion 12A.

18 Claims, 99 Drawing Sheets

(51) Int. Cl.
*H01L 41/332* (2013.01)
*H01L 41/047* (2006.01)
*H01L 41/187* (2006.01)
*B41J 2/14* (2006.01)
*B41J 2/16* (2006.01)
*H01L 41/08* (2006.01)
*H01L 41/314* (2013.01)

(52) U.S. Cl.
CPC ........ *H01L 41/081* (2013.01); *H01L 41/1876* (2013.01); *H01L 41/314* (2013.01); *B41J 2002/14241* (2013.01); *B41J 2002/14491* (2013.01); *B41J 2202/13* (2013.01)

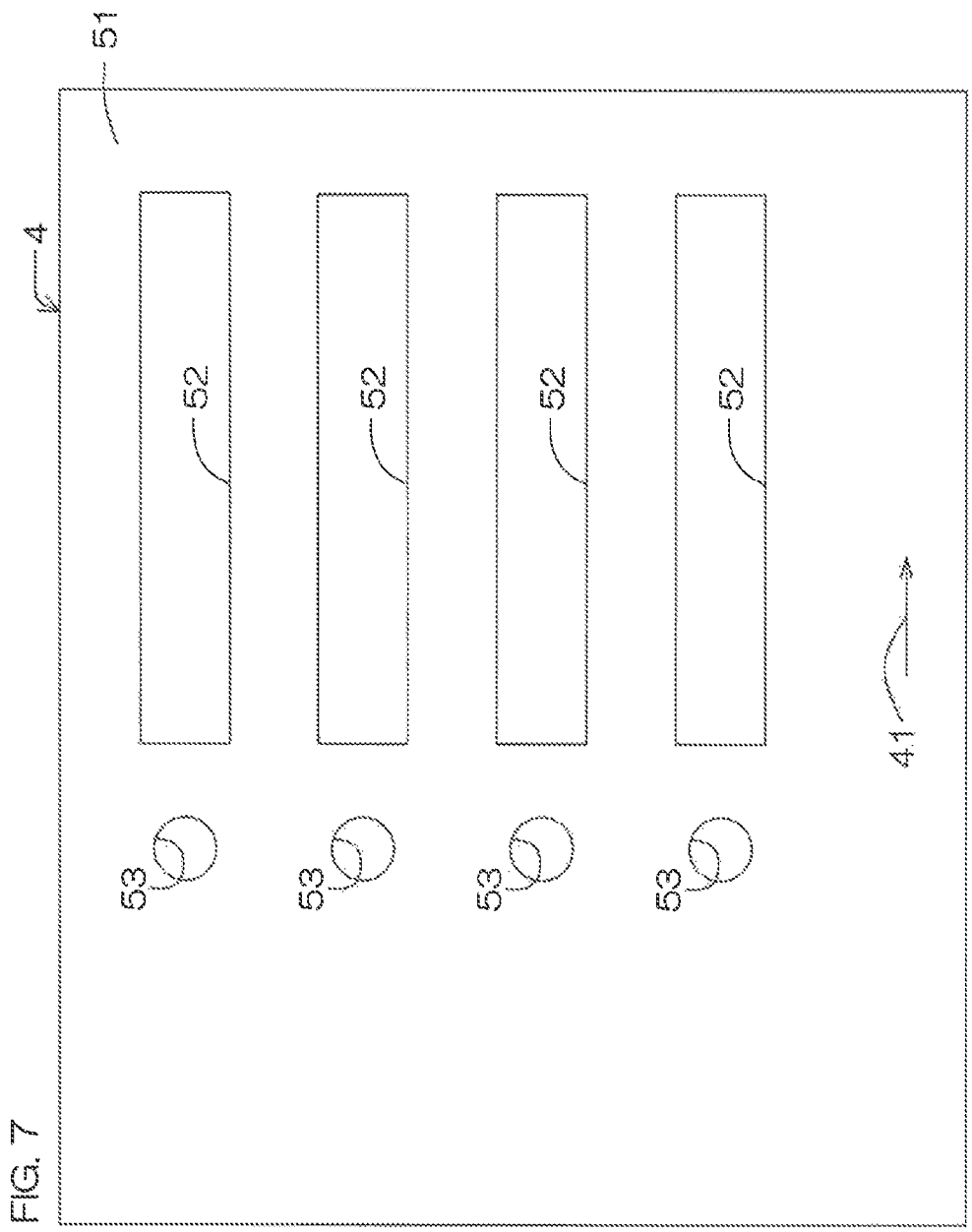

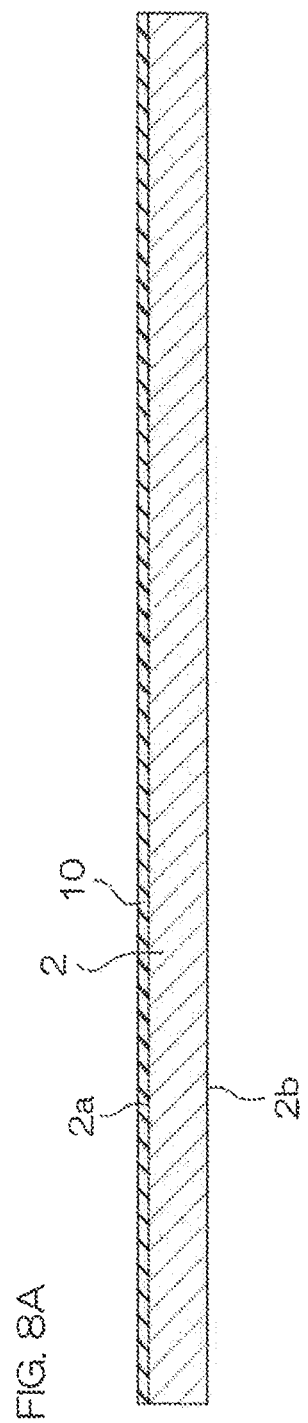

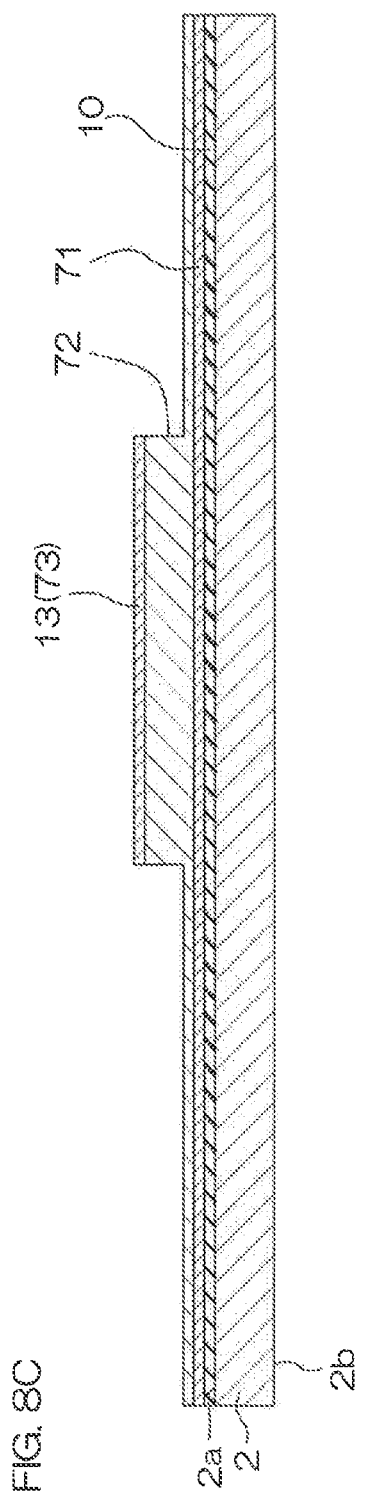

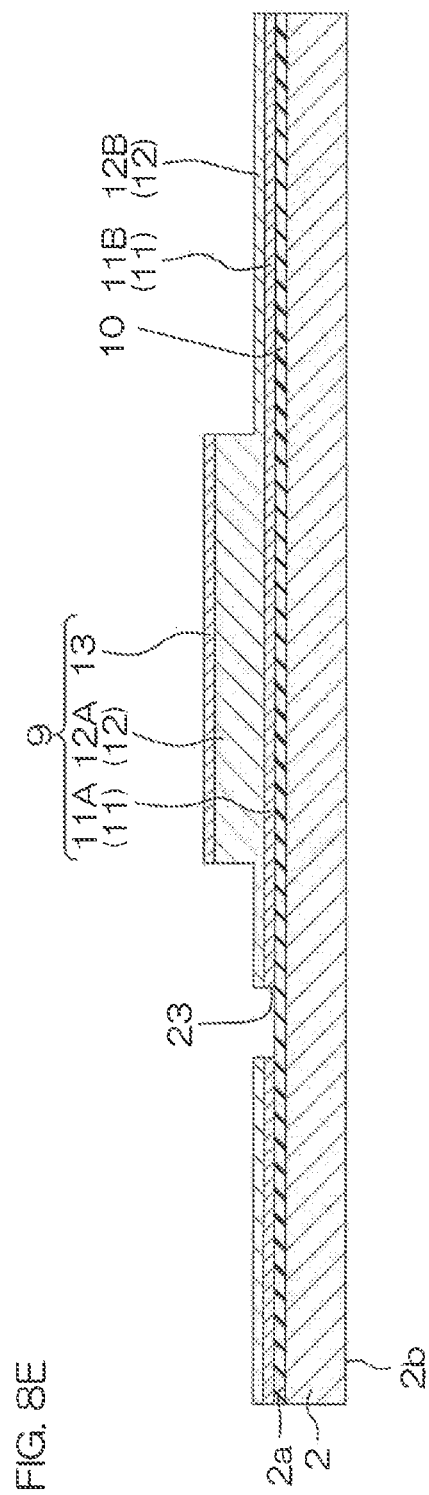

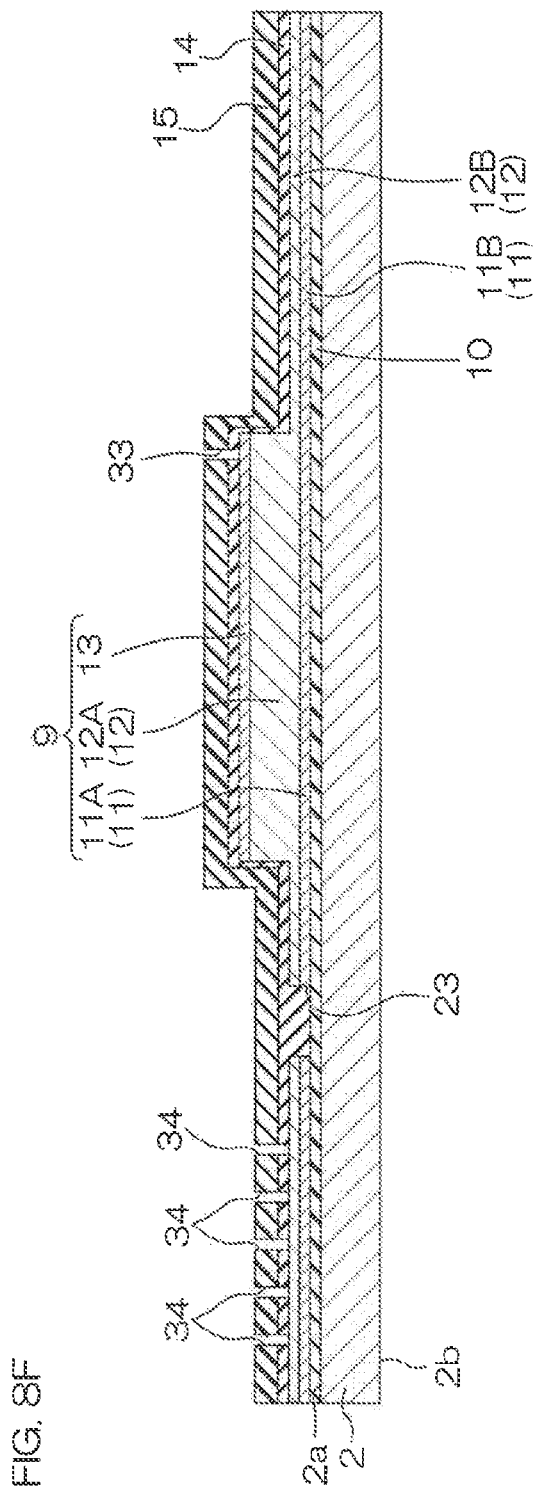

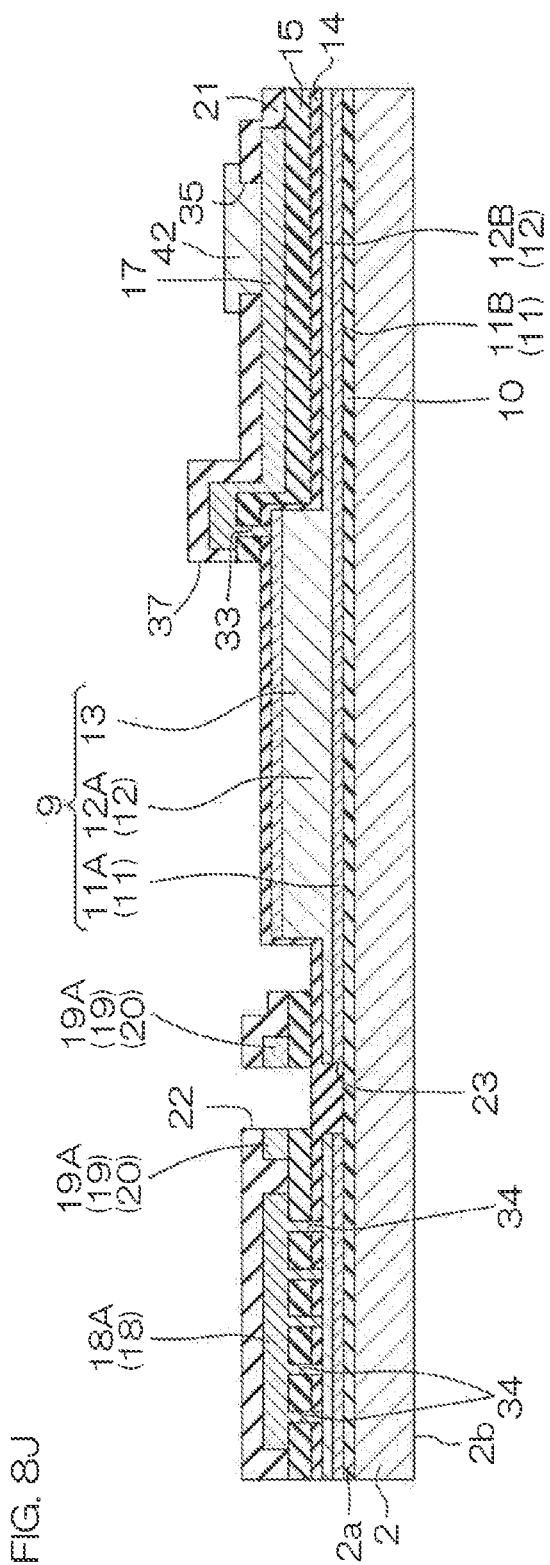

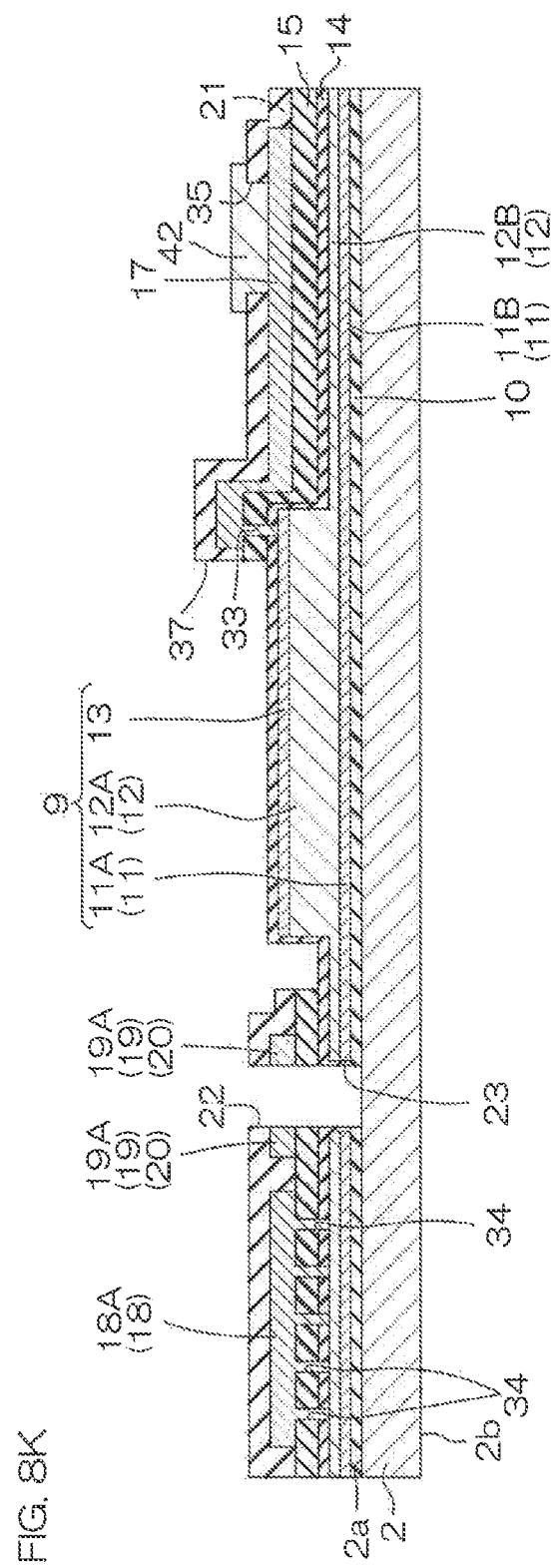

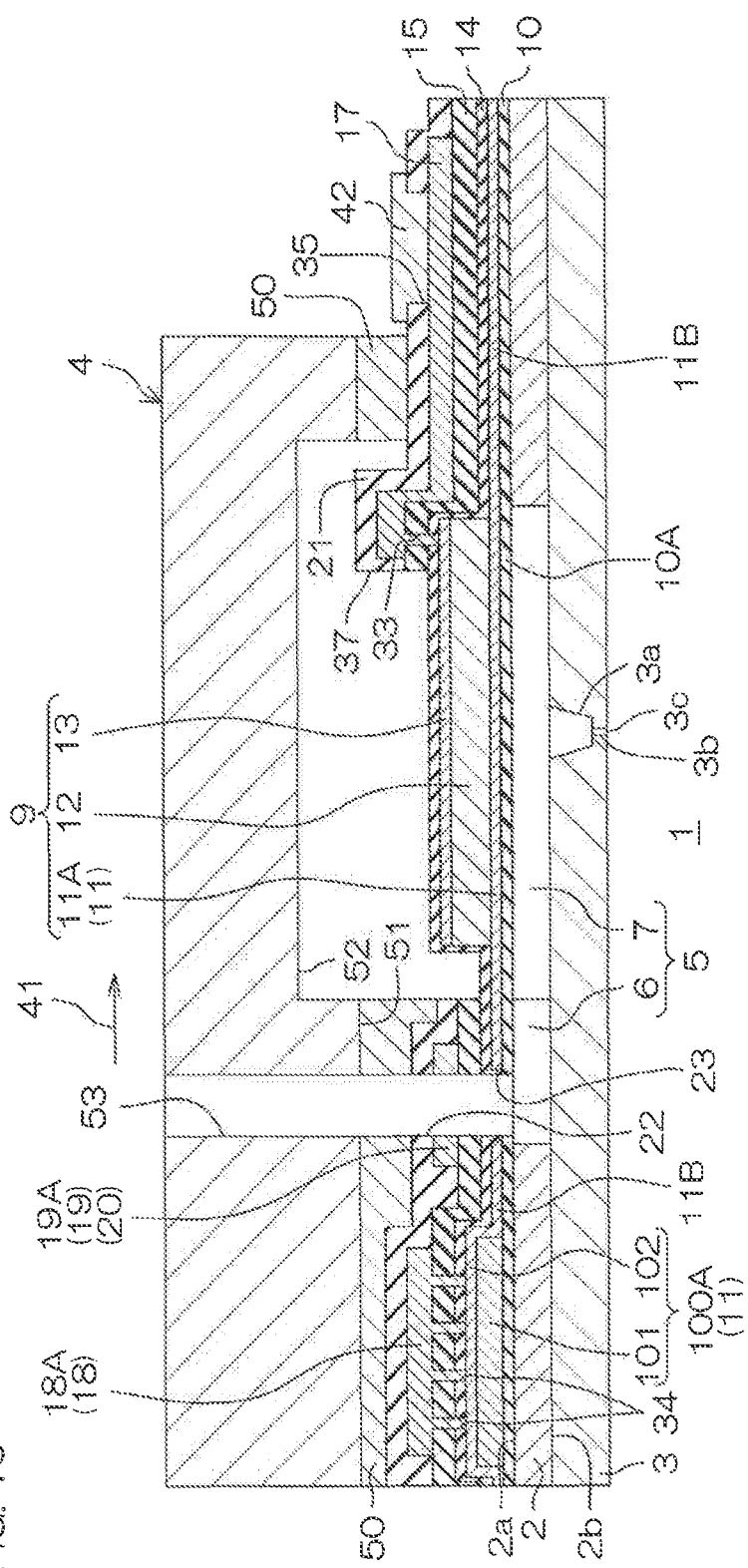

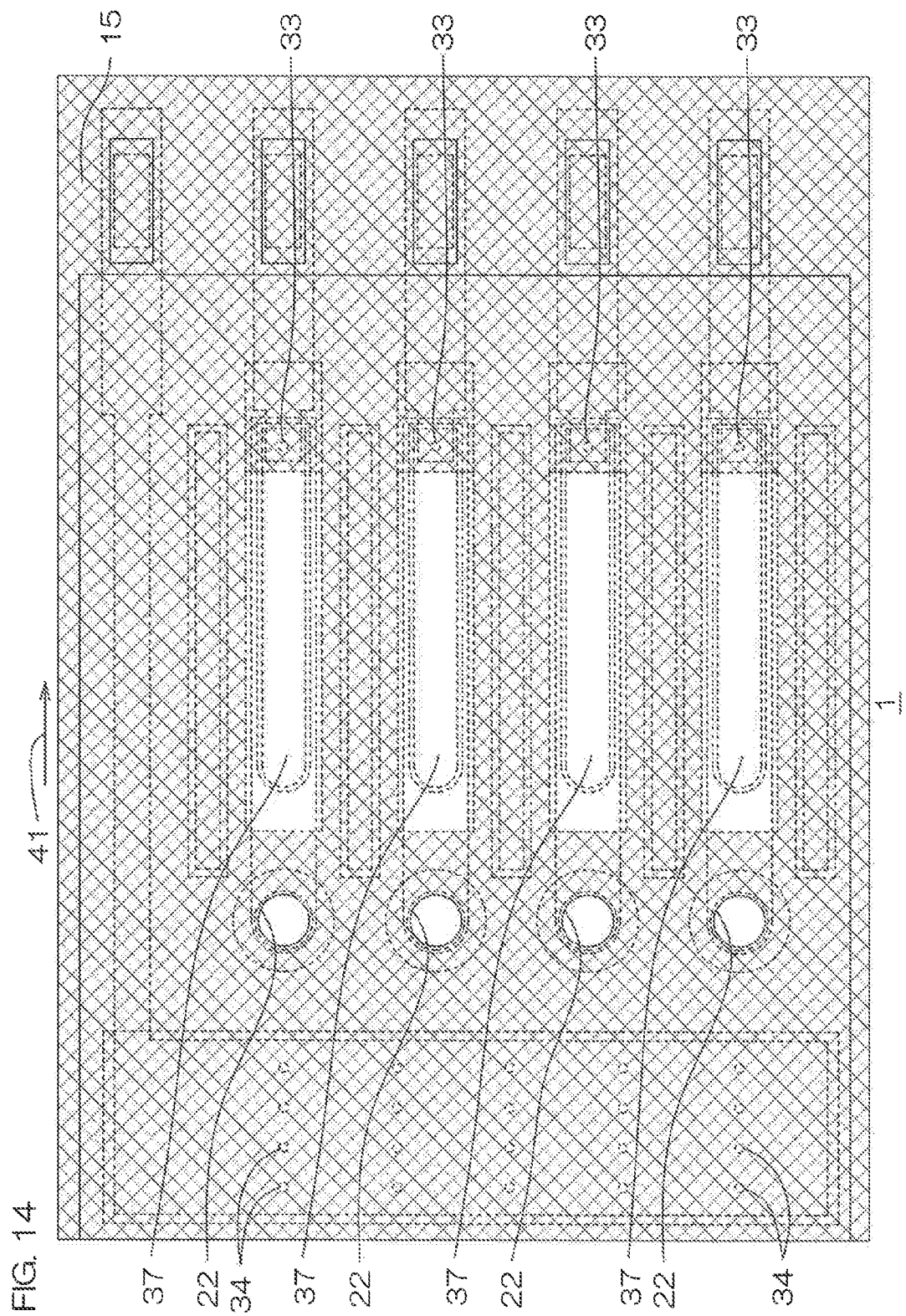

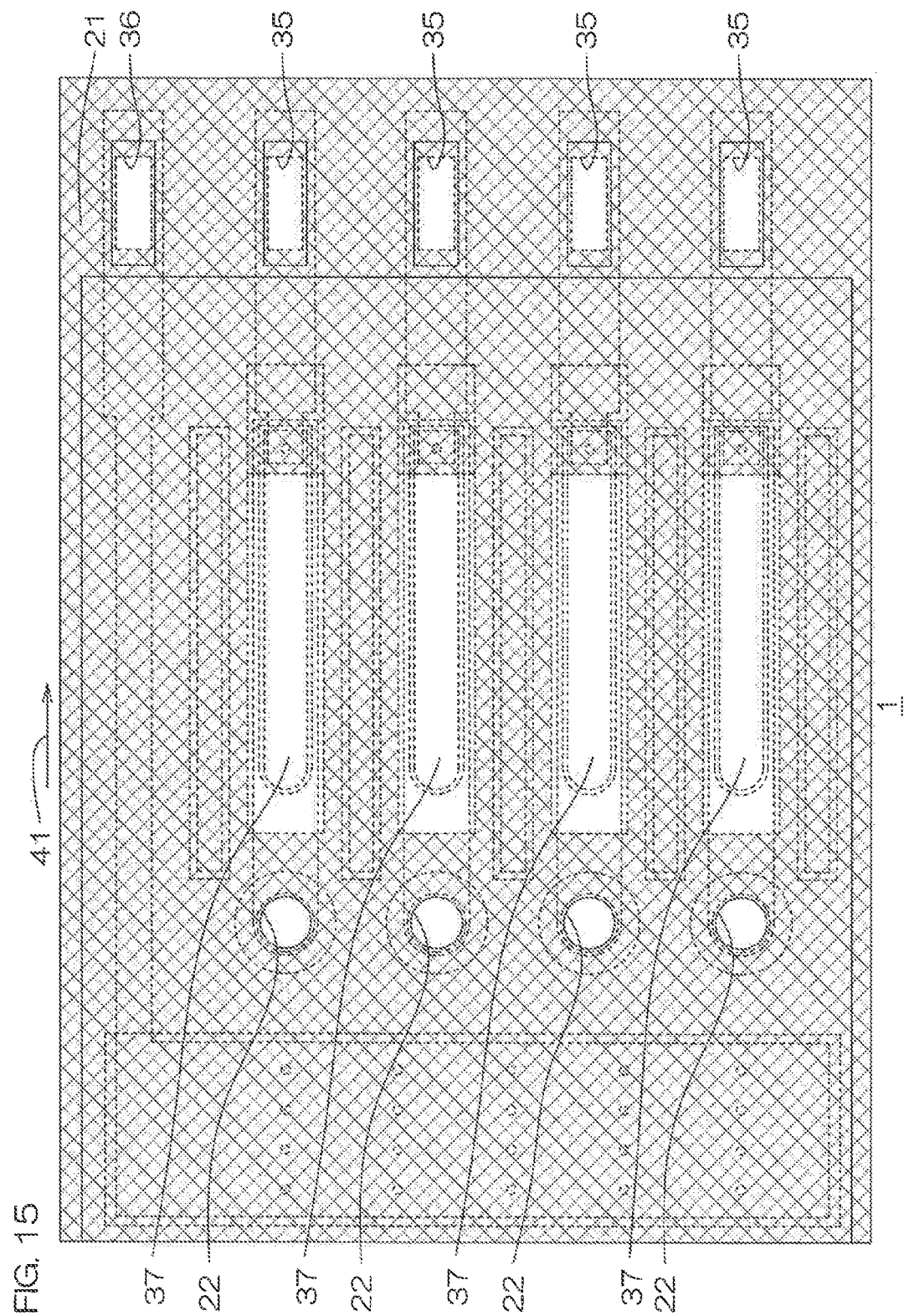

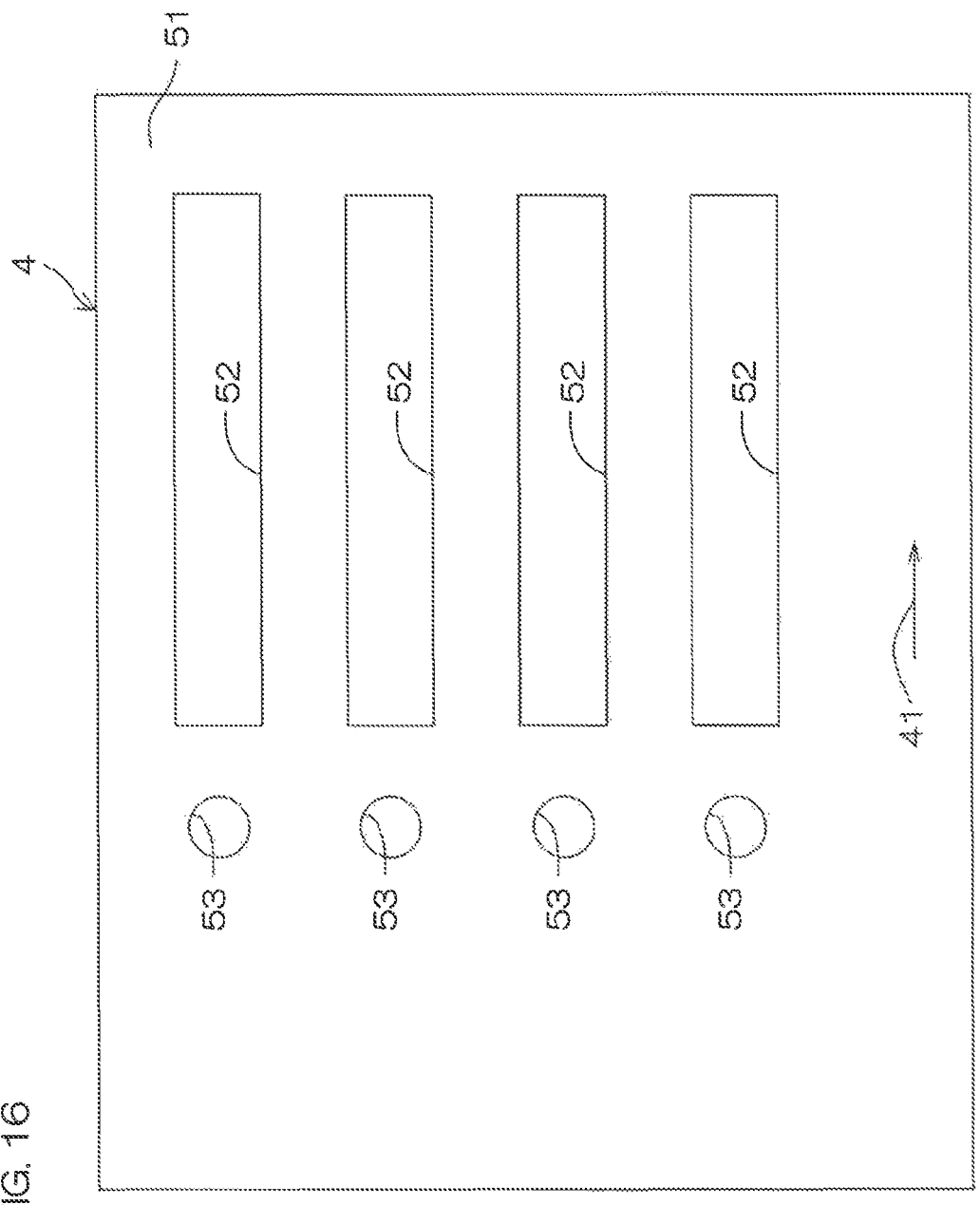

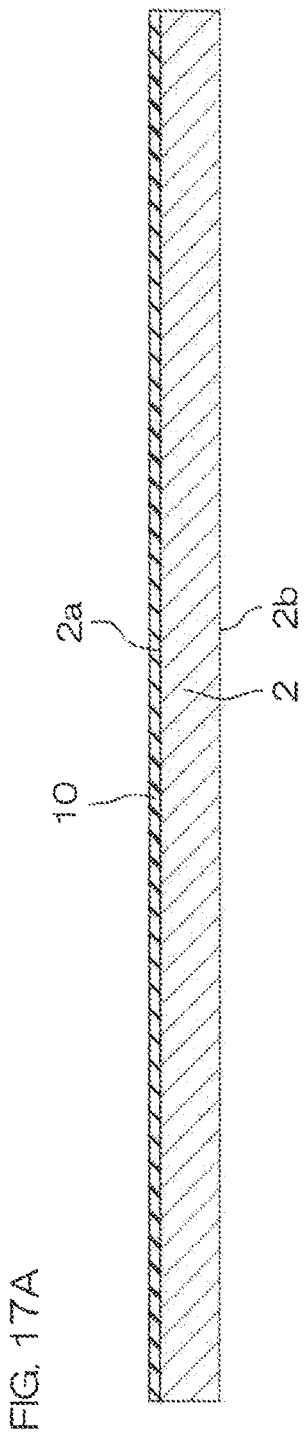

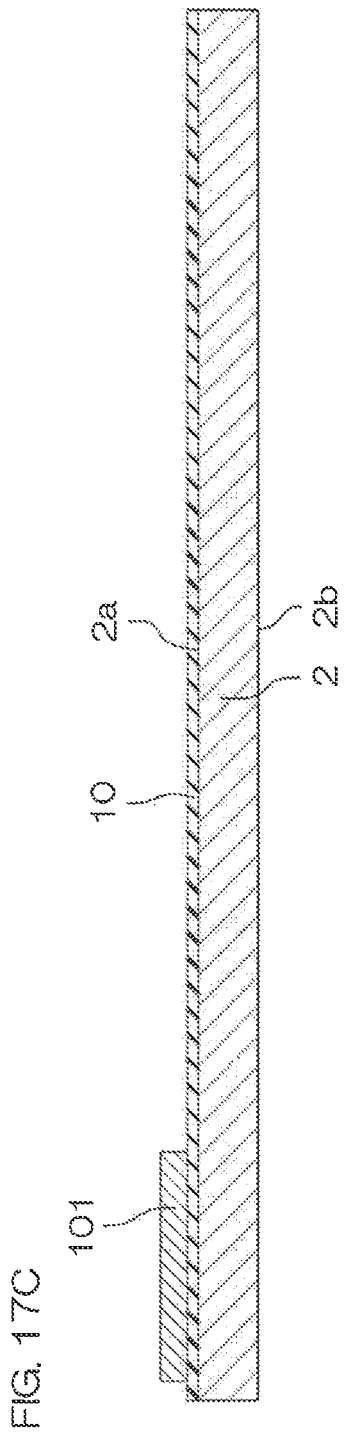

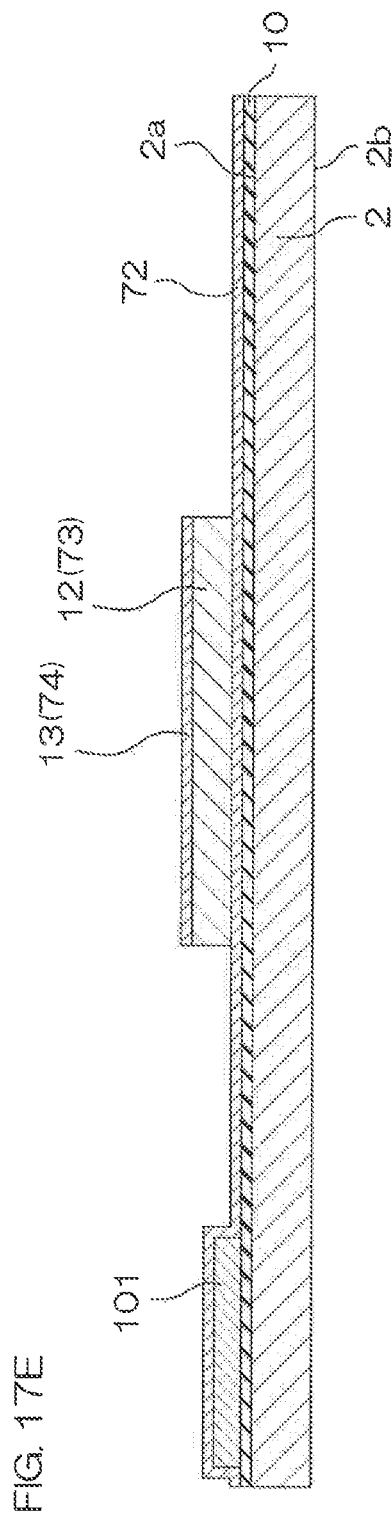

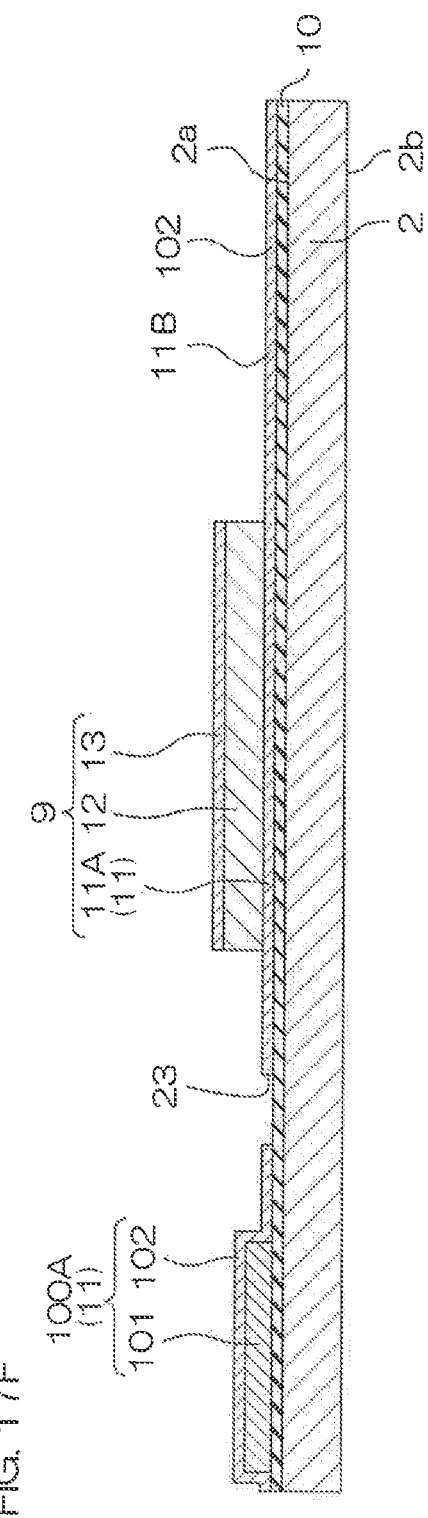

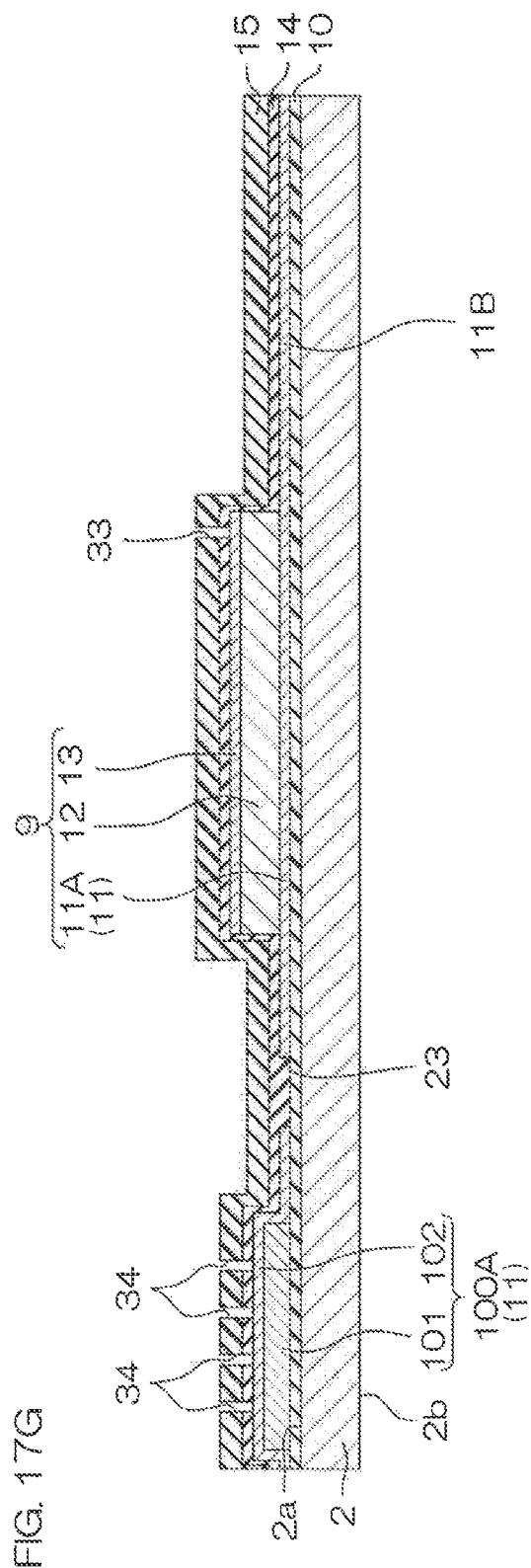

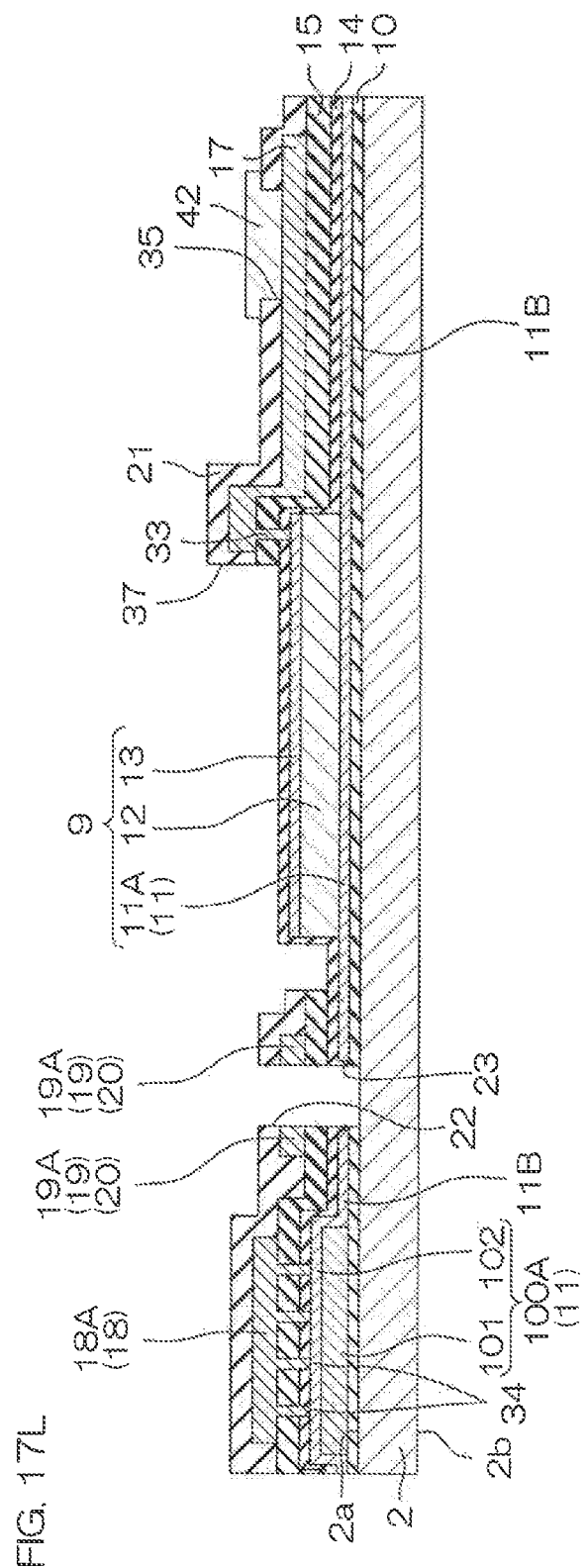

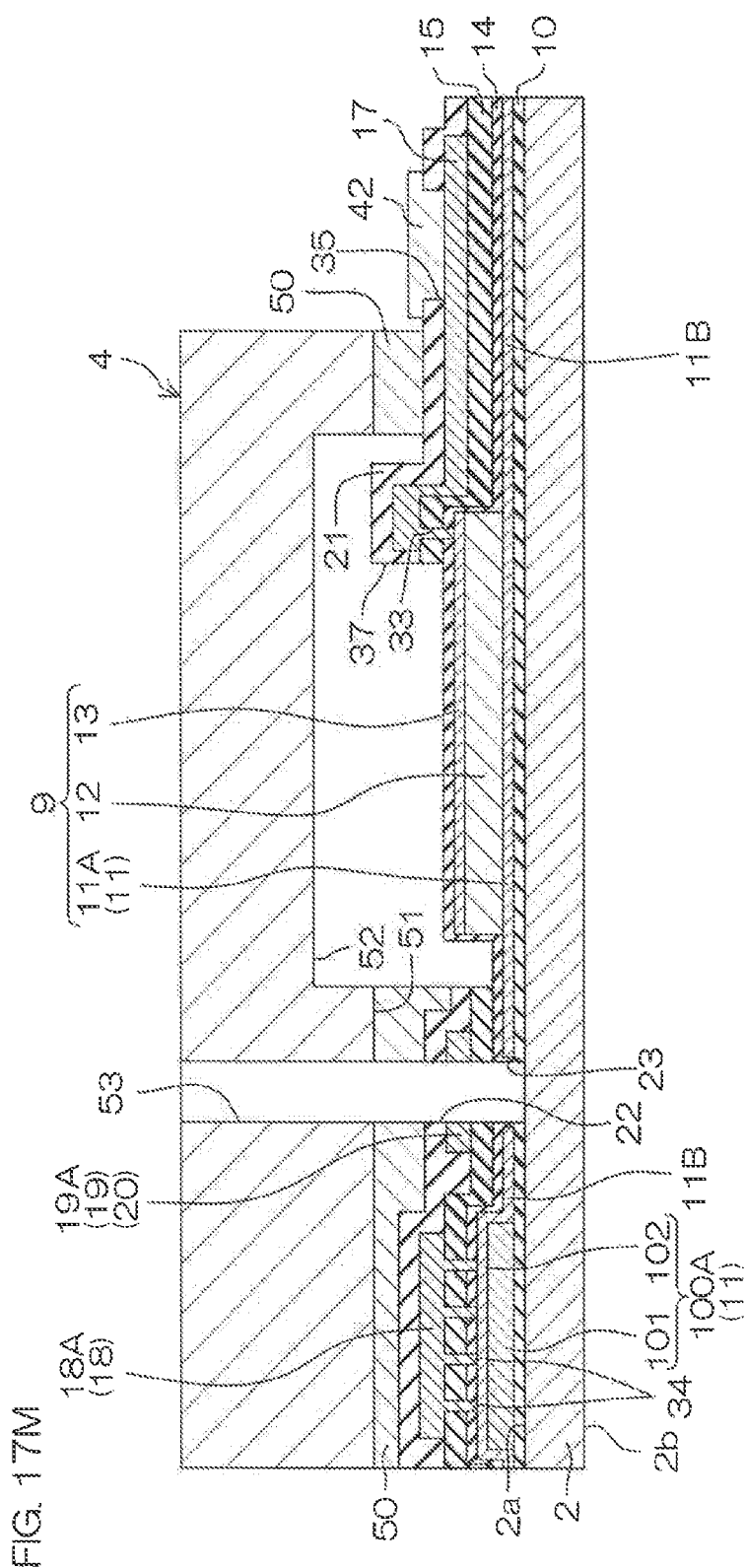

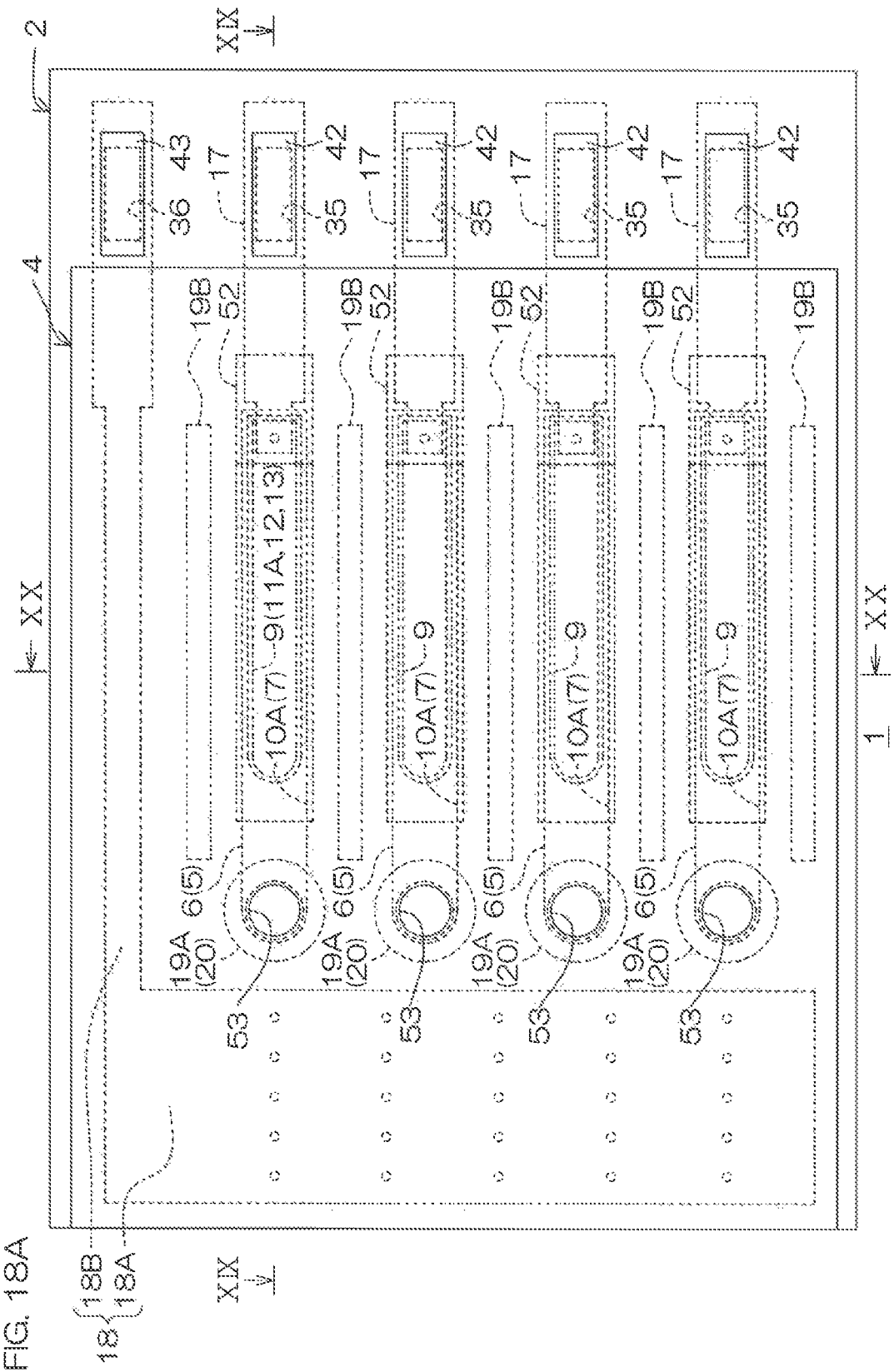

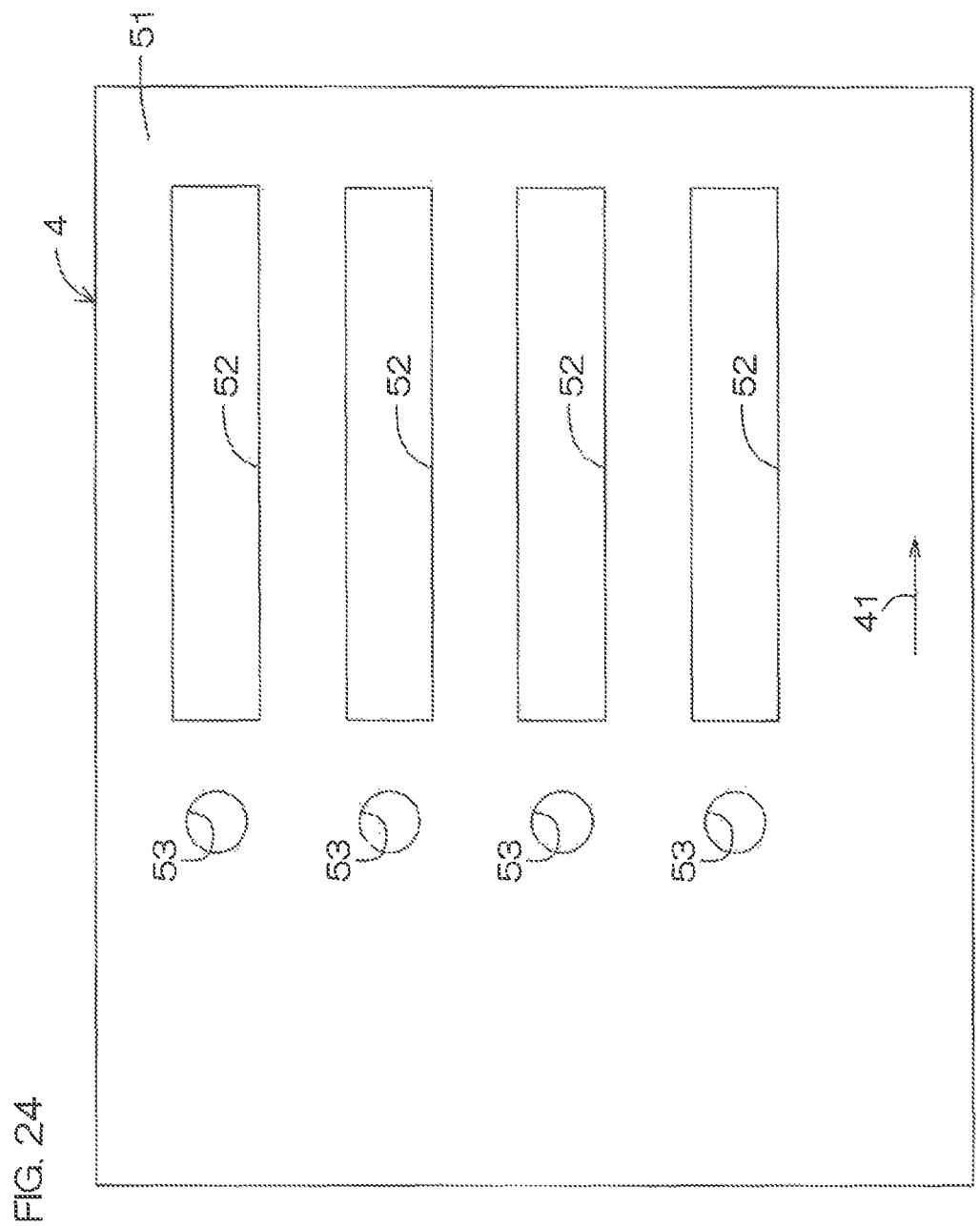

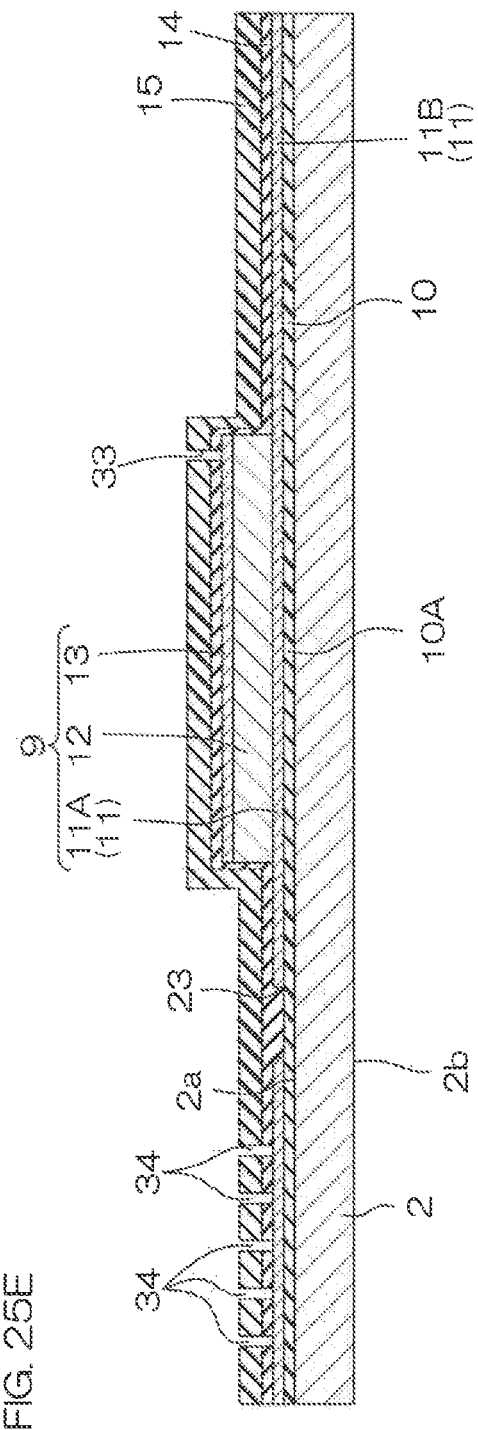

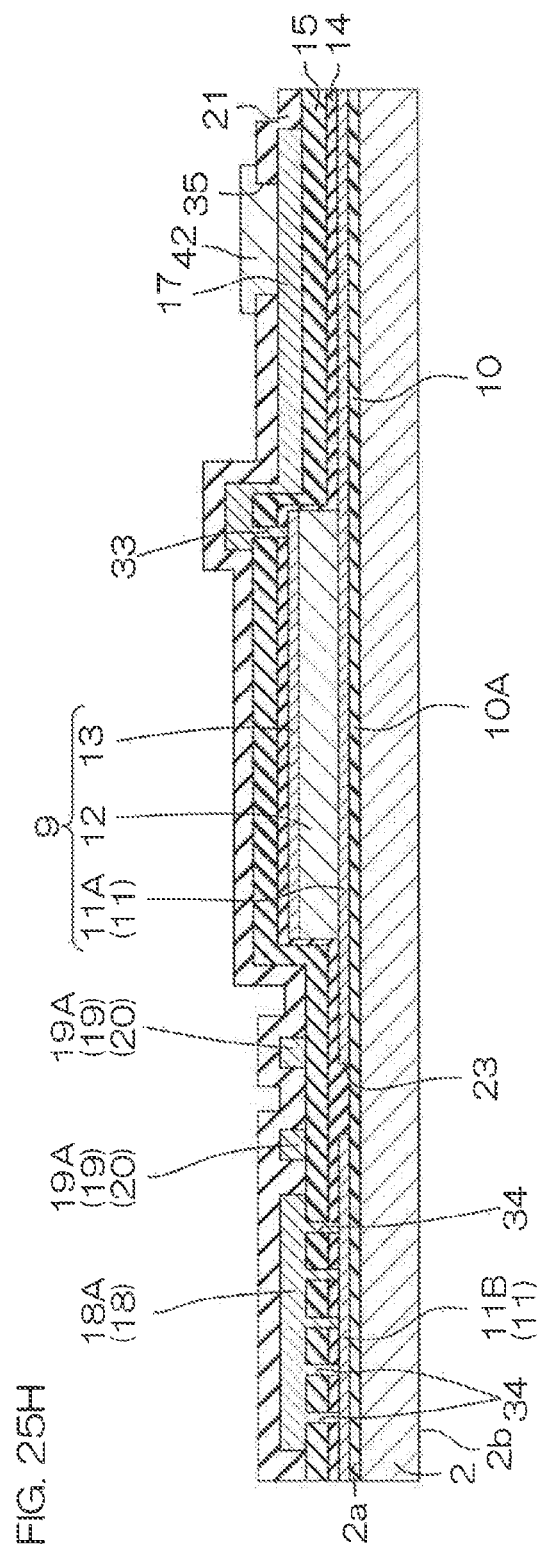

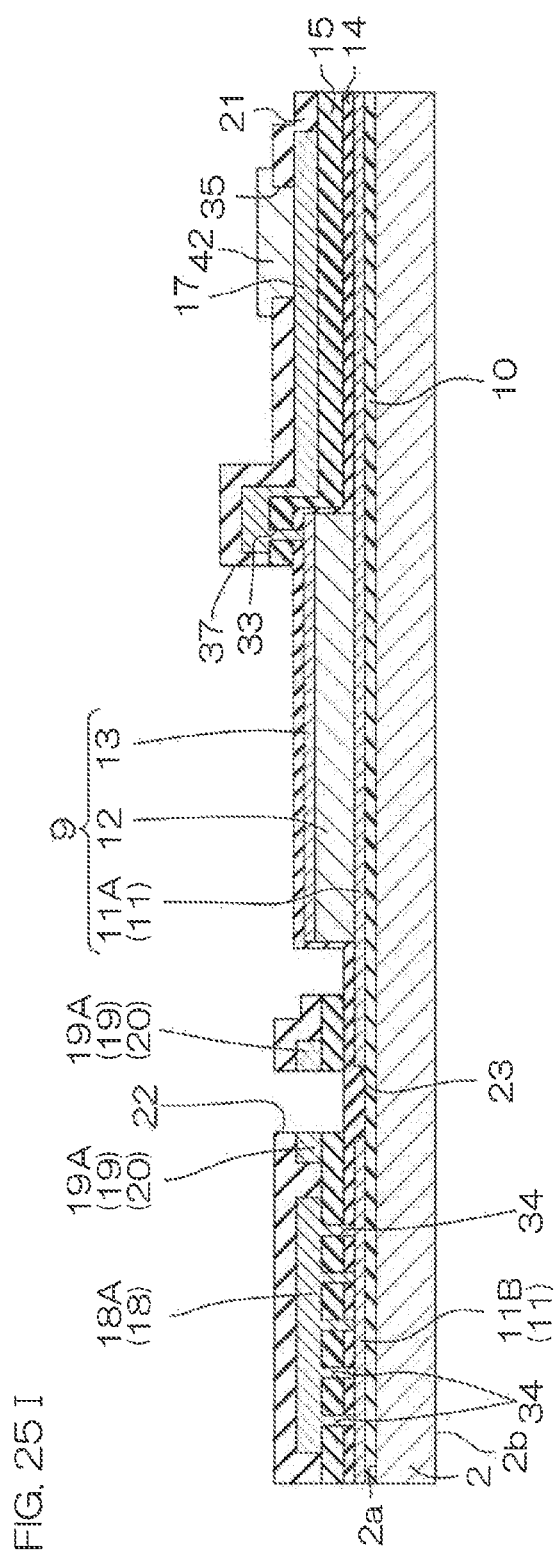

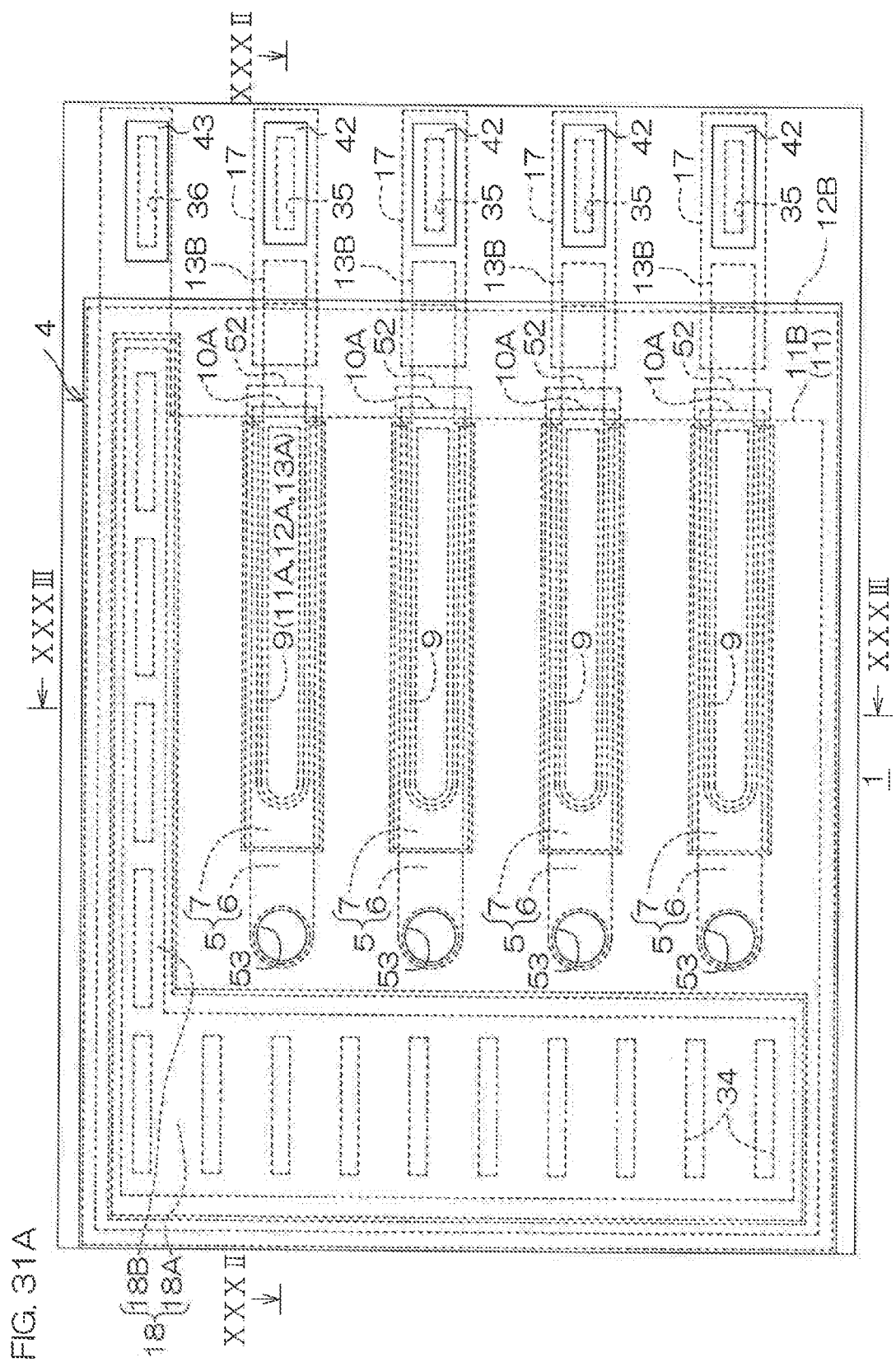

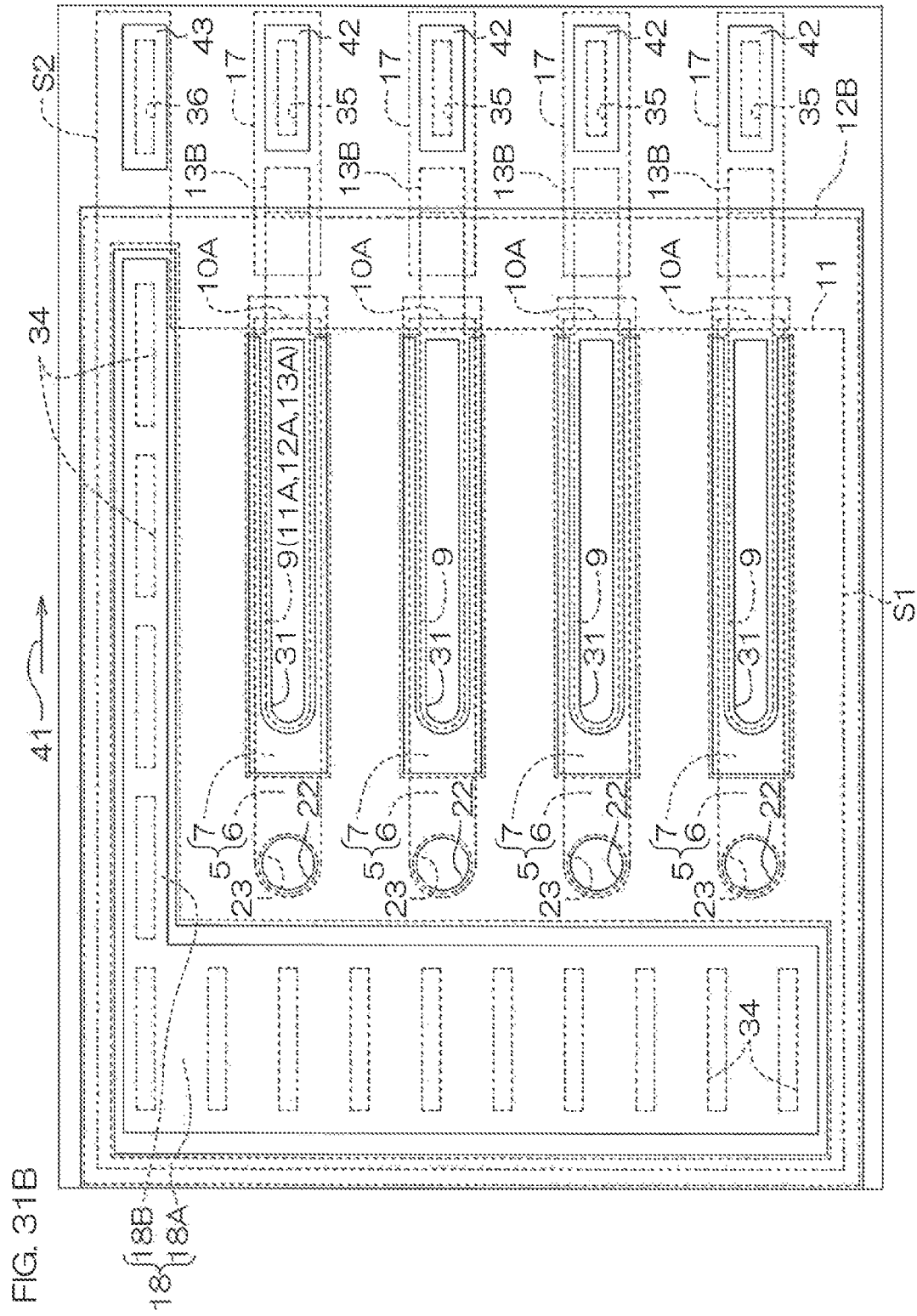

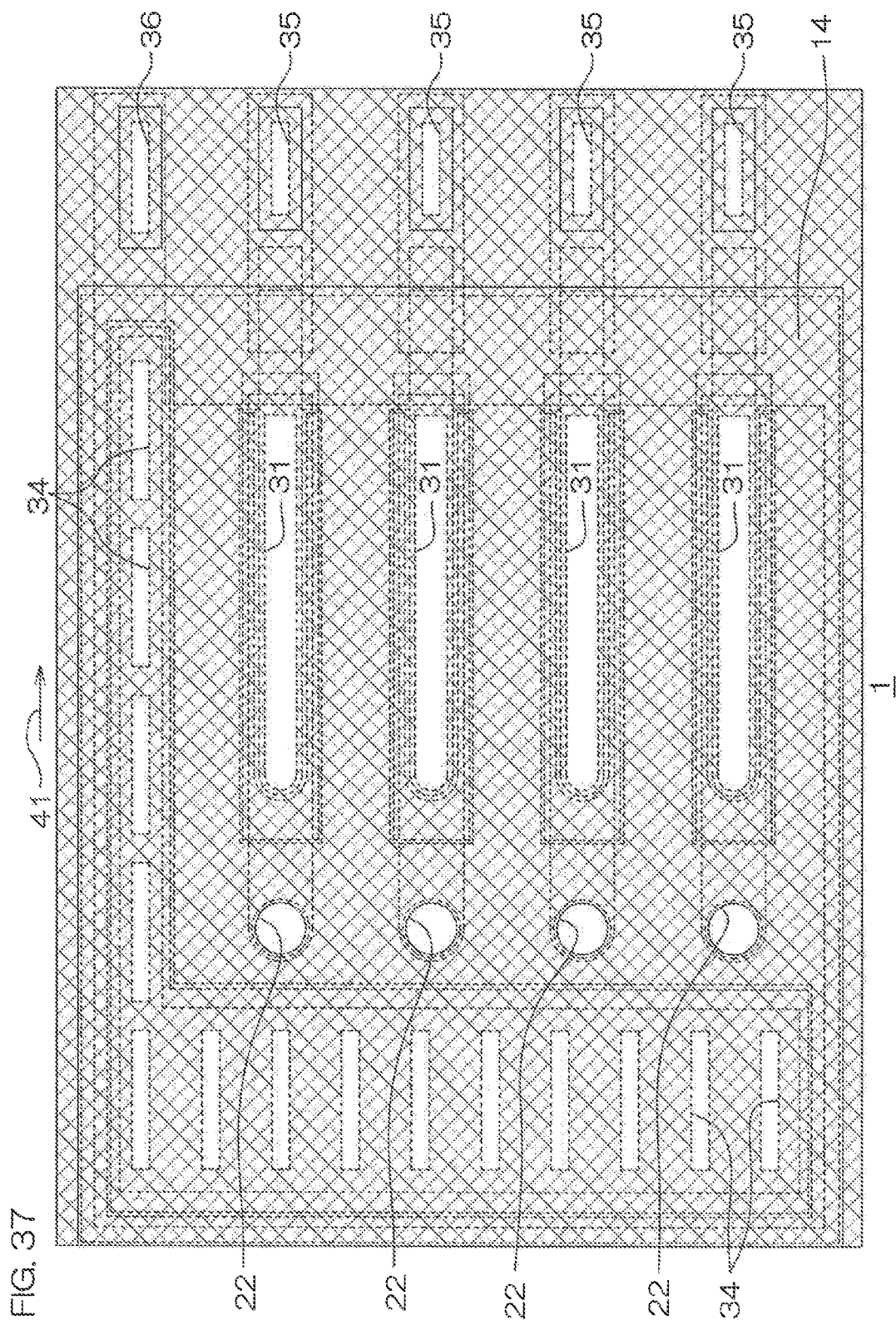

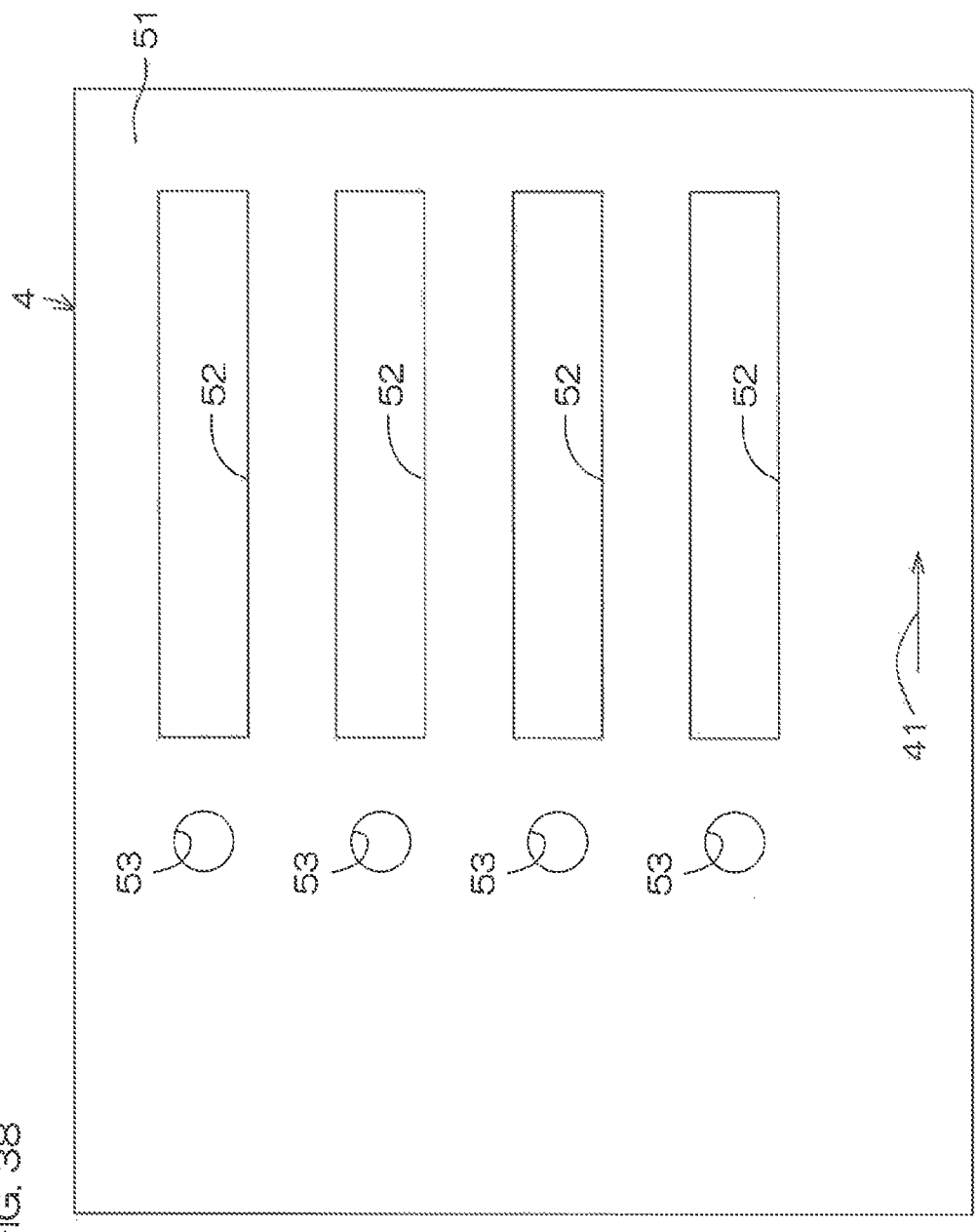

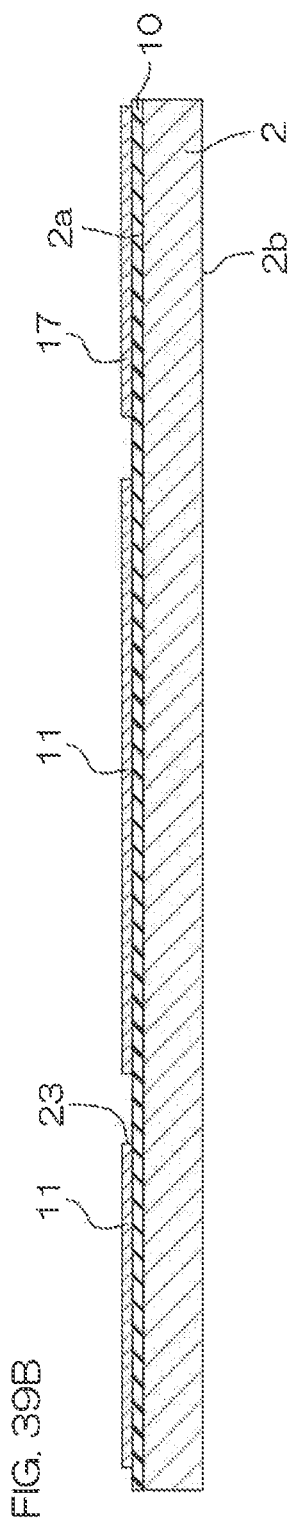

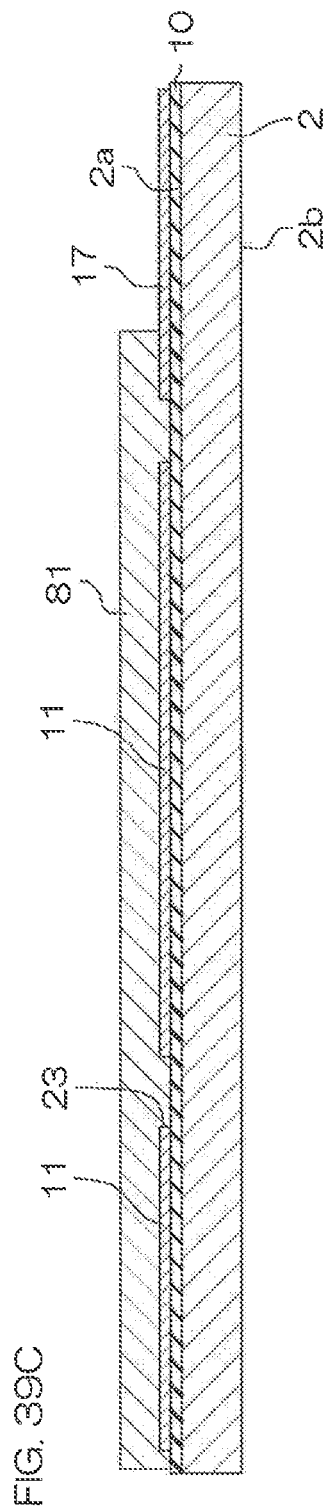

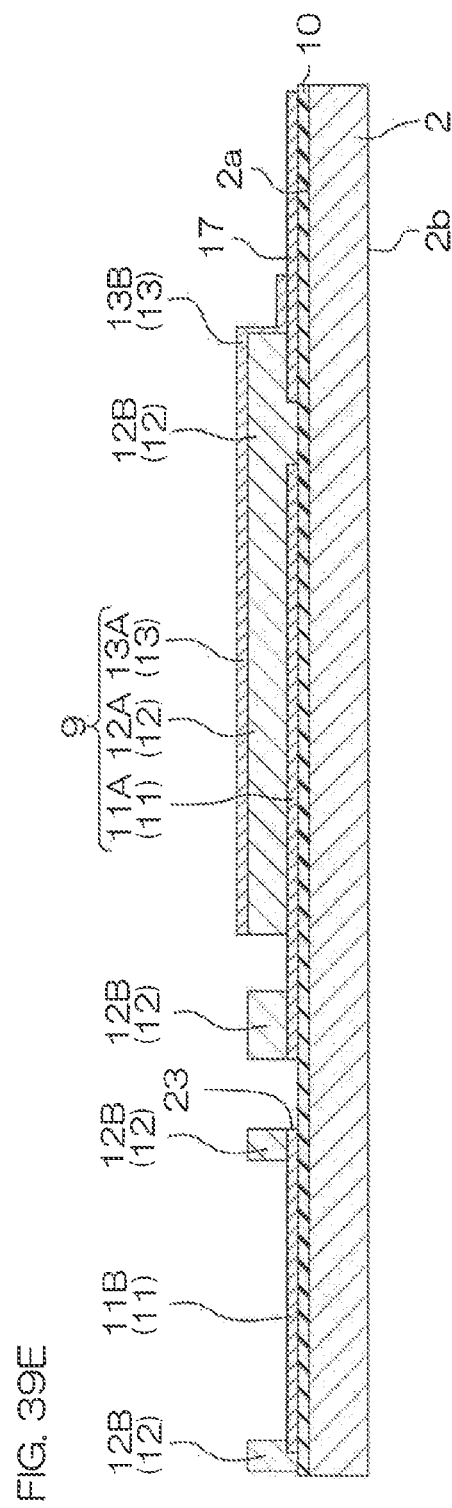

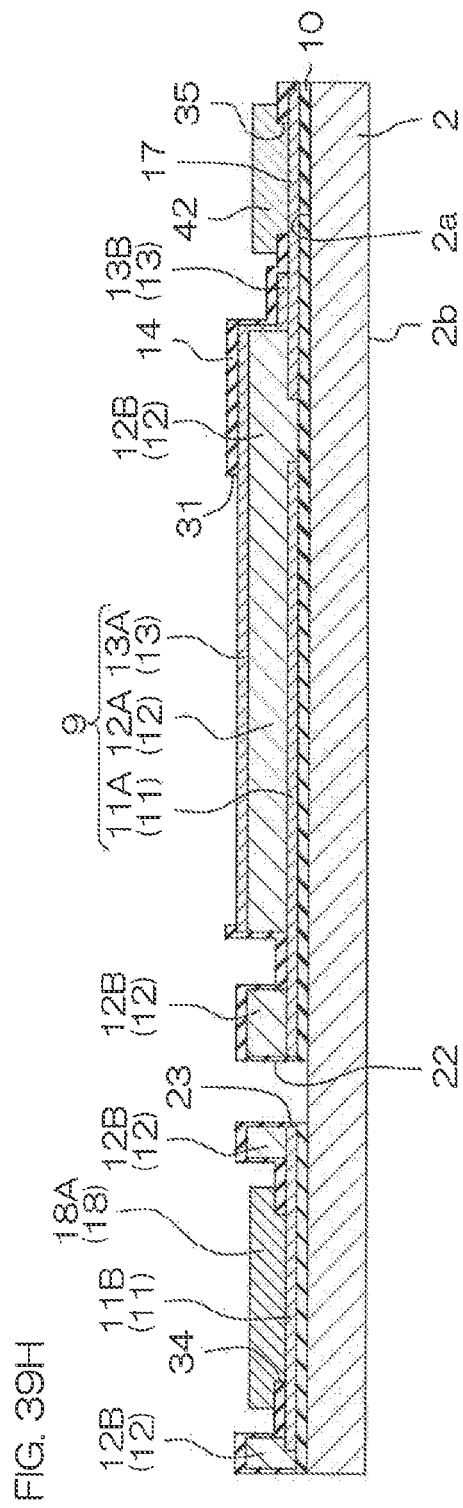

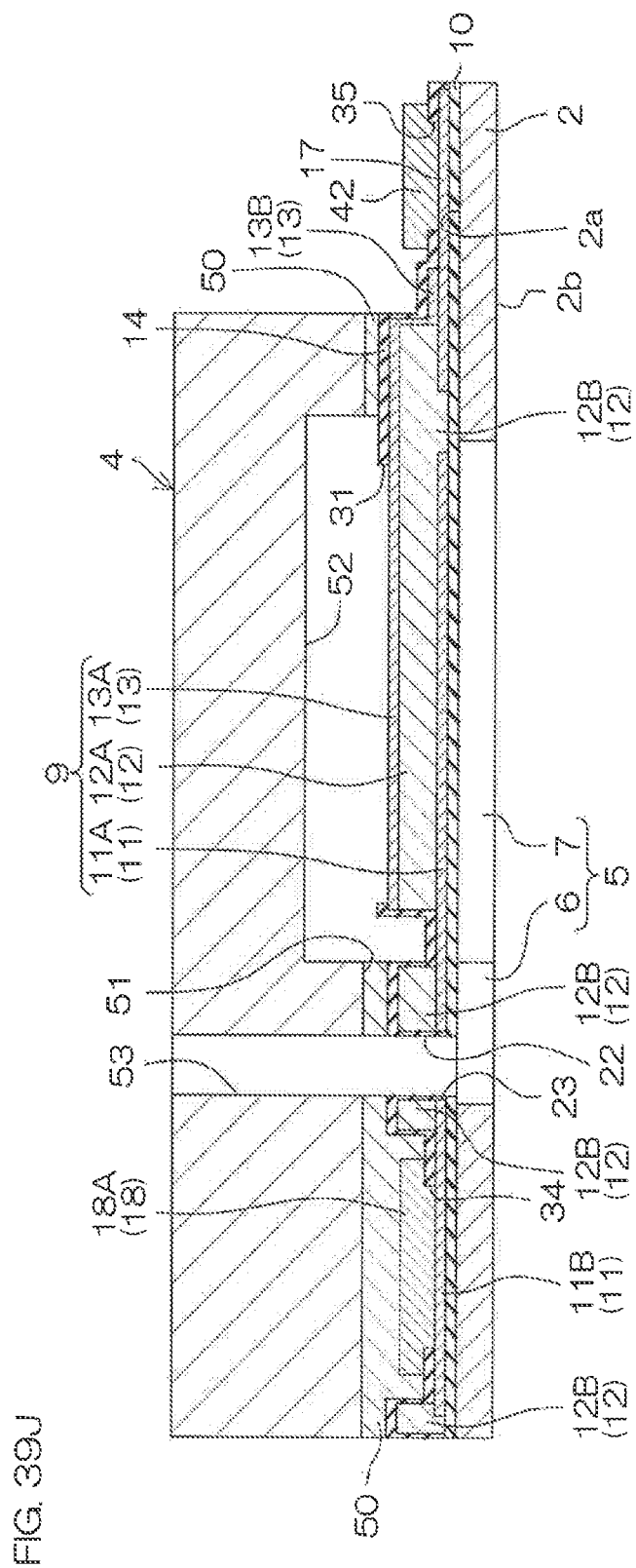

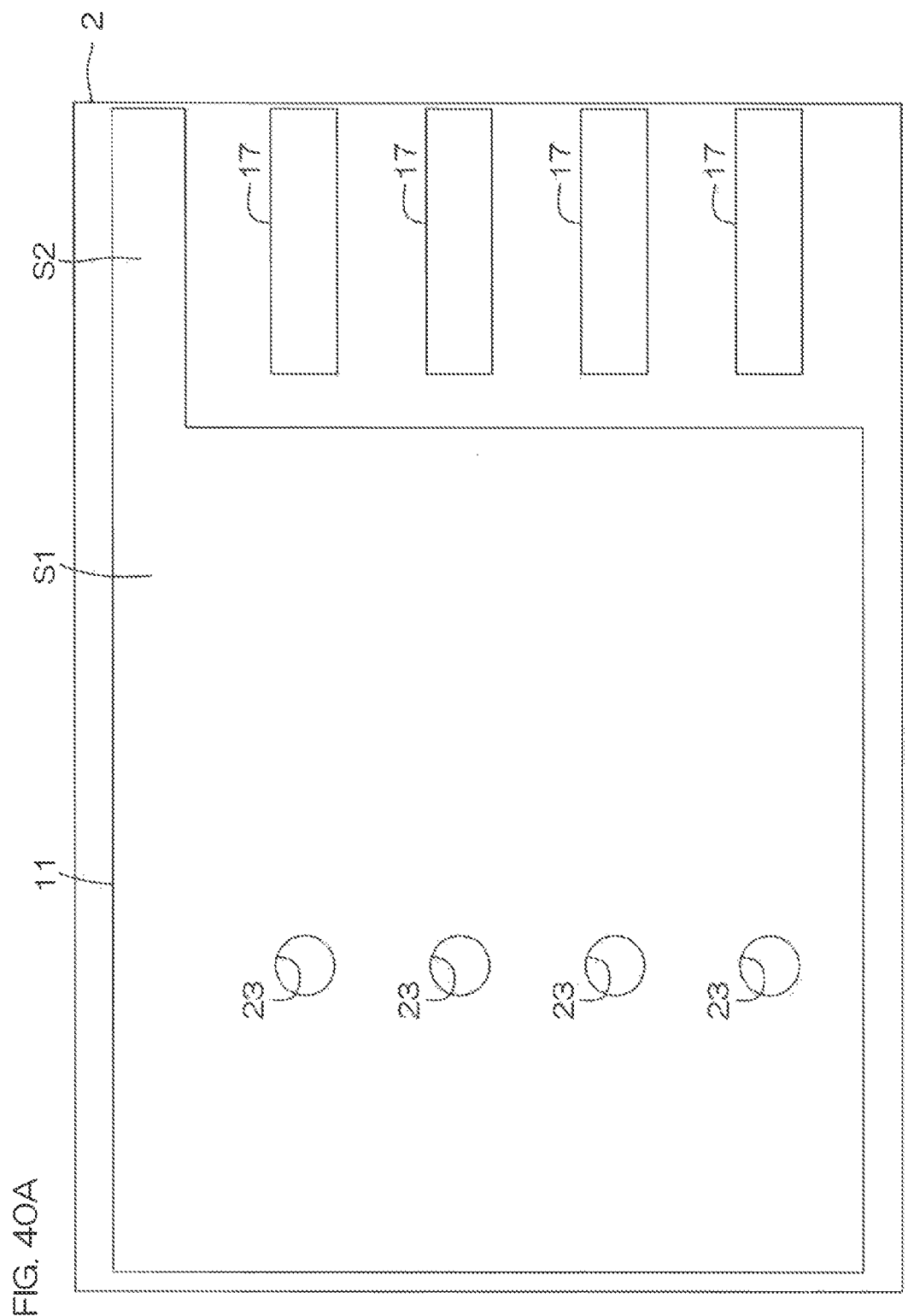

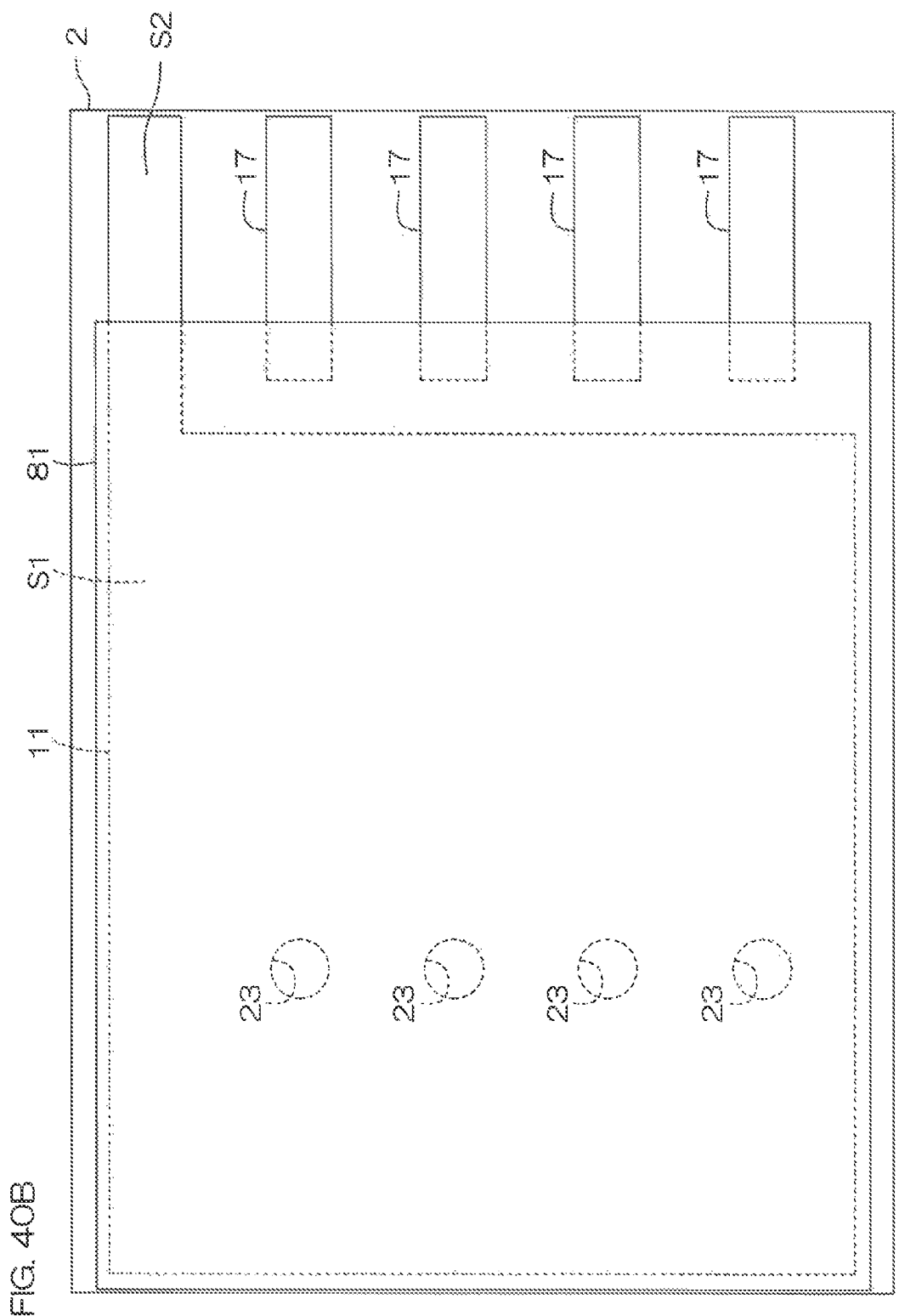

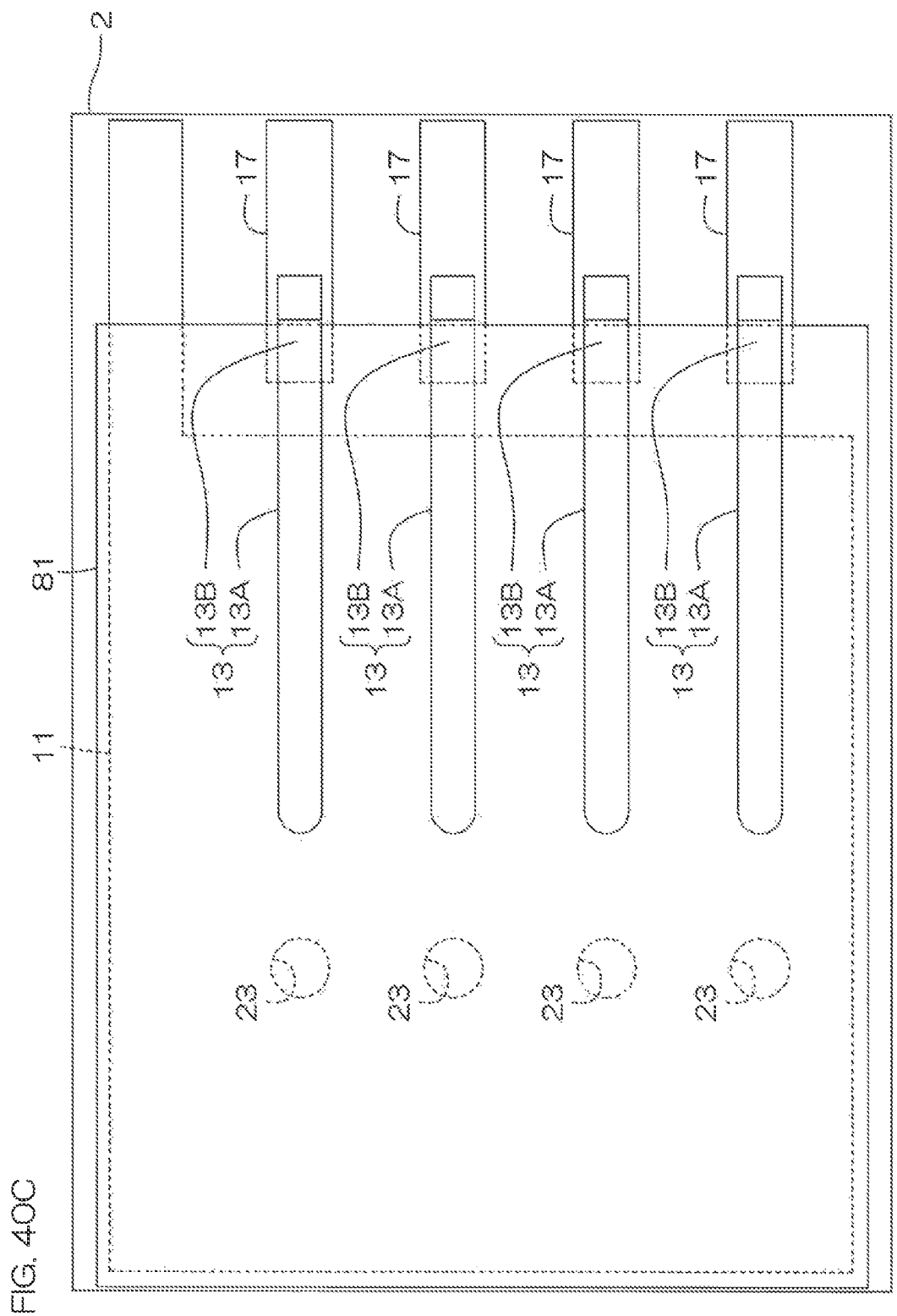

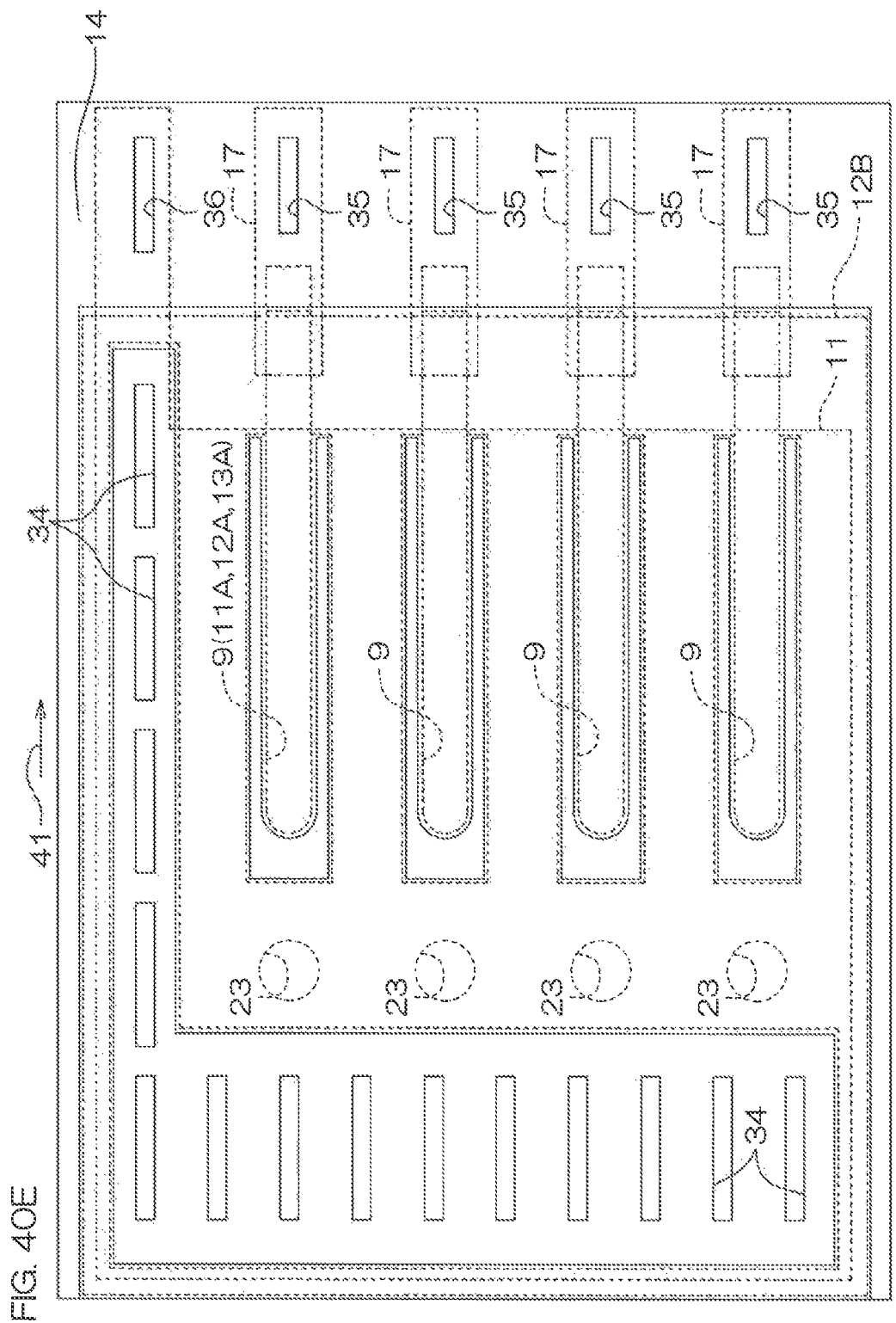

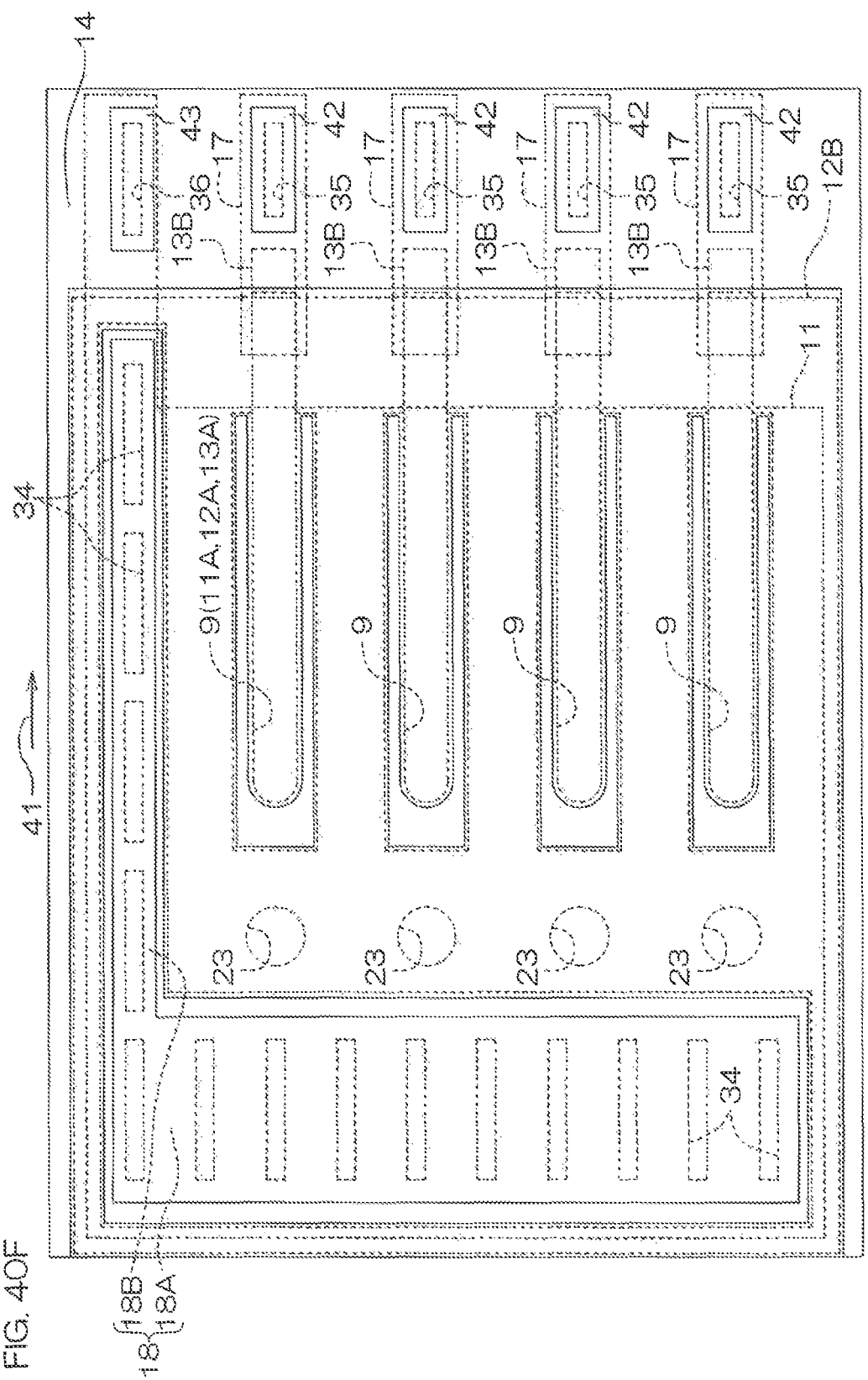

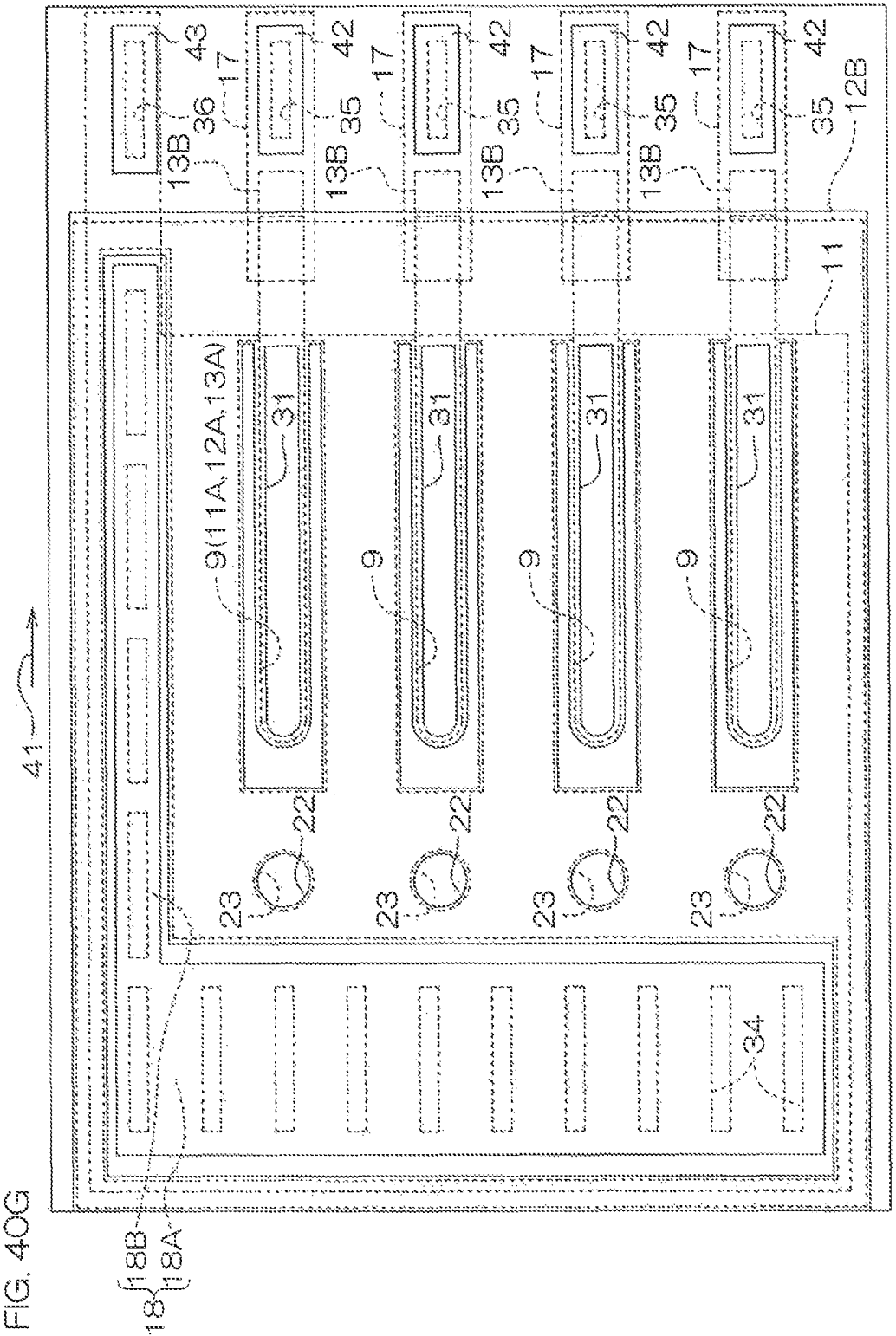

DEVICE USING A PIEZOELECTRIC ELEMENT AND METHOD FOR MANUFACTURING THE SAME

BACKGROUND OF THE INVENTION

1. Field of the invention

The present invention relates to a device using a piezoelectric element that uses a piezoelectric element and a method for manufacturing the same.

2. Description of the Related Art

Japanese Patent Application Publication No. 2013-119182 discloses an inkjet printing head that uses a piezoelectric element. The inkjet printing head of Japanese Patent Application Publication No. 2013-119182 includes an actuator substrate having a pressure chamber (cavity), a movable film supported by the actuator substrate so as to face the pressure chamber, and a piezoelectric element bonded to the movable film. The piezoelectric element is arranged by laminating a lower electrode, a piezoelectric film, and an upper electrode in that order from the movable film side.

SUMMARY OF THE INVENTION

The inventor of preferred embodiments of the present invention described and claimed in the present application conducted an extensive study and research regarding a device using a piezoelectric element and a method for manufacturing the same, such as the one described above, and in doing so, discovered and first recognized new unique challenges and previously unrecognized possibilities for improvements as described in greater detail below.

With the inkjet printing head of Japanese Patent Application Publication No. 2013-119182, after forming a lower electrode film, a piezoelectric material film, and an upper electrode film above a movable film formation layer, the upper electrode film and the piezoelectric material film are patterned by etching to form the upper electrode and the piezoelectric film. The piezoelectric material film contains a metal and therefore in the process of etching the piezoelectric material film, the metal in the piezoelectric material film may react with etching gas to form a metal thin film at a side portion of the piezoelectric film. When the metal thin film is formed at the side portion of the piezoelectric film, a leak path formed between the upper electrode and the lower electrode and the leak current increases.

An object of the present invention is to provide a device using a piezoelectric element and a method for manufacturing the same with which increase of leak current can be suppressed.

In order to overcome the previously unrecognized and unsolved challenges described above, a preferred embodiment of the present invention provides a device using a piezoelectric element. The device using the piezoelectric element includes a substrate having a cavity, a movable film formation layer including a movable film disposed above the cavity and defining a top surface portion of the cavity, and a piezoelectric element formed above the movable film, the piezoelectric element includes a lower electrode formed above the movable film, a piezoelectric film formed above the lower electrode, and an upper electrode formed above the piezoelectric film, and the piezoelectric film includes an active portion with an upper surface in contact with a lower surface of the upper electrode and an inactive portion led out in a direction along a front surface of the movable film formation layer from an entire periphery of a side portion of the active portion and having a thickness thinner than that of the active portion.

With the present arrangement, the piezoelectric film includes the inactive portion that is led out in the direction along the front surface of the movable film formation layer from the entire periphery of the side portion of the active portion and having the thickness thinner than that of the active portion. A length of a path putting the upper electrode and a lower electrode in communication along an outer surface of the piezoelectric film is thus made longer than in a case where the piezoelectric film does not include the inactive portion. Therefore, even if a metal thin film is formed on the outer surface of the piezoelectric film, a leak path is made longer and increase of leak current can thus be suppressed. Also, in a process of patterning the piezoelectric film by etching, a metal thin film is less likely to form on an upper surface of the inactive portion than on a side surface of the active portion or a side surface of the inactive portion and increase of the leak current can thus be suppressed.

In the preferred embodiment of the present invention, the thickness of the inactive portion is not less than $1/20$ and not more than $1/10$ the thickness of the active portion. With the present arrangement, lowering of a displacement amount of the movable film by the inactive portion can be suppressed more than in a case where the thickness of the inactive portion is thicker than $1/10$ the thickness of the active portion.

In the preferred embodiment of the present invention, in a plan view of viewing from a direction normal to a major surface of the movable film, the upper electrode has a peripheral edge that is receded further toward an interior of the cavity than the movable film.

In the preferred embodiment of the present invention, the inactive portion, in the plan view, extends from the entire periphery of the side portion of the active portion to an outer side beyond a peripheral edge of the cavity. With the present arrangement, cracking of a peripheral edge portion of the movable film can be suppressed.

The preferred embodiment of the present invention further includes a wiring, which, in the plan view, has one end portion connected to an upper surface of the upper electrode and another end portion led out to the outer side of the peripheral edge of the cavity.

In the preferred embodiment of the present invention further includes a hydrogen barrier film, covering at least entireties of side surfaces of the upper electrode and the active portion and covering the upper surface of the inactive portion, and an insulating film, formed above the hydrogen barrier film and disposed between the hydrogen barrier film and the wiring. A contact hole, exposing a portion of the upper electrode, is formed in the hydrogen barrier film and the insulating film. The one end portion of the wiring is connected to the upper electrode via the contact hole. With the present arrangement, degradation of characteristics of the piezoelectric film due to hydrogen reduction can be prevented.

The preferred embodiment of the present invention further includes a passivation film formed above the insulating film and covering the wiring. With the present arrangement, the wiring can be protected by the passivation film.

In the preferred embodiment of the present invention, the cavity is formed to a rectangular shape in the plan view. The movable film is formed to a rectangular shape matching the peripheral edge of the cavity in the plan view. Each of the upper electrode and the active portion is, in the plan view, a rectangle having a width shorter than a width in a short direction of the movable film and a length shorter than a length in a long direction of the movable film, with both end edges and both side edges thereof being respectively receded further toward an interior of the movable film than both end edges and both side edges of the movable film. In the plan view, the inactive portion extends from the entire periphery of the side portion of the active portion to the outer side beyond the peripheral edge of the cavity. With the present arrangement, cracking of the peripheral edge portion of the movable film can be suppressed.

In the preferred embodiment of the present invention, the movable film formation layer is constituted of an $SiO_2$ single film.

In the preferred embodiment of the present invention, the movable film formation layer is constituted of a laminated film of an Si film formed above the substrate, an $SiO_2$ film formed above the Si film, and an SiN film formed above the $SiO_2$ film.

In the preferred embodiment of the present invention, the piezoelectric film is constituted of a PZT film.

In the preferred embodiment of the present invention, the upper electrode is constituted of a Pt single film.

In the preferred embodiment of the present invention, the upper electrode is constituted of a laminated film of an $IrO_2$ film formed above the piezoelectric film and an Ir film formed above the $IrO_2$ film.

In the preferred embodiment of the present invention, the lower electrode is constituted of a laminated film of a Ti film formed at the movable film side and a Pt film formed above the Ti film.

A preferred embodiment of the present invention provides a method for manufacturing a device using a piezoelectric element. The method for manufacturing the device using the piezoelectric element includes a step of forming a movable film formation layer, including a movable film formation region, above a substrate in which a cavity is to be formed, a step of forming a lower electrode film, a piezoelectric material film, and an upper electrode film successively above the movable film formation layer, a step of forming an upper electrode by patterning the upper electrode film by etching to an upper electrode pattern having, in a plan view of viewing from a direction normal to a major surface of the movable film formation layer, a peripheral edge that is receded further inward than a peripheral edge of the movable film formation region, a step of performing overetching by continuing the etching to thin a portion of the piezoelectric material film exposed from the upper electrode, a step of patterning the piezoelectric material film to a piezoelectric film pattern to form a piezoelectric film constituted of an active portion with an upper surface in contact with a lower surface of the upper electrode and an inactive portion extending from an entire periphery of a side portion of the active portion to an outer side of the movable film formation region and being thinner than the active portion, and a step of patterning the lower electrode film to a lower electrode pattern to form a lower electrode to thereby form a piezoelectric element including the lower electrode, the upper electrode, and the active portion sandwiched thereby.

With the present method for manufacturing the device using the piezoelectric element, the device using the piezoelectric element with which increase of the leak current can be suppressed is obtained.

The method for manufacturing the device using the piezoelectric element may further include, a step, after the step of forming the piezoelectric element, of successively forming, above the movable film formation layer, a hydrogen barrier film and an insulating film that cover the piezoelectric element and the inactive portion, a step of forming, above the upper electrode, a contact hole, exposing a portion of the upper electrode, in the hydrogen barrier film and the insulating film, a step of forming, above the insulating film, a wiring having one end portion in contact with the upper electrode via the contact hole and another end portion being led out to an outer side of the piezoelectric element, and a step of etching the substrate from below to form a cavity facing the movable film formation region.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 7 is a bottom view of a main portion of the protective substrate as viewed from an actuator substrate side of the inkjet printing head of FIG. 1A.

FIG. 8A is a sectional view of an example of a manufacturing process of the inkjet printing head of FIG. 1A.

FIG. 8C is a sectional view of a step subsequent to that of FIG. 8B.

FIG. 8E is a sectional view of a step subsequent to that of FIG. 8D.

FIG. 8F is a sectional view of a step subsequent to that of FIG. 8E.

FIG. 8J is a sectional view of a step subsequent to that of FIG. 8I.

FIG. 8K is a sectional view of a step subsequent to that of FIG. 8J.

FIG. 10 is an illustrative sectional view taken along line X-X in FIG. 9A.

FIG. 14 is an illustrative plan view of a pattern example of an insulating film of the inkjet printing head of FIG. 9A.

p FIG. 15 is an illustrative plan view of a pattern example of a passivation film of the inkjet printing head of FIG. 9A.

FIG. 16 is a bottom view of a main portion of the protective substrate as viewed from an actuator substrate side of the inkjet printing head of FIG. 9A.

FIG. 17A is a sectional view of an example of a manufacturing process of the inkjet printing head of FIG. 9A.

FIG. 17C is a sectional view of a step subsequent to that of FIG. 17B.

FIG. 17E is a sectional view of a step subsequent to that of FIG. 17D.

FIG. 17F is a sectional view of a step subsequent to that of FIG. 17E.

FIG. 17G is a sectional view of a step subsequent to that of FIG. 17F.

FIG. 17L is a sectional view of a step subsequent to that of FIG. 17K.

FIG. 17M is a sectional view of a step subsequent to that of FIG. 17L.

FIG. 18A is an illustrative plan view for describing the arrangement of a main portion of an inkjet printing head according to a preferred embodiment of a third invention.

FIG. 24 is a bottom view of a main portion of the protective substrate as viewed from an actuator substrate side of the inkjet printing head of FIG. 18A.

FIG. 25E is a sectional view of a step subsequent to that of FIG. 25D.

FIG. 25H is a sectional view of a step subsequent to that of FIG. 25G.

FIG. 25I is a sectional view of a step subsequent to that of FIG. 25H.

FIG. 31A is an illustrative plan view for describing the arrangement of a main portion of an inkjet printing head according to a preferred embodiment of a fourth invention.

FIG. 31B is an illustrative plan view of the main portion of the inkjet printing head of FIG. 31A and is a plan view with a protective substrate omitted.

FIG. 37 is an illustrative plan view of a pattern example of a hydrogen barrier film of the inkjet printing head of FIG. 31A.

FIG. 38 is a bottom view of a main portion of the protective substrate as viewed from an actuator substrate side of the inkjet printing head of FIG. 31A.

FIG. 40A is a plan view of an example of a manufacturing process of the inkjet printing head of FIG. 31A.

FIG. 40B is a plan view of a step subsequent to that of FIG. 40A.

FIG. 40C is a plan view of a step subsequent to that of FIG. 40B.

FIG. 40E is a plan view of a step subsequent to that of FIG. 40D.

FIG. 40F is a plan view of a step subsequent to that of FIG. 40E.

FIG. 40G is a plan view of a step subsequent to that of FIG. 40F.

DETAILED DESCRIPTION OF THE PREFERRED EMBODIMENTS

Preferred embodiments of first to fourth inventions shall now be descried in detail with reference to the attached drawings.

[1] First Invention

A preferred embodiment of the first invention shall now be described in detail with reference to FIG. 1A to FIG. 8N.

Figure 1A:
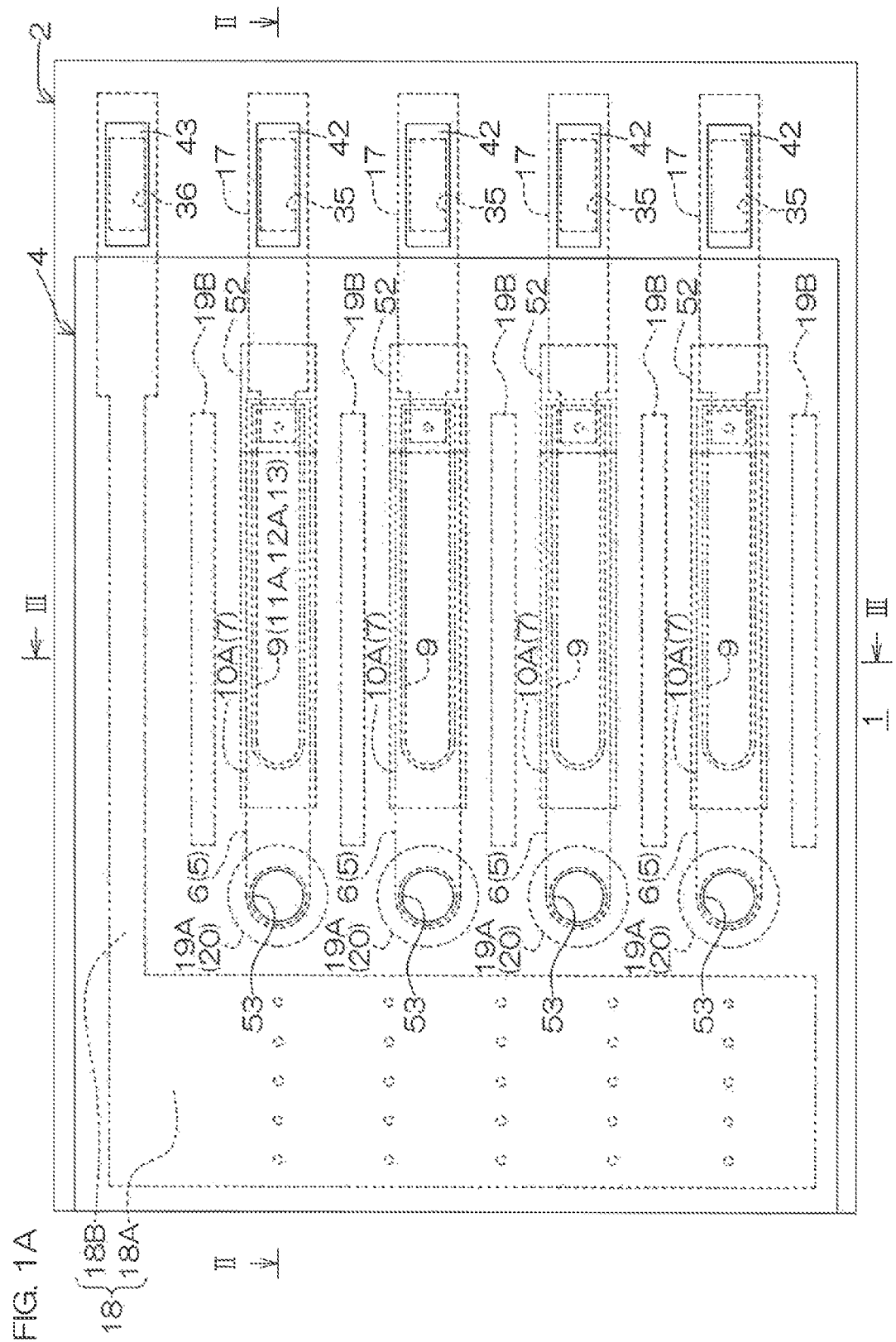
FIG. 1A is an illustrative plan view for describing the arrangement of a main portion of an inkjet printing head according to a preferred embodiment of a first invention.
Figure 1B:
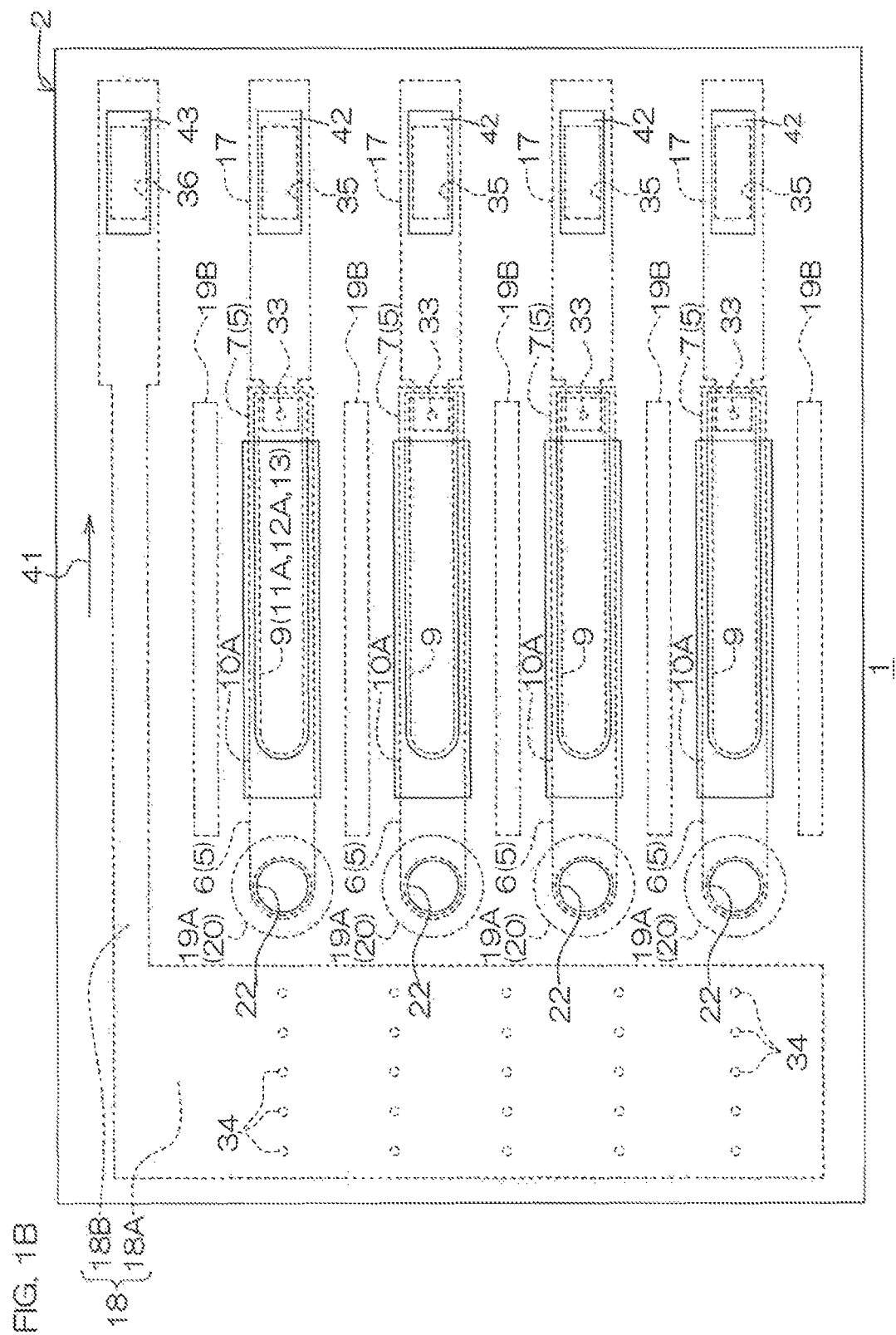
FIG. 1B is an illustrative plan view of the main portion of the inkjet printing head of FIG. 1A and is a plan view with a protective substrate omitted.
Figure 2:
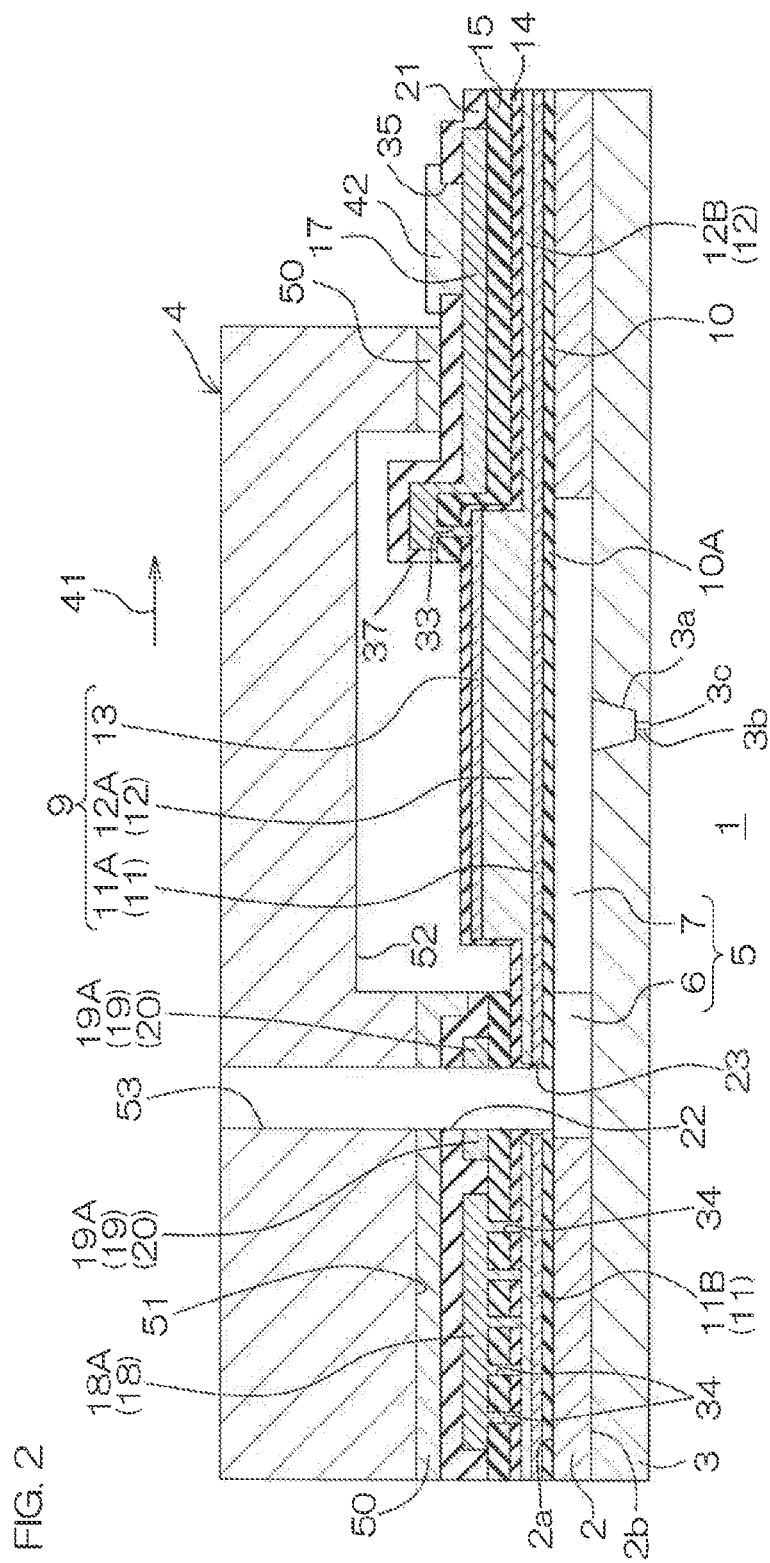
FIG. 2 is an illustrative sectional view taken along line II-II in FIG. 1.
Figure 3:
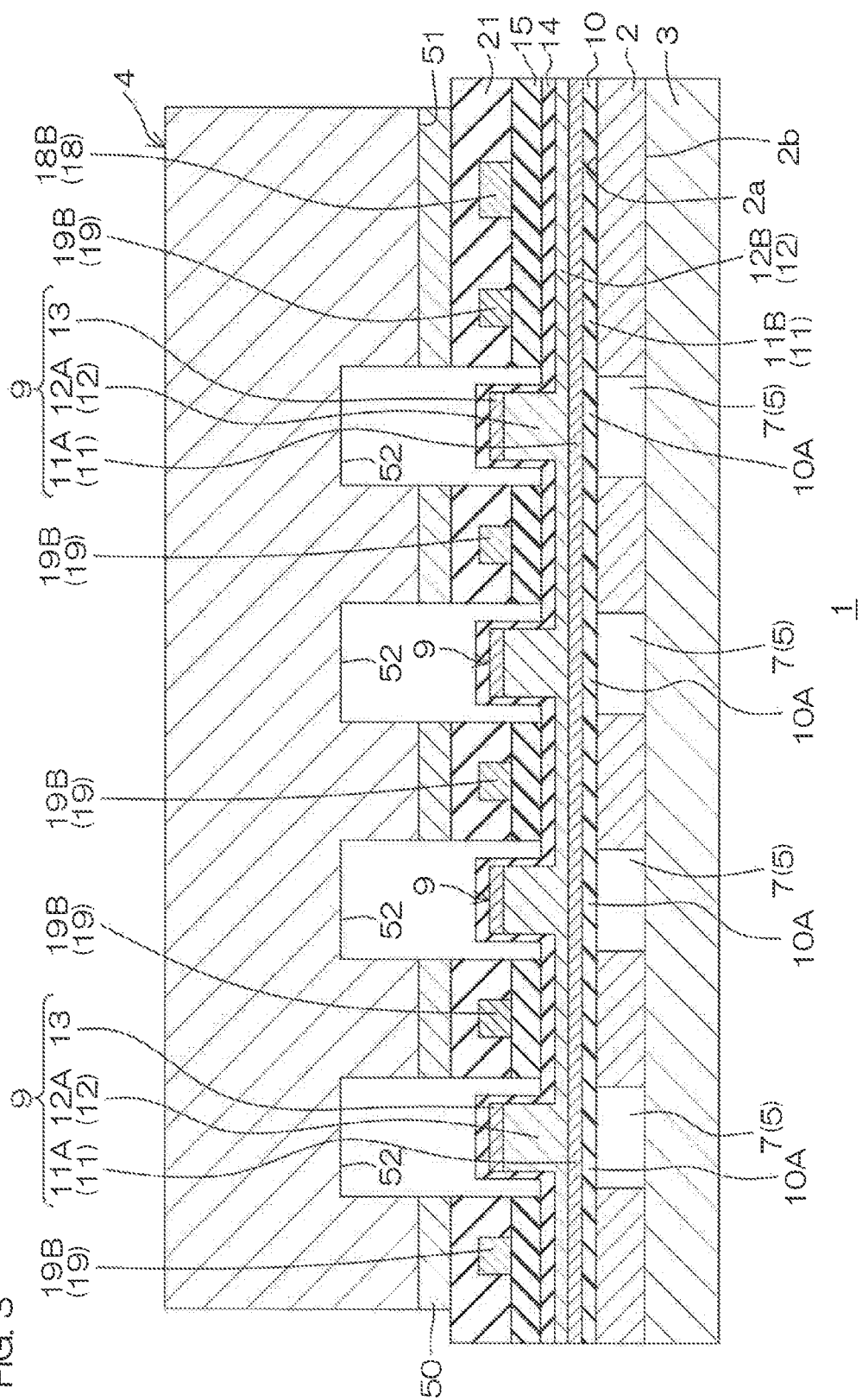
FIG. 3 is an illustrative enlarged sectional view of a portion of a section taken along line III-III in FIG. 1A.
Figure 4:
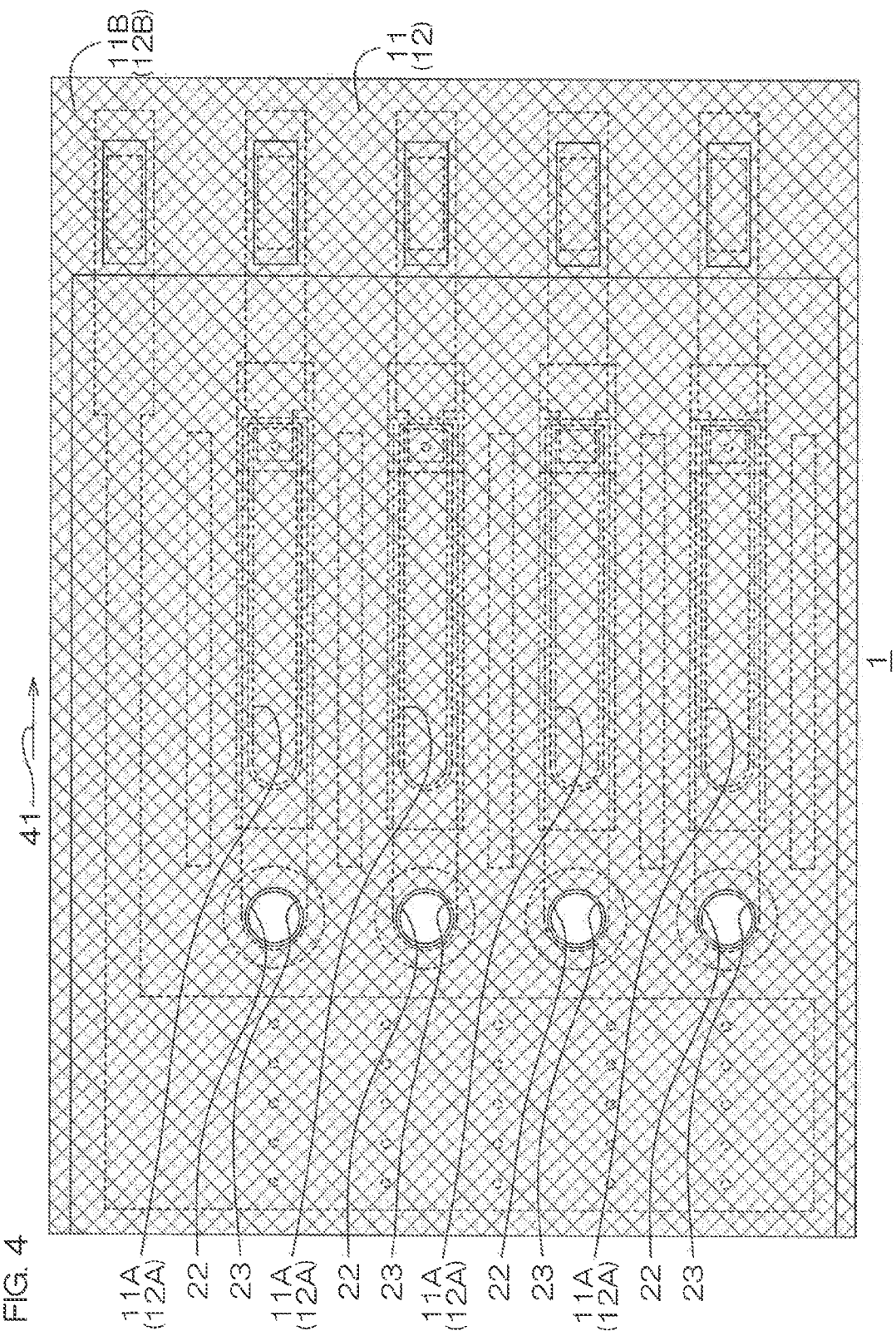
FIG. 4 is an illustrative plan view of a pattern example of a lower electrode and a piezoelectric film of the inkjet printing head of FIG. 1A.

FIG. 1A is an illustrative plan view for describing the arrangement of a main portion of an inkjet printing head according to a preferred embodiment of a first invention. FIG. 1B is an illustrative plan view of the main portion of the inkjet printing head of FIG. 1A and is a plan view with a protective substrate omitted. FIG. 2 is an illustrative sectional view taken along line II-II in FIG. 1A. FIG. 3 is an illustrative enlarged sectional view of a portion of a section taken along line III-III in FIG. 1A. FIG. 4 is an illustrative plan view of a pattern example of a lower electrode and a piezoelectric film of the inkjet printing head of FIG. 1A.

The arrangement of an inkjet printing head 1 shall now be described in outline with reference to FIG. 2.

The inkjet printing head 1 includes an actuator substrate 2, a nozzle substrate 3, and a protective substrate 4. A movable film formation layer 10 is laminated on a front surface of the actuator substrate 2. In the actuator substrate 2, ink flow passages (ink reservoirs) 5 are formed. In the present preferred embodiment, the ink flow passages 5 are formed to penetrate through the actuator substrate 2. Each ink flow passage 5 is formed to be elongate along an ink flow direction 41, which is indicated by an arrow FIG. 2. Each ink flow passage 5 is constituted of an ink inflow portion 6 at an upstream side end portion (left end portion in FIG. 2) in the ink flow direction 41 and a pressure chamber 7 (cavity) in communication with the ink inflow portion 6. In FIG. 2, a boundary between the ink inflow portion 6 and the pressure chamber 7 is indicated by an alternate long and two short dashes line.

The nozzle substrate 3 is constituted, for example, of a silicon substrate. The nozzle substrate 3 is adhered to a rear surface 2b of the actuator substrate 2. The nozzle substrate 3, together with the actuator substrate 2 and the movable film formation layer 10, defines the ink flow passages 5. More specifically, the nozzle substrate 3 defines bottom surface portions of the ink flow passages 5. The nozzle substrate 3 has recess portions 3a each facing a pressure chamber 7 and an ink discharge passage 3b is formed in a bottom surface of each recess portion 3a. Each ink discharge passage 3b penetrates through the nozzle substrate 3 and has a discharge port 3c at an opposite side from the pressure chamber 7. Therefore, when a volume change occurs in a pressure chamber 7, the ink retained in the pressure chamber 7 passes through the ink discharge passage 3b and is discharged from the discharge port 3c.

Each portion of the movable film formation layer 10 that is a top roof portion of a pressure chamber 7 constitutes a movable film 10A. The movable film 10A (movable film formation layer 10) is constituted, for example, of a silicon oxide ($SiO_2$) film formed above the actuator substrate 2. The movable film 10A (movable film formation layer 10) may be constituted of a laminated film, for example, of a silicon (Si) film formed above the actuator substrate 2, a silicon oxide ($SiO_2$) film formed above the silicon film, and a silicon nitride (SiN) film formed above the silicon oxide film. In the present specification, the movable film 10A refers to a top roof portion of the movable film formation layer 10 that defines the top surface portion of the pressure chamber 7. Therefore, portions of the movable film formation layer 10 besides the top roof portions of the pressure chambers 7 do not constitute the movable film 10A.

Each movable film 10A has a thickness of, for example, 0.4 μm to 2 μm. If the movable film 10A is constituted of a silicon oxide film, the thickness of the silicon oxide film may be approximately 1.2 μm. If the movable film 10A is constituted of a laminated film of a silicon film, a silicon oxide film, and a silicon nitride film, the thickness of each of the silicon film, the silicon oxide film, and the silicon nitride film may be approximately 0.4 μm.

Each pressure chamber 7 is defined by a movable film 10A, the actuator substrate 2, and the nozzle substrate 3 and is formed to a substantially rectangular parallelepiped shape in the present preferred embodiment. The pressure chamber 7 may, for example, have a length of approximately 800 μm and a width of approximately 55 μm. Each ink inflow portion 6 is in communication with one end portion in a long direction of a pressure chamber 7.

A piezoelectric element 9 is disposed on a front surface of each movable film 10A. Each piezoelectric element 9 includes a lower electrode 11 formed above the movable film formation layer 10, a piezoelectric film 12 formed above the lower electrode 11, and an upper electrode 13 formed above the piezoelectric film 12. In other words, the piezoelectric element 9 is arranged by sandwiching the piezoelectric film 12 from above and below by the upper electrode 13 and the lower electrode 11.

The upper electrode 13 may be a single film of platinum (Pt) or may have a laminated structure, for example, in which a conductive oxide film (for example, an $IrO_2$ (iridium oxide) film) and a metal film (for example, an Ir (iridium) film) are laminated. The upper electrode 13 may have a thickness, for example, of approximately 0.2 μm.

As the piezoelectric film 12, for example, a PZT ($PbZr_xTi_{1-x}O_3$: lead zirconate titanate) film formed by a sol-gel method or a sputtering method may be applied. Such a piezoelectric film 12 is constituted of a sintered body of a metal oxide crystal. The piezoelectric film 12 includes active portions 12A, each in contact with a lower surface of an upper electrode 13, and an inactive portion 12B extending along a front surface of the movable film formation layer 10 from entire peripheries of side portions of the active portions 12A. The active portions 12A are formed to be of the same shape as the upper electrodes 13 in plan view.

Each active portion 12A has a thickness of approximately 1 μm. The inactive portion 12B has a thickness thinner than the thickness of the active portion 12A. The thickness of the inactive portion 12B is preferably not less than ⅟20 and not more than ⅟10 the thickness of the active portion 12A. The overall thickness of each movable film 10A is preferably approximately the same as the thickness of the active portion 12A or approximately ⅔ the thickness of the active portion 12A.

The lower electrode 11 has, for example, a two-layer structure with a Ti (titanium) film and a Pt (platinum) film being laminated successively from the movable film formation layer 10 side. Besides this, the lower electrode 11 may be formed of a single film that is an Au (gold) film, a Cr (chromium) layer, or an Ni (nickel) layer, etc. The lower electrode 11 has main electrode portions 11A, in contact with lower surfaces of the active portions 12A of the piezoelectric film 12, and an extension portion 11B extending along the front surface of the movable film formation layer 10 from entire peripheries of the main electrode portions 11A. The lower electrode 11 may have a thickness, for example, of approximately 0.2 μm.

A hydrogen barrier film 14 is formed above the inactive portion 12B of the piezoelectric film 12 and above the piezoelectric element 9. The hydrogen barrier film 14 is constituted, for example, of $Al_2O_3$ (alumina). The hydrogen barrier film 14 has a thickness of approximately 50 nm to 100 nm. The hydrogen barrier film 14 is provided to prevent degradation of characteristics of the piezoelectric film 12 due to hydrogen reduction.

An insulating film 15 is laminated on the hydrogen barrier film 14. The insulating film 15 is constituted, for example, of $SiO_2$ or low-hydrogen SiN, etc. The insulating film 15 has a thickness of approximately 500 nm. Upper wirings 17, a lower wiring 18, and dummy wirings 19 are formed above the insulating film 15. These wirings 17, 18, and 19 may be constituted of a metal material that includes Al (aluminum). These wirings 17, 18, and 19 have a thickness, for example, of approximately 1000 nm (1 μm).

One end portion of each upper wiring 17 is disposed above one end portion (downstream side end portion in the ink flow direction 41) of an upper electrode 13. A contact hole 33, penetrating continuously through the hydrogen barrier film 14 and the insulating film 15, is formed between the upper wiring 17 and the upper electrode 13. The one end portion of the upper wiring 17 enters into the contact hole 33 and is connected to the upper electrode 13 inside the contact hole 33. From above the upper electrode 13, the upper wiring 17 crosses an outer edge of the pressure chamber 7 and extends outside the pressure chamber 7.

The lower wiring 18 is disposed above the extension portion 11B of the lower electrode 11 at an opposite side from the pressure chamber 7 with respect to the ink inflow portion 6 of the ink flow passage 5. A plurality of contact holes 34, penetrating continuously through the hydrogen barrier film 14 and the insulating film 15, are formed between the lower wiring 18 and the extension portion 11B of the lower electrode 11. The lower wiring 18 enters into the contact holes 34 and is connected to the extension portion 11B of the lower electrode 11 inside the contact holes 34.

The dummy wirings 19 are not electrically connected to either of the upper wirings 17 and the lower wiring 18 and are electrically insulated wirings. The dummy wirings 19 are formed in the same process as a process in which the upper wirings 17 and the lower wiring 18 are formed.

A passivation film 21, covering the wirings 17, 18, and 19 and the insulating film 15 is formed above the insulating film 15. The passivation film 21 is constituted, for example, of SiN (silicon nitride). The passivation film 21 may have a thickness, for example, of approximately 800 nm.

Pad openings 35 that expose portions of the upper wirings 17 are formed in the passivation film 21. The pad openings 35 are formed in a region outside the pressure chambers 7 and are formed, for example, at tip portions (end portions at opposite sides from the portions of contact with the upper electrodes 13) of the upper wirings 17. Pads 42 that cover the pad openings 35 are formed above the passivation film 21. The pads 42 enter into the pad openings 35 and are connected to the upper wirings 17 inside the pad openings 35.

Ink supply penetrating holes 22, penetrating through the passivation film 21, the insulating film 15, the hydrogen barrier film 14, the inactive portion 12B, the lower electrode 11, and the movable film formation layer 10 are formed at positions corresponding to end portions of the ink flow passages 5 at the ink inflow portion 6 sides. Penetrating holes 23, each including an ink supply penetrating hole 22 and being larger than the ink supply penetrating hole 22, are formed in the inactive portion 12B and the lower electrode 11. The hydrogen barrier film 14 enters into gaps between the penetrating holes 23, in the inactive portion 12B and the lower electrode 11, and the ink supply penetrating holes 22. The ink supply penetrating holes 22 are in communication with the ink inflow portions 6.

The protective substrate 4 is constituted, for example, of a silicon substrate. The protective substrate 4 is disposed above the actuator substrate 2 so as to cover the piezoelectric elements 9. The protective substrate 4 is bonded to the passivation film 21 via an adhesive 50. The protective substrate 4 has housing recesses 52 in a facing surface 51 that faces a front surface 2a of the actuator substrate 2. The piezoelectric elements 9 are housed inside the housing recesses 52. Further, the protective substrate 4 has formed therein ink supply passages 53 that are in communication with the ink supply penetrating holes 22. The ink supply passages 53 penetrate through the protective substrate 4. An ink tank (not shown) storing ink is disposed above the protective substrate 4.

Each piezoelectric element 9 is formed at a position facing a pressure chamber 7 across a movable film 10A. That is, the piezoelectric element 9 is formed to contact a front surface of the movable film 10A at the opposite side from the pressure chamber 7. Each pressure chamber 7 is filled with ink by the ink being supplied from the ink tank to the pressure chamber 7 through an ink supply passage 53, an ink supply penetrating hole 22, and an ink inflow portion 6. The movable film 10A defines a top surface portion of the pressure chamber 7 and faces the pressure chamber 7. The movable film 10A is supported by portions of the actuator substrate 2 at a periphery of the pressure chamber 7 and has flexibility enabling deformation in a direction facing the pressure chamber 7 (in other words, in the thickness direction of the movable film 10A).

The upper wirings 17 and the lower wiring 18 are connected to a drive circuit (not shown). Specifically, the pads 42 of the upper wirings 17 and the drive circuit are connected via a connecting metal member (not shown). As shall be described later, a pad 43 (see FIG. 1A) is connected to the lower wiring 18. The pad 43 of the lower wiring 18 and the drive circuit are connected via a connecting metal member (not shown). When a drive voltage is applied from the drive circuit to a piezoelectric element 9, the active portion 12A of the piezoelectric film 12 deforms due to an inverse piezoelectric effect. The movable film 10A is thereby made to deform together with the piezoelectric element 9 to bring about a volume change of the pressure chamber 7 and the ink inside the pressure chamber 7 is pressurized. The pressurized ink passes through the ink discharge passage 3b and is discharged as microdroplets from the discharge port 3c.

The arrangement of the inkjet printing head 1 shall now be described in more detail with reference to FIG. 1A to FIG. 4.

A plurality of the ink flow passages 5 (pressure chambers 7) are formed as stripes extending parallel to each other in the actuator substrate 2. The piezoelectric element 9 is disposed respectively in each of the plurality of ink flow passages 5. The ink supply penetrating holes 22 are provided respectively for each of the plurality of ink flow passages 5. The housing recesses 52 and the ink supply passages 53 in the protective substrate 4 are provided respectively for each of the plurality of ink flow passages 5.

The plurality of ink flow passages 5 are formed at equal intervals that are minute intervals (for example, of approximately 30 μm to 350 μm) in a width direction thereof. Each ink flow passage 5 is elongate along the ink flow direction 41. Each ink flow passage 5 is constituted of an ink inflow portion 6 in communication with an ink supply penetrating hole 22 and the pressure chamber 7 in communication with the ink inflow portion 6. In plan view, the pressure chamber 7 has an oblong shape that is elongate along the ink flow direction 41. That is, the top surface portion of the pressure chamber 7 has two side edges along the ink flow direction 41 and two end edges along a direction orthogonal to the ink flow direction 41. In plan view, the ink inflow portion 6 has substantially the same width as the pressure chamber 7. An inner surface of an end portion of the ink inflow portion 6 at an opposite side from the pressure chamber 7 is formed to a semicircle in plan view. The ink supply penetrating hole 22 is circular in plan view (see especially FIG. 1B).

Each piezoelectric element 9 has, in plan view, a rectangular shape that is long in a long direction of a pressure chamber 7 (movable film 10A). A length in a long direction of the piezoelectric element 9 is shorter than a length in the long direction of the pressure chamber 7 (movable film 10A). As shown in FIG. 1B, respective end edges along a short direction of the piezoelectric element 9 are disposed at inner sides at predetermined intervals respectively from respective corresponding end edges of the movable film 10A. Also, a width in the short direction of the piezoelectric element 9 is narrower than a width in a short direction of the movable film 10A. Respective side edges along the long direction of the piezoelectric element 9 are disposed at inner sides at predetermined intervals from respective corresponding side edges of the movable film 10A.

The lower electrode 11 is formed on substantially an entirety of the front surface of the movable film formation layer 10 (see especially FIG. 4). The lower electrode 11 is a common electrode used in common for the plurality of piezoelectric elements 9. The lower electrode 11 includes the main electrode portions 11A of rectangular shape in plan view that constitute the piezoelectric elements 9 and the extension portion 11B led out from the main electrode portions 11A in directions along the front surface of the movable film formation layer 10 to extend outside the peripheral edges of the top surface portions of the pressure chambers 7.

A length in a long direction of each main electrode portion 11A is shorter than the length in the long direction of each movable film 10A. Respective end edges of the main electrode portion 11A are disposed at inner sides at predetermined intervals respectively from the respective corresponding end edges of the movable film 10A. Also, a width in a short direction of the main electrode portion 11A is narrower than the width of the movable film 10A in the short direction. Respective side edges of the main electrode portion 10A are disposed at inner sides at predetermined intervals from the respective corresponding side edges of the movable film 10A. The extension portion 11B is a region of the entire region of the lower electrode 11 excluding the main electrode portions 11A.

In plan view, the upper electrodes 13 are formed to rectangular shapes of the same pattern as the main electrode portions 11A of the lower electrode 11. That is, a length in a long direction of each upper electrode 13 is shorter than the length in the long direction of each movable film 10A. Respective end edges of the upper electrode 13 are disposed at inner sides at predetermined intervals respectively from the respective corresponding end edges of the movable film 10A. Also, a width in a short direction of the upper electrode 13 is narrower than the width in the short direction of the movable film 10A. Respective side edges of the upper electrode 13 are disposed at inner sides at predetermined intervals from the respective corresponding side edges of the movable film 10A.

Figure 5:
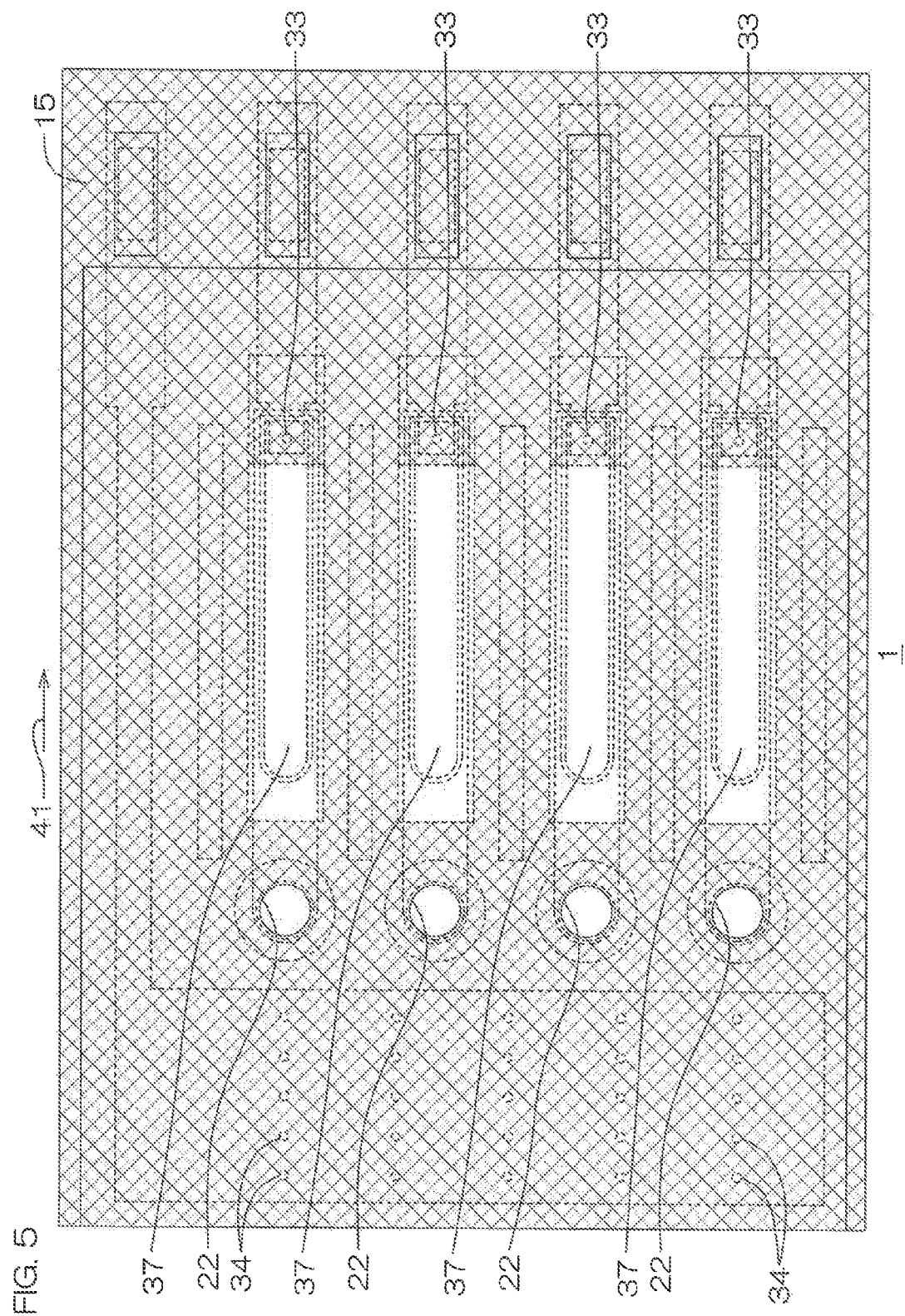
FIG. 5 is an illustrative plan view of a pattern example of an insulating film of the inkjet printing head of FIG. 1A.

In plan view, the piezoelectric film 12 is formed to be of the same pattern as the lower electrode 11 (see FIG. 5). That is, the piezoelectric film 12 is formed across substantially an entirety of the front surface of the movable film formation layer 10. As mentioned above, the piezoelectric film 12 includes the active portions 12A and the inactive portion 12B. In plan view, the active portions 12A are formed to rectangular shapes of the same pattern as the upper electrodes 13. That is, a length in a long direction of each active portion 12A is shorter than the length in the long direction of each movable film 10A. Respective end edges of the active portion 12A are disposed at inner sides at predetermined intervals respectively from the respective corresponding end edges of the movable film 10A. Also, a width in a short direction of the active portion 12A is narrower than the width in the short direction of the movable film 10A. Respective side edges of the active portion 12A are disposed at inner sides at predetermined intervals from the respective corresponding side edges of the movable film 10A. A lower surface of the active portion 12A contacts an upper surface of the main electrode portion 11A of the lower electrode 11 and an upper surface of the active portion 12A contacts a lower surface of the upper electrode 13.

In plan view, the inactive portion 12B is formed to be of the same pattern as the extension portion 11B of the lower electrode 11. The inactive portion 12B extends from entire peripheries of side walls of the active portions 12A to an outer side beyond the peripheral edges of the pressure chambers 7. An upper surface of the inactive portion 12B is covered by the hydrogen barrier film 14.

In the present preferred embodiment, the piezoelectric film 12 includes the inactive portion 12B that is led out from the entire peripheries of the side portions of the active portions 12A in directions along the front surface of the movable film formation layer 10 and is thinner in thickness than the active portions 12A. Therefore, a path putting an upper electrode 13 and the lower electrode 11 in communication along an outer surface of the piezoelectric film 12 is made longer in length than in a case where the piezoelectric film 12 does not include the inactive portion 12B. Therefore, even if a metal thin film is formed on an outer surface of the piezoelectric film 12 in patterning the piezoelectric film 12 by etching, a leak path will be long and increase of leak current can thus be suppressed. Increase of leak current can also be suppressed because in patterning the piezoelectric film 12 by etching, a metal thin film is less likely to form on the upper surface of the inactive portion 12B than on side surfaces of the active portions 12A or on a side surface of the inactive portion 12B.

An annular region in each movable film 10A between peripheral edges of the movable film 10A and peripheral edges of the piezoelectric element 9 is a region that is not constrained by the piezoelectric element 9 or a peripheral wall of the pressure chamber 7 and is a region in which a large deformation occurs. That is, a peripheral edge portion of the movable film 10A is a region in which a large deformation occurs. Therefore, when the piezoelectric element 9 is driven, the peripheral edge portion of the movable film 10A bends so that an inner peripheral edge side of the peripheral edge portion of the movable film 10A is displaced in a thickness direction of the pressure chamber 7 (downward in the present preferred embodiment) and an entirety of a central portion surrounded by the peripheral edge portion of the movable film 10A is thereby displaced in the thickness direction of the pressure chamber 7 (downward in the present preferred embodiment). Thus, cracking occurs readily in the peripheral edge portion of the movable film 10A because it is such a region in which a large deformation occurs. In the present preferred embodiment, the inactive portion 12B, in plan view, extends outward across the peripheral edges of the movable film 10A from the entire peripheries of the side surfaces of the active portions 12A. That is, the inactive portion 12B of the piezoelectric film 12 is interposed above the peripheral edge portions of the movable films 10A. Cracking of the peripheral edge portions of the movable film 10A can thus be suppressed.

Each upper wiring 17 extends from an upper surface of one end portion of a piezoelectric element 9 and along an end surface of the piezoelectric element 9 continuous to the upper surface and extends further along the front surface of the inactive portion 12B of the piezoelectric film 12 in a direction along the ink flow direction 41. The tip portion of the upper wiring 17 is disposed further downstream in the ink flow direction 41 than a downstream side end of the protective substrate 4. The pad openings 35 that expose central portions of tip portion front surfaces of the upper wirings 17 are formed in the passivation film 21. The pads 42 are provided on the passivation film 21 so as to cover the pad openings 35. The pads 42 are connected to the upper wirings 17 inside the pad openings 35.

In plan view, the lower wiring 18 has a rectangular main wiring portion 18A that is long in a direction orthogonal to the ink flow direction 41 and a lead portion 18B extending along the ink flow direction 41 from one end portion of the main wiring portion 18A. A tip portion of the lead portion 18B is disposed further downstream in the ink flow direction 41 than the downstream side end of the protective substrate 4. The lower wiring 18 enters into the plurality of contact holes 34 and is connected to the extension portion 11B of the lower electrode 11 inside the contact holes 34. A pad opening 36 that exposes a central portion of a tip portion front surface of the lead portion 18B is formed in the passivation film 21. The pad 43 is provided above the passivation film 21 so as to cover the pad opening 36. The pad 43 is connected to the lead portion 18B inside the pad opening 36.

FIG. 7 is a bottom view of a main portion of the protective substrate as viewed from the actuator substrate side of the inkjet printing head.

As shown in FIG. 1A, FIG. 3, and FIG. 7, in the facing surface 51 of the protective substrate 4, the plurality of housing recesses 52 are formed in parallel at intervals in a direction orthogonal to the ink flow direction 41. In plan view, the plurality of housing recesses 52 are disposed at positions facing the plurality of pressure chambers 7. With respect to the respective housing recesses 52, the ink supply passages 53 are disposed at upstream sides in the ink flow direction 41. In plan view, each housing recess 52 is formed to a rectangular shape slightly larger than the pattern of the upper electrode 13 of the corresponding piezoelectric element 9. The corresponding piezoelectric element 9 is housed in each housing recess 52.

In plan view, the ink supply passages 53 of the protective substrate 4 have circular shapes of the same pattern as the ink supply penetrating holes 22 at the actuator substrate 2 side. In plan view, the ink supply passages 53 are matched with the ink supply penetrating holes 22.

In plan view, the dummy wirings 19 include first dummy wirings 19A of circular annular shapes that surround the ink supply passages 53 (ink supply penetrating holes 22). Above the actuator substrate 2, the first dummy wirings 19A are disposed in regions facing regions of the facing surface 51 of the protective substrate 4 peripheral to the ink supply passages 53. A width of each first dummy wiring 19A (difference between an inner diameter and an outer diameter of each first dummy wiring 19A) is preferably not less than ⅓ a diameter of each ink supply passage 53. Upper surfaces of the first dummy wirings 19A are flat. Each first dummy wiring 19A constitutes a base 20 that supports the protective substrate 4 and increases adhesion with the facing surface of the protective substrate 4.

The dummy wirings 19 further include second dummy wirings 19B of elongate rectangular shapes that are formed at width central portions of regions between adjacent pressure chambers 7 and at outward sides of the pressure chambers 7 at respective outer sides of the set of plurality of pressure chambers and extend in the direction along the ink flow direction 41. Upper surfaces of the second dummy wirings 19B are flat. Each second dummy wiring 19B constitutes a base that supports the protective substrate 4 and increases adhesion with the facing surface of the protective substrate 4.

In bonding the protective substrate 4 to the actuator substrate 2, the protective substrate 4 is pressed against the actuator substrate 2 in a state where an adhesive 50 is coated on a portion of bonding of the actuator substrate 2 and the protective substrate 4. In this process, the facing surface 51 of the protective substrate 4 is pressed via the passivation film 21 against the first dummy wirings 19A and the second dummy wirings 19B that are bases with flat upper surfaces. The facing surface 51 of the protective substrate 4 is thus bonded firmly via the passivation film 21 and the adhesive 50 to the upper surfaces of the first dummy wirings 19A and the second dummy wirings 19B. Defective adhesion is thus made unlikely to occur at the portion of bonding of the facing surface 51 of the actuator substrate 2 and the protective substrate 4.

In the present preferred embodiment, by the first dummy wirings 19A (bases 20) of circular annular shapes surrounding the ink supply passages 53 (ink supply penetrating holes 22) being provided at the actuator substrate 2 side, occurrence of defective bonding between lower surfaces of wall portions of the protective substrate 4 between the housing recesses 52 and the ink supply passages 53 and the actuator substrate 2 can be suppressed. Leakage of ink into a housing recess 52 from an ink supply passage 53 can thereby be suppressed.

Figure 6:
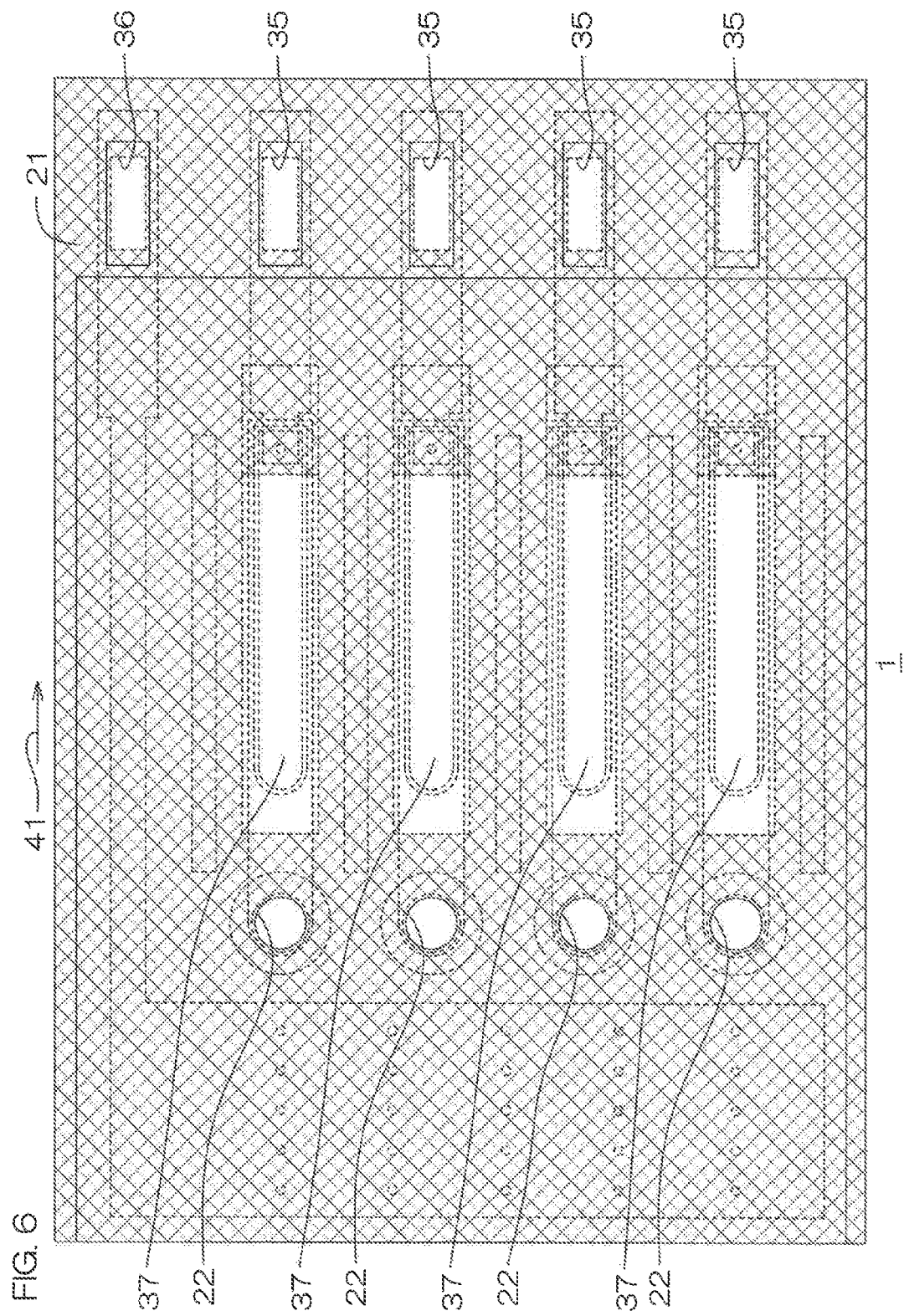
FIG. 6 is an illustrative plan view of a pattern example of a passivation film of the inkjet printing head of FIG. 1A.

FIG. 5 is an illustrative plan view of a pattern example of the insulating film of the inkjet printing head. FIG. 6 is an illustrative plan view of a pattern example of the passivation film of the inkjet printing head.

In the present preferred embodiment, above the actuator substrate 2, the insulating film 15 and the passivation film 21 are formed on substantially an entirety of a region of the protective substrate 4 outside the housing recesses 52 in plan view. However, in this region, the ink supply penetrating holes 22 and the contact holes 34 are formed in the insulating film 15. In this region, the ink supply penetrating holes 22 and the pad openings 35 and 36 are formed in the passivation film 21.

In the regions of the protective substrate 4 inside the housing recesses 52, the insulating film 15 and the passivation film 21 are formed just in one end portions (upper wiring regions) in which the upper wirings 17 are present. In each of these regions, the passivation film 21 is formed to cover an upper surface and a side surface of an upper wiring 17 above the insulating film 15. In other words, in the insulating film 15 and the passivation film 21, openings 37 are formed in regions, within the inner side regions of the housing recesses 52 in plan view, that exclude the upper wiring regions. The contact holes 33 are further formed in the insulating film 15.

In the present preferred embodiment, in a region at the inner side of the peripheral edge of each pressure chamber 7 in plan view, the insulating film 15 and the passivation film 21 are formed just in the upper wiring region in which an upper wiring 17 is present. Therefore, most of the side surface and the upper surface of each piezoelectric element 9 are not covered by the insulating film 15 and the passivation film 21. Displacement of each movable film 10A can thereby be increased in comparison to a case where entireties of the side surface and the upper surface of the piezoelectric element 9 are covered by the insulating film and the passivation film.

Figure 8B:
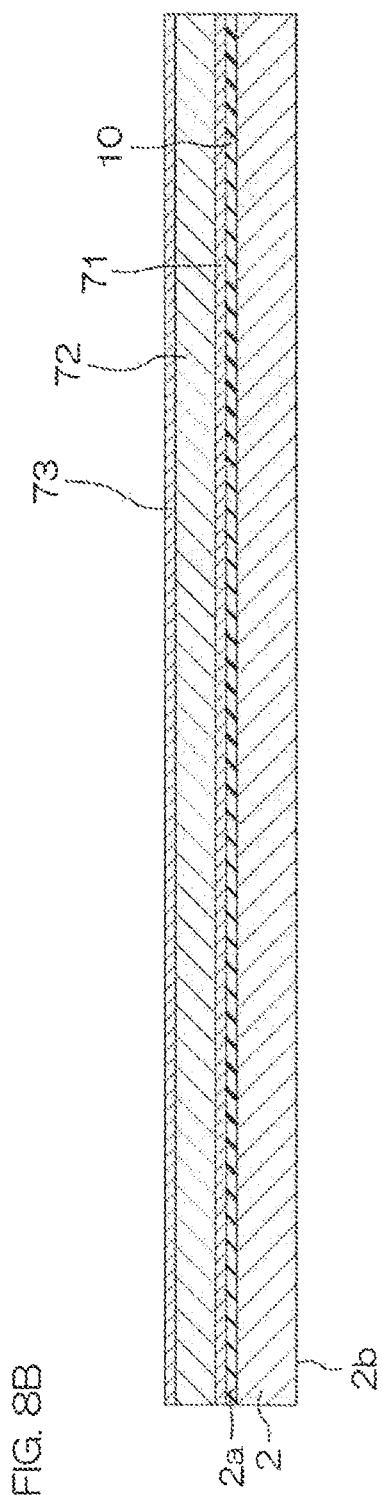
FIG. 8B is a sectional view of a step subsequent to that of FIG. 8A.
Figure 8D:
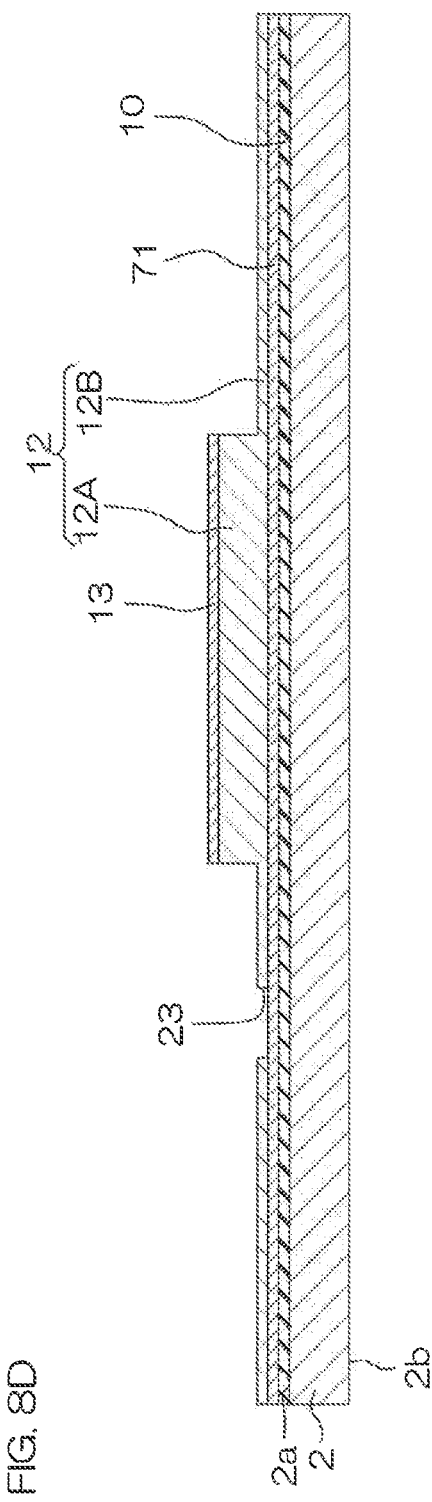
FIG. 8D is a sectional view of a step subsequent to that of FIG. 8C.
Figure 8G:
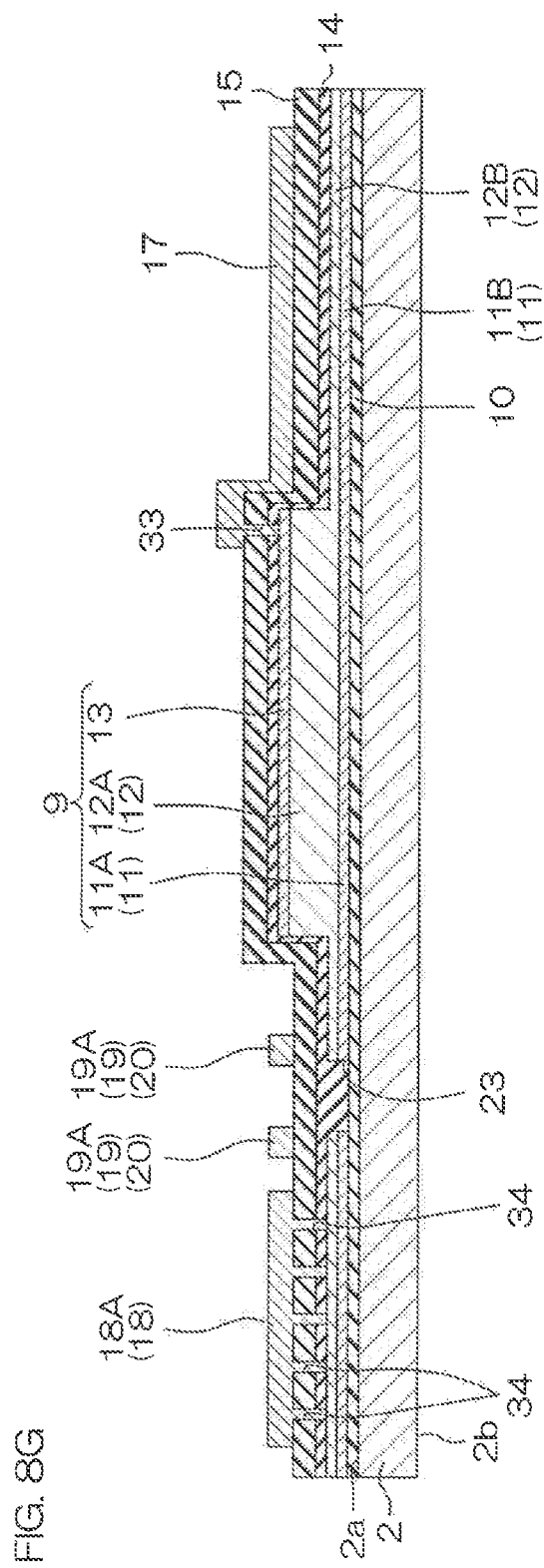
FIG. 8G is a sectional view of a step subsequent to that of FIG. 8F.
Figure 8H:
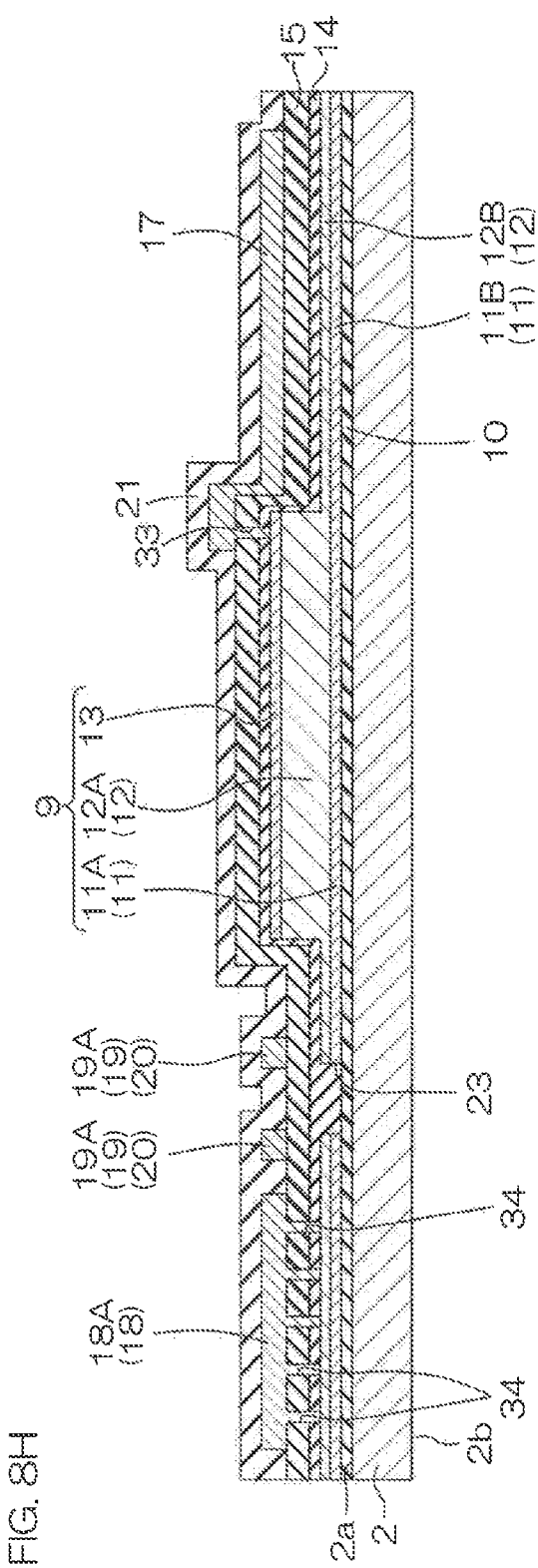
FIG. 8H is a sectional view of a step subsequent to that of FIG. 8G.
Figure 8I:
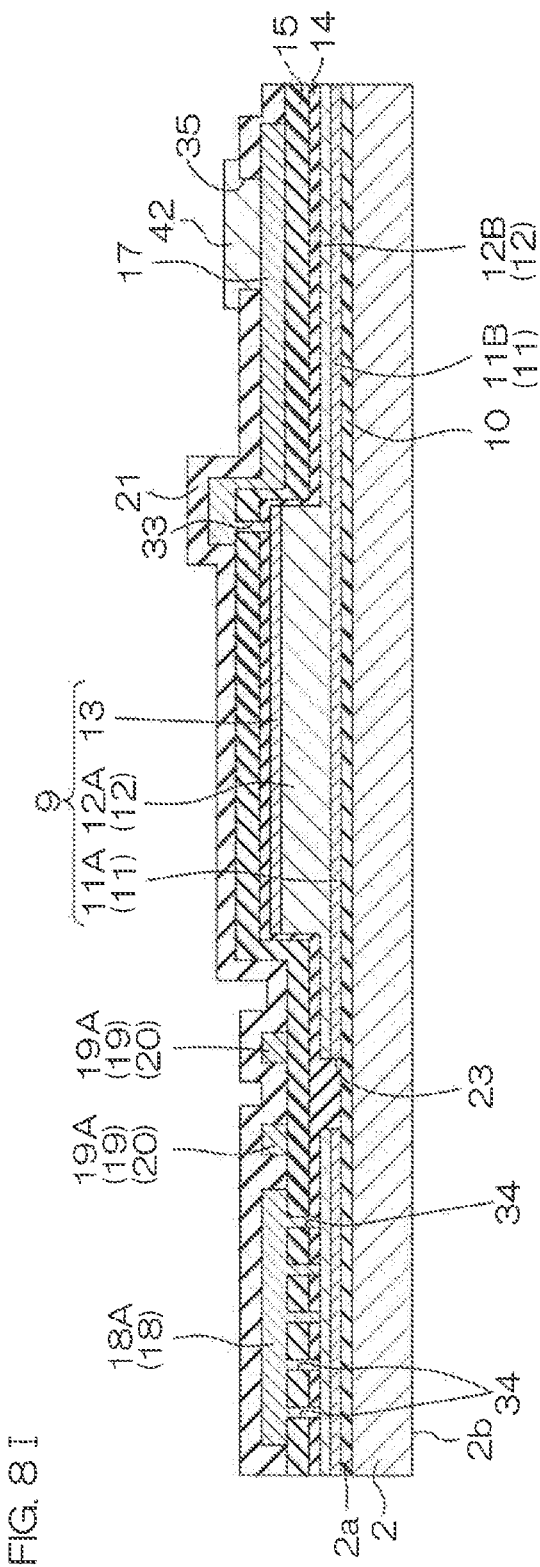
FIG. 8I is a sectional view of a step subsequent to that of FIG. 8H.
Figure 8L:
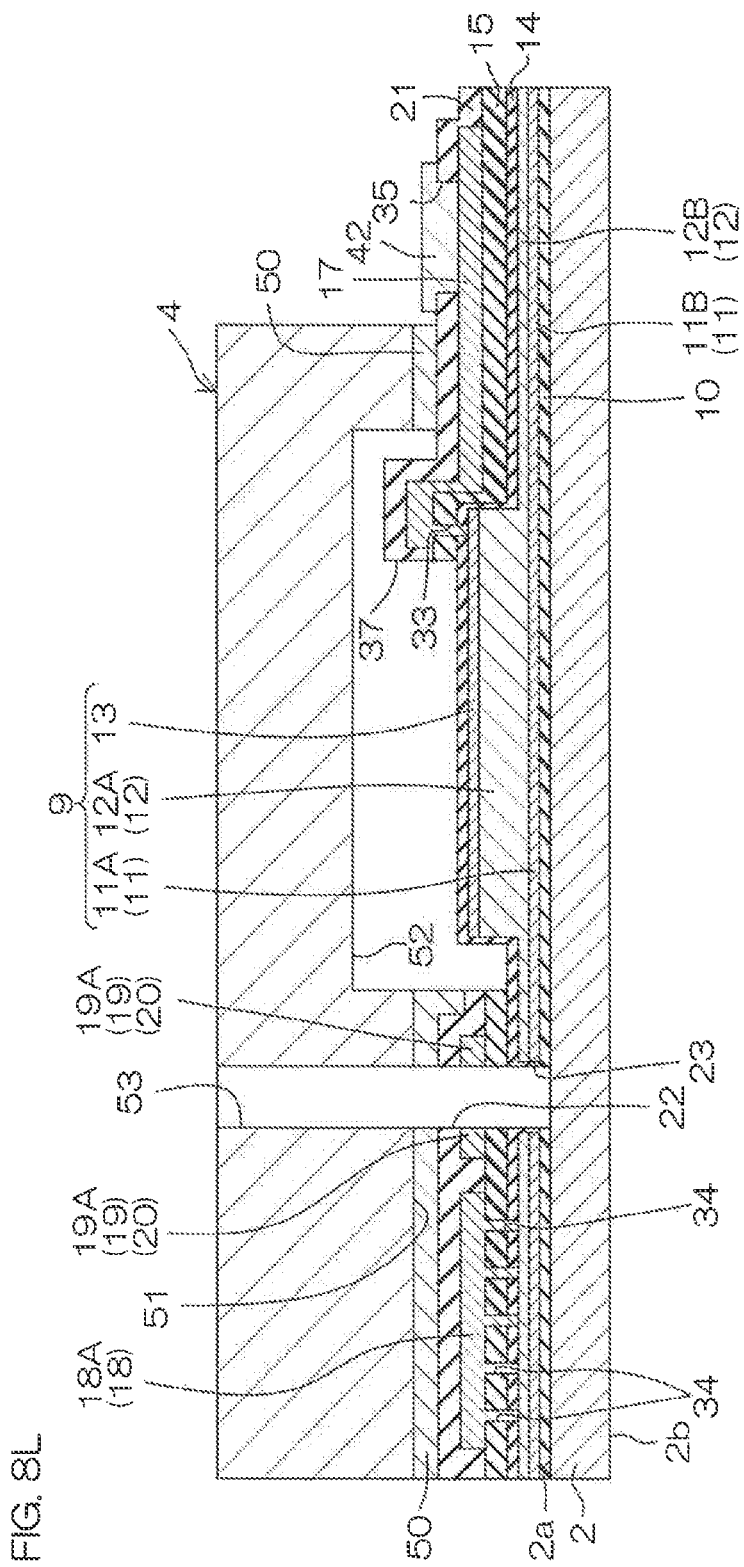
FIG. 8L is a sectional view of a step subsequent to that of FIG. 8K.
Figure 8M:
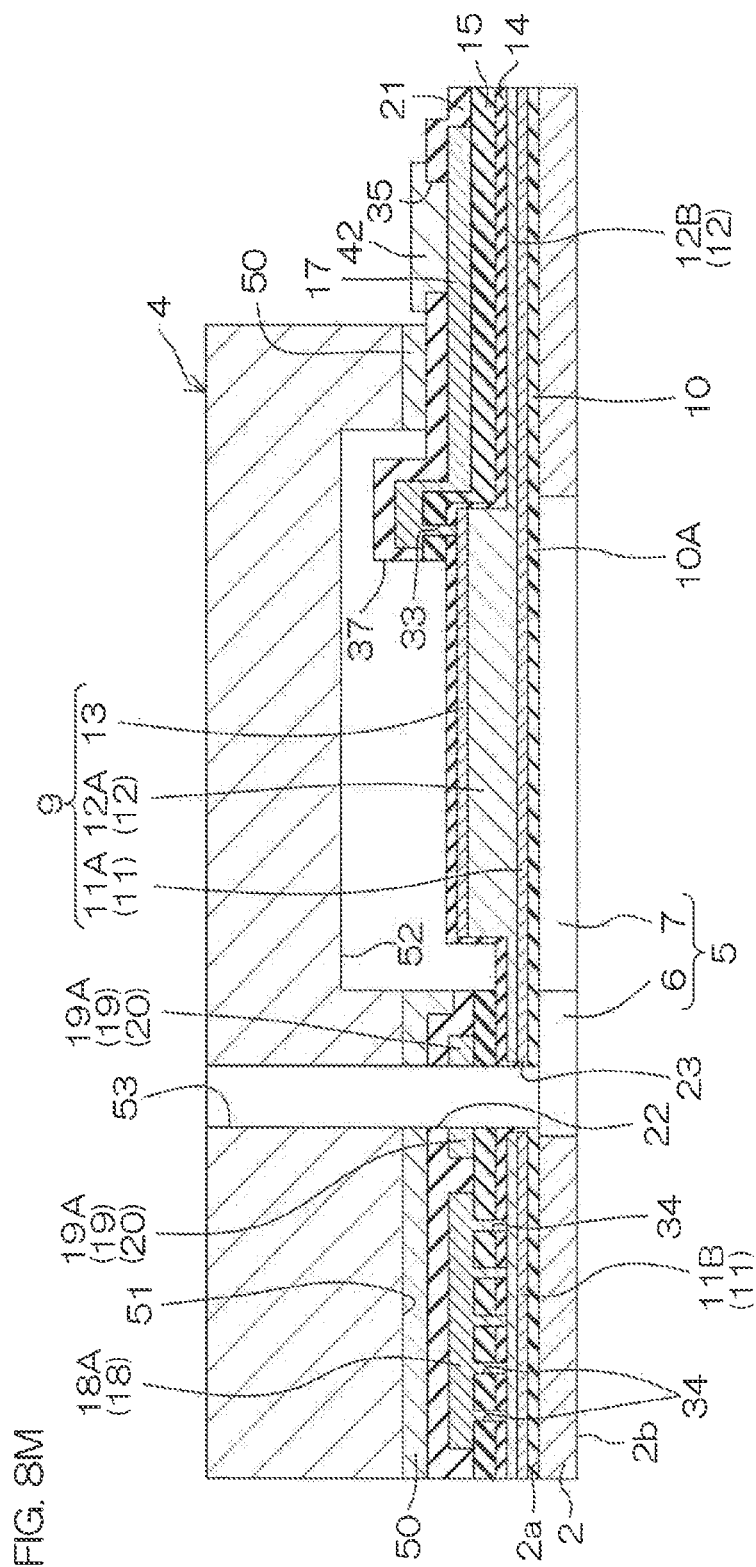
FIG. 8M is a sectional view of a step subsequent to that of FIG. 8L.
Figure 8N:
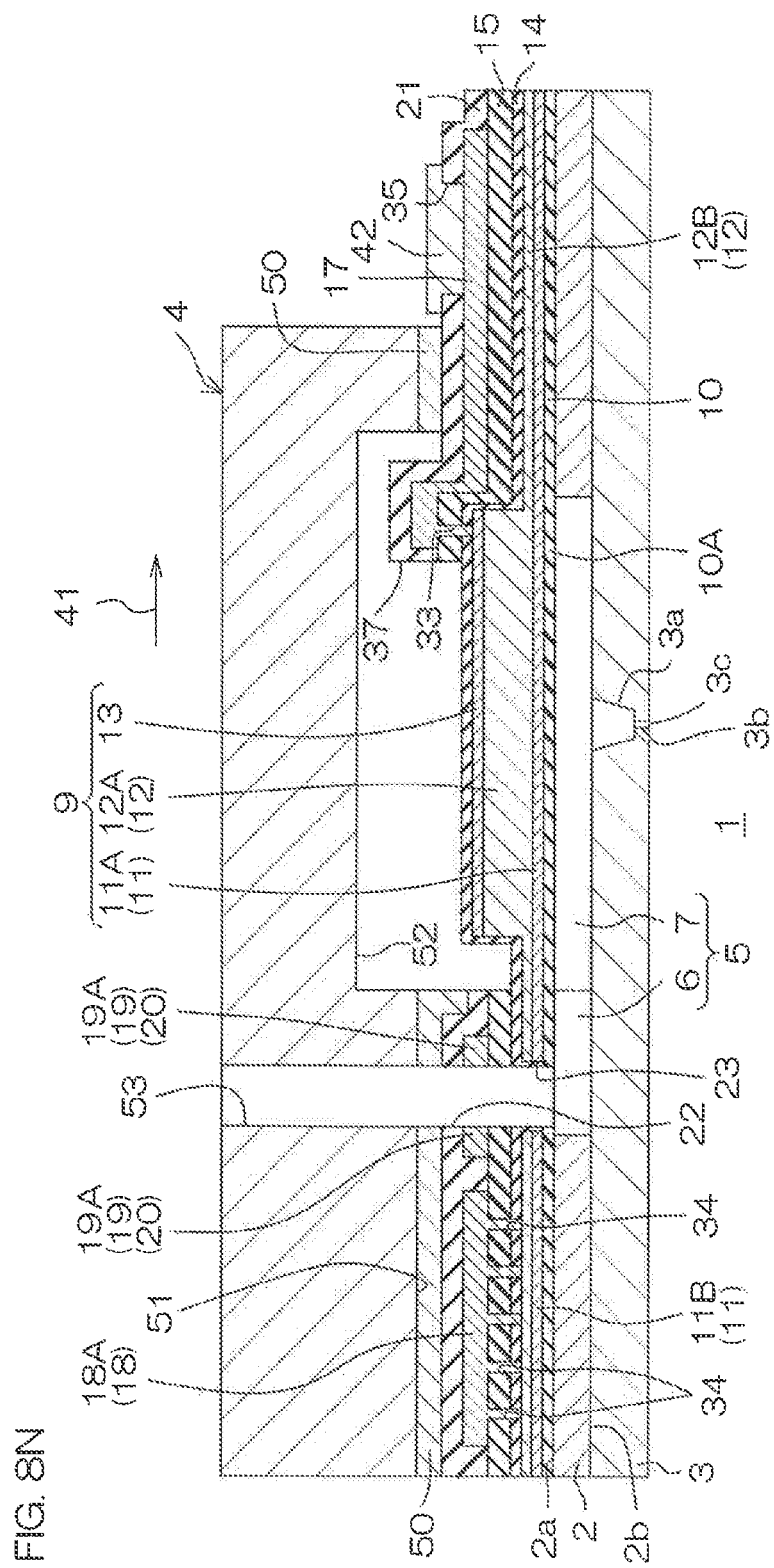
FIG. 8N is a sectional view of a step subsequent to that of FIG. 8M.

FIG. 8A to FIG. 8N are sectional views of an example of a manufacturing process of the inkjet printing head 1 and show a section corresponding to FIG. 2A.

First, as shown in FIG. 8A, the movable film formation layer 10 is formed on the front surface 2a of the actuator substrate 2. However, as the actuator substrate 2, that which is thicker than the thickness of the actuator substrate 2 at the final stage is used. Specifically, a silicon oxide film (for example, of 1.2 μm thickness) is formed on the front surface of the actuator substrate 2. If the movable film formation layer 10 is constituted of a laminated film of a silicon film, a silicon oxide film, and a silicon nitride film, the silicon film (for example, of 0.4 μm thickness) is formed on the front surface of the actuator substrate 2, the silicon oxide film (for example, of 0.4 μm thickness) is formed above the silicon film, and the silicon nitride film (for example, of 0.4 μm thickness) is formed above the silicon oxide film.

A base oxide film, for example, of $Al_2O_3$, MgO, or $ZrO_2$, etc., may be formed on the front surface of the movable film formation layer 10. Such base oxide films prevent metal atoms from escaping from the piezoelectric film 12 to be formed later. When metal atoms escape, the piezoelectric film 12 may degrade in piezoelectric characteristics. Also, when metal atoms that have escaped become mixed in the silicon layer constituting each movable film 10A, the movable film 10A may degrade in durability.

Next, a lower electrode film 71, which is a material layer of the lower electrode 11, is formed above the movable film formation layer 10 (above the base oxide film in the case where the base oxide film is formed) as shown in FIG. 8B. The lower electrode film 71 is constituted, for example, of a Pt/Ti laminated film having a Ti film (for example, of 10 nm to 40 nm thickness) as a lower layer and a Pt film (for example, of 10 nm to 400 nm thickness) as an upper layer. Such a lower electrode film 71 may be formed by the sputtering method.

Next, a material film (piezoelectric material film) 72 of the piezoelectric film 12 is formed on an entire surface above the lower electrode film 71. Specifically, for example, the piezoelectric material film 72 of 1 μm to 3 μm thickness is formed by a sol-gel method. Such a piezoelectric material film 72 is constituted of a sintered body of metal oxide crystal grains.

Next, an upper electrode film 73, which is a material of the upper electrodes 13, is formed on the entire surface of the piezoelectric material film 72. The upper electrode film 73 may, for example, be a single film of platinum (Pt). The upper electrode film 73 may, for example, be an $IrO_2$/Ir laminated film having an $IrO_2$ film (for example, of 40 nm to 160 nm thickness) as a lower layer and an Ir film (for example, of 40 nm to 160 nm thickness) as an upper layer. Such an upper electrode film 73 may be formed by the sputtering method.

Next, as shown in FIG. 8C to FIG. 8E, patterning of the upper electrode film 73, the piezoelectric material film 72, and the lower electrode film 71 is performed. First, a resist mask with a pattern of the upper electrodes 13 is formed by photolithography. Then, as shown in FIG. 8C, the upper electrode film 73 is etched using the resist mask as a mask to form the upper electrodes 13 of the predetermined pattern. Thereafter, overetching is performed by continuing the etching to thin a portion of the piezoelectric material film 72 exposed from the upper electrodes 13. A thickness of the portion of the piezoelectric material film 72 exposed from the upper electrodes 13 is thereby made, for example, approximately 1/10 the thickness of the portions covered by the upper electrodes 13.

Next, after peeling off the resist mask, a resist mask with a pattern of the piezoelectric film 12 is formed by photolithography. Then, as shown in FIG. 8D, the piezoelectric material film 72 is etched using the resist mask as a mask to form the piezoelectric film 12 of the predetermined pattern. The piezoelectric film 12, constituted of the active portions 12A with the upper surfaces in contact with the lower surfaces of the upper electrodes 13 and the inactive portion 12B having the penetrating holes 23 and being thinner in thickness than the active portions 12A, is thereby formed.

Thereafter, the same mask is used to etch the lower electrode film 71 to form the lower electrode 11 of the same pattern as the piezoelectric film 12 as shown in FIG. 8E. The lower electrode 11, constituted of the main electrode portions 11A and the extension portion 11B having the penetrating holes 23, is thereby formed. The piezoelectric elements 9, each constituted of a main electrode portion 11A of the lower electrode 11, an active portion 12A of the piezoelectric film 12, and an upper electrode 13, are thereby formed.

Next, after peeling off the resist mask, the hydrogen barrier film 14 covering the entire surface is formed as shown in FIG. 8E The hydrogen barrier film 14 may be an Al$_2$O$_3$ film formed by the sputtering method and may have a film thickness of 50 nm to 100 nm Thereafter, the insulating film 15 is formed above the entire surface of the hydrogen barrier film 14. The insulating film 15 may be an SiO$_2$ film and may have a film thickness of 200 nm to 300 nm. Next, the contact holes 33 and 34 are formed by successively etching the insulating film 15 and the hydrogen barrier film 14.

Next, as shown in FIG. 8G, a wiring film that constitutes the upper wirings 17, the lower wiring 18, and the dummy wirings 19 (19A, 19B) is formed by the sputtering method above the insulating film 15 as well as inside the contact holes 33 and 34. Thereafter, the wiring film is patterned by photolithography and etching to form the upper wirings 17, the lower wiring 18, and the dummy wirings 19 (19A, 19B) at the same time.

Next, as shown in FIG. 8H, the passivation film 21 that covers the wirings 17, 18, and 19 is formed on the front surface of the insulating film 15. The passivation film 21 is constituted, for example, of SiN. The passivation film 21 is formed, for example, by plasma CVD.

Next, a resist mask, having openings corresponding to the pad openings 35 and 36, is formed by photolithography, and the passivation film 21 is etched using the resist mask as a mask. The pad openings 35 and 36 are thereby formed in the passivation film 21 as shown in FIG. 8I. After the resist mask is peeled off, the pads 42 and 43, respectively connected to the upper wirings 17 and the lower wiring 18 via the pad openings 35 and the pad opening 36, are formed above the passivation film 21.

A resist mask having openings corresponding to the openings 37 and the ink supply penetrating holes 22 is then formed by photolithography, and using the resist mask as a mask, the passivation film 21 and the insulating film 15 are etched successively. The openings 37 and the ink supply penetrating holes 22 are thereby formed in the passivation film 21 and the insulating film 15 as shown in FIG. 8J.

Next, the resist mask is peeled off. A resist mask having openings corresponding to the ink supply penetrating holes 22 is then formed by photolithography, and the hydrogen barrier film 14 and the movable film formation layer 10 are etched using the resist mask as a mask. The ink supply penetrating holes 22 are thereby formed in the hydrogen barrier film 14 and the movable film formation layer 10 as shown in FIG. 8K.

Next, as shown in FIG. 8L, an adhesive 50 is coated onto the facing surface 51 of the protective substrate 4 and the protective substrate 4 is fixed onto the actuator substrate 2 so that the ink supply passages 53 and the ink supply penetrating holes 22 are matched. In this process, the facing surface 51 of the protective substrate 4 is pressed via the passivation film 21 against the first dummy wirings 19A and the second dummy wirings 19B that are bases with flat upper surfaces. The facing surface 51 of the protective substrate 4 is thus bonded firmly via the passivation film 21 and the adhesive 50 to the upper surfaces of the first dummy wirings 19A and the second dummy wirings 19B.

Next, as shown in FIG. 8M, rear surface grinding for thinning the actuator substrate 2 is performed. The actuator substrate 2 is made thin by the actuator substrate 2 being ground from the rear surface 2b. For example, the actuator substrate 2 with a thickness of approximately 670 µm in the initial state may be thinned to a thickness of approximately 300 µm. Next, etching (dry etching or wet etching) from the rear surface of the actuator substrate 2 is performed on the actuator substrate 2 to form the ink flow passages 5 (the ink inflow portions 6 and the pressure chambers 7).

In the etching process, the base oxide film formed on the front surface of the movable film formation layer 10 prevents the escaping of metal elements (Pb, Zr, and Ti in the case of PZT) from the piezoelectric film 12 and keeps the piezoelectric characteristics of the piezoelectric film 12 in a satisfactory state. Also as mentioned above, the base oxide film formed on the front surface of the movable film formation layer 10 contributes to maintaining the durability of the silicon layer that forms each movable film 10A.

Thereafter, as shown in FIG. 8N, the nozzle substrate 3 is adhered onto the rear surface of the actuator substrate 2 and the inkjet printing head 1 is thereby obtained.

Although a preferred embodiment of the present invention has been described above, the present invention may be implemented in yet other preferred embodiments. Although in the preferred embodiment described above, the insulating film 15 is formed on a portion of the front surface of the hydrogen barrier film 14, the insulating film 15 may instead be formed on the entirety of the front surface of the hydrogen barrier film 14.

Also, although in the preferred embodiment described above, the insulating film 15 is formed on a portion of the front surface of the hydrogen barrier film 14, the insulating film 15 may be omitted.

Also, although with the preferred embodiment described above, PZT was cited as an example of the material of the piezoelectric film, a piezoelectric material besides this that is constituted of a metal oxide as represented by lead titanate (PbPO$_3$), potassium niobate (KNbO$_3$), lithium niobate (LiNbO$_3$), lithium tantalate (LiTaO$_3$), etc., may be applied instead.

Also, although with the preferred embodiment described above, a case where the present invention is applied to an inkjet printing head was described, the present invention may also be applied to a piezoelectric microphone, pressure sensor, etc., that uses a piezoelectric element.

[2] Second Invention

Japanese Patent Application Publication No. 2013-119182 discloses an inkjet printing head that uses a piezoelectric element. The inkjet printing head of Japanese Patent Application Publication No. 2013-119182 includes an actuator substrate having a pressure chamber (cavity), a movable film supported by the actuator substrate so as to face the pressure chamber, and a piezoelectric element bonded to the movable film. The piezoelectric element is arranged by laminating a lower electrode, a piezoelectric film, and an upper electrode in that order from the movable film side.

With the arrangement described in Japanese Patent Application Publication No. 2013-119182, the lower electrode is formed to have a uniform thickness. Although to make the displacement of the movable film large, it is preferable for the lower electrode to be thinner in thickness, if the lower electrode is made thin in thickness, the lower electrode increases in resistance value.

An object of a second invention is to provide a device using a piezoelectric element and a method for manufacturing the same with which a lower electrode can be made low in resistance value and a movable film can be made large in displacement at the same time.

The second invention has the following features.

A1. A device using a piezoelectric element including a cavity, a movable film formation layer including a movable film disposed above the cavity and defining a top surface portion of the cavity, and a piezoelectric element formed to contact a front surface of the movable film at an opposite side from the cavity and having a peripheral edge receded further toward an interior of the cavity than the movable film in plan view, and where the piezoelectric element includes a lower electrode formed on a front surface of the movable film formation layer at the opposite side from the cavity, an upper electrode disposed at an opposite side from the movable film formation layer with respect to the lower electrode, and a piezoelectric film provided between the upper electrode and the lower electrode, the lower electrode includes a main electrode portion constituting the piezoelectric element and an extension portion led out from the main electrode portion in a direction along the front surface of the movable film formation layer and extending across a top surface portion peripheral edge of the cavity to outside the cavity in a plan view of viewing from a direction normal to a major surface of the movable film and in the plan view, the main electrode portion is included in an inner electrode region of the lower electrode located further inward than the top surface portion peripheral edge of the cavity, the extension portion includes an outer electrode region of the lower electrode connected to the inner electrode region and located further outward than the top surface portion peripheral edge of the cavity, and the lower electrode has, in the outer electrode region, a thick portion that is formed thicker than the inner electrode region.

The portion (inner electrode region) of the lower electrode that is located further inward than the top surface portion peripheral edge of the cavity is formed above the movable film. The inner electrode region of the lower electrode may thus obstruct deformation of the movable film. On the other hand, the portion (outer electrode region) of the lower electrode that is located further outward than the top surface portion peripheral edge of the cavity has hardly any influence on the deformation of the movable film.

With the present arrangement, the lower electrode has the thick portion in the outer electrode region. Electrical resistance of the lower electrode as a whole can thus be made low in comparison to a case where the thickness of the entirety of the lower electrode is the same thickness as the thickness of the inner electrode region. Even if the thick portion is thus provided at the lower electrode, the thick portion is formed in the outer electrode region and does not have an adverse effect on the deformation of the movable film. That is, by the present arrangement, the lower electrode can be made low in resistance value and the movable film can be made large in displacement at the same time.

A2. The device using the piezoelectric element according to "A1.," where the thick portion has a two-layer structure, in which a first layer portion, formed just in the thick portion, and a second layer portion, formed integral to a portion of the lower electrode other than the thick portion, are laminated, and a specific electrical resistance of the first layer portion is lower than that of the second layer portion.

With the present arrangement, the specific electrical resistance of the first layer portion is lower than the specific electrical resistance of the second layer portion and therefore the lower electrode as a whole can be made lower in electrical resistance.

A3. The device using the piezoelectric element according to "A2.," where a thickness of the portion of the lower electrode other than the thick portion is equal to a thickness of the second portion.

A4. The device using the piezoelectric element according to "A3.," where a thickness of the first layer portion is thicker than the thickness of the second layer portion.

A5. The device using the piezoelectric element according to "A4.," where the thickness of the first layer portion is not less than two times and not more than five times the thickness of the second layer portion.

A6. The device using the piezoelectric element according to "A5.," where the first layer portion is constituted of one film selected arbitrarily from among an Al film, a W film, and an Au film, and the second layer portion is constituted of one film or a plurality of films selected arbitrarily from among a Pt film, a Ti/TiO$_2$ film, and an Ir film.

A7. The device using the piezoelectric element according to any one of "A1." to "A6.," further including an upper wiring, which, in the plan view, has one end portion connected to an upper surface of the upper electrode and another end portion led out to an outer side of a peripheral edge of the pressure chamber.

A8. The device using the piezoelectric element according to "A7.," further including a hydrogen barrier film, covering at least entireties of side surfaces of the upper electrode and the piezoelectric film and covering an upper surface of the lower electrode, and an insulating film, formed above the hydrogen barrier film and disposed between the hydrogen barrier film and the upper wiring, and where a contact hole, exposing a portion of the upper electrode, is formed in the hydrogen barrier film and the insulating film and the one end portion of the upper wiring is connected to the upper electrode via the contact hole. With the present arrangement, degradation of characteristics of the piezoelectric film due to hydrogen reduction can be prevented.

A9. The device using the piezoelectric element according to "A8.," further including a passivation film formed above the insulating film and covering the wiring. With the present arrangement, the wiring can be protected by the passivation film.

A10. The device using the piezoelectric element according to any one of "A1." to "A9.," where the top surface portion of the cavity is, in the plan view, a rectangle that is long in one direction, the main electrode portion is, in the plan view, a rectangle that is long in the one direction and has a width shorter than a width in a short direction of the top surface portion of the cavity and a length shorter than a length in a long direction of the top surface portion of the cavity, with both end edges and both side edges thereof being respectively receded further toward the interior of the cavity than both end edges and both side edges of the top surface portion of the cavity, and the extension portion extends from a peripheral edge of the main electrode portion, across the peripheral edge of the top surface portion of the cavity, and to outside the top surface portion peripheral edge.

A11. The device using the piezoelectric element according to "A10.," where a plurality of the cavities are provided and the plurality of the cavities are disposed to be aligned in a short direction of each cavity.

A12. The device using the piezoelectric element according to "A11.," where the thick portion includes a first thick portion, which, in the plan view, is disposed between two of the cavities that are mutually adjacent and extends in a length direction of each cavity.

A13. The device using the piezoelectric element according to "A11.," where the thick portion includes a second thick portion, which, in the plan view, extends, in a direction along the direction of alignment of the plurality of cavities, at an outside of one end in a long direction of the plurality of cavities.

A14. The device using the piezoelectric element according to "A11.," where the thick portion includes a first thick portion, which, in the plan view, is disposed between two of the cavities that are mutually adjacent and extends in a length direction of each cavity, and a second thick portion, which, in the plan view, extends, in a direction along the direction of alignment of the plurality of cavities, at an outside of one end in a long direction of the plurality of cavities.

A15. A method for manufacturing a device using a piezoelectric element including a step of forming a movable film formation layer, including a movable film formation region, above a substrate in which a cavity is to be formed, a step of forming a first lower electrode film above the movable film formation layer, a step of patterning the first lower electrode film to form a first lower electrode in a region of the movable film formation layer other than the movable film formation region, a step of forming, above the movable film formation layer, a second lower electrode film covering the first lower electrode, a step of forming a piezoelectric material film and an upper electrode film successively above the second lower electrode film, a step of patterning the upper electrode film, the piezoelectric material film, and the second lower electrode film successively to form an upper electrode, a piezoelectric film, and a second lower electrode to form a lower electrode constituted of the first lower electrode and the second lower electrode and form a piezoelectric element that includes the second lower electrode, the upper electrode, and the piezoelectric film sandwiched thereby.

With the present method for manufacturing the device using the piezoelectric element, the device using the piezoelectric element with which the lower electrode can be made low in resistance value and the movable film can be made large in displacement at the same time is obtained.

A16. The method for manufacturing the device using the piezoelectric element according to "A15.," further including a step, after the step of forming the piezoelectric element, of successively forming, above the movable film formation layer, a hydrogen barrier film and an insulating film that cover the piezoelectric element and the lower electrode, a step of forming, above the upper electrode, a contact hole, exposing a portion of the upper electrode, in the hydrogen barrier film and the insulating film, a step of forming, above the insulating film, a wiring having one end portion in contact with the upper electrode via the contact hole and another end portion being led out to an outer side of the piezoelectric element, and a step of etching the substrate from below to form a cavity facing the movable film formation region.

A preferred embodiment of the second invention shall now be described in detail with reference to FIG. 9A to FIG. 17O. The symbols in FIG. 9A to FIG. 17O are unrelated to the symbols in FIG. 1A to FIG. 8N used in the above description of the first invention.

Figure 9A:
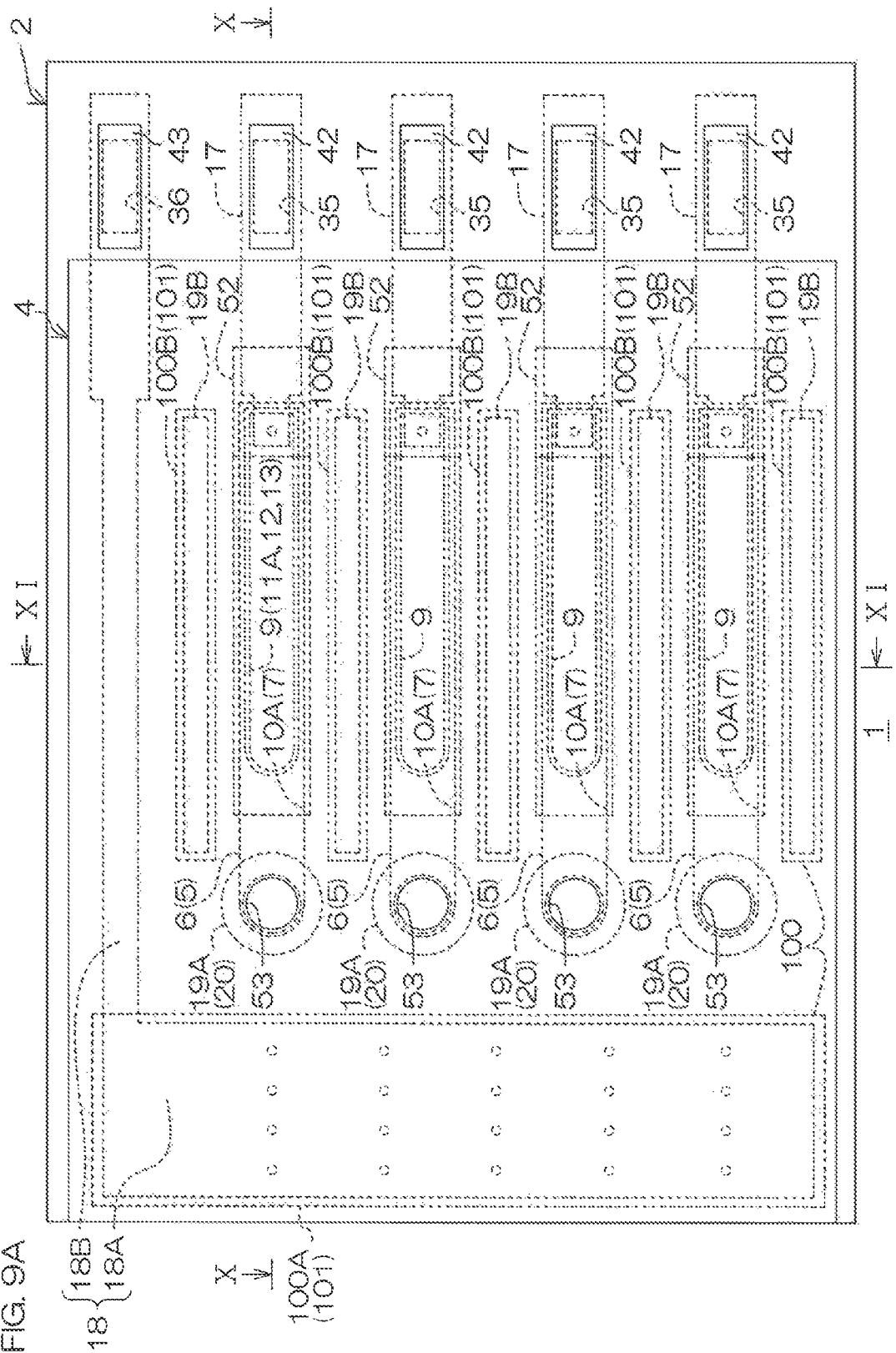
FIG. 9A is an illustrative plan view for describing the arrangement of a main portion of an inkjet printing head according to a preferred embodiment of a second invention.
Figure 9B:
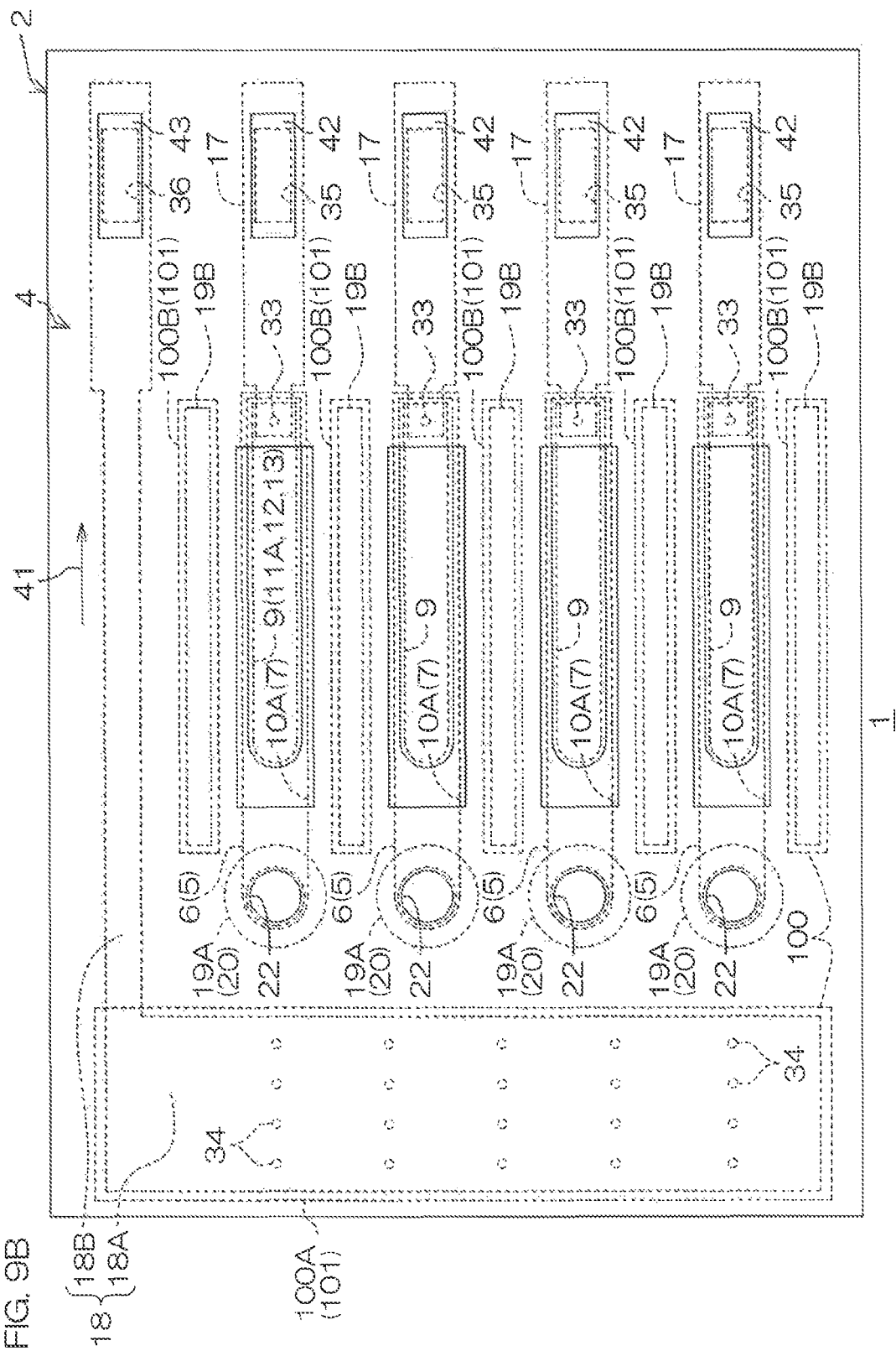
FIG. 9B is an illustrative plan view of the main portion of the inkjet printing head of FIG. 9A and is a plan view with a protective substrate omitted.
Figure 11:
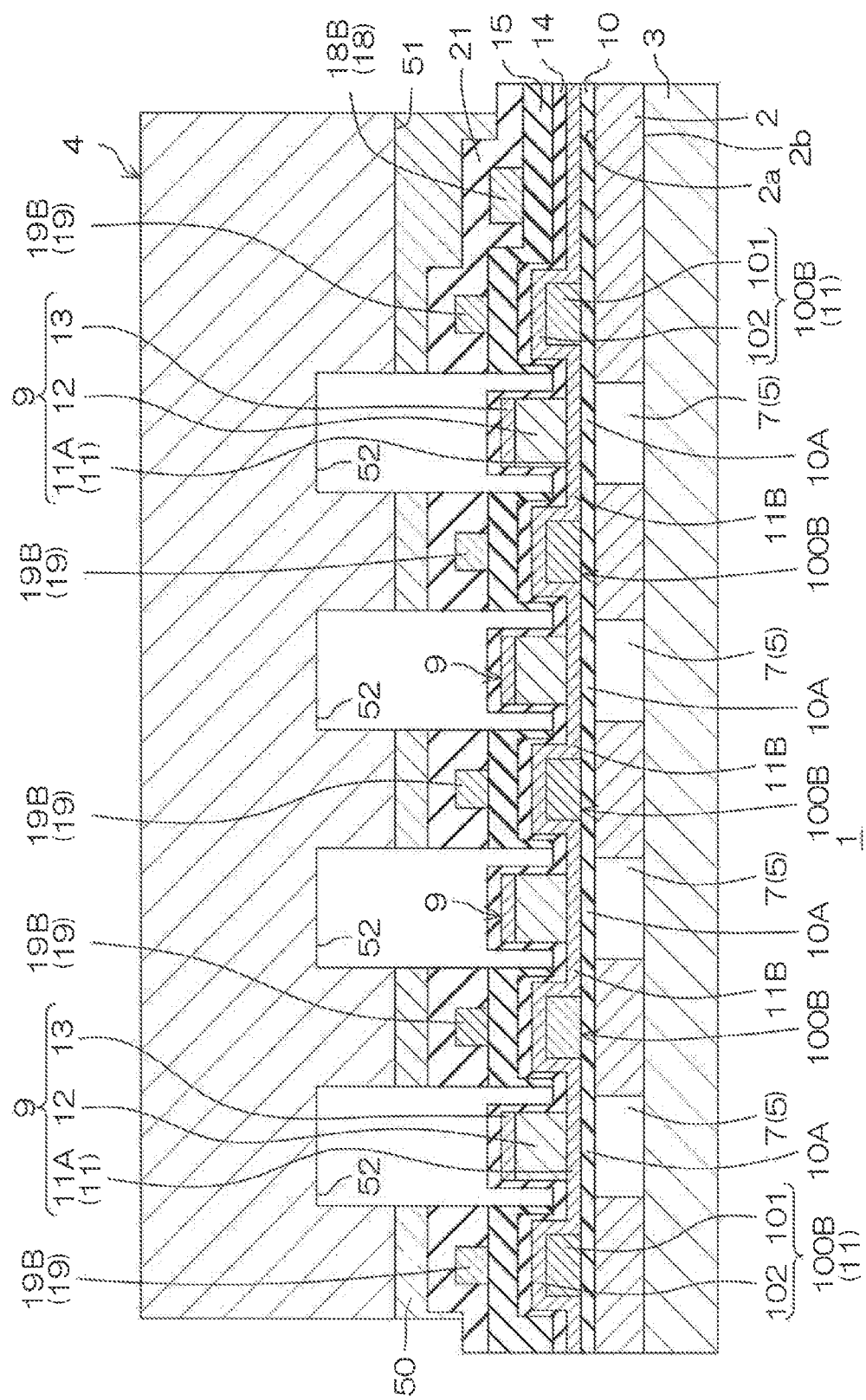
FIG. 11 is an illustrative enlarged sectional view of a portion of a section taken along line XI-XI in FIG. 9A.
Figure 12:
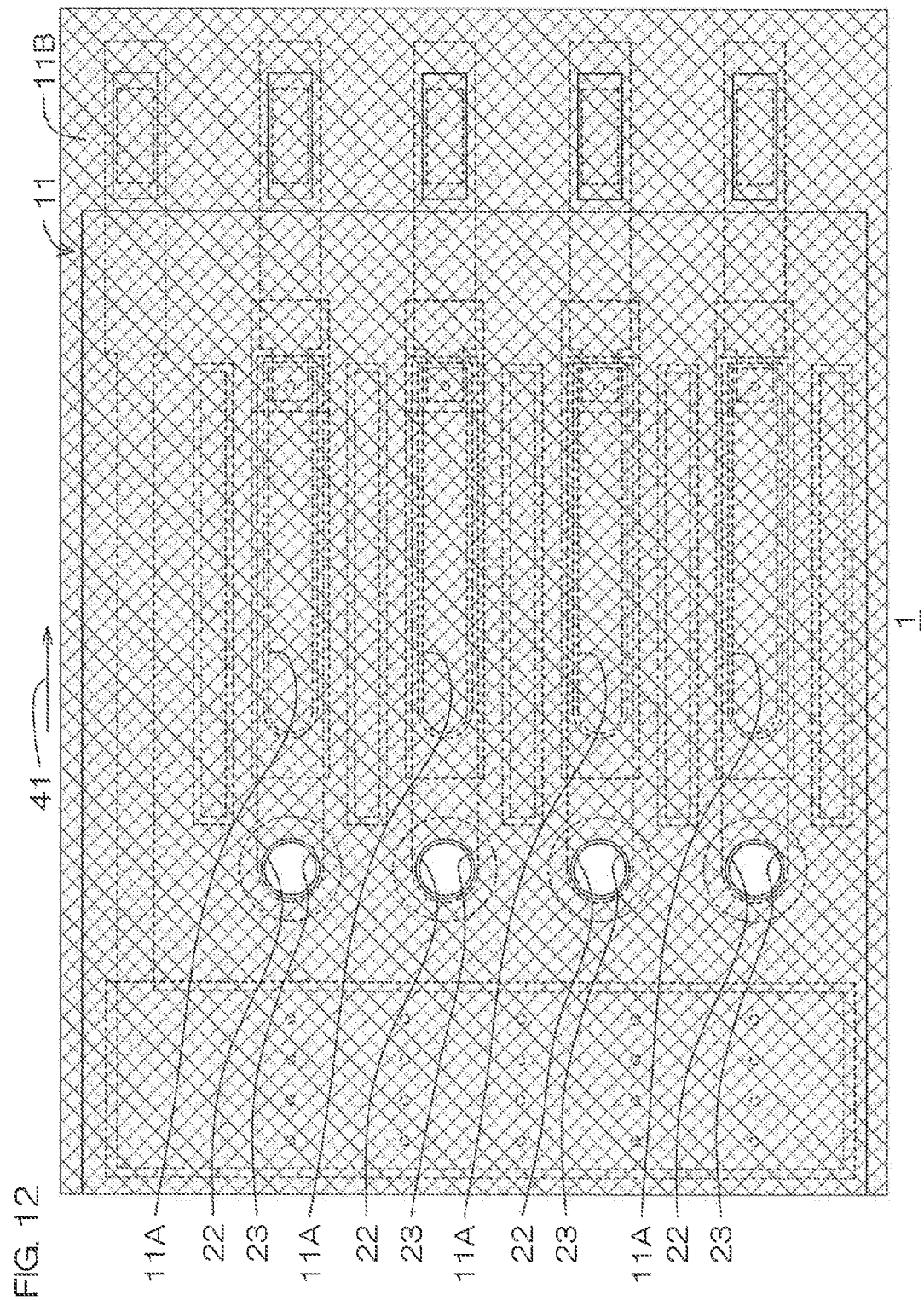
FIG. 12 is an illustrative plan view of a pattern example of a lower electrode of the inkjet printing head of FIG. 9A.
Figure 13:
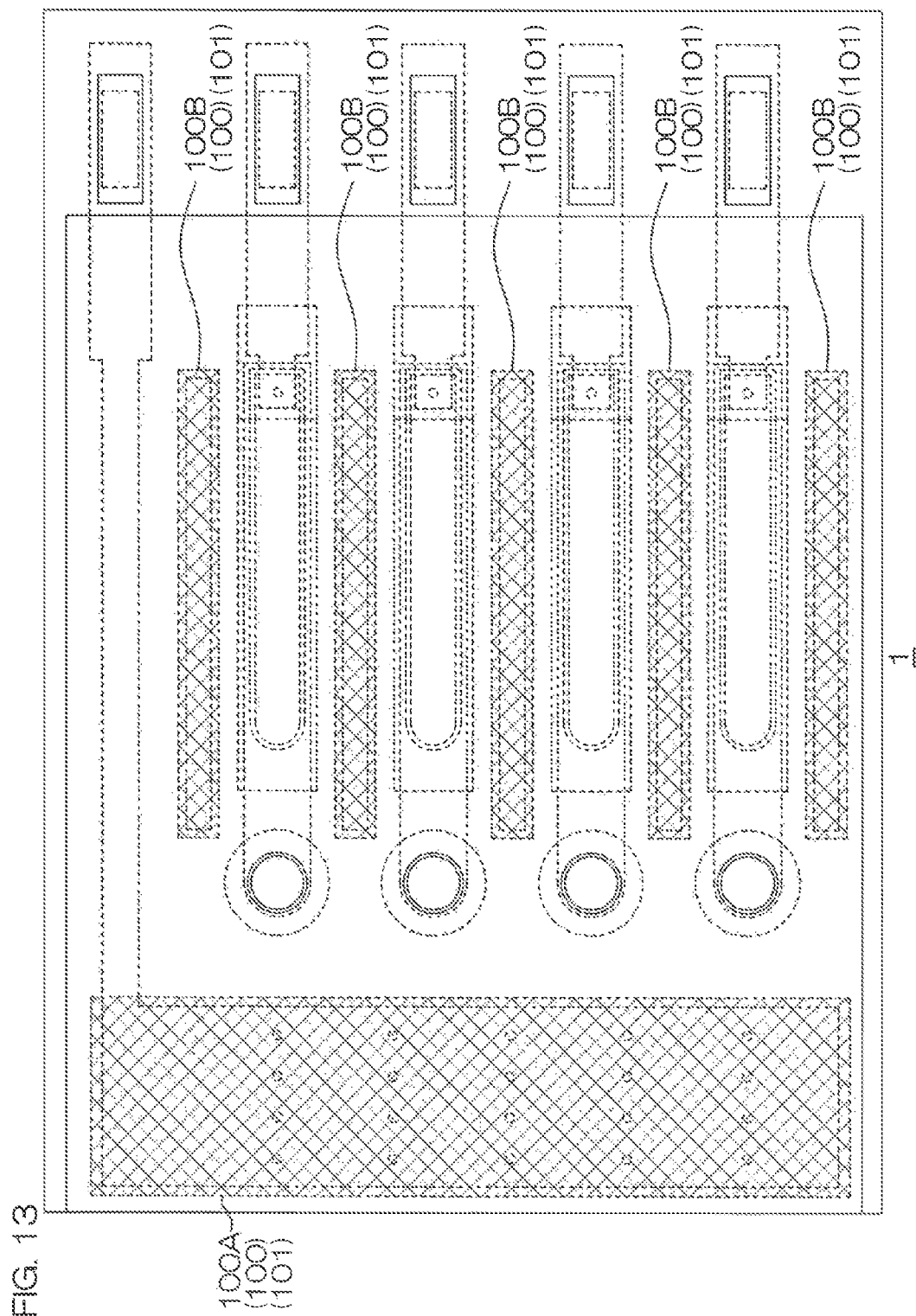
FIG. 13 is an illustrative plan view of a pattern example of thick portions (first lower electrodes) of the lower electrode of the inkjet printing head of FIG. 9A.

FIG. 9A is an illustrative plan view for describing the arrangement of a main portion of an inkjet printing head according to the preferred embodiment of the second invention. FIG. 9B is an illustrative plan view of the main portion of the inkjet printing head of FIG. 9A and is a plan view with a protective substrate omitted. FIG. 10 is an illustrative sectional view taken along line X-X in FIG. 9A. FIG. 11 is an illustrative enlarged sectional view of a portion of a section taken along line XI-XI in FIG. 9A. FIG. 12 is an illustrative plan view of a pattern example of a lower electrode of the inkjet printing head of FIG. 9A. FIG. 13 is an illustrative plan view of a pattern example of a thick portions (first lower electrodes) of the lower electrode of the inkjet printing head of FIG. 9A.

The arrangement of an inkjet printing head 1 shall now be described in outline with reference to FIG. 10.

The inkjet printing head 1 includes an actuator substrate 2, a nozzle substrate 3, and a protective substrate 4. A movable film formation layer 10 is laminated on a front surface of the actuator substrate 2. In the actuator substrate 2, ink flow passages (ink reservoirs) 5 are formed. In the present preferred embodiment, the ink flow passages 5 are formed to penetrate through the actuator substrate 2. Each ink flow passage 5 is formed to be elongate along an ink flow direction 41, which is indicated by an arrow FIG. 10. Each ink flow passage 5 is constituted of an ink inflow portion 6 at an upstream side end portion (left end portion in FIG. 10) in the ink flow direction 41 and a pressure chamber 7 (cavity) in communication with the ink inflow portion 6. In FIG. 10, a boundary between the ink inflow portion 6 and the pressure chamber 7 is indicated by an alternate long and two short dashes line.

The nozzle substrate 3 is constituted, for example, of a silicon substrate. The nozzle substrate 3 is adhered to a rear surface 2b of the actuator substrate 2. The nozzle substrate 3, together with the actuator substrate 2 and the movable film formation layer 10, defines the ink flow passages 5. More specifically, the nozzle substrate 3 defines bottom surface portions of the ink flow passages 5. The nozzle substrate 3 has recess portions 3a each facing a pressure chamber 7 and an ink discharge passage 3b is formed in a bottom surface of each recess portion 3a. Each ink discharge passage 3b penetrates through the nozzle substrate 3 and has a discharge port 3c at an opposite side from the pressure chamber 7. Therefore, when a volume change occurs in a pressure chamber 7, the ink retained in the pressure chamber 7 passes through the ink discharge passage 3b and is discharged from the discharge port 3c.

Each portion of the movable film formation layer 10 that is a top roof portion of a pressure chamber 7 constitutes a movable film 10A. The movable film 10A (movable film formation layer 10) is constituted, for example, of a silicon oxide ($SiO_2$) film formed above the actuator substrate 2. The movable film 10A (movable film formation layer 10) may be constituted of a laminated film, for example, of a silicon (Si) film formed above the actuator substrate 2, a silicon oxide ($SiO_2$) film formed above the silicon film, and a silicon nitride (SiN) film formed above the silicon oxide film. In the present specification, the movable film 10A refers to a top roof portion of the movable film formation layer 10 that defines the top surface portion of the pressure chamber 7. Therefore, portions of the movable film formation layer 10 besides the top roof portions of the pressure chambers 7 do not constitute the movable film 10A.

Each movable film 10A has a thickness of, for example, 0.4 μm to 2 μm. If the movable film 10A is constituted of a silicon oxide film, the thickness of the silicon oxide film may be approximately 1.2 μm. If the movable film 10A is constituted of a laminated film of a silicon film, a silicon oxide film, and a silicon nitride film, the thickness of each of the silicon film, the silicon oxide film, and the silicon nitride film may be approximately 0.4 μm.

Each pressure chamber 7 is defined by a movable film 10A, the actuator substrate 2, and the nozzle substrate 3 and is formed to a substantially rectangular parallelepiped shape in the present preferred embodiment. The pressure chamber 7 may, for example, have a length of approximately 800 μm and a width of approximately 55 μm. Each ink inflow portion 6 is in communication with one end portion in a long direction of a pressure chamber 7.

A piezoelectric element 9 is disposed on a front surface of each movable film 10A. Each piezoelectric element 9 includes a lower electrode 11 formed above the movable film formation layer 10, a piezoelectric film 12 formed above the lower electrode 11, and an upper electrode 13 formed above the piezoelectric film 12. In other words, the piezoelectric element 9 is arranged by sandwiching the piezoelectric film 12 from above and below by the upper electrode 13 and the lower electrode 11.

The upper electrode 13 may be a single film of platinum (Pt) or may have a laminated structure, for example, in which a conductive oxide film (for example, an $IrO_2$ (iridium oxide) film) and a metal film (for example, an Ir (iridium) film) are laminated. The upper electrode 13 may have a thickness, for example, of approximately 0.2 μm.

As each piezoelectric film 12, for example, a PZT ($PbZr_xTi_{1-x}O_3$: lead zirconate titanate) film formed by a sol-gel method or a sputtering method may be applied. Such a piezoelectric film 12 is constituted of a sintered body of a metal oxide crystal. The piezoelectric films 12 are formed to be of the same shape as the upper electrodes 13 in plan view. The piezoelectric film 12 has a thickness of approximately 1 μm. The overall thickness of each movable film 10A is preferably approximately the same as the thickness of the piezoelectric film 12 or approximately 2/3 the thickness of the piezoelectric film 12.

The lower electrode 11 has main electrode portions 11A, in contact with lower surfaces of the piezoelectric films 12, and an extension portion 11B extending to a region outside the piezoelectric films 12. A main portion of the lower electrode 11 may have a thickness, for example, of approximately 0.2 μm.

A hydrogen barrier film 14 is formed above the extension portion 11B of the lower electrode 11 and above the piezoelectric element 9. The hydrogen barrier film 14 is constituted, for example, of $Al_2O_3$ (alumina). The hydrogen barrier film 14 has a thickness of approximately 50 nm to 100 nm. The hydrogen barrier film 14 is provided to prevent degradation of characteristics of the piezoelectric film 12 due to hydrogen reduction. An insulating film 15 is laminated on the hydrogen barrier film 14. The insulating film 15 is constituted, for example, of $SiO_2$ or low-hydrogen SiN, etc. The insulating film 15 has a thickness of approximately 500 nm. Upper wirings 17, a lower wiring 18, and dummy wirings 19 are formed above the insulating film 15. These wirings 17, 18, and 19 may be constituted of a metal material that includes Al (aluminum). These wirings 17, 18, and 19 have a thickness, for example, of approximately 1000 nm (1 μm).

One end portion of each upper wiring 17 is disposed above one end portion (downstream side end portion in the ink flow direction 41) of an upper electrode 13. A contact hole 33, penetrating continuously through the hydrogen barrier film 14 and the insulating film 15, is formed between the upper wiring 17 and the upper electrode 13. The one end portion of the upper wiring 17 enters into the contact hole 33 and is connected to the upper electrode 13 inside the contact hole 33. From above the upper electrode 13, the upper wiring 17 crosses an outer edge of the pressure chamber 7 and extends outside the pressure chamber 7.

The lower wiring 18 is disposed above the extension portion 11B of the lower electrode 11 at an opposite side from the pressure chamber 7 with respect to the ink inflow portion 6 of the ink flow passage 5. A plurality of contact holes 34, penetrating continuously through the hydrogen barrier film 14 and the insulating film 15, are formed between the lower wiring 18 and the extension portion 11B of the lower electrode 11. The lower wiring 18 enters into the contact holes 34 and is connected to the extension portion 11B of the lower electrode 11 inside the contact holes 34.

The dummy wirings 19 are not electrically connected to either of the upper wirings 17 and the lower wiring 18 and are electrically insulated wirings. The dummy wirings 19 are formed in the same process as a process in which the upper wirings 17 and the lower wiring 18 are formed.

A passivation film 21, covering the wirings 17, 18, and 19 and the insulating film 15 is formed above the insulating film 15. The passivation film 21 is constituted, for example, of SiN (silicon nitride). The passivation film 21 may have a thickness, for example, of approximately 800 nm.

Pad openings 35 that expose portions of the upper wirings 17 are formed in the passivation film 21. The pad openings 35 are formed in a region outside the pressure chambers 7 and are formed, for example, at tip portions (end portions at opposite sides from the portions of contact with the upper electrodes 13) of the upper wirings 17. Pads 42 that cover the pad openings 35 are formed above the passivation film 21. The pads 42 enter into the pad openings 35 and are connected to the upper wirings 17 inside the pad openings 35.

Ink supply penetrating holes 22, penetrating through the passivation film 21, the insulating film 15, the hydrogen barrier film 14, the lower electrode 11, and the movable film formation layer 10 are formed at positions corresponding to end portions of the ink flow passages 5 at the ink inflow portion 6 sides. Penetrating hole 23, including an ink supply penetrating hole 22 and being larger than the ink supply penetrating hole 22, are formed in the lower electrode 11. The hydrogen barrier film 14 enters into gaps between the penetrating hole 23, in the lower electrode 11, and the ink supply penetrating holes 22. The ink supply penetrating holes 22 are in communication with the ink inflow portions 6.

The protective substrate 4 is constituted, for example, of a silicon substrate. The protective substrate 4 is disposed above the actuator substrate 2 so as to cover the piezoelectric elements 9. The protective substrate 4 is bonded to the passivation film 21 via an adhesive 50. The protective substrate 4 has housing recesses 52 in a facing surface 51 that faces a front surface 2a of the actuator substrate 2. The piezoelectric elements 9 are housed inside the housing recesses 52. Further, the protective substrate 4 has formed therein ink supply passages 53 that are in communication with the ink supply penetrating holes 22. The ink supply passages 53 penetrate through the protective substrate 4. An ink tank (not shown) storing ink is disposed above the protective substrate 4.

Each piezoelectric element 9 is formed at a position facing a pressure chamber 7 across a movable film 10A. That is, the piezoelectric element 9 is formed to contact a front surface of the movable film 10A at the opposite side from the pressure chamber 7. Each pressure chamber 7 is filled with ink by the ink being supplied from the ink tank to the pressure chamber 7 through an ink supply passage 53, an ink supply penetrating hole 22, and an ink inflow portion 6. The movable film 10A defines a top surface portion of the pressure chamber 7 and faces the pressure chamber 7. The movable film 10A is supported by portions of the actuator substrate 2 at a periphery of the pressure chamber 7 and has flexibility enabling deformation in a direction facing the pressure chamber 7 (in other words, in the thickness direction of the movable film 10A).

The upper wirings 17 and the lower wiring 18 are connected to a drive circuit (not shown). Specifically, the pads 42 of the upper wirings 17 and the drive circuit are connected via a connecting metal member (not shown). As shall be described later, a pad 43 (see FIG. 9A) is connected to the lower wiring 18. The pad 43 of the lower wiring 18 and the drive circuit are connected via a connecting metal member (not shown). When a drive voltage is applied from the drive circuit to a piezoelectric element 9, the piezoelectric film 12 deforms due to an inverse piezoelectric effect. The movable film 10A is thereby made to deform together with the piezoelectric element 9 to bring about a volume change of the pressure chamber 7 and the ink inside the pressure chamber 7 is pressurized. The pressurized ink passes through the ink discharge passage 3b and is discharged as microdroplets from the discharge port 3c.

The arrangement of the inkjet printing head 1 shall now be described in more detail with reference to FIG. 9A to FIG. 13.

A plurality of the ink flow passages 5 (pressure chambers 7) are formed as stripes extending parallel to each other in the actuator substrate 2. The piezoelectric element 9 is disposed respectively in each of the plurality of ink flow passages 5. The ink supply penetrating holes 22 are provided respectively for each of the plurality of ink flow passages 5. The housing recesses 52 and the ink supply passages 53 in the protective substrate 4 are provided respectively for each of the plurality of ink flow passages 5.

The plurality of ink flow passages 5 are formed at equal intervals that are minute intervals (for example, of approximately 30 μm to 350 μm) in a width direction thereof. Each ink flow passage 5 is elongate along the ink flow direction 41. Each ink flow passage 5 is constituted of an ink inflow portion 6 in communication with an ink supply penetrating hole 22 and the pressure chamber 7 in communication with the ink inflow portion 6. In plan view, the pressure chamber 7 has an oblong shape that is elongate along the ink flow direction 41. That is, the top surface portion of the pressure chamber 7 has two side edges along the ink flow direction 41 and two end edges along a direction orthogonal to the ink flow direction 41. In plan view, the ink inflow portion 6 has substantially the same width as the pressure chamber 7. An inner surface of an end portion of the ink inflow portion 6 at an opposite side from the pressure chamber 7 is formed to a semicircle in plan view. The ink supply penetrating hole 22 is circular in plan view (see especially FIG. 9B).

Each piezoelectric element 9 has, in plan view, a rectangular shape that is long in a long direction of a pressure chamber 7 (movable film 10A). A length in a long direction of the piezoelectric element 9 is shorter than a length in the long direction of the pressure chamber 7 (movable film 10A). As shown in FIG. 9B, respective end edges along a short direction of the piezoelectric element 9 are disposed at inner sides at predetermined intervals respectively from respective corresponding end edges of the movable film 10A. Also, a width in the short direction of the piezoelectric element 9 is narrower than a width in a short direction of the movable film 10A. Respective side edges along the long direction of the piezoelectric element 9 are disposed at inner sides at predetermined intervals from respective corresponding side edges of the movable film 10A.

The lower electrode 11 is formed on substantially an entirety of the front surface of the movable film formation layer 10 (see especially FIG. 12). The lower electrode 11 is a common electrode used in common for the plurality of piezoelectric elements 9. The lower electrode 11 includes the main electrode portions 11A of rectangular shape in plan view that constitute the piezoelectric elements 9 and the extension portion 11B led out from the main electrode portions 11A in directions along the front surface of the movable film formation layer 10 to extend outside the peripheral edges of the top surface portions of the pressure chambers 7.

A length in a long direction of each main electrode portion 11A is shorter than the length in the long direction of each movable film 10A. Respective end edges of the main electrode portion 11A are disposed at inner sides at predetermined intervals respectively from the respective corresponding end edges of the movable film 10A. Also, a width in a short direction of the main electrode portion 11A is narrower than the width of the movable film 10A in the short direction. Respective side edges of the main electrode portion 10A are disposed at inner sides at predetermined intervals from the respective corresponding side edges of the movable film 10A.

The extension portion 11B is a region of the entire region of the lower electrode 11 excluding the main electrode portions 11A. In the lower electrode 11, in plan view, each region located at an inner side of the peripheral edge of the top surface portion of a pressure chamber 7 may be referred to at times as the "inner electrode region" and a region located at outer sides of the peripheral edges of the top surface portions of the pressure chambers 7 may be referred to at times as the "outer electrode region."

The main electrode portions 11A are included in the inner electrode regions. The extension portion 11B is constituted of the outer electrode region and portions of the inner electrode regions other than the main electrode portions 11A. The outer electrode region of the lower electrode 11 has thick portions 100 that are thicker than a thickness of each inner electrode region. FIG. 13 shows a pattern example of the thick portions 100.

As shown in FIG. 10 and FIG. 13, the thick portions 100 include a first thick portion 100A of rectangular shape in plan view, which, in plan view, is disposed outside upstream side ends in the ink flow direction 41 of the plurality of ink flow passages 5 (pressure chambers 7) and extends in a direction of alignment of the plurality of ink flow passages 5. As shown in FIG. 11 and FIG. 13, the thick portions 100 further include second thick portions 100B of rectangular shapes in plan view, which, in plan view, are disposed at width central portions of regions between adjacent pressure chambers 7 and at outward sides of the pressure chambers 7 at respective outer sides of the set of plurality of pressure chambers 7 and extend in a length direction of the pressure chambers 7.

In the present preferred embodiment, the lower electrode 11 includes first lower electrodes 101 for thick portion formation that are formed above the movable film formation layer 10 and a second lower electrode 102 formed above the movable film formation layer 10 to cover the first lower electrodes 101. The first lower electrodes 101 are formed just in the thick portions 100. The second lower electrode 102 has, in plan view, the same pattern as an overall planar pattern of the lower electrode 11. In the present preferred embodiment, each thick portion 100 (100A, 100B) is constituted of a first layer portion, constituted of a first lower electrode 101, and a second layer portion, laminated above the first layer portion and constituted of the second lower electrode 102. That is, the second layer portion laminated above the first layer portion is formed integral to a portion (thin portion) of the lower electrode 11 besides the thick portions 100.

A thickness of each first lower electrode 101 (a thickness of each first layer portion) is thicker than a thickness of the second lower electrode 102 (a thickness of the second layer portion). The thickness of each first lower electrode 101 is preferably not less than two times and not more than five times the thickness of the second lower electrode 102. The thickness of the second lower electrode 102 may, for example, be approximately 0.2 µm. Also, a specific electrical resistance of each first lower electrode 101 (a specific electrical resistance of each first layer portion) is preferably lower than a specific electrical resistance of the second lower electrode 102 (a specific electrical resistance of the second layer portion).

The first lower electrode 101 is constituted, for example, of a single film, such as an Al film, a W film, an Au film, etc. The second lower electrode 102 may, for example, be a single film of Pt. The second lower electrode 102 may be constituted of a Ti/TiO$_2$ film, an Ir film, etc. Also, the second lower electrode 102 may be constituted, for example, of a laminated film of a Pt film and a Ti/TiO$_2$ film or a laminated film of a Ti/TiO$_2$ film and an Ir film.

In plan view, the upper electrodes 13 are formed to rectangular shapes of the same pattern as the main electrode portions 11A of the lower electrode 11. That is, a length in a long direction of each upper electrode 13 is shorter than the length in the long direction of each movable film 10A. Respective end edges of the upper electrode 13 are disposed at inner sides at predetermined intervals respectively from the respective corresponding end edges of the movable film 10A. Also, a width in a short direction of the upper electrode 13 is narrower than the width in the short direction of the movable film 10A. Respective side edges of the upper electrode 13 are disposed at inner sides at predetermined intervals from the respective corresponding side edges of the movable film 10A.

In plan view, the piezoelectric films 12 are formed to rectangular shapes of the same pattern as the upper electrodes 13. That is, a length in a long direction of each piezoelectric film 12 is shorter than the length in the long direction of each movable film 10A. Respective end edges of the piezoelectric film 12 are disposed at inner sides at predetermined intervals respectively from the respective corresponding end edges of the movable film 10A. Also, a width in a short direction of the piezoelectric film 12 is narrower than the width in the short direction of the movable film 10A. Respective side edges of the piezoelectric film 12 are disposed at inner sides at predetermined intervals from the respective corresponding side edges of the movable film 10A. A lower surface of the piezoelectric film 12 contacts an upper surface of the main electrode portion 11A of the lower electrode 11 and an upper surface of the piezoelectric film 12 contacts a lower surface of an upper electrode 13.

Each upper wiring 17 extends from an upper surface of one end portion of a piezoelectric element 9 and along an end surface of the piezoelectric element 9 continuous to the upper surface and extends further along a front surface of the extension portion 11B of the lower electrode 11 in a direction along the ink flow direction 41. The tip portion of the upper wiring 17 is disposed further downstream in the ink flow direction 41 than a downstream side end of the protective substrate 4. The pad openings 35 that expose central portions of tip portion front surfaces of the upper wirings 17 are formed in the passivation film 21. The pads 42 are provided on the passivation film 21 so as to cover the pad openings 35. The pads 42 are connected to the upper wirings 17 inside the pad openings 35.

In plan view, the lower wiring 18 has a rectangular main wiring portion 18A that is long in a direction orthogonal to the ink flow direction 41 and a lead portion 18B extending along the ink flow direction 41 from one end portion of the main wiring portion 18A. The main wiring portion 18A is disposed above the first thick portion 100A of the lower electrode 11. A tip portion of the lead portion 18B is disposed further downstream in the ink flow direction 41 than the downstream side end of the protective substrate 4. The lower wiring 18 enters into the plurality of contact holes 34 and is connected to the extension portion 11B of the lower electrode 11 inside the contact holes 34. A pad opening 36 that exposes a central portion of a tip portion front surface of the lead portion 18B is formed in the passivation film 21. The pad 43 is provided above the passivation film 21 so as to cover the pad opening 36. The pad 43 is connected to the lead portion 18B inside the pad opening 36. FIG. 16 is a bottom view of a main portion of the protective substrate as viewed from the actuator substrate side of the inkjet printing head.

As shown in FIG. 9A, FIG. 11, and FIG. 16, in the facing surface 51 of the protective substrate 4, the plurality of housing recesses 52 are formed in parallel at intervals in a direction orthogonal to the ink flow direction 41. In plan view, the plurality of housing recesses 52 are disposed at positions facing the plurality of pressure chambers 7. With respect to the respective housing recesses 52, the ink supply passages 53 are disposed at upstream sides in the ink flow direction 41. In plan view, each housing recess 52 is formed to a rectangular shape slightly larger than the pattern of the upper electrode 13 of the corresponding piezoelectric element 9. The corresponding piezoelectric element 9 is housed in each housing recess 52.

In plan view, the ink supply passages 53 of the protective substrate 4 have circular shapes of the same pattern as the ink supply penetrating holes 22 at the actuator substrate 2 side. In plan view, the ink supply passages 53 are matched with the ink supply penetrating holes 22.

In plan view, the dummy wirings 19 include first dummy wirings 19A of circular annular shapes that surround the ink supply passages 53 (ink supply penetrating holes 22). Above the actuator substrate 2, the first dummy wirings 19A are disposed in regions facing regions of the facing surface 51 of the protective substrate 4 peripheral to the ink supply passages 53. A width of each first dummy wiring 19A (difference between an inner diameter and an outer diameter of each first dummy wiring 19A) is preferably not less than ⅓ a diameter of each ink supply passage 53. Upper surfaces of the first dummy wirings 19A are flat. Each first dummy wiring 19A constitutes a base 20 that supports the protective substrate 4 and increases adhesion with the facing surface of the protective substrate 4.

The dummy wirings 19 further include second dummy wirings 19B of elongate rectangular shapes that are formed at width central portions of regions between adjacent pressure chambers 7 and at outward sides of the pressure chambers 7 at respective outer sides of the set of plurality of pressure chambers and extend in the direction along the ink flow direction 41. The respective second dummy wirings 19B are disposed above the respective second thick portions 100B of the lower electrode 11. Upper surfaces of the second dummy wirings 19B are flat. Each second dummy wiring 19B constitutes a base that supports the protective substrate 4 and increases adhesion with the facing surface of the protective substrate 4.

In bonding the protective substrate 4 to the actuator substrate 2, the protective substrate 4 is pressed against the actuator substrate 2 in a state where an adhesive 50 is coated on a portion of bonding of the actuator substrate 2 and the protective substrate 4. In this process, the facing surface 51 of the protective substrate 4 is pressed via the passivation film 21 against the first dummy wirings 19A and the second dummy wirings 19B that are bases with flat upper surfaces. The facing surface 51 of the protective substrate 4 is thus bonded firmly via the passivation film 21 and the adhesive 50 to the upper surfaces of the first dummy wirings 19A and the second dummy wirings 19B. Defective adhesion is thus made unlikely to occur at the portion of bonding of the facing surface 51 of the actuator substrate 2 and the protective substrate 4.

In the present preferred embodiment, by the first dummy wirings 19A (bases 20) of circular annular shapes surrounding the ink supply passages 53 (ink supply penetrating holes 22) being provided at the actuator substrate 2 side, occurrence of defective bonding between lower surfaces of wall portions of the protective substrate 4 between the housing recesses 52 and the ink supply passages 53 and the actuator substrate 2 can be suppressed. Leakage of ink into a housing recess 52 from an ink supply passage 53 can thereby be suppressed.

FIG. 14 is an illustrative plan view of a pattern example of the insulating film of the inkjet printing head. FIG. 15 is an illustrative plan view of a pattern example of the passivation film of the inkjet printing head.

In the present preferred embodiment, above the actuator substrate 2, the insulating film 15 and the passivation film 21 are formed on substantially an entirety of a region of the protective substrate 4 outside the housing recesses 52 in plan view. However, in this region, the ink supply penetrating holes 22 and the contact holes 34 are formed in the insulating film 15. In this region, the ink supply penetrating holes 22 and the pad openings 35 and 36 are formed in the passivation film 21.

In the regions of the protective substrate 4 inside the housing recesses 52, the insulating film 15 and the passivation film 21 are formed just in one end portions (upper wiring regions) in which the upper wirings 17 are present. In each of these regions, the passivation film 21 is formed to cover an upper surface and a side surface of an upper wiring 17 above the insulating film 15. In other words, in the insulating film 15 and the passivation film 21, openings 37 are formed in regions, within the inner side regions of the housing recesses 52 in plan view, that exclude the upper wiring regions. The contact holes 33 are further formed in the insulating film 15.

In the present preferred embodiment, in a region at the inner side of the peripheral edge of each pressure chamber 7 in plan view, the insulating film 15 and the passivation film 21 are formed just in the upper wiring region in which an upper wiring 17 is present. Therefore, most of the side surface and the upper surface of each piezoelectric element 9 are not covered by the insulating film 15 and the passivation film 21. Displacement of each movable film 10A can thereby be increased in comparison to a case where entireties of the side surface and the upper surface of the piezoelectric element 9 are covered by the insulating film and the passivation film.

The portions (inner electrode regions) of the lower electrode 11 that are located further inward than the top surface portion peripheral edges of the pressure chambers 7 are formed above the movable films 10A. The inner electrode regions of the lower electrode 11 may thus obstruct deformations of the movable films 10A. On the other hand, the portion (outer electrode region) of the lower electrode 11 that is located further outward than the top surface portion peripheral edges of the pressure chambers 7 has hardly any influence on the deformations of the movable films 10A.

With the present preferred embodiment, the lower electrode 11 has the thick portions 100 (100A, 100B) in the outer electrode region. Electrical resistance of the lower electrode 11 as a whole can thus be made low in comparison to a case where the thickness of the entirety of the lower electrode 11 is the same thickness as the thickness of the inner electrode region. In the present preferred embodiment, the electrical resistance of the lower electrode 11 as a whole can be made lower because the specific electrical resistance of the first lower electrodes 101 (first layer portions), which are present just in the thick portions 100 (100A, 100B), is lower than the specific electrical resistance of the second lower electrode 102 (second layer portion). Even if the thick portions 100 are thus provided at the lower electrode 11, the thick portions 100 are formed in the outer electrode region and do not have an adverse effect on the deformations of the movable films 10A. That is, by the present preferred embodiment, the lower electrode 11 can be made low in resistance value and the movable films 10A can be made large in displacement at the same time.

Figure 17B:
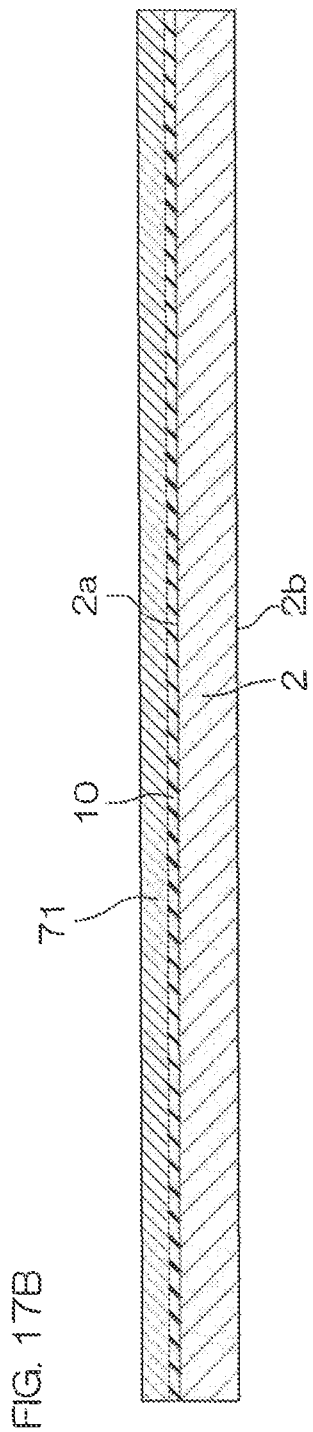
FIG. 17B is a sectional view of a step subsequent to that of FIG. 17A.
Figure 17D:
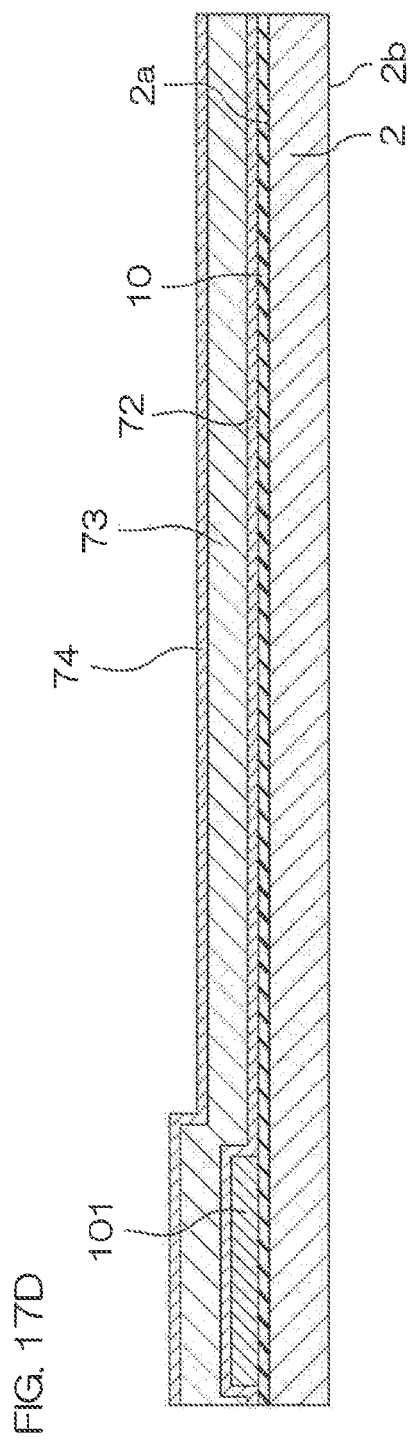
FIG. 17D is a sectional view of a step subsequent to that of FIG. 17C.
Figure 17H:
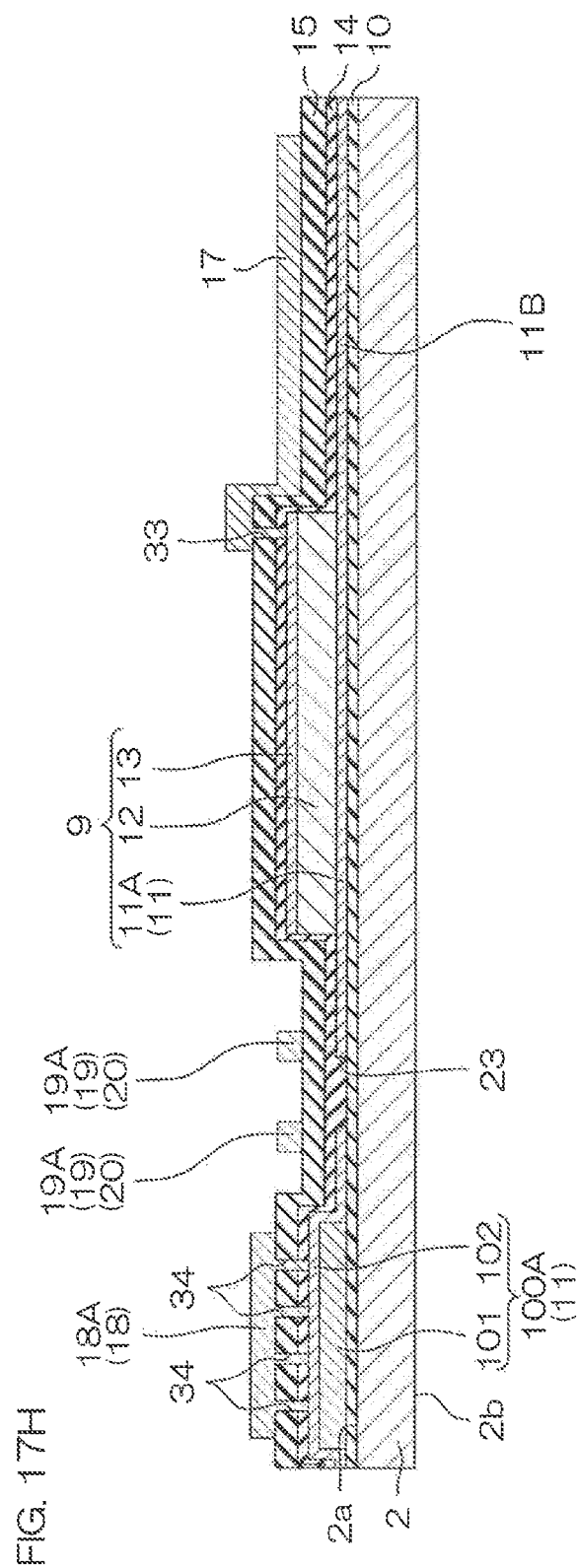
FIG. 17H is a sectional view of a step subsequent to that of FIG. 17G.
Figure 17I:
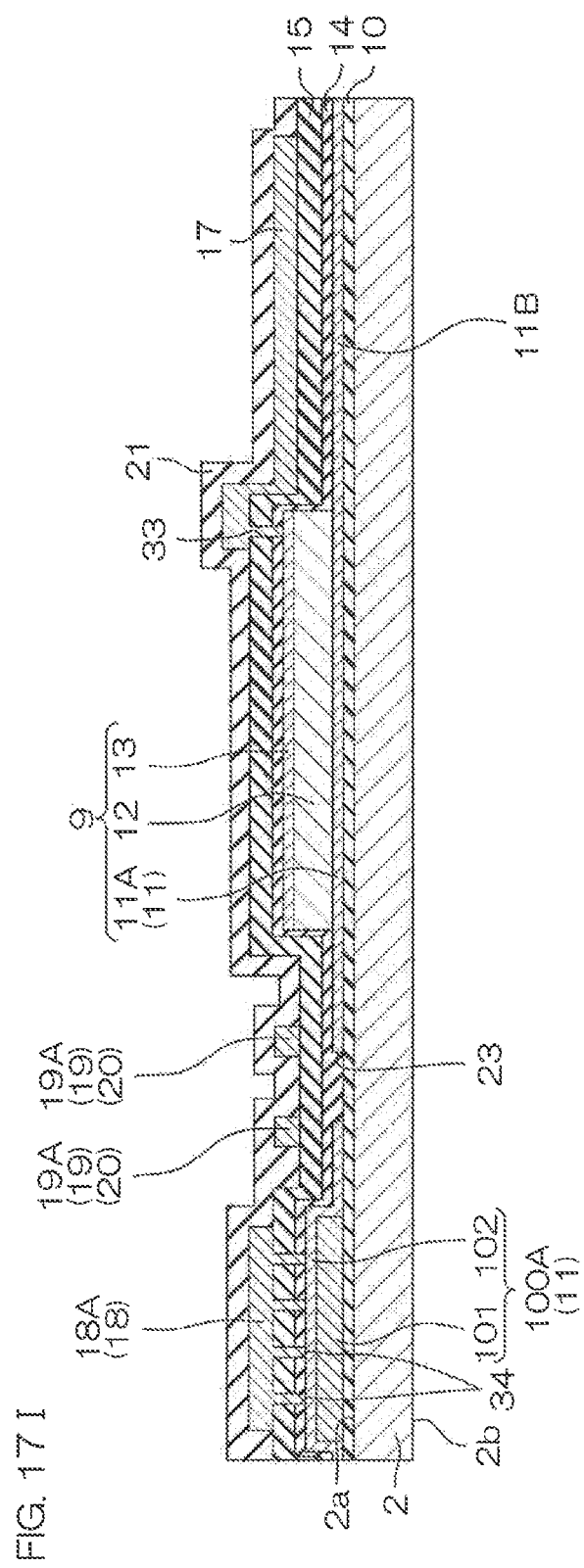
FIG. 17I is a sectional view of a step subsequent to that of FIG. 17H.
Figure 17J:
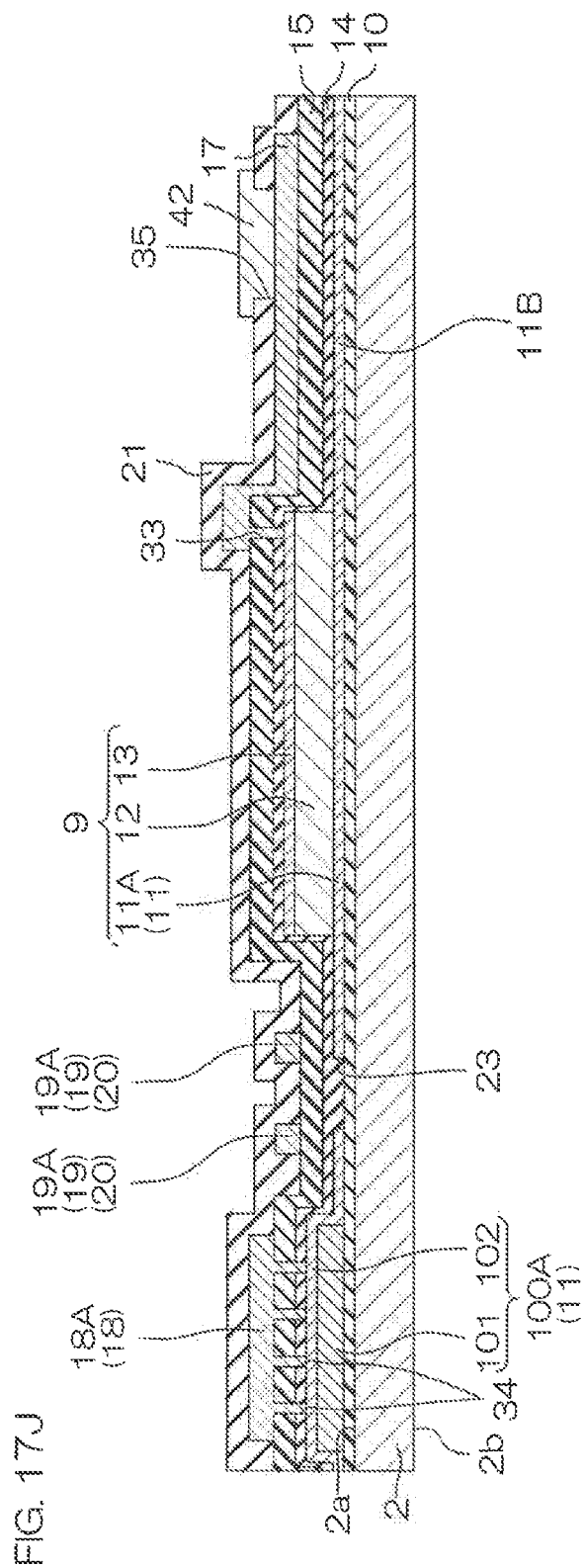
FIG. 17J is a sectional view of a step subsequent to that of FIG. 17I.
Figure 17K:
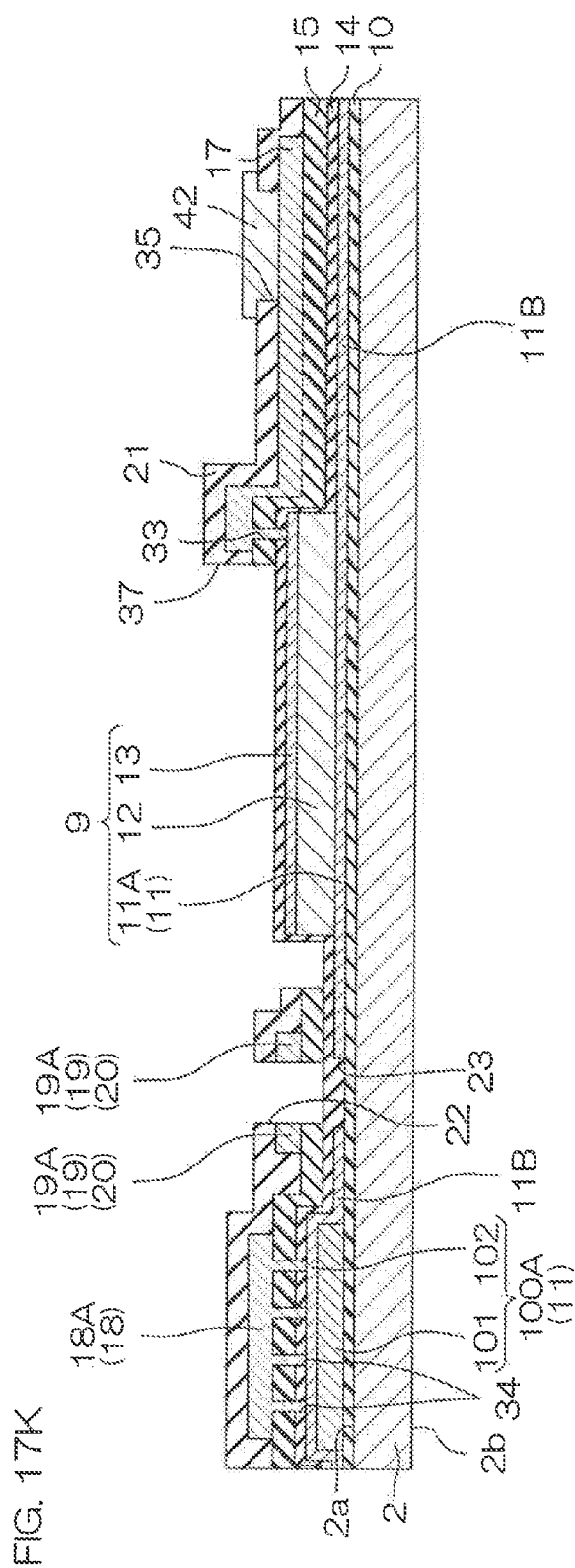
FIG. 17K is a sectional view of a step subsequent to that of FIG. 17J.
Figure 17N:
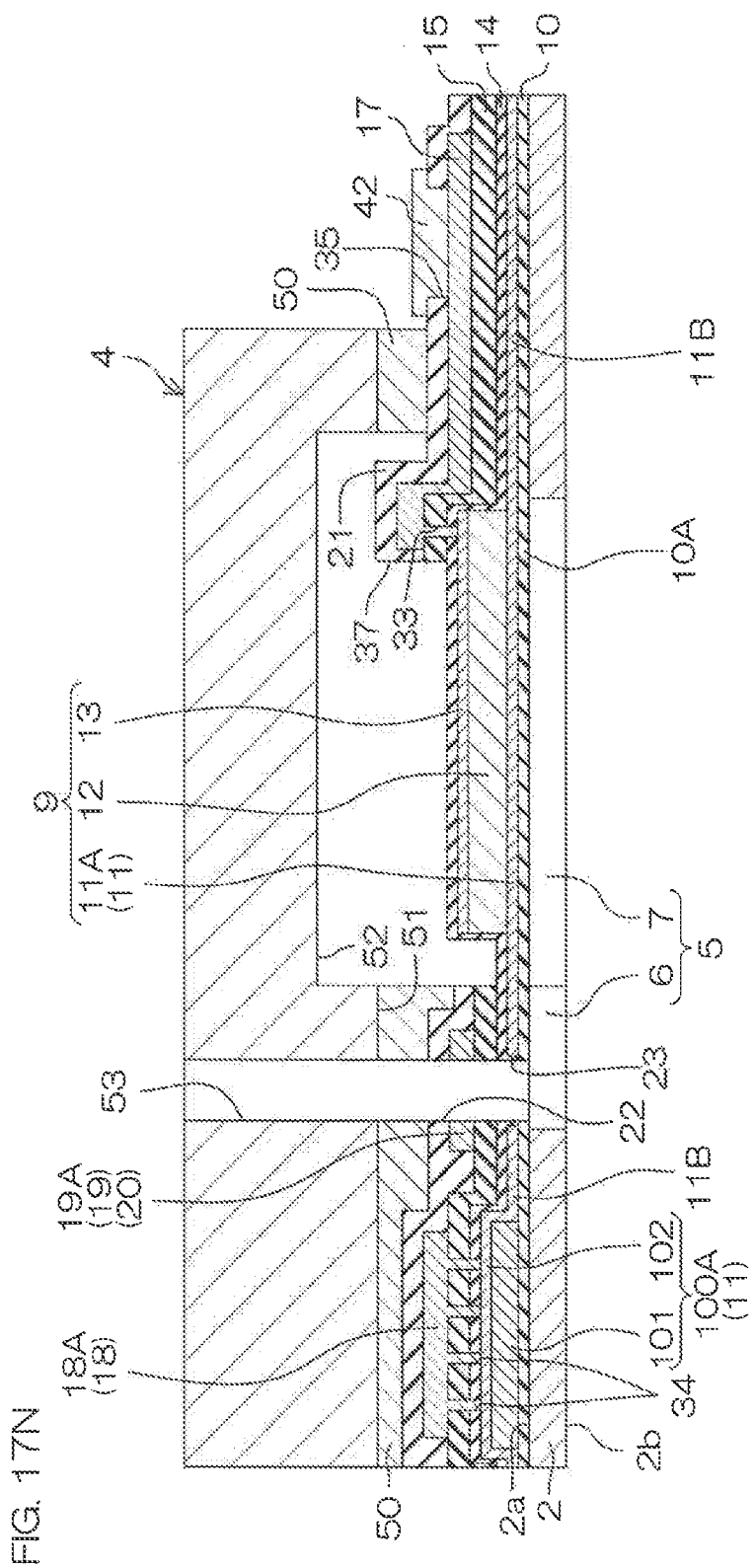
FIG. 17N is a sectional view of a step subsequent to that of FIG. 17M.
Figure 17O:
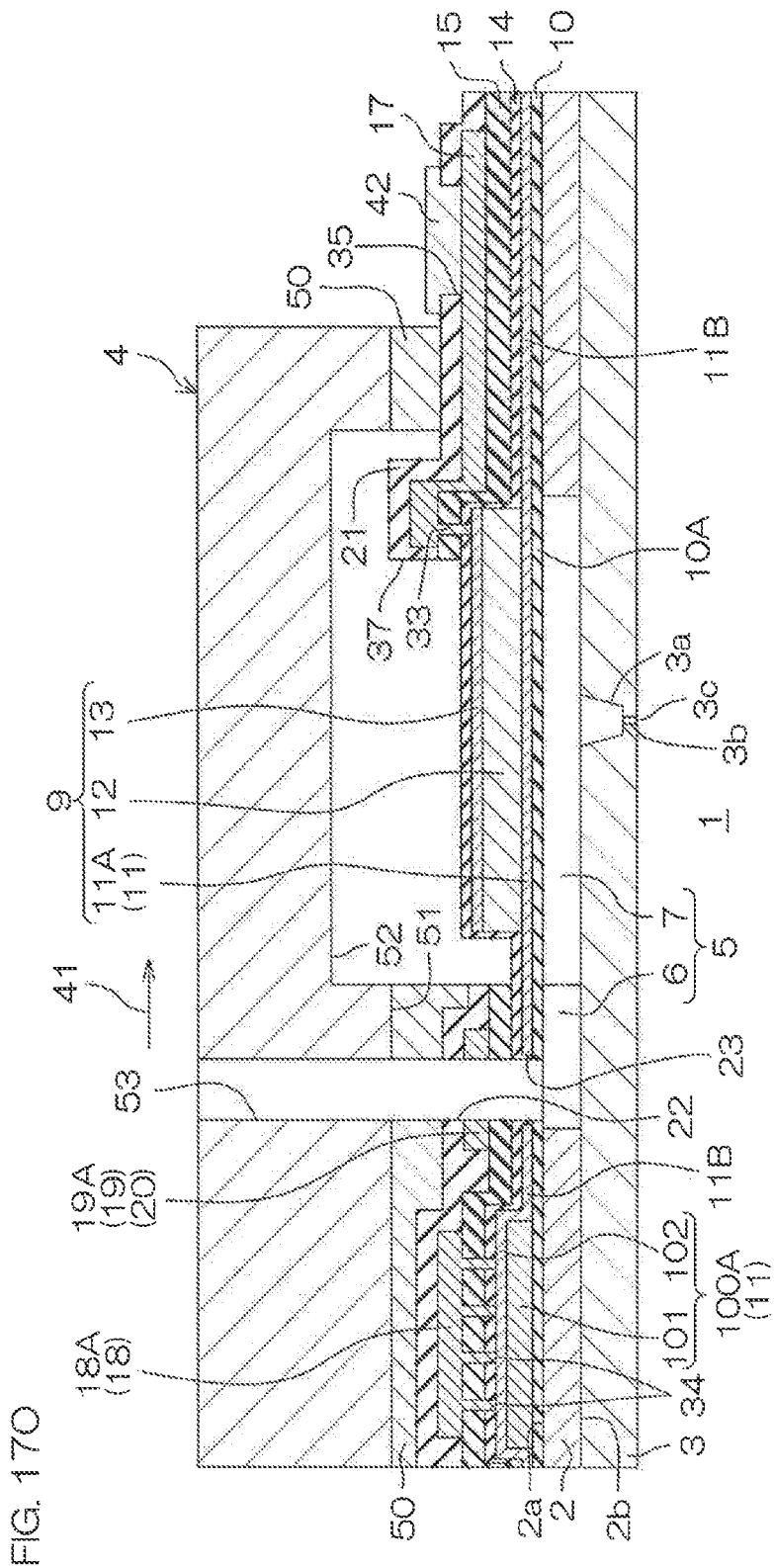
FIG. 17O is a sectional view of a step subsequent to that of FIG. 17N.

FIG. 17A to FIG. 17O are sectional views of an example of a manufacturing process of the inkjet printing head 1 and show a section corresponding to FIG. 10A.

First, as shown in FIG. 17A, the movable film formation layer 10 is formed on the front surface 2a of the actuator substrate 2. However, as the actuator substrate 2, that which is thicker than the thickness of the actuator substrate 2 at the final stage is used. Specifically, a silicon oxide film (for example, of 1.2 µm thickness) is formed on the front surface of the actuator substrate 2. If the movable film formation layer 10 is constituted of a laminated film of a silicon film, a silicon oxide film, and a silicon nitride film, the silicon film (for example, of 0.4 µm thickness) is formed on the front surface of the actuator substrate 2, the silicon oxide film (for example, of 0.4 µm thickness) is formed above the silicon film, and the silicon nitride film (for example, of 0.4 µm thickness) is formed above the silicon oxide film.

A base oxide film, for example, of $Al_2O_3$, MgO, or $ZrO_2$, etc., may be formed on the front surface of the movable film formation layer 10. Such base oxide films prevent metal atoms from escaping from the piezoelectric film 12 to be formed later. When metal atoms escape, the piezoelectric film 12 may degrade in piezoelectric characteristics. Also, when metal atoms that have escaped become mixed in the silicon layer constituting each movable film 10A, the movable film 10A may degrade in durability.

Next, a first lower electrode film 71, which is a material layer of the first lower electrodes 101, is formed above the movable film formation layer 10 (above the base oxide film in the case where the base oxide film is formed) as shown in FIG. 17B. The first lower electrode film 71 is constituted, for example, of an Al film (for example, of 0.4 µm to 1.0 µm thickness). Such a first lower electrode film 71 may be formed by the sputtering method.

Next, a resist mask with a pattern of the first lower electrodes 101 is formed by photolithography. Then, as shown in FIG. 17C, the first lower electrode film 71 is etched using the resist mask as a mask to form the first lower electrodes 101 of the predetermined pattern.

Next, a second lower electrode film 72, which is a material layer of the second lower electrode 102, is formed above the movable film formation layer 10 so as to cover the first lower electrodes 101 as shown in FIG. 17D. The second lower electrode film 72 is constituted, for example, of a Pt film (for example, of 0.2 μm thickness). Such a second lower electrode film 72 may be formed by the sputtering method.

Next, a material film (piezoelectric material film) 73 of the piezoelectric film 12 is formed on an entire surface above the second lower electrode film 72. Specifically, for example, the piezoelectric material film 73 of 1 μm to 3 μm thickness is formed by a sol-gel method. Such a piezoelectric material film 73 is constituted of a sintered body of metal oxide crystal grains.

Next, an upper electrode film 74, which is a material of the upper electrodes 13, is formed on the entire surface of the piezoelectric material film 73. The upper electrode film 74 may, for example, be a single film of platinum (Pt). The upper electrode film 74 may, for example, be an $IrO_2/Ir$ laminated film having an $IrO_2$ film (for example, of 40 nm to 160 nm thickness) as a lower layer and an Ir film (for example, of 40 nm to 160 nm thickness) as an upper layer. Such an upper electrode film 74 may be formed by the sputtering method.

Next, as shown in FIG. 17E and FIG. 17F, patterning of the upper electrode film 74, the piezoelectric material film 73, and the second lower electrode film 72 is performed. First, a resist mask with a pattern of the upper electrodes 13 is formed by photolithography. Then, as shown in FIG. 17E, the upper electrode film 74 and the piezoelectric material film 73 are etched successively using the resist mask as a mask to form the upper electrodes 13 and the piezoelectric films 12 of the predetermined pattern.

Next, after peeling off the resist mask, a resist mask with a pattern of the second lower electrode 102 is formed by photolithography. Then, as shown in FIG. 17F, the second lower electrode film 72 is etched using the resist mask as a mask to form the second lower electrode 102 of the predetermined pattern. The lower electrode 11, constituted of the first lower electrodes 101 and the second lower electrode 102 and having the thick portions 100, is thereby formed. The lower electrode 11 includes the main electrode portions 11A and the extension portion 11B having the penetrating holes 23. The piezoelectric elements 9, each constituted of a main electrode portion 11A of the lower electrode 11, a piezoelectric film 12, and an upper electrode 13, are thereby formed.

Next, after peeling off the resist mask, the hydrogen barrier film 14 covering the entire surface is formed as shown in FIG. 17G. The hydrogen barrier film 14 may be an $Al_2O_3$ film formed by the sputtering method and may have a film thickness of 50 nm to 100 nm. Thereafter, the insulating film 15 is formed above the entire surface of the hydrogen barrier film 14. The insulating film 15 may be an $SiO_2$ film and may have a film thickness of 200 nm to 300 nm. Next, the contact holes 33 and 34 are formed by successively etching the insulating film 15 and the hydrogen barrier film 14.

Next, as shown in FIG. 17H, a wiring film that constitutes the upper wirings 17, the lower wiring 18, and the dummy wirings 19 (19A, 19B) is formed by the sputtering method above the insulating film 15 as well as inside the contact holes 33 and 34. Thereafter, the wiring film is patterned by photolithography and etching to form the upper wirings 17, the lower wiring 18, and the dummy wirings 19 (19A, 19B) at the same time.

Next, as shown in FIG. 17I, the passivation film 21 that covers the wirings 17, 18, and 19 is formed on the front surface of the insulating film 15. The passivation film 21 is constituted, for example, of SiN. The passivation film 21 is formed, for example, by plasma CVD.

Next, a resist mask, having openings corresponding to the pad openings 35 and 36, is formed by photolithography, and the passivation film 21 is etched using the resist mask as a mask. The pad openings 35 and 36 are thereby formed in the passivation film 21 as shown in FIG. 17J. After the resist mask is peeled off, the pads 42 and 43, respectively connected to the upper wirings 17 and the lower wiring 18 via the pad openings 35 and the pad opening 36, are formed above the passivation film 21.

A resist mask having openings corresponding to the openings 37 and the ink supply penetrating holes 22 is then formed by photolithography, and using the resist mask as a mask, the passivation film 21 and the insulating film 15 are etched successively. The openings 37 and the ink supply penetrating holes 22 are thereby formed in the passivation film 21 and the insulating film 15 as shown in FIG. 17K.

Next, the resist mask is peeled off. A resist mask having openings corresponding to the ink supply penetrating holes 22 is then formed by photolithography, and the hydrogen barrier film 14 and the movable film formation layer 10 are etched using the resist mask as a mask. The ink supply penetrating holes 22 are thereby formed in the hydrogen barrier film 14 and the movable film formation layer 10 as shown in FIG. 17L.

Next, as shown in FIG. 17M, an adhesive 50 is coated onto the facing surface 51 of the protective substrate 4 and the protective substrate 4 is fixed onto the actuator substrate 2 so that the ink supply passages 53 and the ink supply penetrating holes 22 are matched. In this process, the facing surface 51 of the protective substrate 4 is pressed via the passivation film 21 against the first dummy wirings 19A and the second dummy wirings 19B that are bases with flat upper surfaces. The facing surface 51 of the protective substrate 4 is thus bonded firmly via the passivation film 21 and the adhesive 50 to the upper surfaces of the first dummy wirings 19A and the second dummy wirings 19B.

Next, as shown in FIG. 17N, rear surface grinding for thinning the actuator substrate 2 is performed. The actuator substrate 2 is made thin by the actuator substrate 2 being ground from the rear surface 2b. For example, the actuator substrate 2 with a thickness of approximately 670 μm in the initial state may be thinned to a thickness of approximately 300 μm. Next, etching (dry etching or wet etching) from the rear surface of the actuator substrate 2 is performed on the actuator substrate 2 to form the ink flow passages 5 (the ink inflow portions 6 and the pressure chambers 7).

In the etching process, the base oxide film formed on the front surface of the movable film formation layer 10 prevents the escaping of metal elements (Pb, Zr, and Ti in the case of PZT) from the piezoelectric film 12 and keeps the piezoelectric characteristics of the piezoelectric film 12 in a satisfactory state. Also as mentioned above, the base oxide film formed on the front surface of the movable film formation layer 10 contributes to maintaining the durability of the silicon layer that forms each movable film 10A.

Thereafter, as shown in FIG. 17O, the nozzle substrate 3 is adhered onto the rear surface of the actuator substrate 2 and the inkjet printing head 1 is thereby obtained. Although a preferred embodiment of the present invention has been described above, the present invention may be implemented in yet other preferred embodiments. Although in the preferred embodiment described above, the first lower electrodes 101 are provided at a lower surface side of the second lower electrode 102, the first lower electrodes 101 may be provided instead at an upper surface side of the second lower electrode 102.

Although in the preferred embodiment described above, the insulating film 15 is formed on a portion of the front surface of the hydrogen barrier film 14, the insulating film 15 may instead be formed on the entirety of the front surface of the hydrogen barrier film 14.

Also, although in the preferred embodiment described above, the insulating film 15 is formed on a portion of the front surface of the hydrogen barrier film 14, the insulating film 15 may be omitted.

Also, although with the preferred embodiment described above, PZT was cited as an example of the material of the piezoelectric film, a piezoelectric material besides this that is constituted of a metal oxide as represented by lead titanate ($PbPO_3$), potassium niobate ($KNbO_3$), nothium niobate ($LiNbO_3$), lithium tantalate ($LiTaO_3$), etc., may be applied instead.

Also, although with the preferred embodiment described above, a case where the present invention is applied to an inkjet printing head was described, the present invention may also be applied to a piezoelectric microphone, pressure sensor, etc., that uses a piezoelectric element.

[3] Third Invention

Japanese Patent Application Publication No. 2015-91668 discloses an inkjet printing head. The inkjet printing head of Japanese Patent Application Publication No. 2015-91668 includes an actuator substrate (substrate) having a pressure chamber (pressure generating chamber) as an ink flow passage, a movable film (elastic film) formed above the actuator substrate, and a piezoelectric element provided above the movable film. The inkjet printing head of Japanese Patent Application Publication No. 2015-91668 further includes a nozzle substrate (nozzle plate), bonded to a lower surface of the substrate and having a nozzle opening in communication with the pressure chamber, and a protective substrate bonded to an upper surface of the actuator substrate and covering the piezoelectric element.

The actuator substrate has formed therein an individual ink supply passage in communication with the pressure chamber and a common ink supply passage (communication portion) in communication with the individual ink supply passage. That is, the actuator substrate has formed therein an ink flow passage that includes the common ink supply passage, the individual ink supply passage, and the pressure chamber. A housing recess (piezoelectric element holding portion) housing the piezoelectric element is formed in a lower surface of the protective substrate. Also, an ink supply passage (reservoir portion) in communication with the common ink supply passage of the actuator substrate is formed at an interval from the housing recess in plan view in the protective substrate. Ink from an ink tank is supplied to the pressurizing chamber through the ink supply passage of the protective substrate and the common ink supply passage and the individual ink supply passage of the actuator substrate.

Generally with an inkjet printing head such as that described in Japanese Patent Application Publication No. 2015-91668, the protective substrate is bonded to the actuator substrate by an adhesive. In this process, a lower surface of a wall portion of the protective substrate between the housing recess and the ink supply passage is also bonded to the actuator substrate by the adhesive. When defective bonding occurs between the wall portion lower surface of the protective substrate and the actuator substrate due to a cause, such as mixing in of a bubble in the adhesive, etc., ink may leak out from the ink supply passage into the housing recess and the piezoelectric element may be destroyed thereby.

An object of a third invention is to provide an inkjet printing head and a method for manufacturing the same with which occurrence of defective bonding between an actuator substrate and a lower surface of a wall portion of a protective substrate between an ink supply passage and a housing recess can be suppressed and leakage of ink from the ink supply passage into the housing recess can be suppressed.

The third invention has the following features.

B1. An inkjet printing head including an actuator substrate having an ink flow passage that includes a pressure chamber, a movable film formation layer including a movable film disposed above the pressure chamber and defining a top surface portion of the pressure chamber, a piezoelectric element formed above the movable film, and a protective substrate bonded by an adhesive to the actuator substrate so as to cover the piezoelectric element, and where the protective substrate has a downwardly-opening housing recess housing the piezoelectric element and an ink supply passage formed outside one end of the housing recess in a plan view of viewing from a direction normal to a major surface of the movable film and being in communication with one end portion of the ink flow passage, and the actuator substrate has formed thereon a base having a flat upper surface and disposed in a region facing a region of a lower surface of the protective substrate peripheral to the ink supply passage so as to surround the ink supply passage in the plan view.

In bonding the protective substrate to the actuator substrate, the protective substrate is pressed against the actuator substrate in a state where the adhesive is coated on a portion of bonding of the actuator substrate and the protective substrate. In this process, the region of the lower surface of the protective substrate peripheral to the ink supply passage is pressed against the base with the flat upper surface. The region of the lower surface of the protective substrate peripheral to the ink supply passage is thus bonded firmly via the adhesive to the upper surface of the base. Occurrence of defective bonding between the actuator substrate and a lower surface of a wall portion of the protective substrate between the housing recess and the ink supply passage can thereby be suppressed. Leakage of ink from the ink supply passage into the housing recess can thereby be suppressed.

B2. The inkjet printing head according to "B 1.," where the base includes an annular base that surrounds the ink supply passage in the plan view.

With the present arrangement, leakage of ink from the ink supply passage into the housing recess can be suppressed more effectively.

B3. The inkjet printing head according to "B1.," where the base includes an annular first base that surrounds the ink supply passage in the plan view and one or a plurality of second bases disposed in a periphery of the first base.

With the present arrangement, leakage of ink from the ink supply passage into the housing recess can be suppressed more effectively.

B4. The inkjet printing head according to any one of "B1." to "B3.," where the piezoelectric element includes a lower electrode formed above the movable film, a piezoelectric film formed above the lower electrode, and an upper electrode formed above the piezoelectric film, the upper electrode has a peripheral edge receded further toward an interior of the pressure chamber than the movable film in the plan view, an upper wiring is further included which, in the plan view, has one end portion connected to an upper surface of the upper electrode and another end portion led out to an outer side of a peripheral edge of the pressure chamber, and the base is constituted of a dummy wiring prepared in the same step as a step of forming the upper wiring.

The present arrangement is simple in manufacturing process because the base can be formed in the same step as the step of forming the upper electrode.

B5. The inkjet printing head according to "B4.," further including a hydrogen barrier film, covering at least entireties of side surfaces of the upper electrode and the piezoelectric film and covering an upper surface of the lower electrode, and an insulating film, formed above the hydrogen barrier film and disposed between the hydrogen barrier film and the upper wiring plus the dummy wiring, and where a contact hole, exposing a portion of the upper electrode, is formed in the hydrogen barrier film and the insulating film and the one end portion of the upper wiring is connected to the upper electrode via the contact hole.

With the present arrangement, degradation of characteristics of the piezoelectric film due to hydrogen reduction can be prevented.

B6. The inkjet printing head according to any one of "B1." to "B3.," where the piezoelectric element includes a lower electrode formed above the movable film, a piezoelectric film formed above the lower electrode, and an upper electrode formed above the piezoelectric film, and the base is constituted of a dummy piezoelectric film prepared in the same step as a step of forming the piezoelectric film.

The present arrangement is simple in manufacturing process because the base can be formed in the same step as the step of forming the piezoelectric film.

B7. The inkjet printing head according to "B6.," where the upper electrode has a peripheral edge receded further toward an interior of the pressure chamber than the movable film in the plan view, and an upper wiring is further included which, in the plan view, has one end portion connected to an upper surface of the upper electrode and another end portion led out to an outer side of a peripheral edge of the pressure chamber.

B8. The inkjet printing head according to "B7.," further including a hydrogen barrier film, covering at least entireties of side surfaces of the upper electrode and the piezoelectric film and covering front surfaces of the lower electrode and the dummy piezoelectric film, and an insulating film, formed above the hydrogen barrier film and disposed between the hydrogen barrier film and the upper wiring, and where a contact hole, exposing a portion of the upper electrode, is formed in the hydrogen barrier film and the insulating film and the one end portion of the upper wiring is connected to the upper electrode via the contact hole.

With the present arrangement, degradation of characteristics of the piezoelectric film due to hydrogen reduction can be prevented.

B9. The inkjet printing head according to "B5." or "B8.," further including a passivation film formed above the insulating film and covering the wiring.

With the present arrangement, the wiring can be protected by the passivation film.

B10. The inkjet printing head according to any one of "B1." to "B9.," where the movable film formation layer is constituted of an $SiO_2$ single film.

B11. The inkjet printing head according to any one of "B 1." to "B9.," where the movable film formation layer is constituted of a laminated film of an Si film formed above the substrate, an $SiO_2$ film formed above the Si film, and an SiN film formed above the $SiO_2$ film.

B12. The inkjet printing head according to "B4." or "B6.," where the piezoelectric film is constituted of a PZT film.

B13. The inkjet printing head according to "B4." or "B6.," where the upper electrode is constituted of a Pt single film.

B14. The inkjet printing head according to "B4." or "B6.," where the upper electrode is constituted of a laminated film of an $IrO_2$ film formed above the piezoelectric film and an Ir film formed above the $IrO_2$ film.

B15. The inkjet printing head according to "B4." or "B6.," where the lower electrode is constituted of a laminated film of a Ti film formed at the movable film side and a Pt film formed above the Ti film.

B16. A method for manufacturing an inkjet printing head including a step of forming, above an actuator substrate, a movable film formation layer including a movable film formation region, a step of forming a lower electrode film, a piezoelectric material film, and an upper electrode film above the movable film formation layer, a step of patterning the upper electrode film, the piezoelectric material film, and the lower electrode film to form an upper electrode, a piezoelectric film, and a lower electrode to form a piezoelectric element that includes the lower electrode, the upper electrode, and the piezoelectric film sandwiched thereby, a step of successively forming, above the movable film formation layer, a hydrogen barrier film and an insulating film covering the piezoelectric element and the lower electrode, a step of forming, above the upper electrode and in the hydrogen barrier film and the insulating film, a contact hole exposing a portion of the upper electrode, a step of forming a wiring film above the insulating film and thereafter patterning the wiring film to form an upper wiring, connected to the upper electrode via the contact hole, and a base constituted of a dummy wiring, a step of bonding a protective substrate to the actuator substrate so as to cover the piezoelectric element, and a step of etching the actuator substrate from below to form an ink flow passage including a pressure chamber facing the movable film formation region, and where the protective substrate has a downwardly-opening housing recess housing the piezoelectric element and an ink supply passage formed outside one end of the housing recess in the plan view and being in communication with one end portion of the ink flow passage, and the base being disposed in a region facing a region of a lower surface of the protective substrate peripheral to the ink supply passage so as to surround the ink supply passage in a plan view of viewing from a direction normal to a major surface of the movable film formation layer.

With the present method for manufacturing the inkjet printing head, an inkjet printing head can be obtained with which leakage of ink from the ink supply passage into the housing recess can be suppressed.

B17. A method for manufacturing an inkjet printing head including a step of forming, above an actuator substrate, a movable film formation layer including a movable film formation region, a step of forming a lower electrode film, a piezoelectric material film, and an upper electrode film above the movable film formation layer, a step of patterning the upper electrode film, the piezoelectric material film, and the lower electrode film to form an upper electrode, a piezoelectric film, a lower electrode, and a base-forming dummy piezoelectric film to form a piezoelectric element, including the lower electrode, the upper electrode, and the piezoelectric film sandwiched thereby, and a base constituted of the dummy piezoelectric film, a step of successively forming, above the movable film formation layer, a hydrogen barrier film and an insulating film covering the piezoelectric element and the lower electrode, a step of forming, above the upper electrode and in the hydrogen barrier film and the insulating film, a contact hole exposing a portion of the upper electrode, a step of forming a wiring film above the insulating film and thereafter patterning the wiring film to form an upper wiring, connected to the upper electrode via the contact hole, a step of bonding a protective substrate to the actuator substrate so as to cover the piezoelectric element, and a step of etching the actuator substrate from below to form an ink flow passage including a pressurizing chamber facing the movable film formation region, and where the protective substrate has a downwardly-opening housing recess housing the piezoelectric element and an ink supply passage formed outside one end of the housing recess in the plan view and being in communication with one end portion of the ink flow passage, and the base being disposed in a region facing a region of a lower surface of the protective substrate peripheral to the ink supply passage so as to surround the ink supply passage in a plan view of viewing from a direction normal to a major surface of the movable film formation layer.

With the present method for manufacturing the inkjet printing head, an inkjet printing head can be obtained with which leakage of ink from the ink supply passage into the housing recess can be suppressed.

A preferred embodiment of the third invention shall now be described in detail with reference to FIG. 18A to FIG. 30B. The symbols in FIG. 18A to FIG. 30B are unrelated to the symbols in FIG. 1A to FIG. 8N used in the above description of the first invention and the symbols in FIG. 9A to FIG. 17O used in the above description of the second invention.

Figure 18B:
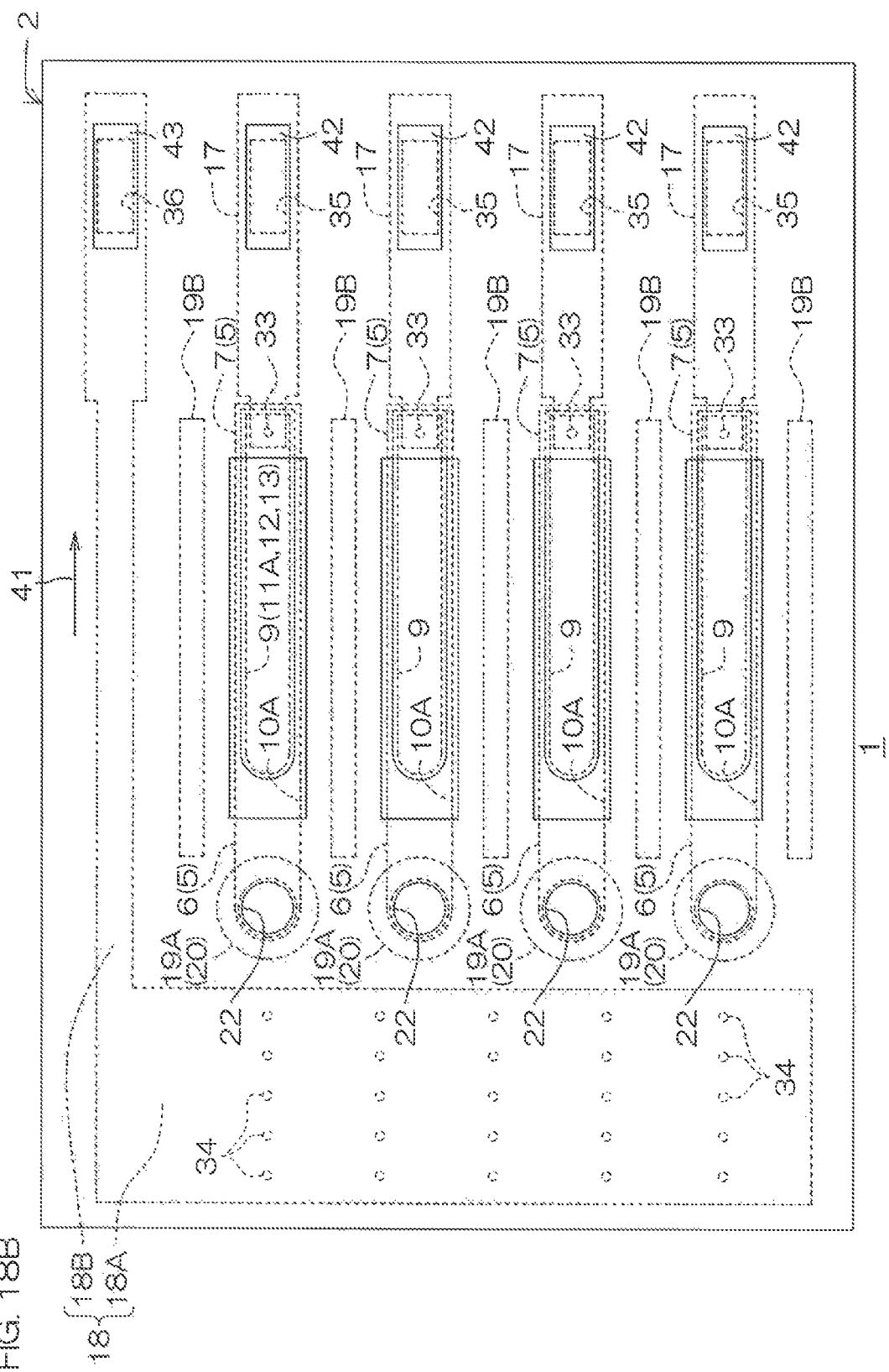
FIG. 18B is an illustrative plan view of the main portion of the inkjet printing head of FIG. 18A and is a plan view with a protective substrate omitted.
Figure 19:
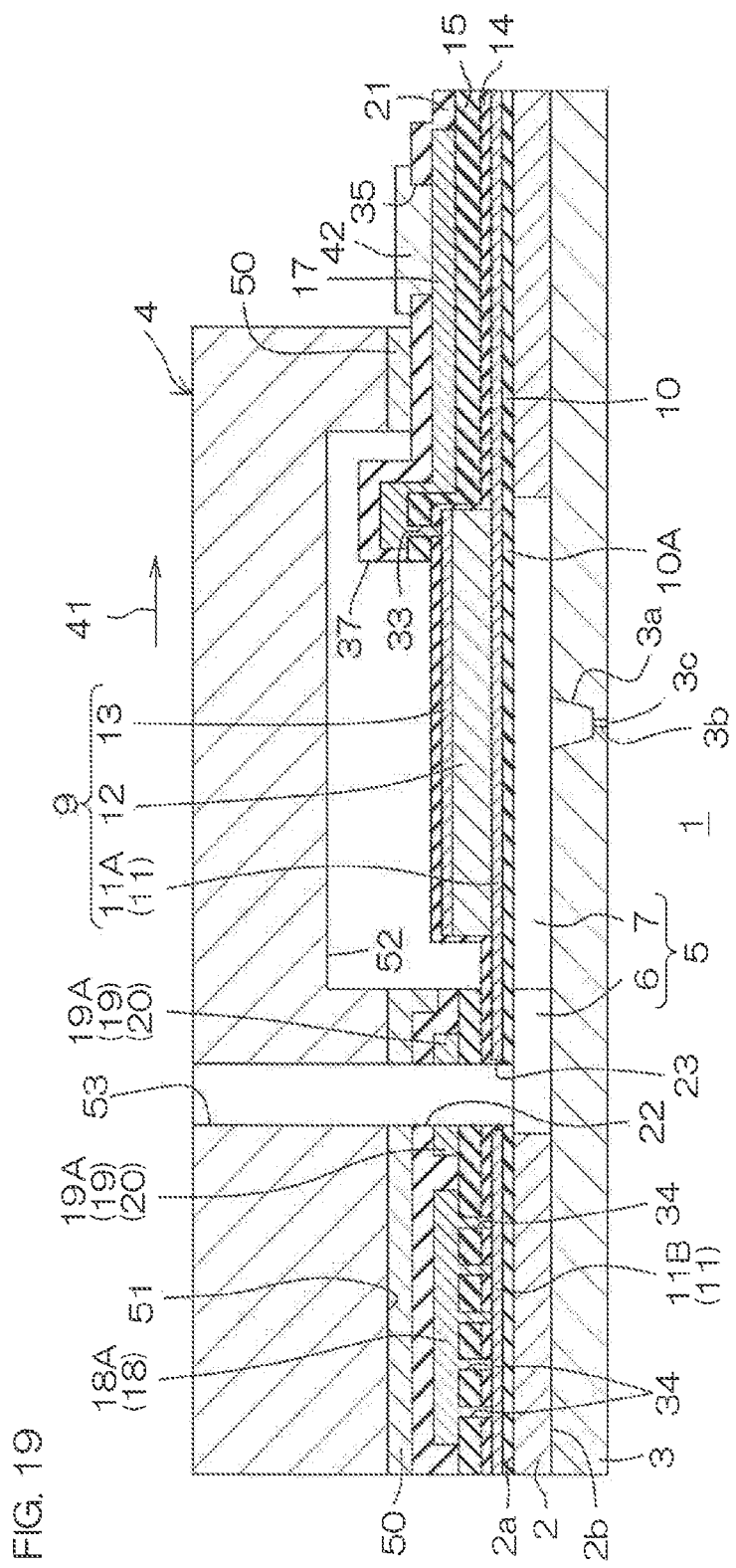
FIG. 19 is an illustrative sectional view taken along line XIX-XIX in FIG. 18A.
Figure 20:
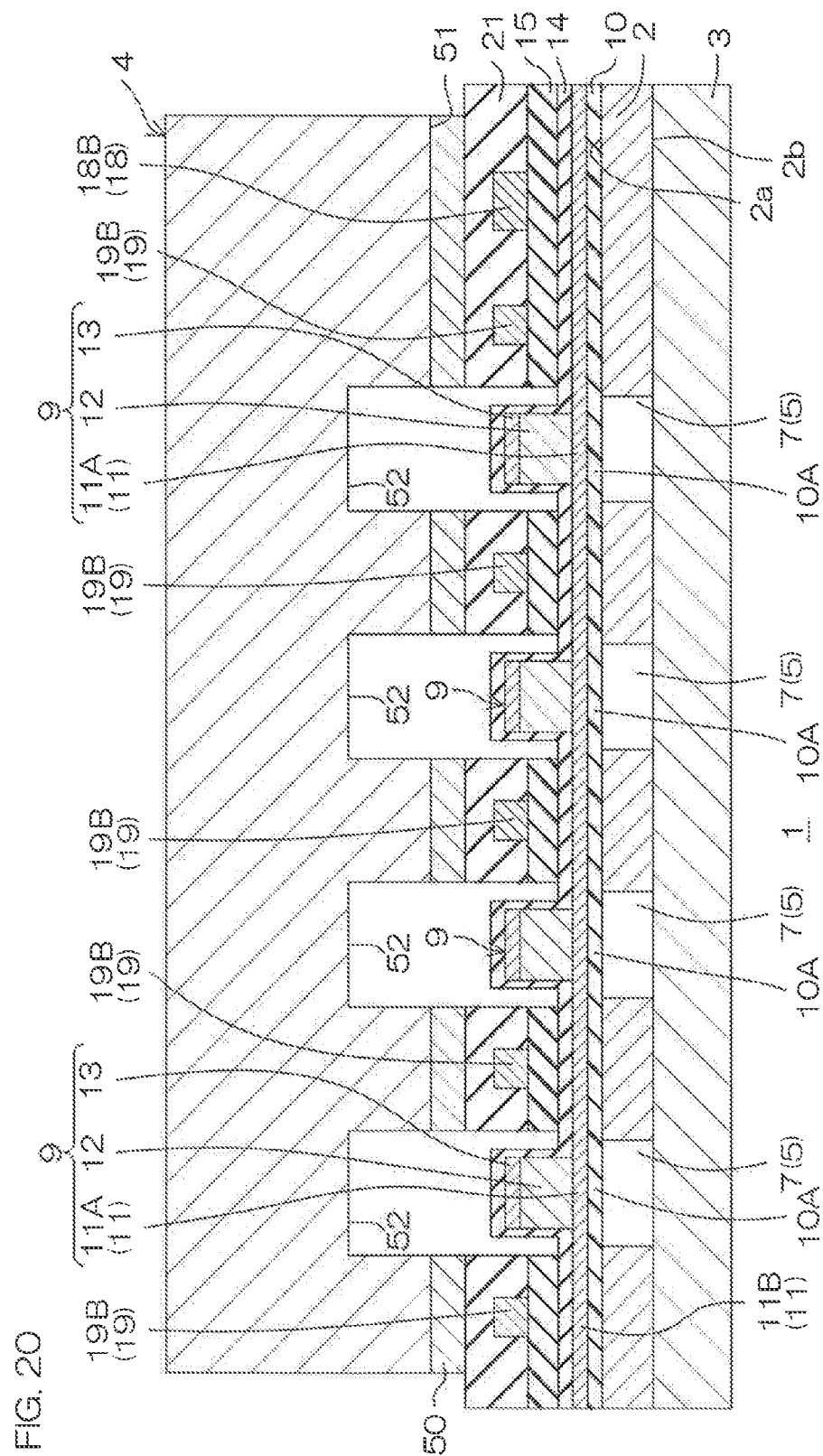
FIG. 20 is an illustrative enlarged sectional view of a portion of a section taken along line XX-XX in FIG. 18A.
Figure 21:
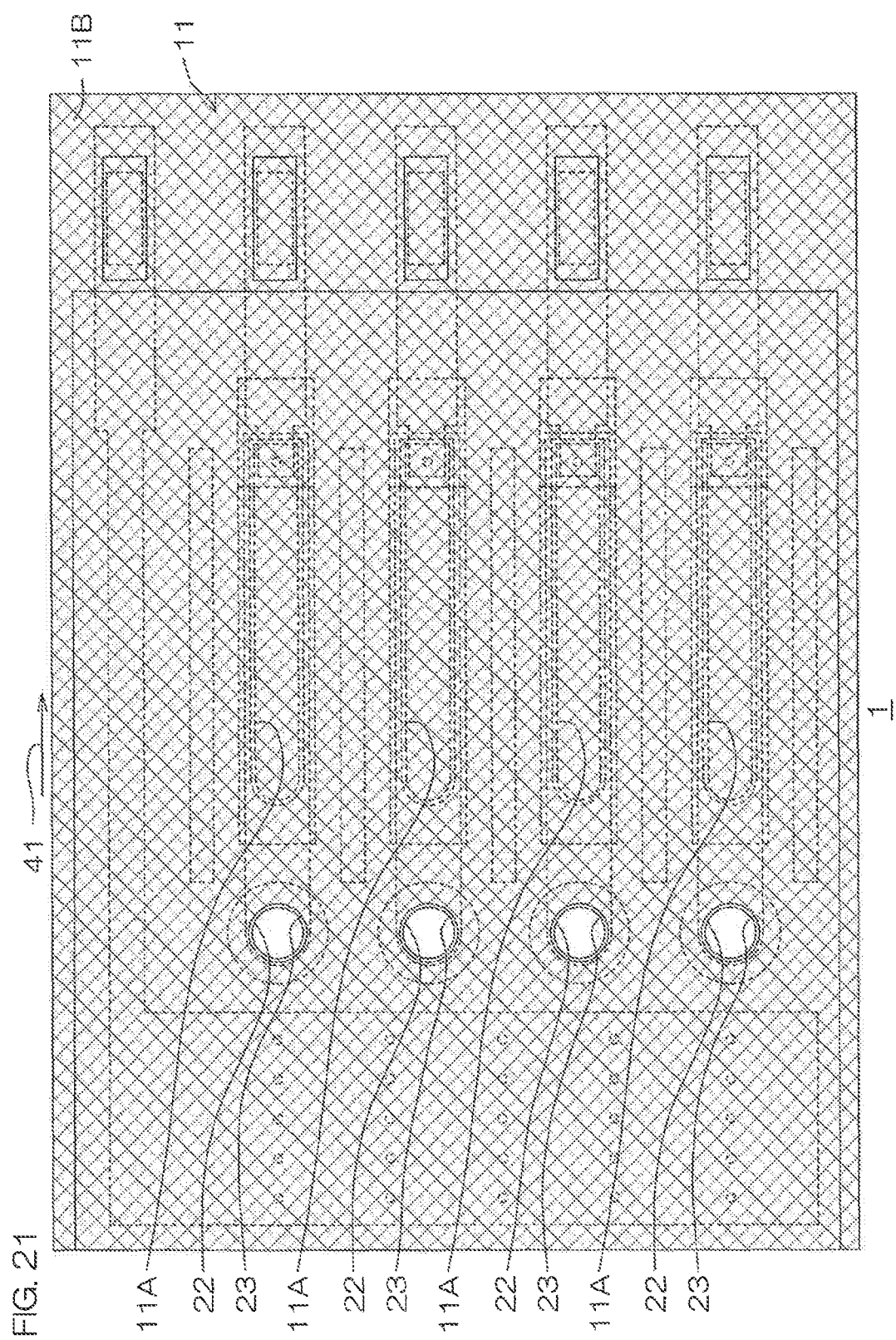
FIG. 21 is an illustrative plan view of a pattern example of a lower electrode of the inkjet printing head of FIG. 18A.

FIG. 18A is an illustrative plan view for describing the arrangement of a main portion of an inkjet printing head according to a preferred embodiment of the third invention. FIG. 18B is an illustrative plan view of the main portion of the inkjet printing head and is a plan view with a protective substrate omitted. FIG. 19 is an illustrative sectional view taken along line XIX-XIX in FIG. 18A. FIG. 20 is an illustrative enlarged sectional view of a portion of a section taken along line XX-XX in FIG. 18A. FIG. 21 is an illustrative plan view of a pattern example of a lower electrode of the inkjet printing head of FIG. 18A. The arrangement of an inkjet printing head 1 shall now be described in outline with reference to FIG. 19.

The inkjet printing head 1 includes an actuator substrate 2, a nozzle substrate 3, and a protective substrate 4. A movable film formation layer 10 is laminated on a front surface of the actuator substrate 2. In the actuator substrate 2, ink flow passages (ink reservoirs) 5 are formed. In the present preferred embodiment, the ink flow passages 5 are formed to penetrate through the actuator substrate 2. Each ink flow passage 5 is formed to be elongate along an ink flow direction 41, which is indicated by an arrow FIG. 19. Each ink flow passage 5 is constituted of an ink inflow portion 6 at an upstream side end portion (left end portion in FIG. 19) in the ink flow direction 41 and a pressure chamber 7 (cavity) in communication with the ink inflow portion 6. In FIG. 19, a boundary between the ink inflow portion 6 and the pressure chamber 7 is indicated by an alternate long and two short dashes line.

The nozzle substrate 3 is constituted, for example, of a silicon substrate. The nozzle substrate 3 is adhered to a rear surface 2b of the actuator substrate 2. The nozzle substrate 3, together with the actuator substrate 2 and the movable film formation layer 10, defines the ink flow passages 5.

More specifically, the nozzle substrate 3 defines bottom surface portions of the ink flow passages 5. The nozzle substrate 3 has recess portions 3a each facing a pressure chamber 7 and an ink discharge passage 3b is formed in a bottom surface of each recess portion 3a. Each ink discharge passage 3b penetrates through the nozzle substrate 3 and has a discharge port 3c at an opposite side from the pressure chamber 7. Therefore, when a volume change occurs in a pressure chamber 7, the ink retained in the pressure chamber 7 passes through the ink discharge passage 3b and is discharged from the discharge port 3c.

Each portion of the movable film formation layer 10 that is a top roof portion of a pressure chamber 7 constitutes a movable film 10A. The movable film 10A (movable film formation layer 10) is constituted, for example, of a silicon oxide ($SiO_2$) film formed above the actuator substrate 2. The movable film 10A (movable film formation layer 10) may be constituted of a laminated film, for example, of a silicon (Si) film formed above the actuator substrate 2, a silicon oxide ($SiO_2$) film formed above the silicon film, and a silicon nitride (SiN) film formed above the silicon oxide film. In the present specification, the movable film 10A refers to a top roof portion of the movable film formation layer 10 that defines the top surface portion of the pressure chamber 7. Therefore, portions of the movable film formation layer 10 besides the top roof portions of the pressure chambers 7 do not constitute the movable film 10A.

Each movable film 10A has a thickness of, for example, 0.4 μm to 2 μm. If the movable film 10A is constituted of a silicon oxide film, the thickness of the silicon oxide film may be approximately 1.2 μm. If the movable film 10A is constituted of a laminated film of a silicon film, a silicon oxide film, and a silicon nitride film, the thickness of each of the silicon film, the silicon oxide film, and the silicon nitride film may be approximately 0.4 μm.

Each pressure chamber 7 is defined by a movable film 10A, the actuator substrate 2, and the nozzle substrate 3 and is formed to a substantially rectangular parallelepiped shape in the present preferred embodiment. The pressure chamber 7 may, for example, have a length of approximately 800 μm and a width of approximately 55 μm. Each ink inflow portion 6 is in communication with one end portion in a long direction of a pressure chamber 7.

A piezoelectric element 9 is disposed on a front surface of each movable film 10A. Each piezoelectric element 9 includes a lower electrode 11 formed above the movable film formation layer 10, a piezoelectric film 12 formed above the lower electrode 11, and an upper electrode 13 formed above the piezoelectric film 12. In other words, the piezoelectric element 9 is arranged by sandwiching the piezoelectric film 12 from above and below by the upper electrode 13 and the lower electrode 11.

The upper electrode 13 may be a single film of platinum (Pt) or may have a laminated structure, for example, in which a conductive oxide film (for example, an $IrO_2$ (iridium oxide) film) and a metal film (for example, an Ir (iridium) film) are laminated. The upper electrode 13 may have a thickness, for example, of approximately 0.2 μm.

As each piezoelectric film 12, for example, a PZT (PbZr$_x$Ti$_{1-x}$O$_3$: lead zirconate titanate) film formed by a sol-gel method or a sputtering method may be applied. Such a piezoelectric film 12 is constituted of a sintered body of a metal oxide crystal. The piezoelectric films 12 are formed to be of the same shape as the upper electrodes 13 in plan view. The piezoelectric film 12 has a thickness of approximately 1 μm. The overall thickness of each movable film 10A is preferably approximately the same as the thickness of the piezoelectric film 12 or approximately ⅔ the thickness of the piezoelectric film 12.

The lower electrode 11 has, for example, a two-layer structure with a Ti (titanium) film and a Pt (platinum) film being laminated successively from the movable film formation layer 10 side. Besides this, the lower electrode 11 may be formed of a single film that is an Au (gold) film, a Cr (chromium) layer, or an Ni (nickel) layer, etc. The lower electrode 11 has main electrode portions 11A, in contact with lower surfaces of the piezoelectric films 12, and an extension portion 11B extending to a region outside the piezoelectric films 12. The lower electrode 11 may have a thickness, for example, of approximately 0.2 μm.

A hydrogen barrier film 14 is formed above the extension portion 11B of the lower electrode 11 and above the piezoelectric element 9. The hydrogen barrier film 14 is constituted, for example, of $Al_2O_3$ (alumina). The hydrogen barrier film 14 has a thickness of approximately 50 nm to 100 nm. The hydrogen barrier film 14 is provided to prevent degradation of characteristics of the piezoelectric film 12 due to hydrogen reduction.

An insulating film 15 is laminated on the hydrogen barrier film 14. The insulating film 15 is constituted, for example, of $SiO_2$ or low-hydrogen SiN, etc. The insulating film 15 has a thickness of approximately 500 nm. Upper wirings 17, a lower wiring 18, and dummy wirings 19 are formed above the insulating film 15. These wirings 17, 18, and 19 may be constituted of a metal material that includes Al (aluminum). These wirings 17, 18, and 19 have a thickness, for example, of approximately 1000 nm (1 μm).

One end portion of each upper wiring 17 is disposed above one end portion (downstream side end portion in the ink flow direction 41) of an upper electrode 13. A contact hole 33, penetrating continuously through the hydrogen barrier film 14 and the insulating film 15, is formed between the upper wiring 17 and the upper electrode 13. The one end portion of the upper wiring 17 enters into the contact hole 33 and is connected to the upper electrode 13 inside the contact hole 33. From above the upper electrode 13, the upper wiring 17 crosses an outer edge of the pressure chamber 7 and extends outside the pressure chamber 7.

The lower wiring 18 is disposed above the extension portion 11B of the lower electrode 11 at an opposite side from the pressure chamber 7 with respect to the ink inflow portion 6 of the ink flow passage 5. A plurality of contact holes 34, penetrating continuously through the hydrogen barrier film 14 and the insulating film 15, are formed between the lower wiring 18 and the extension portion 11B of the lower electrode 11. The lower wiring 18 enters into the contact holes 34 and is connected to the extension portion 11B of the lower electrode 11 inside the contact holes 34.

The dummy wirings 19 are not electrically connected to either of the upper wirings 17 and the lower wiring 18 and are electrically insulated wirings. The dummy wirings 19 are formed in the same process as a process in which the upper wirings 17 and the lower wiring 18 are formed.

A passivation film 21, covering the wirings 17, 18, and 19 and the insulating film 15 is formed above the insulating film 15. The passivation film 21 is constituted, for example, of SiN (silicon nitride). The passivation film 21 may have a thickness, for example, of approximately 800 nm.

Pad openings 35 that expose portions of the upper wirings 17 are formed in the passivation film 21. The pad openings 35 are formed in a region outside the pressure chambers 7 and are formed, for example, at tip portions (end portions at opposite sides from the portions of contact with the upper electrodes 13) of the upper wirings 17. Pads 42 that cover the pad openings 35 are formed above the passivation film 21. The pads 42 enter into the pad openings 35 and are connected to the upper wirings 17 inside the pad openings 35.

Ink supply penetrating holes 22, penetrating through the passivation film 21, the insulating film 15, the hydrogen barrier film 14, the lower electrode 11, and the movable film formation layer 10 are formed at positions corresponding to end portions of the ink flow passages 5 at the ink inflow portion 6 sides. Penetrating hole 23, including an ink supply penetrating hole 22 and being larger than the ink supply penetrating hole 22, are formed in the lower electrode 11. The hydrogen barrier film 14 enters into gaps between the penetrating hole 23, in the lower electrode 11, and the ink supply penetrating holes 22. The ink supply penetrating holes 22 are in communication with the ink inflow portions 6.

The protective substrate 4 is constituted, for example, of a silicon substrate. The protective substrate 4 is disposed above the actuator substrate 2 so as to cover the piezoelectric elements 9. The protective substrate 4 is bonded to the passivation film 21 via an adhesive 50. The protective substrate 4 has housing recesses 52 in a facing surface 51 that faces a front surface 2a of the actuator substrate 2. The piezoelectric elements 9 are housed inside the housing recesses 52. Further, the protective substrate 4 has formed therein ink supply passages 53 that are in communication with the ink supply penetrating holes 22. The ink supply passages 53 penetrate through the protective substrate 4. An ink tank (not shown) storing ink is disposed above the protective substrate 4.

Each piezoelectric element 9 is formed at a position facing a pressure chamber 7 across a movable film 10A. That is, the piezoelectric element 9 is formed to contact a front surface of the movable film 10A at the opposite side from the pressure chamber 7. Each pressure chamber 7 is filled with ink by the ink being supplied from the ink tank to the pressure chamber 7 through an ink supply passage 53, an ink supply penetrating hole 22, and an ink inflow portion 6. The movable film 10A defines a top surface portion of the pressure chamber 7 and faces the pressure chamber 7. The movable film 10A is supported by portions of the actuator substrate 2 at a periphery of the pressure chamber 7 and has flexibility enabling deformation in a direction facing the pressure chamber 7 (in other words, in the thickness direction of the movable film 10A).

The upper wirings 17 and the lower wiring 18 are connected to a drive circuit (not shown). Specifically, the pads 42 of the upper wirings 17 and the drive circuit are connected via a connecting metal member (not shown). As shall be described later, a pad 43 (see FIG. 18A) is connected to the lower wiring 18. The pad 43 of the lower wiring 18 and the drive circuit are connected via a connecting metal member (not shown). When a drive voltage is applied from the drive circuit to a piezoelectric element 9, the piezoelectric film 12 deforms due to an inverse piezoelectric effect. The movable film 10A is thereby made to deform together with the piezoelectric element 9 to bring about a volume change of the pressure chamber 7 and the ink inside the pressure chamber 7 is pressurized. The pressurized ink passes through the ink discharge passage 3b and is discharged as microdroplets from the discharge port 3c.

The arrangement of the inkjet printing head 1 shall now be described in more detail with reference to FIG. 18A to FIG. 21.

A plurality of the ink flow passages 5 (pressure chambers 7) are formed as stripes extending parallel to each other in the actuator substrate 2. The piezoelectric element 9 is disposed respectively in each of the plurality of ink flow passages 5. The ink supply penetrating holes 22 are provided respectively for each of the plurality of ink flow passages 5. The housing recesses 52 and the ink supply passages 53 in the protective substrate 4 are provided respectively for each of the plurality of ink flow passages 5.

The plurality of ink flow passages 5 are formed at equal intervals that are minute intervals (for example, of approximately 30 μm to 350 μm) in a width direction thereof. Each ink flow passage 5 is elongate along the ink flow direction 41. Each ink flow passage 5 is constituted of an ink inflow portion 6 in communication with an ink supply penetrating hole 22 and the pressure chamber 7 in communication with the ink inflow portion 6. In plan view, the pressure chamber 7 has an oblong shape that is elongate along the ink flow direction 41. That is, the top surface portion of the pressure chamber 7 has two side edges along the ink flow direction 41 and two end edges along a direction orthogonal to the ink flow direction 41. In plan view, the ink inflow portion 6 has substantially the same width as the pressure chamber 7. An inner surface of an end portion of the ink inflow portion 6 at an opposite side from the pressure chamber 7 is formed to a semicircle in plan view. The ink supply penetrating hole 22 is circular in plan view (see especially FIG. 18B).

Each piezoelectric element 9 has, in plan view, a rectangular shape that is long in a long direction of a pressure chamber 7 (movable film 10A). A length in a long direction of the piezoelectric element 9 is shorter than a length in the long direction of the pressure chamber 7 (movable film 10A). As shown in FIG. 18B, respective end edges along a short direction of the piezoelectric element 9 are disposed at inner sides at predetermined intervals respectively from respective corresponding end edges of the movable film 10A. Also, a width in the short direction of the piezoelectric element 9 is narrower than a width in a short direction of the movable film 10A. Respective side edges along the long direction of the piezoelectric element 9 are disposed at inner sides at predetermined intervals from respective corresponding side edges of the movable film 10A.

The lower electrode 11 is formed on substantially an entirety of the front surface of the movable film formation layer 10 (see especially FIG. 21). The lower electrode 11 is a common electrode used in common for the plurality of piezoelectric elements 9. The lower electrode 11 includes the main electrode portions 11A of rectangular shape in plan view that constitute the piezoelectric elements 9 and the extension portion 11B led out from the main electrode portions 11A in directions along the front surface of the movable film formation layer 10 to extend outside the peripheral edges of the top surface portions of the pressure chambers 7.

A length in a long direction of each main electrode portion 11A is shorter than the length in the long direction of each movable film 10A. Respective end edges of the main electrode portion 11A are disposed at inner sides at predetermined intervals respectively from the respective corresponding end edges of the movable film 10A. Also, a width in a short direction of the main electrode portion 11A is narrower than the width of the movable film 10A in the short direction. Respective side edges of the main electrode portion 10A are disposed at inner sides at predetermined intervals from the respective corresponding side edges of the movable film 10A. The extension portion 11B is a region of the entire region of the lower electrode 11 excluding the main electrode portions 11A.

In plan view, the upper electrodes 13 are formed to rectangular shapes of the same pattern as the main electrode portions 11A of the lower electrode 11. That is, a length in a long direction of each upper electrode 13 is shorter than the length in the long direction of each movable film 10A. Respective end edges of the upper electrode 13 are disposed at inner sides at predetermined intervals respectively from the respective corresponding end edges of the movable film 10A. Also, a width in a short direction of the upper electrode 13 is narrower than the width in the short direction of the movable film 10A. Respective side edges of the upper electrode 13 are disposed at inner sides at predetermined intervals from the respective corresponding side edges of the movable film 10A.

In plan view, the piezoelectric films 12 are formed to rectangular shapes of the same pattern as the upper electrodes 13. That is, a length in a long direction of each piezoelectric film 12 is shorter than the length in the long direction of each movable film 10A. Respective end edges of the piezoelectric film 12 are disposed at inner sides at predetermined intervals respectively from the respective corresponding end edges of the movable film 10A. Also, a width in a short direction of the piezoelectric film 12 is narrower than the width in the short direction of the movable film 10A. Respective side edges of the piezoelectric film 12 are disposed at inner sides at predetermined intervals from the respective corresponding side edges of the movable film 10A. A lower surface of the piezoelectric film 12 contacts an upper surface of the main electrode portion 11A of the lower electrode 11 and an upper surface of the piezoelectric film 12 contacts a lower surface of an upper electrode 13.

Each upper wiring 17 extends from an upper surface of one end portion of a piezoelectric element 9 and along an end surface of the piezoelectric element 9 continuous to the upper surface and extends further along a front surface of the extension portion 11B of the lower electrode 11 in a direction along the ink flow direction 41. The tip portion of the upper wiring 17 is disposed further downstream in the ink flow direction 41 than a downstream side end of the protective substrate 4. The pad openings 35 that expose central portions of tip portion front surfaces of the upper wirings 17 are formed in the passivation film 21. The pads 42 are provided on the passivation film 21 so as to cover the pad openings 35. The pads 42 are connected to the upper wirings 17 inside the pad openings 35. In plan view, the lower wiring 18 has a rectangular main wiring portion 18A that is long in a direction orthogonal to the ink flow direction 41 and a lead portion 18B extending along the ink flow direction 41 from one end portion of the main wiring portion 18A. A tip portion of the lead portion 18B is disposed further downstream in the ink flow direction 41 than the downstream side end of the protective substrate 4. The lower wiring 18 enters into the plurality of contact holes 34 and is connected to the extension portion 11B of the lower electrode 11 inside the contact holes 34. A pad opening 36 that exposes a central portion of a tip portion front surface of the lead portion 18B is formed in the passivation film 21. The pad 43 is provided above the passivation film 21 so as to cover the pad opening 36. The pad 43 is connected to the lead portion 18B inside the pad opening 36.

FIG. 24 is a bottom view of a main portion of the protective substrate as viewed from the actuator substrate side of the inkjet printing head.

As shown in FIG. 18A, FIG. 20, and FIG. 24, in the facing surface 51 of the protective substrate 4, the plurality of housing recesses 52 are formed in parallel at intervals in a direction orthogonal to the ink flow direction 41. In plan view, the plurality of housing recesses 52 are disposed at positions facing the plurality of pressure chambers 7. With respect to the respective housing recesses 52, the ink supply passages 53 are disposed at upstream sides in the ink flow direction 41. In plan view, each housing recess 52 is formed to a rectangular shape slightly larger than the pattern of the upper electrode 13 of the corresponding piezoelectric element 9. The corresponding piezoelectric element 9 is housed in each housing recess 52.

In plan view, the ink supply passages 53 of the protective substrate 4 have circular shapes of the same pattern as the ink supply penetrating holes 22 at the actuator substrate 2 side. In plan view, the ink supply passages 53 are matched with the ink supply penetrating holes 22.

In plan view, the dummy wirings 19 include first dummy wirings 19A of circular annular shapes that surround the ink supply passages 53 (ink supply penetrating holes 22).

Above the actuator substrate 2, the first dummy wirings 19A are disposed in regions facing regions of the facing surface 51 of the protective substrate 4 peripheral to the ink supply passages 53. A width of each first dummy wiring 19A (difference between an inner diameter and an outer diameter of each first dummy wiring 19A) is preferably not less than ⅓ a diameter of each ink supply passage 53. Upper surfaces of the first dummy wirings 19A are flat. Each first dummy wiring 19A constitutes a base 20 that supports the protective substrate 4 and increases adhesion with the facing surface of the protective substrate 4.

The dummy wirings 19 further include second dummy wirings 19B of elongate rectangular shapes that are formed at width central portions of regions between adjacent pressure chambers 7 and at outward sides of the pressure chambers 7 at respective outer sides of the set of plurality of pressure chambers and extend in the direction along the ink flow direction 41. Upper surfaces of the second dummy wirings 19B are flat. Each second dummy wiring 19B constitutes a base that supports the protective substrate 4 and increases adhesion with the facing surface of the protective substrate 4.

In bonding the protective substrate 4 to the actuator substrate 2, the protective substrate 4 is pressed against the actuator substrate 2 in a state where an adhesive 50 is coated on a portion of bonding of the actuator substrate 2 and the protective substrate 4. In this process, the facing surface 51 of the protective substrate 4 is pressed via the passivation film 21 against the first dummy wirings 19A and the second dummy wirings 19B that are bases with flat upper surfaces. The facing surface 51 of the protective substrate 4 is thus bonded firmly via the passivation film 21 and the adhesive 50 to the upper surfaces of the first dummy wirings 19A and the second dummy wirings 19B. Defective adhesion is thus made unlikely to occur at the portion of bonding of the facing surface 51 of the actuator substrate 2 and the protective substrate 4.

In the present preferred embodiment, by the first dummy wirings 19A (bases 20) of circular annular shapes surrounding the ink supply passages 53 (ink supply penetrating holes 22) being provided at the actuator substrate 2 side, occurrence of defective bonding between lower surfaces of wall portions of the protective substrate 4 between the housing recesses 52 and the ink supply passages 53 and the actuator substrate 2 can be suppressed. Leakage of ink into a housing recess 52 from an ink supply passage 53 can thereby be suppressed.

Figure 22:
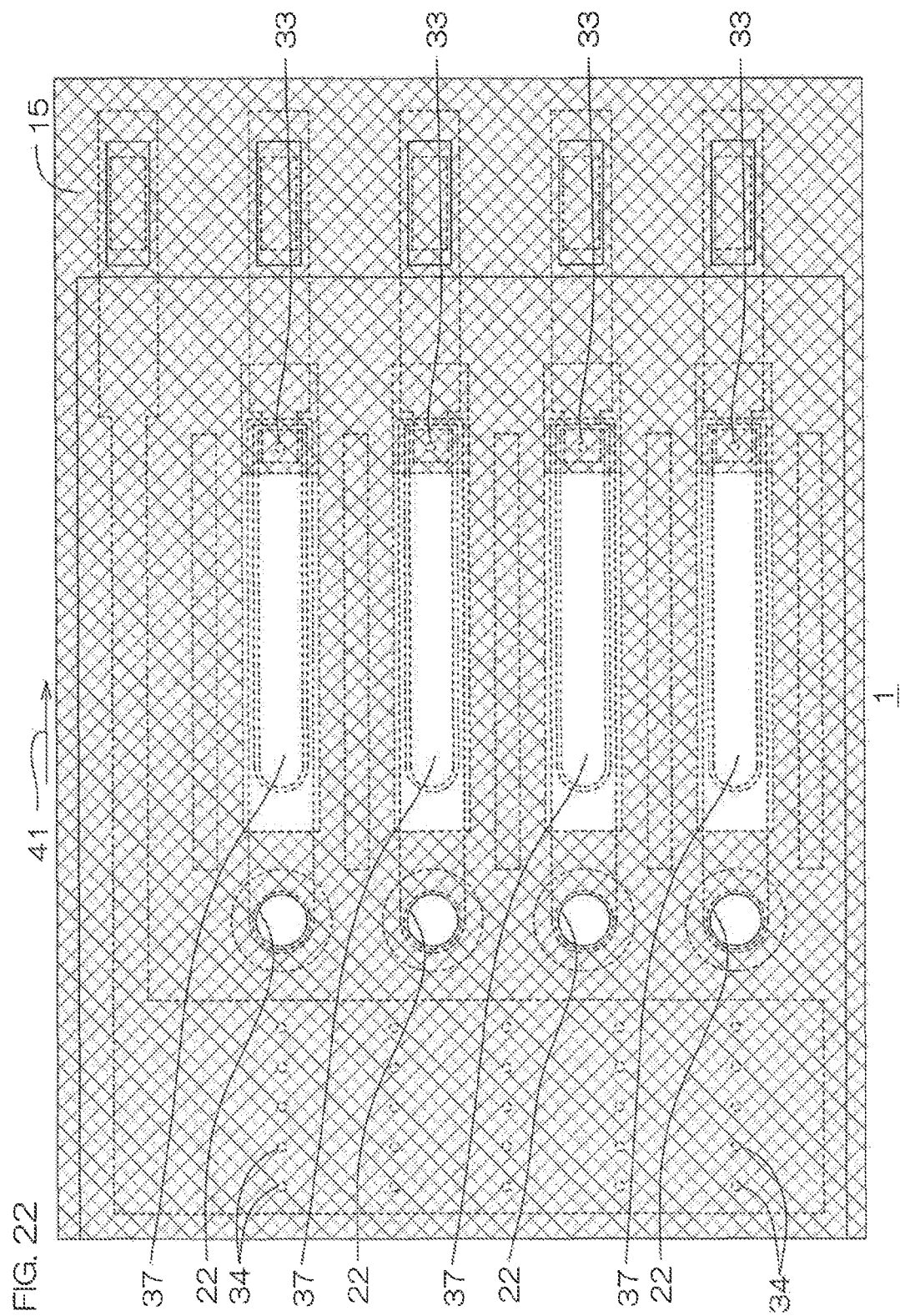
FIG. 22 is an illustrative plan view of a pattern example of an insulating film of the inkjet printing head of FIG. 18A.
Figure 23:
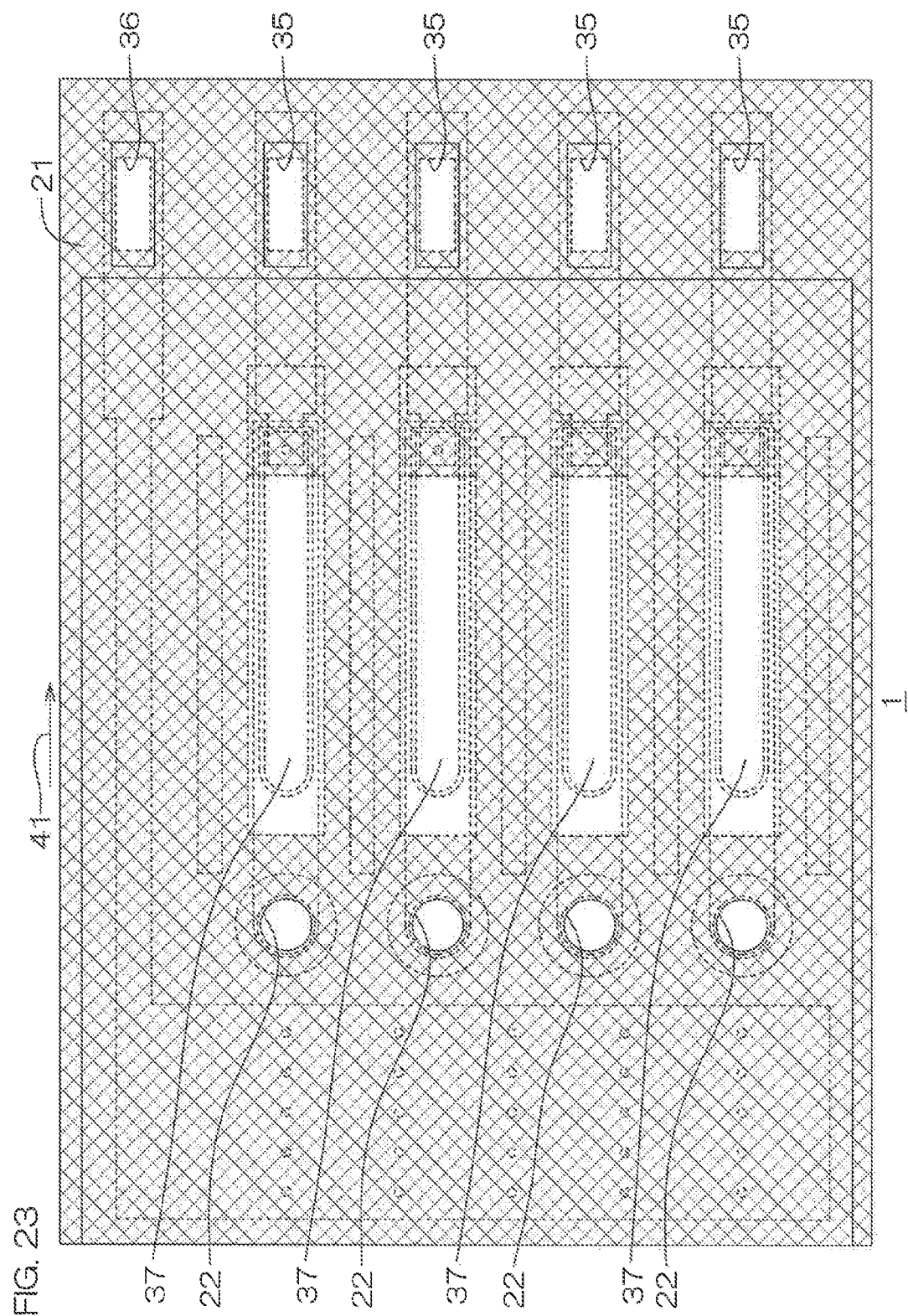
FIG. 23 is an illustrative plan view of a pattern example of a passivation film of the inkjet printing head of FIG. 18A.

FIG. 22 is an illustrative plan view of a pattern example of the insulating film of the inkjet printing head. FIG. 23 is an illustrative plan view of a pattern example of the passivation film of the inkjet printing head.

In the present preferred embodiment, above the actuator substrate 2, the insulating film 15 and the passivation film 21 are formed on substantially an entirety of a region of the protective substrate 4 outside the housing recesses 52 in plan view. However, in this region, the ink supply penetrating holes 22 and the contact holes 34 are formed in the insulating film 15. In this region, the ink supply penetrating holes 22 and the pad openings 35 and 36 are formed in the passivation film 21.

In the regions of the protective substrate 4 inside the housing recesses 52, the insulating film 15 and the passivation film 21 are formed just in one end portions (upper wiring regions) in which the upper wirings 17 are present. In each of these regions, the passivation film 21 is formed to cover an upper surface and a side surface of an upper wiring 17 above the insulating film 15. In other words, in the insulating film 15 and the passivation film 21, openings 37 are formed in regions, within the inner side regions of the housing recesses 52 in plan view, that exclude the upper wiring regions. The contact holes 33 are further formed in the insulating film 15.

In the present preferred embodiment, in a region at the inner side of the peripheral edge of each pressure chamber 7 in plan view, the insulating film 15 and the passivation film 21 are formed just in the upper wiring region in which an upper wiring 17 is present. Therefore, most of the side surface and the upper surface of each piezoelectric element 9 are not covered by the insulating film 15 and the passivation film 21. Displacement of each movable film 10A can thereby be increased in comparison to a case where entireties of the side surface and the upper surface of the piezoelectric element 9 are covered by the insulating film and the passivation film.

FIG. 25A to FIG. 25M are sectional views of an example of a manufacturing process of the inkjet printing head 1 and show a section corresponding to FIG. 19.

Figure 25A:
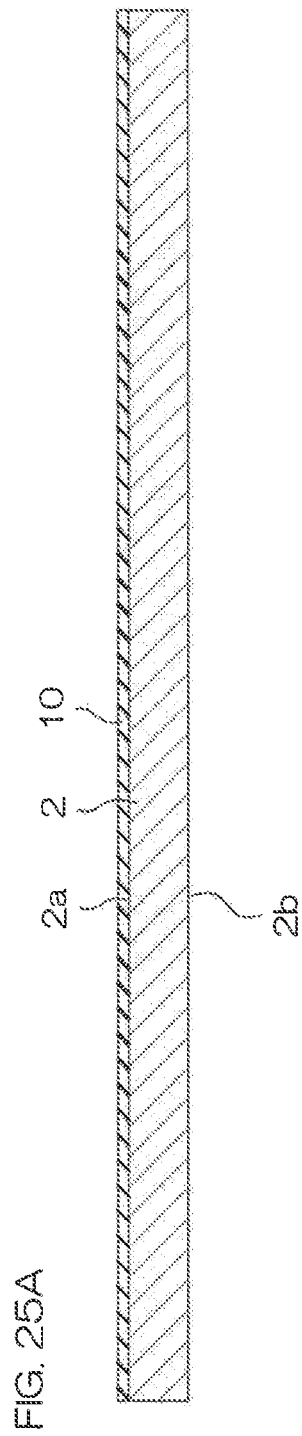
FIG. 25A is a sectional view of an example of a manufacturing process of the inkjet printing head of FIG. 18A.

First, as shown in FIG. 25A, the movable film formation layer 10 is formed on the front surface 2a of the actuator substrate 2. However, as the actuator substrate 2, that which is thicker than the thickness of the actuator substrate 2 at the final stage is used. Specifically, a silicon oxide film (for example, of 1.2 μm thickness) is formed on the front surface of the actuator substrate 2. If the movable film formation layer 10 is constituted of a laminated film of a silicon film, a silicon oxide film, and a silicon nitride film, the silicon film (for example, of 0.4 μm thickness) is formed on the front surface of the actuator substrate 2, the silicon oxide film (for example, of 0.4 μm thickness) is formed above the silicon film, and the silicon nitride film (for example, of 0.4 μthickness) is formed above the silicon oxide film.

A base oxide film, for example, of $Al_2O_3$, MgO, or $ZrO_2$, etc., may be formed on the front surface of the movable film formation layer 10. Such base oxide films prevent metal atoms from escaping from the piezoelectric film 12 to be formed later. When metal atoms escape, the piezoelectric film 12 may degrade in piezoelectric characteristics. Also, when metal atoms that have escaped become mixed in the silicon layer constituting each movable film 10A, the movable film 10A may degrade in durability.

Figure 25B:
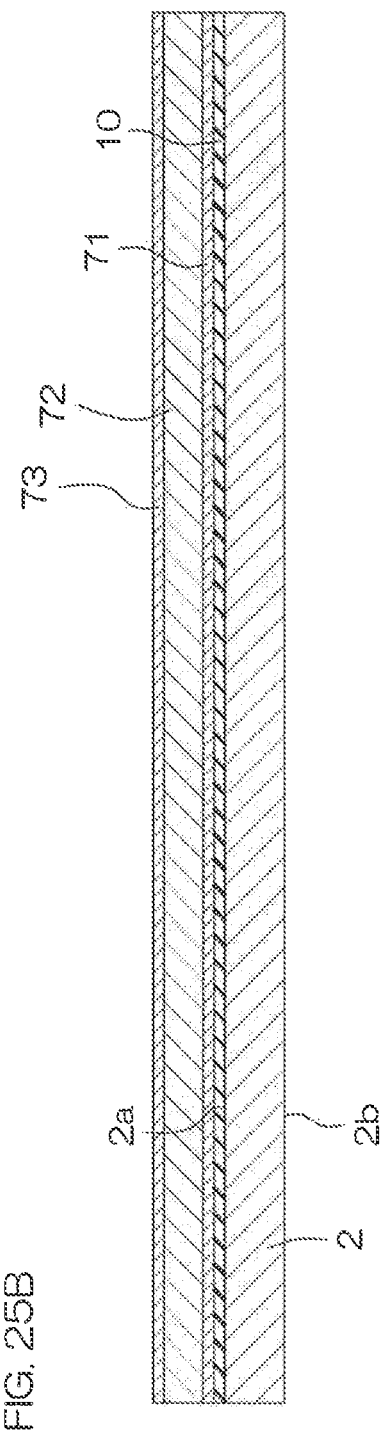
FIG. 25B is a sectional view of a step subsequent to that of FIG. 25A.

Next, a lower electrode film 71, which is a material layer of the lower electrode 11, is formed above the movable film formation layer 10 (above the base oxide film in the case where the base oxide film is formed) as shown in FIG. 25B. The lower electrode film 71 is constituted, for example, of a Pt/Ti laminated film having a Ti film (for example, of 10 nm to 40 nm thickness) as a lower layer and a Pt film (for example, of 10 nm to 400 nm thickness) as an upper layer. Such a lower electrode film 71 may be formed by the sputtering method.

Next, a material film (piezoelectric material film) 72 of the piezoelectric film 12 is formed on an entire surface above the lower electrode film 71. Specifically, for example, the piezoelectric material film 72 of 1 µm to 3 µm thickness is formed by a sol-gel method. Such a piezoelectric material film 72 is constituted of a sintered body of metal oxide crystal grains.

Next, an upper electrode film 73, which is a material of the upper electrodes 13, is formed on the entire surface of the piezoelectric material film 72. The upper electrode film 73 may, for example, be a single film of platinum (Pt). The upper electrode film 73 may, for example, be an $IrO_2/Ir$ laminated film having an $IrO_2$ film (for example, of 40 nm to 160 nm thickness) as a lower layer and an Ir film (for example, of 40 nm to 160 nm thickness) as an upper layer. Such an upper electrode film 73 may be formed by the sputtering method.

Figure 25C:
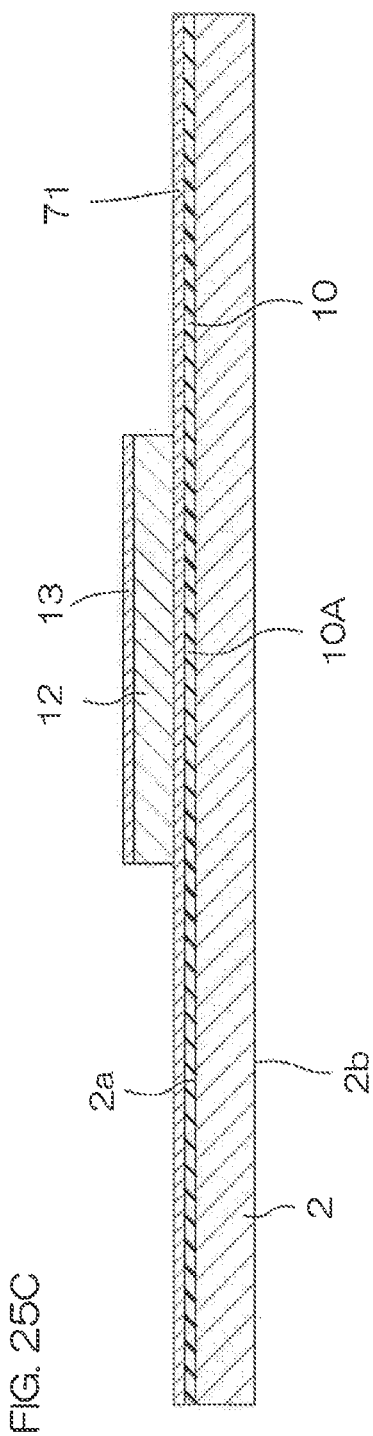
FIG. 25C is a sectional view of a step subsequent to that of FIG. 25B.
Figure 25D:
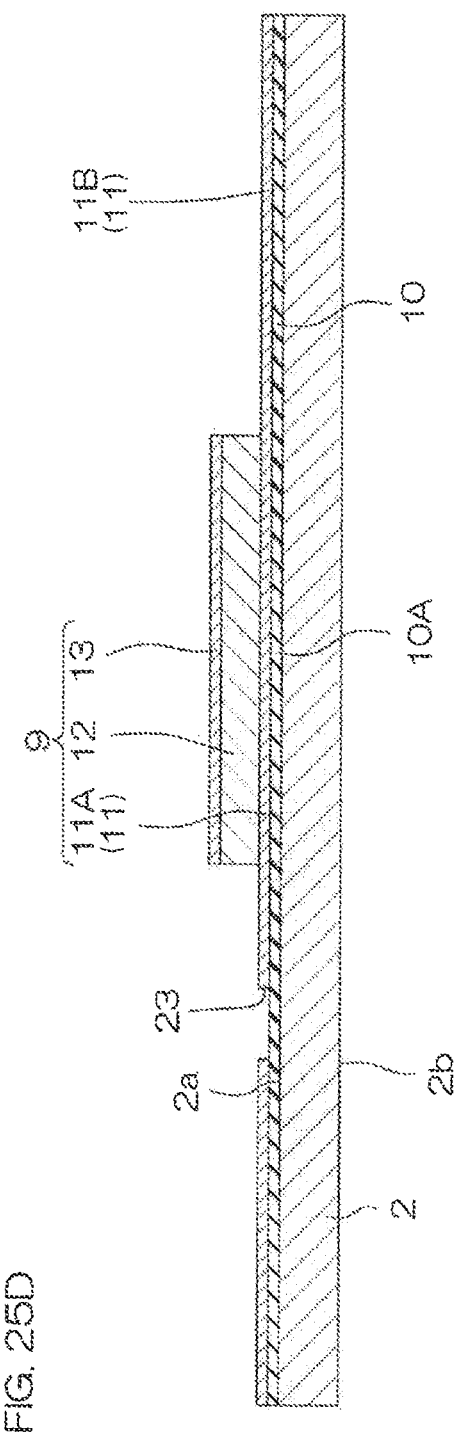
FIG. 25D is a sectional view of a step subsequent to that of FIG. 25C.

Next, as shown in FIG. 25C and FIG. 25D, patterning of the upper electrode film 73, the piezoelectric material film 72, and the lower electrode film 71 is performed. First, a resist mask with a pattern of the upper electrodes 13 is formed by photolithography. Then, as shown in FIG. 25C, the upper electrode film 73 and the piezoelectric material film 72 are etched successively using the resist mask as a mask to form the upper electrodes 13 and the piezoelectric films 12 of the predetermined pattern.

Next, after peeling off the resist mask, a resist mask with a pattern of the lower electrode 11 is formed by photolithography. Then, as shown in FIG. 25D, the lower electrode film 71 is etched using the resist mask as a mask to form the lower electrode 11 of the predetermined pattern. The lower electrode 11, constituted of the main electrode portions 11A and the extension portion 11B having the penetrating holes 23, is thereby formed. The piezoelectric elements 9, each constituted of a main electrode portion 11A of the lower electrode 11, a piezoelectric film 12, and an upper electrode 13, are thereby formed.

Next, after peeling off the resist mask, the hydrogen barrier film 14 covering the entire surface is formed as shown in FIG. 25E. The hydrogen barrier film 14 may be an $Al_2O_3$ film formed by the sputtering method and may have a film thickness of 50 nm to 100 nm. Thereafter, the insulating film 15 is formed above the entire surface of the hydrogen barrier film 14. The insulating film 15 may be an $SiO_2$ film and may have a film thickness of 200 nm to 300 nm. Next, the contact holes 33 and 34 are formed by successively etching the insulating film 15 and the hydrogen barrier film 14.

Figure 25F:
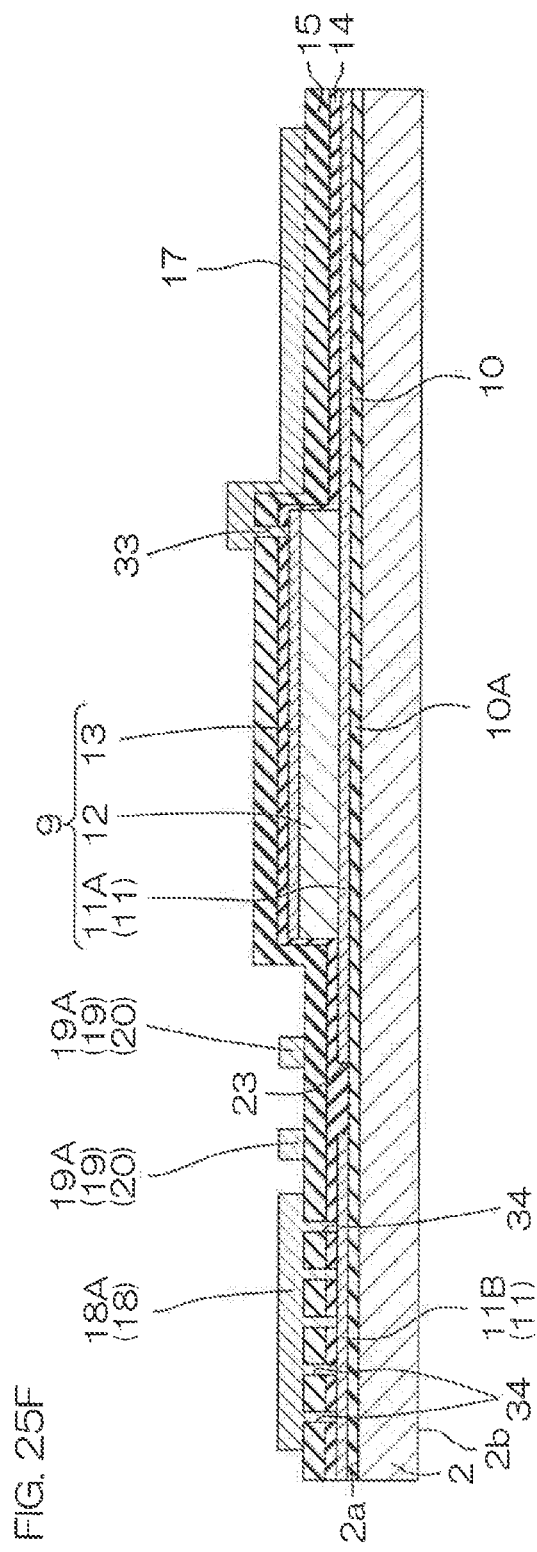
FIG. 25F is a sectional view of a step subsequent to that of FIG. 25E.

Next, as shown in FIG. 25F, a wiring film that constitutes the upper wirings 17, the lower wiring 18, and the dummy wirings 19 (19A, 19B) is formed by the sputtering method above the insulating film 15 as well as inside the contact holes 33 and 34. Thereafter, the wiring film is patterned by photolithography and etching to form the upper wirings 17, the lower wiring 18, and the dummy wirings 19 (19A, 19B) at the same time.

Figure 25G:
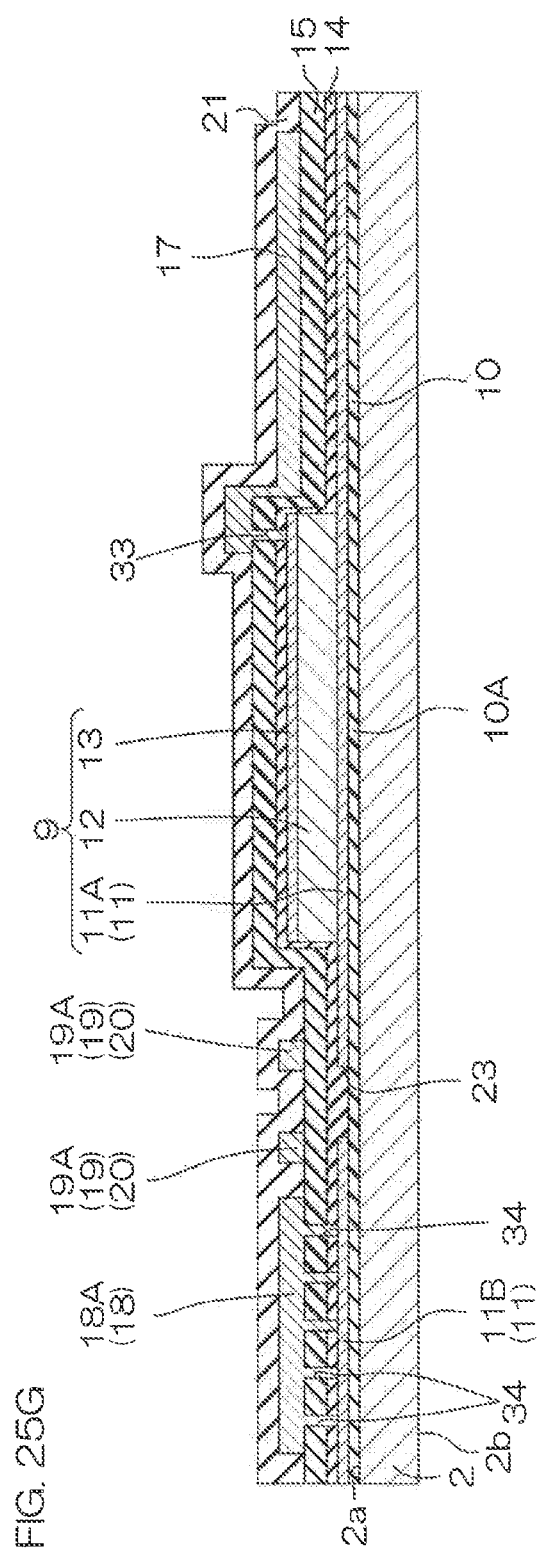
FIG. 25G is a sectional view of a step subsequent to that of FIG. 25F.

Next, as shown in FIG. 25G, the passivation film 21 that covers the wirings 17, 18, and 19 is formed on the front surface of the insulating film 15. The passivation film 21 is constituted, for example, of SiN. The passivation film 21 is formed, for example, by plasma CVD.

Next, a resist mask, having openings corresponding to the pad openings 35 and 36, is formed by photolithography, and the passivation film 21 is etched using the resist mask as a mask. The pad openings 35 and 36 are thereby formed in the passivation film 21 as shown in FIG. 25H. After the resist mask is peeled off, the pads 42 and 43, respectively connected to the upper wirings 17 and the lower wiring 18 via the pad openings 35 and the pad opening 36, are formed above the passivation film 21.

A resist mask having openings corresponding to the openings 37 and the ink supply penetrating holes 22 is then formed by photolithography, and using the resist mask as a mask, the passivation film 21 and the insulating film 15 are etched successively. The openings 37 and the ink supply penetrating holes 22 are thereby formed in the passivation film 21 and the insulating film 15 as shown in FIG. 25I.

Figure 25J:
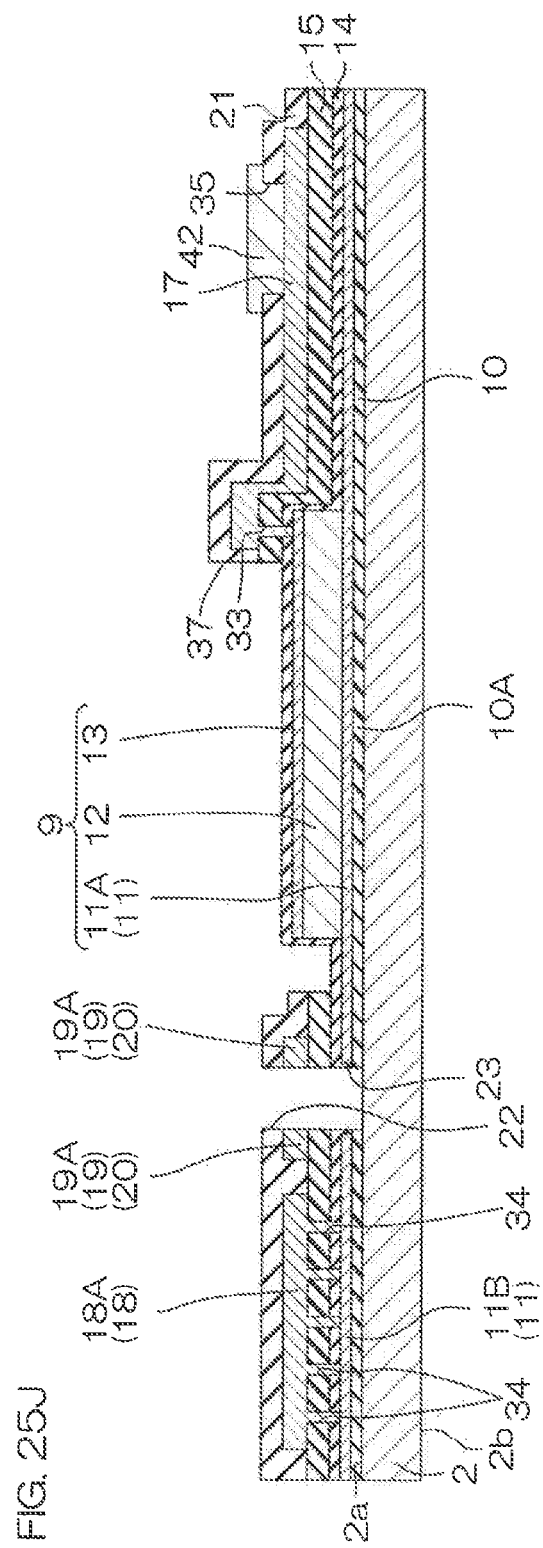
FIG. 25J is a sectional view of a step subsequent to that of FIG. 25I.

Next, the resist mask is peeled off. A resist mask having openings corresponding to the ink supply penetrating holes 22 is then formed by photolithography, and the hydrogen barrier film 14 and the movable film formation layer 10 are etched using the resist mask as a mask. The ink supply penetrating holes 22 are thereby formed in the hydrogen barrier film 14 and the movable film formation layer 10 as shown in FIG. 25J.

Figure 25K:
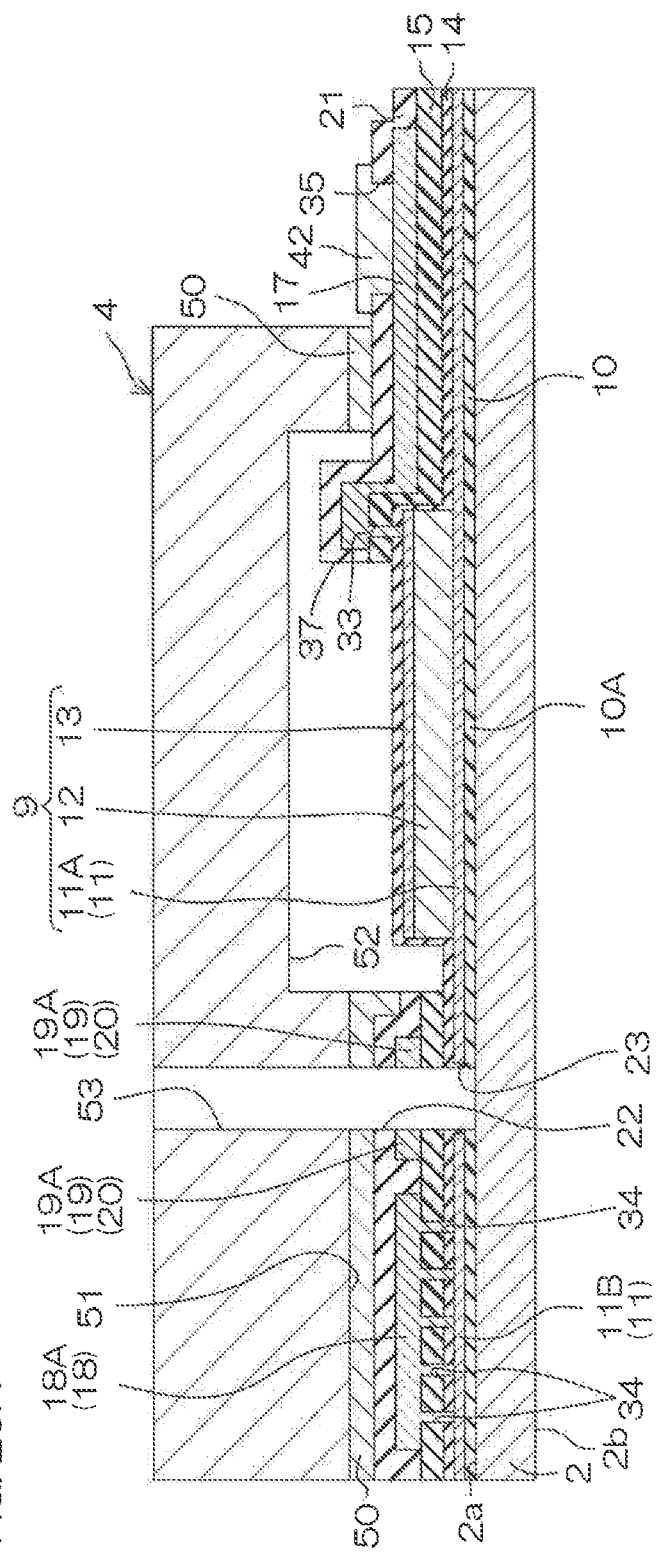
FIG. 25K is a sectional view of a step subsequent to that of FIG. 25J.

Next, as shown in FIG. 25K, an adhesive 50 is coated onto the facing surface 51 of the protective substrate 4 and the protective substrate 4 is fixed onto the actuator substrate 2 so that the ink supply passages 53 and the ink supply penetrating holes 22 are matched. In this process, the facing surface 51 of the protective substrate 4 is pressed via the passivation film 21 against the first dummy wirings 19A and the second dummy wirings 19B that are bases with flat upper surfaces. The facing surface 51 of the protective substrate 4 is thus bonded firmly via the passivation film 21 and the adhesive 50 to the upper surfaces of the first dummy wirings 19A and the second dummy wirings 19B.

Figure 25L:
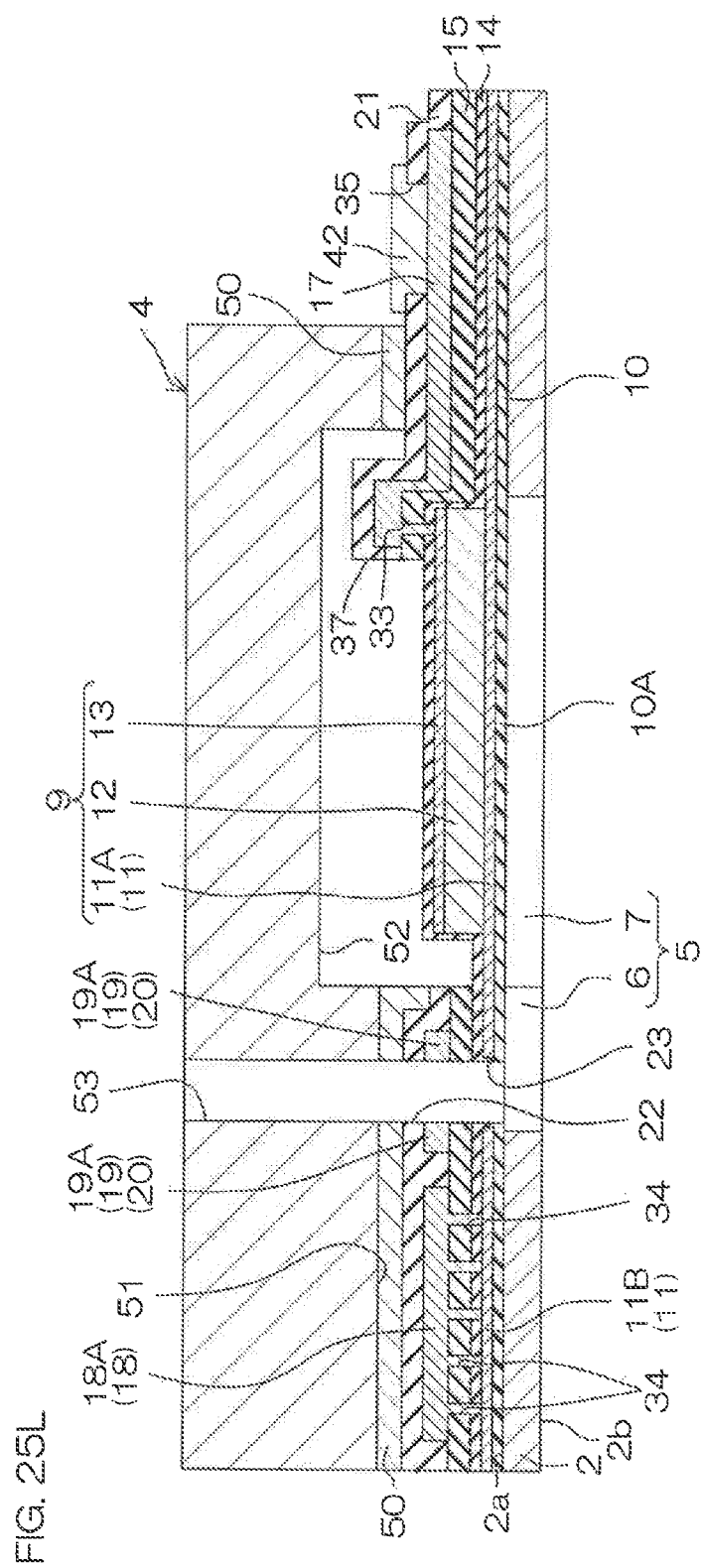
FIG. 25L is a sectional view of a step subsequent to that of FIG. 25K.

Next, as shown in FIG. 25L, rear surface grinding for thinning the actuator substrate 2 is performed. The actuator substrate 2 is made thin by the actuator substrate 2 being ground from the rear surface 2b. For example, the actuator substrate 2 with a thickness of approximately 670 µm in the initial state may be thinned to a thickness of approximately 300 µm. Next, etching (dry etching or wet etching) from the rear surface of the actuator substrate 2 is performed on the actuator substrate 2 to form the ink flow passages 5 (the ink inflow portions 6 and the pressure chambers 7).

In the etching process, the base oxide film formed on the front surface of the movable film formation layer 10 prevents the escaping of metal elements (Pb, Zr, and Ti in the case of PZT) from the piezoelectric film 12 and keeps the piezoelectric characteristics of the piezoelectric film 12 in a satisfactory state. Also as mentioned above, the base oxide film formed on the front surface of the movable film formation layer 10 contributes to maintaining the durability of the silicon layer that forms each movable film 10A.

Figure 25M:
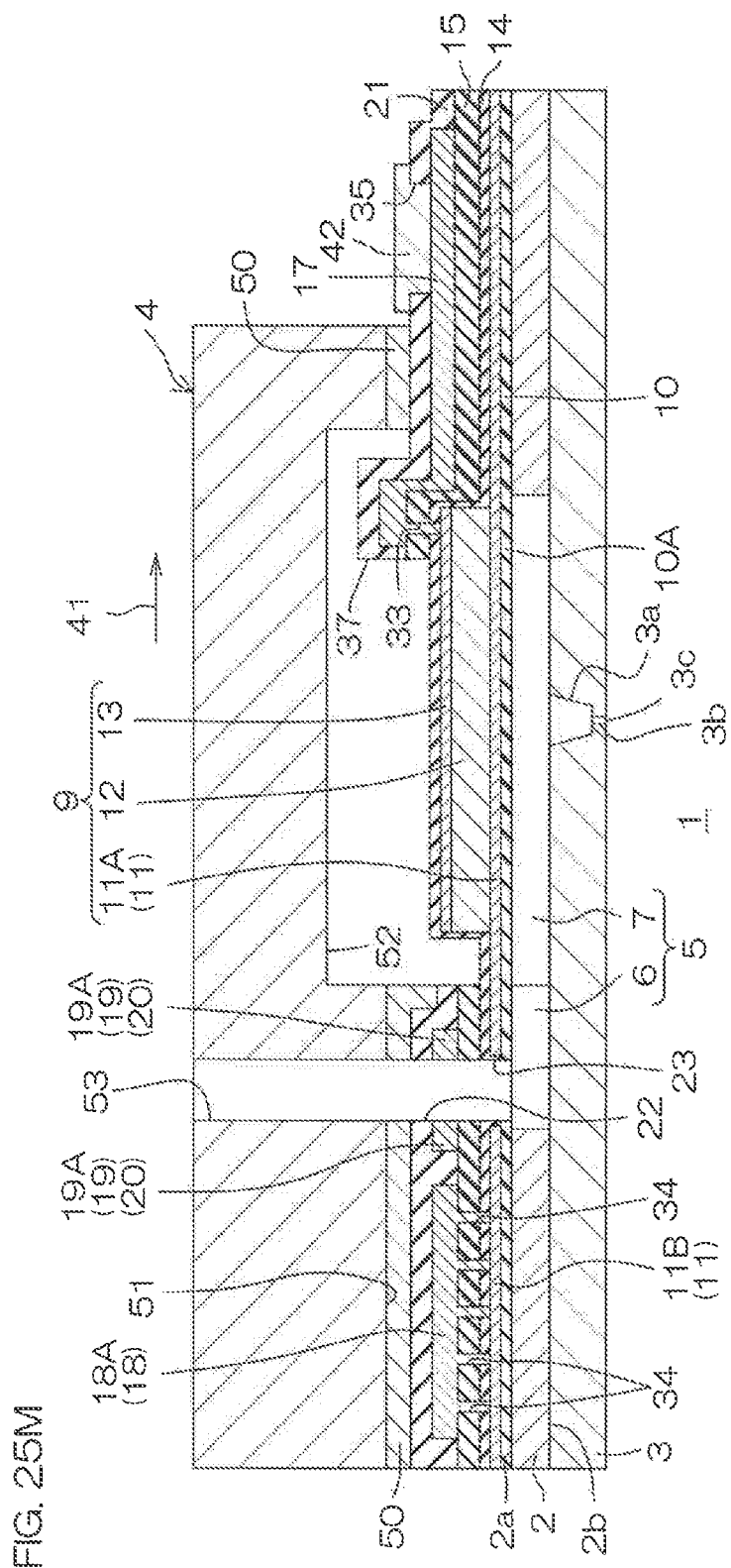
FIG. 25M is a sectional view of a step subsequent to that of FIG. 25L.

Thereafter, as shown in FIG. 25M, the nozzle substrate 3 is adhered onto the rear surface of the actuator substrate 2 and the inkjet printing head 1 is thereby obtained.

Figure 26A:
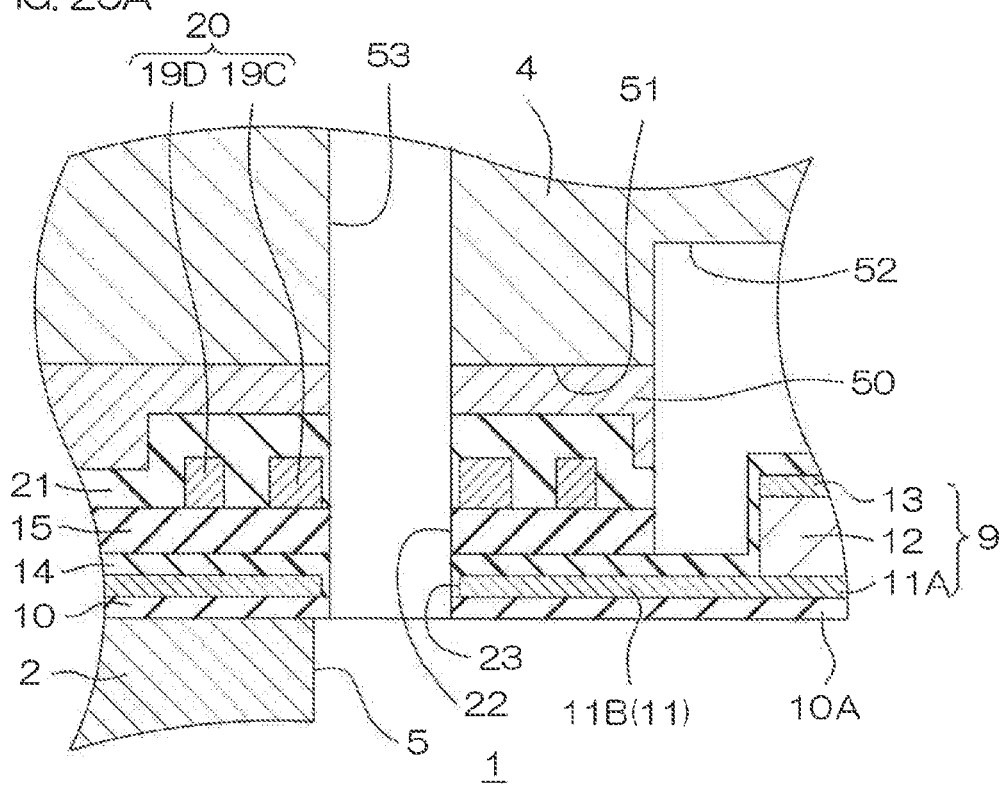
FIG. 26A is a partial sectional view of a first modification example of a base.
Figure 26B:
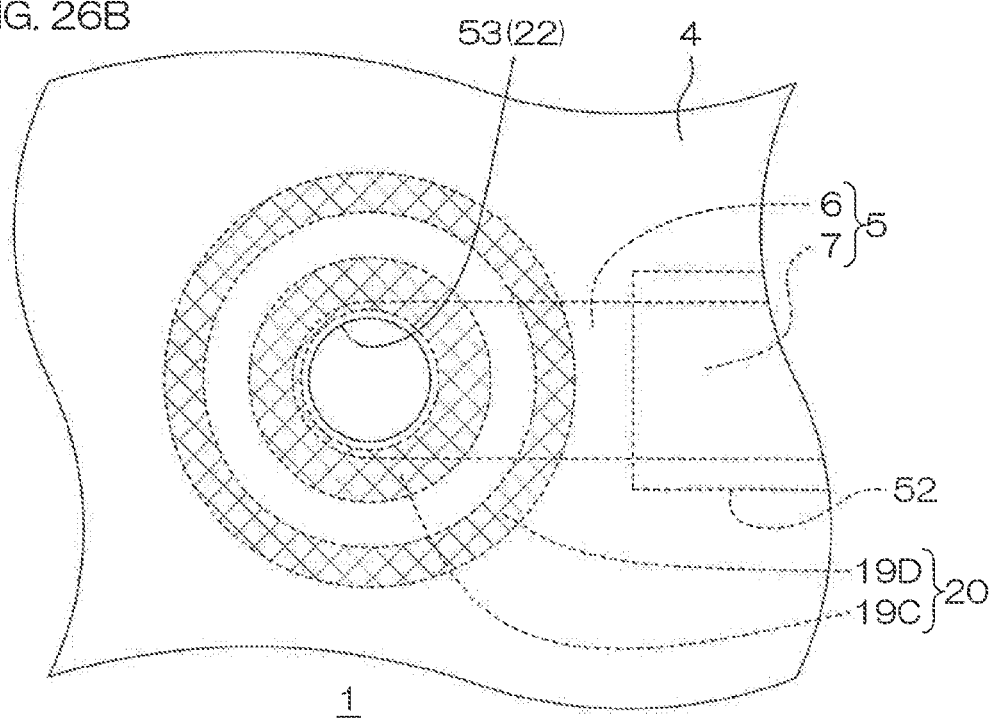
FIG. 26B is a partial plan view of the first modification example of the base.

FIG. 26A is a partial sectional view of a first modification example of a base. FIG. 26B is a partial plan view of the first modification example of the base.

A base 20 according to the first modification example is constituted, in plan view, of a third dummy wiring portion 19C with a circular annular shape surrounding the ink supply passage 53 and a fourth dummy wiring portion 19D with a circular annular shape formed so as to surround the third dummy wiring portion 19C. The fourth dummy wiring portion 19D is disposed at an interval from the third dummy wiring portion 19C.

Figure 27:
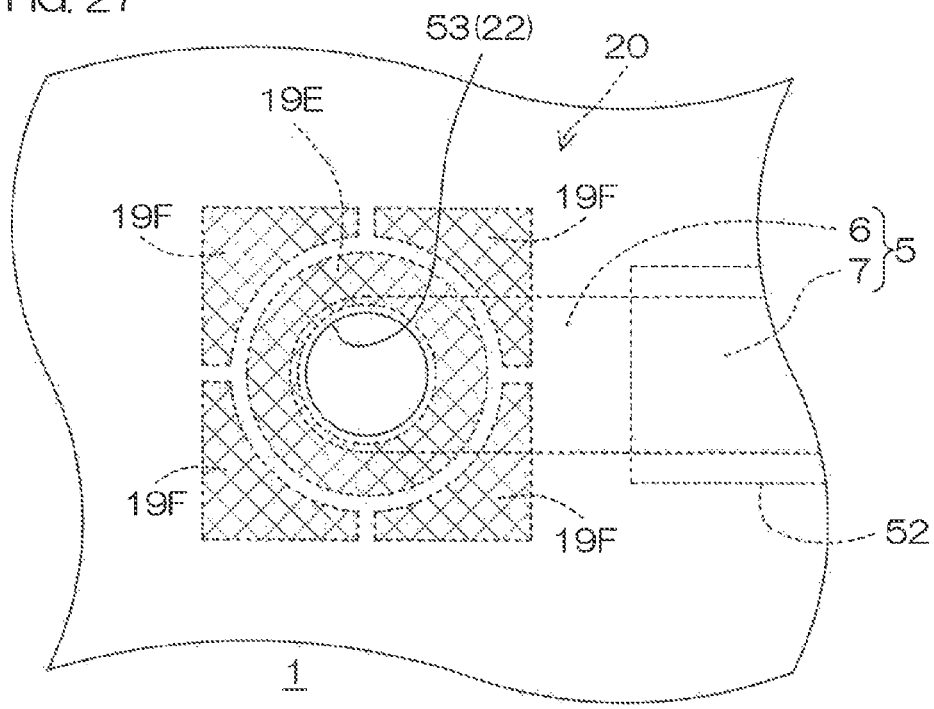
FIG. 27 is a partial plan view of a second modification example of a base.

FIG. 27 is a partial plan view of a second modification example of a base.

A base 20 according to the second modification example is constituted, in plan view, of a fifth dummy wiring portion 19E with a circular annular shape surrounding the ink supply passage 53 and four sixth dummy wiring portions 19F formed so as to surround the fifth dummy wiring portion 19E. The plurality of sixth dummy wiring portions 19F have nearly triangular shapes corresponding to respective corner portions of a square of a size encompassing the fifth dummy wiring portion 19E in plan view. Each sixth dummy wiring portion 19F is disposed at an interval from the fifth dummy wiring portion 19E.

Figure 28:
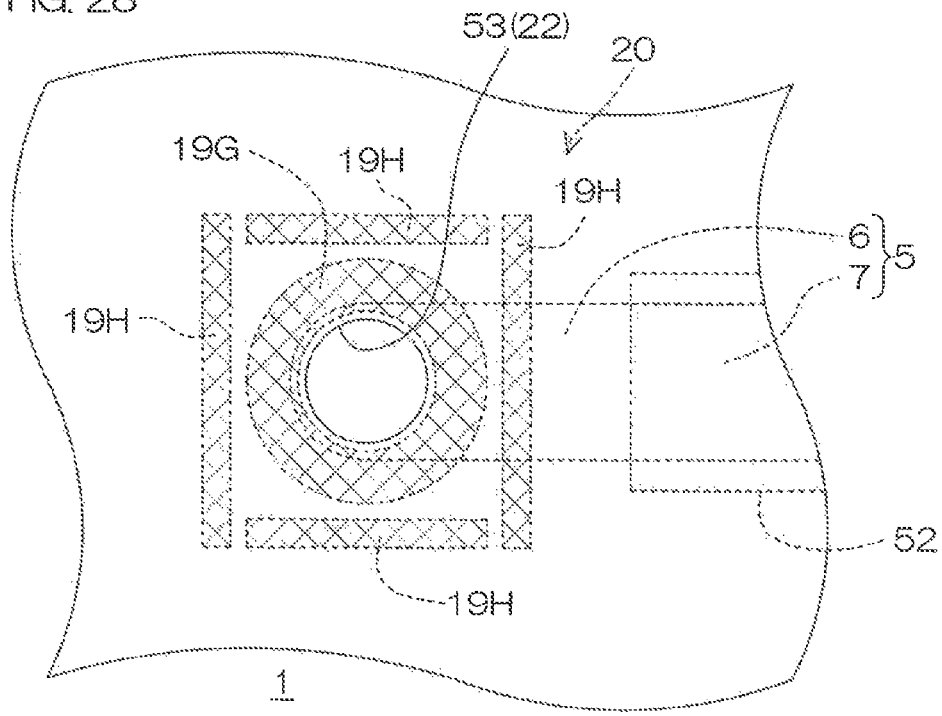
FIG. 28 is a partial plan view of a third modification example of a base.

FIG. 28 is a partial plan view of a third modification example of a base.

A base 20 according to the third modification example is constituted, in plan view, of a seventh dummy wiring portion 19G with a circular annular shape surrounding the ink supply passage 53 and four eighth dummy wiring portions 19H formed so as to surround the seventh dummy wiring portion 19G. The plurality of eighth dummy wiring portions 19H have elongate rectangular shapes corresponding to respective sides of a square of a size encompassing the seventh dummy wiring portion 19G in plan view. Each eighth dummy wiring portion 19H is disposed at an interval from the seventh dummy wiring portion 19G.

Figure 29A:
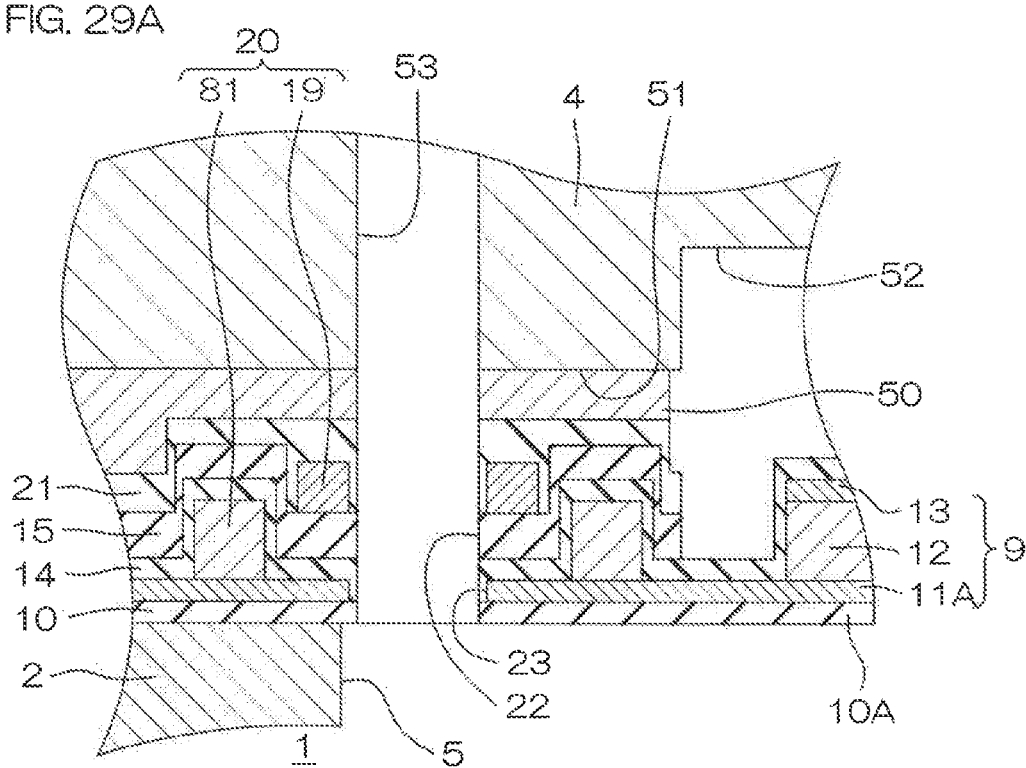
FIG. 29A is a partial sectional view of a fourth modification example of a base.
Figure 29B:
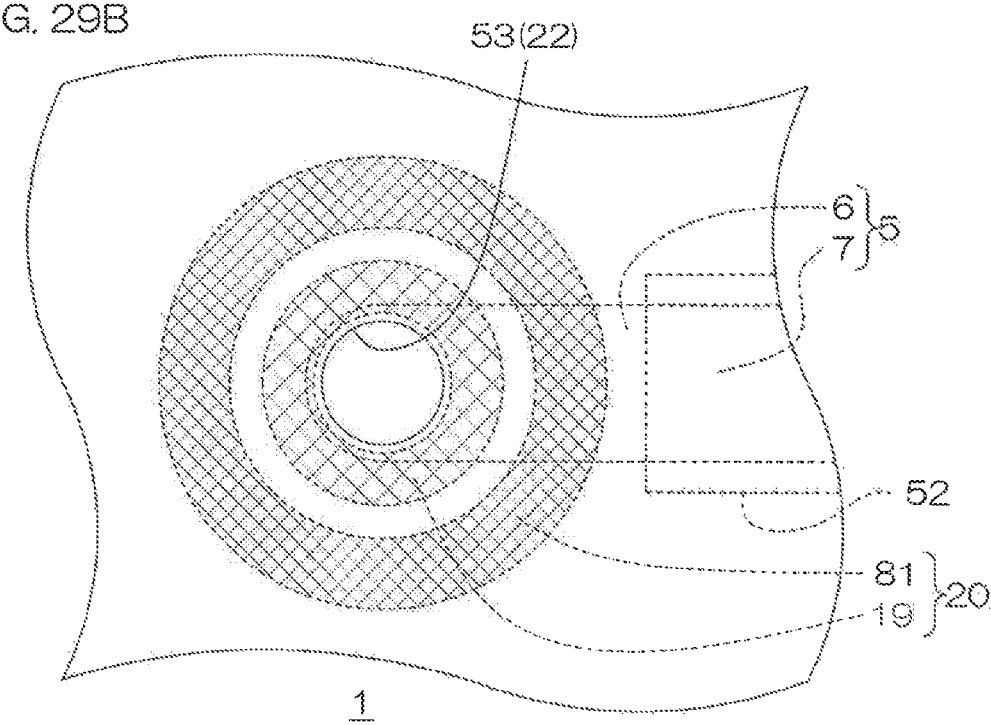
FIG. 29B is a partial plan view of the fourth modification example of the base.

FIG. 29A is a partial sectional view of a fourth modification example of a base. FIG. 29B is a partial plan view of the fourth modification example of the base.

A base 20 according to the fourth modification example is constituted, in plan view, of a ninth dummy wiring portion 19I with a circular annular shape surrounding the ink supply passage 53 and a dummy piezoelectric film 81 having a circular annular shape formed so as to surround the ninth dummy wiring portion 19I. The dummy piezoelectric film 81 is disposed at an interval from the ninth dummy wiring portion 19I. The dummy piezoelectric film 81 is formed of the same material as the piezoelectric film 12. The dummy piezoelectric film 81 is formed in the same step as the step of forming the piezoelectric film 12. That is, the dummy piezoelectric film 81 is formed by patterning a piezoelectric material film. The base 20 may instead be constituted of just the circular annular dummy piezoelectric film 81 that surrounds the ink supply passage 53.

Figure 30A:
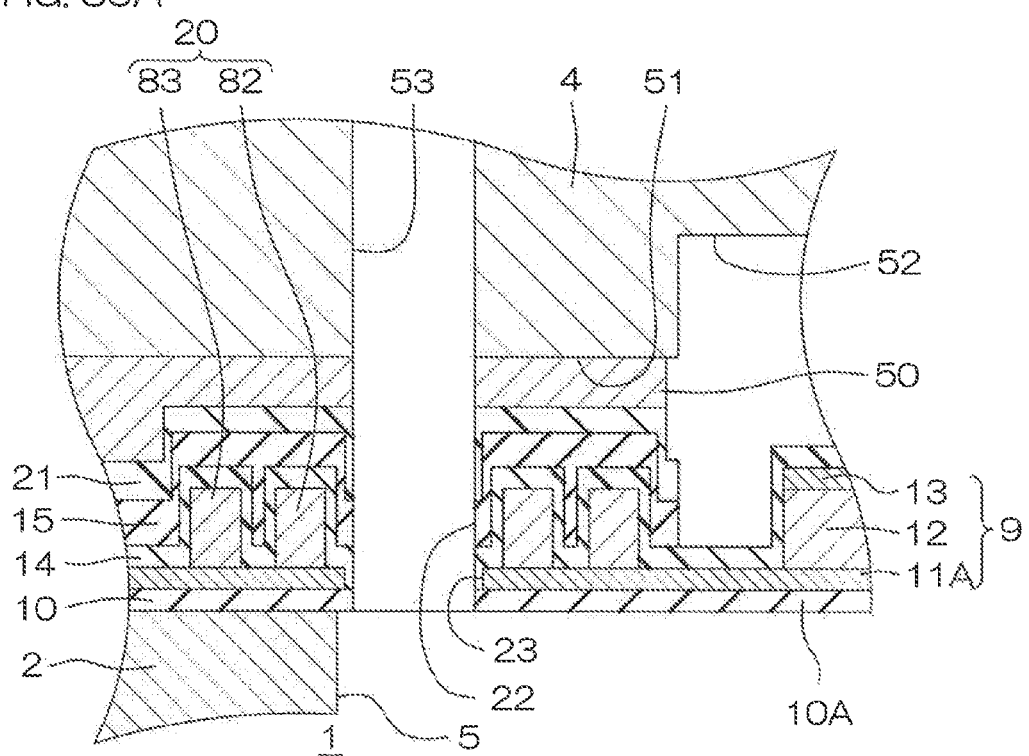
FIG. 30A is a partial sectional view of a fifth modification example of a base.
Figure 30B:
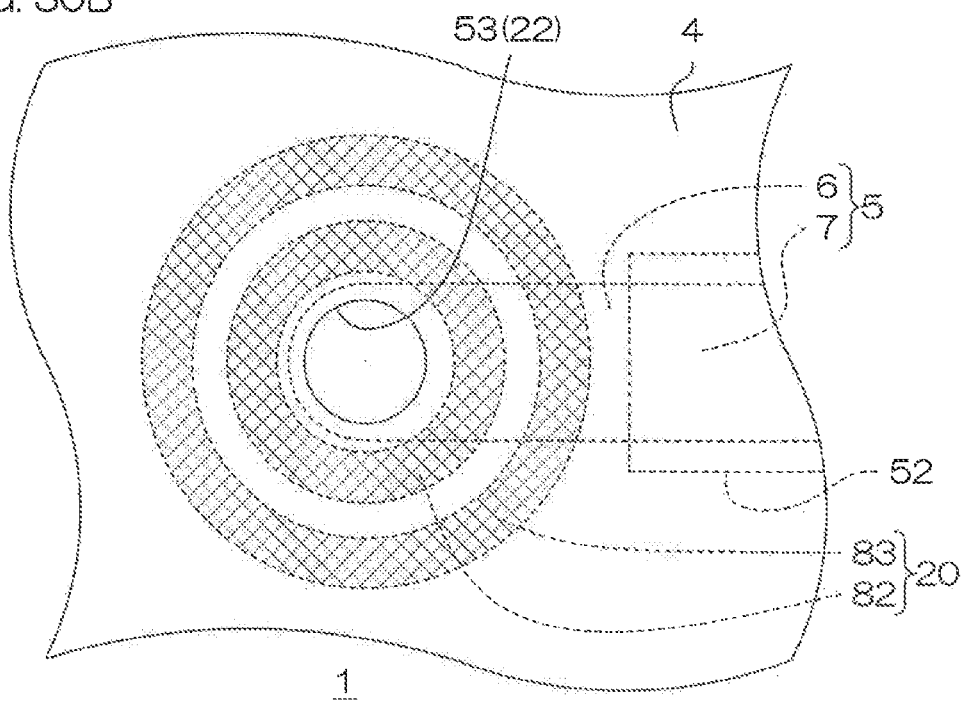
FIG. 30B is a partial plan view of the fifth modification example of the base.

FIG. 30A is a partial sectional view of a fifth modification example of a base. FIG. 30B is a partial plan view of the fifth modification example of the base.

A base 20 according to the fifth modification example is constituted, in plan view, of a first dummy piezoelectric film 82 with a circular annular shape surrounding the ink supply passage 53 and a second dummy piezoelectric film 83 having a circular annular shape formed so as to surround the first dummy piezoelectric film 82. The second dummy piezoelectric film 83 is disposed at an interval from the first dummy piezoelectric film 82. The first dummy piezoelectric film 82 and the second dummy piezoelectric film 83 are formed of the same material as the piezoelectric film 12. The first dummy piezoelectric film 82 and the second dummy piezoelectric film 83 are formed in the same step as the step of forming the piezoelectric film 12.

Although a preferred embodiment of the present invention has been described above, the present invention may be implemented in yet other preferred embodiments. Although in the preferred embodiment described above, the insulating film 15 is formed on a portion of the front surface of the hydrogen barrier film 14, the insulating film 15 may instead be formed on the entirety of the front surface of the hydrogen barrier film 14.

Also, although in the preferred embodiment described above, the insulating film 15 is formed on a portion of the front surface of the hydrogen barrier film 14, the insulating film 15 may be omitted.

Also, although with the preferred embodiment described above, PZT was cited as an example of the material of the piezoelectric film, a piezoelectric material besides this that is constituted of a metal oxide as represented by lead titanate ($PbPO_3$), potassium niobate ($KNbO_3$), nothium niobate ($LiNbO_3$), lithium tantalate ($LiTaO_3$), etc., may be applied instead.

[4] Fourth Invention

Japanese Patent Application Publication No. 2013-119182 discloses an inkjet printing head that uses a piezoelectric element. The inkjet printing head of Japanese Patent Application Publication No. 2013-119182 includes an actuator substrate having a pressure chamber (cavity), a movable film supported by the actuator substrate so as to face the pressure chamber, and a piezoelectric element bonded to the movable film. The piezoelectric element is arranged by laminating a lower electrode, a piezoelectric film, and an upper electrode in that order from the movable film side. An entirety of an upper surface and an entirety of a side surface of the piezoelectric element are covered by a hydrogen barrier film constituted of alumina ($Al_2O_3$). An insulating film (interlayer insulating film), constituted of $SiO_2$, is formed above the hydrogen barrier film and a passivation film (surface protective film), constituted of SiN, is formed above the insulating film.

Also, above the piezoelectric element, a contact hole, exposing a portion of the upper electrode, is formed in the hydrogen barrier film and the insulating film. An upper wiring, having one end portion connected to the upper electrode via the contact hole and another end portion being led out to an outer side of the piezoelectric element, is formed above the insulating film.

With the arrangement described in Japanese Patent Application Publication No. 2013-119182, the upper wiring connected to the upper electrode is formed as follows. That is, after forming the piezoelectric element above the movable film, the hydrogen barrier film and the insulating film are formed and the contact hole, exposing a portion of the upper electrode, is formed in the hydrogen barrier film and the insulating film. Next, the upper wiring, having the one end portion connected to the upper electrode via the contact hole and the other end portion being led out to the outer side of the piezoelectric element, is formed.

An object of a fourth invention is to provide a device using a piezoelectric element and a method for manufacturing the same with which forming of an upper wiring is made easy.

The fourth invention has the following features.

C1. A device using a piezoelectric element including a cavity, a movable film formation layer including a movable film disposed above the cavity and defining a top surface portion of the cavity, a piezoelectric element, formed above the movable film and including a lower electrode, a piezoelectric film formed above the lower electrode, and an upper electrode formed above the piezoelectric film, and a first upper wiring, which is formed above the movable film formation layer in a region outside a peripheral edge of the top surface portion of the cavity in a plan view of viewing from a direction normal to a major surface of the movable film, and the upper electrode includes a main electrode portion constituting the piezoelectric element and an extension portion led out from the main electrode portion and serving as a second upper wiring connected to the first upper wiring.

With the present arrangement, an upper wiring, constituted of the first upper wiring and the extension portion (second upper wiring) of the upper electrode, can be formed by forming the lower electrode and the first upper wiring above the movable film formation layer and thereafter forming the piezoelectric element above the movable film formation layer. Forming of the upper wiring is thus made easy.

C2. The device using the piezoelectric element according to "C1.," where, in the plan view, the piezoelectric element has a peripheral edge that is receded further toward an interior of the cavity than the movable film and the piezoelectric film includes an active portion constituting the piezoelectric element and an inactive portion led out from the active portion and extending to above the first upper wiring, the main electrode portion of the upper electrode is formed above the active portion, and the extension portion of the upper electrode extends along a front surface of the inactive portion to above the first upper wiring.

With the present arrangement, insulation between the lower electrode and the extension portion (second upper wiring) of the upper electrode is maintained because the inactive portion is interposed between the lower electrode and the extension portion (second upper wiring) of the upper electrode.

C3. The device using the piezoelectric element according to "C1.," where the top surface portion of the cavity is, in the plan view, a rectangle that is long in one predetermined direction, the first upper wiring, in the plan view, is disposed further to the outside than one end of the top surface portion of the cavity, the piezoelectric element is, in the plan view, a rectangle that is long in the one direction and has a width shorter than a width in a short direction of the top surface portion of the cavity and a length shorter than a length in a long direction of the top surface portion of the cavity, with both end edges and both side edges thereof being respectively receded further toward the interior of the cavity than both end edges and both side edges of the top surface portion of the cavity, the piezoelectric film includes an active portion constituting the piezoelectric element and an inactive portion extending, in the plan view, from one end at the first upper wiring side of the active portion, across the corresponding one end of the top surface portion of the cavity, and to above the first upper wiring, the main electrode portion of the upper electrode is formed above the active portion, the extension portion of the upper electrode extends along the front surface of the inactive portion to above the first upper wiring, and the lower electrode, in the plan view, is not present below the extension portion of the upper electrode at the outside of the one end of the top surface portion of the cavity.

With the present arrangement, insulation between the lower electrode and the extension portion (second upper wiring) of the upper electrode is maintained more satisfactorily.

C4. The device using the piezoelectric element according to any one of "C1." to "C3.," where the lower electrode includes a main electrode portion constituting the piezoelectric element and an extension portion led out from the main electrode portion in a direction along a front surface of the movable film formation layer and extending across the top surface portion peripheral edge of the cavity to outside the cavity in the plan view and in the plan view, the main electrode portion is included in an inner electrode region of the lower electrode located further inward than the top surface portion peripheral edge of the cavity and the extension portion includes an outer electrode region of the lower electrode connected to the inner electrode region and located further outward than the top surface portion peripheral edge of the cavity.

C5. The device using the piezoelectric element according to "C4.," further including a hydrogen barrier film, covering at least entireties of side surfaces of the upper electrode and the piezoelectric film and covering an upper surface of the first upper wiring and an upper surface of the lower electrode and where a first pad opening, exposing a portion of the first upper wiring, and a second pad opening, exposing a portion of the outer electrode region of the lower electrode, are formed in the hydrogen barrier film, and an upper pad, connected via the first pad opening to the first upper wiring, and a lower pad, connected via the second pad opening to the outer electrode region of the lower electrode, are formed above the hydrogen barrier film.

C6. The device using the piezoelectric element according to "C5.," where both the upper pad and the lower pad are constituted of Au.

C7. The device using the piezoelectric element according to "C5." or "C6.," where a plurality of contact holes, each exposing a portion of the outer electrode region of the lower electrode, are formed in the hydrogen barrier film and a metal film, connected via the plurality of contact holes to the outer electrode region of the lower electrode, is formed above the hydrogen barrier film.

C8. The device using the piezoelectric element according to "C7.," where the metal film is constituted of Au.

C9. The device using the piezoelectric element according to any one of "C1." to "C8.," where the first upper wiring is formed in the same step as a step of forming the lower electrode.

C10. The device using the piezoelectric element according to any one of "C1." to "C9.," where the movable film formation layer is constituted of an $SiO_2$ single film.

C11. The device using the piezoelectric element according to any one of "C1." to "C9.," where the movable film formation layer is constituted of a laminated film of an Si film formed above the substrate, an $SiO_2$ film formed above the Si film, and an SiN film formed above the $SiO_2$ film.

C12. The device using the piezoelectric element according to any one of "C1." to "C11.," where the piezoelectric film is constituted of a PZT film.

C13. The device using the piezoelectric element according to any one of "C1." to "C12.," where the upper electrode is constituted of a Pt single film.

C14. The device using the piezoelectric element according to any one of "C1." to "C12.," where the upper electrode is constituted of a laminated film of an $IrO_2$ film formed above the piezoelectric film and an Ir film formed above the $IrO_2$ film.

C15. device using the piezoelectric element according to any one of "C1." to "C14.," where the lower electrode is constituted of a laminated film of a Ti film formed at the movable film side and a Pt film formed above the Ti film.

C16. A method for manufacturing a device using a piezoelectric element including a step of forming a movable film formation layer, including a movable film formation region, above a substrate in which a cavity is to be formed, a step of forming an electrode/wiring film above the movable film formation layer and thereafter patterning the electrode/wiring film to form a lower electrode and at the same time form a first upper wiring in an outer region of the movable film formation region, a step of forming piezoelectric material film above the movable film formation layer and thereafter patterning the piezoelectric material film to form a piezoelectric material film with a predetermined intermediate pattern, a step of forming an upper electrode film above the movable film formation layer and thereafter patterning the upper electrode film to form an upper electrode including a main electrode portion and an extension portion as a second upper wiring led out from the main electrode portion and connected to the first upper wiring, and a step of patterning the piezoelectric material film of the intermediate pattern to form a piezoelectric film including an active portion in contact with a lower surface of the main electrode portion of the upper electrode and an inactive portion extending along a lower surface of the extension portion of the upper electrode from the active portion to above the first upper wiring, and where, in the step of forming the piezoelectric film, a piezoelectric element is formed that includes the lower electrode, the main electrode portion of the upper electrode, and the active portion sandwiched thereby.

With the present method for manufacturing the device using the piezoelectric element, the forming of the upper wiring is made simple.

C17. The method for manufacturing the device using the piezoelectric element according to "C16.," where the lower electrode includes a main electrode portion in contact with a lower surface of the active portion and an extension portion led out from the main electrode portion of the lower electrode in a direction along a front surface of the movable film formation layer and extending across a top surface portion peripheral edge of the cavity to outside the cavity in the plan view and in the plan view, the main electrode portion is included in an inner electrode region of the lower electrode located further inward than the top surface portion peripheral edge of the cavity and the extension portion includes an outer electrode region of the lower electrode connected to the inner electrode region and located further outward than the top surface portion peripheral edge of the cavity.

C18. The method for manufacturing the device using the piezoelectric element according to "C17.," further including a step, after the step of forming the piezoelectric film, of forming, above the movable film formation layer, a hydrogen barrier film that covers the piezoelectric element, the lower electrode, and the first upper wiring, a step of forming, in the hydrogen barrier film, a first pad opening exposing a portion of the first upper wiring and a second pad opening exposing a portion of the outer electrode region of the lower electrode, and a step of forming, above the hydrogen barrier film, an upper pad connected via the first pad opening to the first upper wiring and a lower pad connected via the second pad opening to the outer electrode region of the lower electrode.

A preferred embodiment of the fourth invention shall now be described in detail with reference to FIG. 31A to FIG. 40H. The symbols in FIG. 31A to FIG. 40H are unrelated to the symbols in FIG. 1A to FIG. 8N used in the above description of the first invention, the symbols in FIG. 9A to FIG. 17O used in the above description of the second invention, and the symbols in FIG. 18A to FIG. 30B used in the above description of the third invention.

Figure 32:
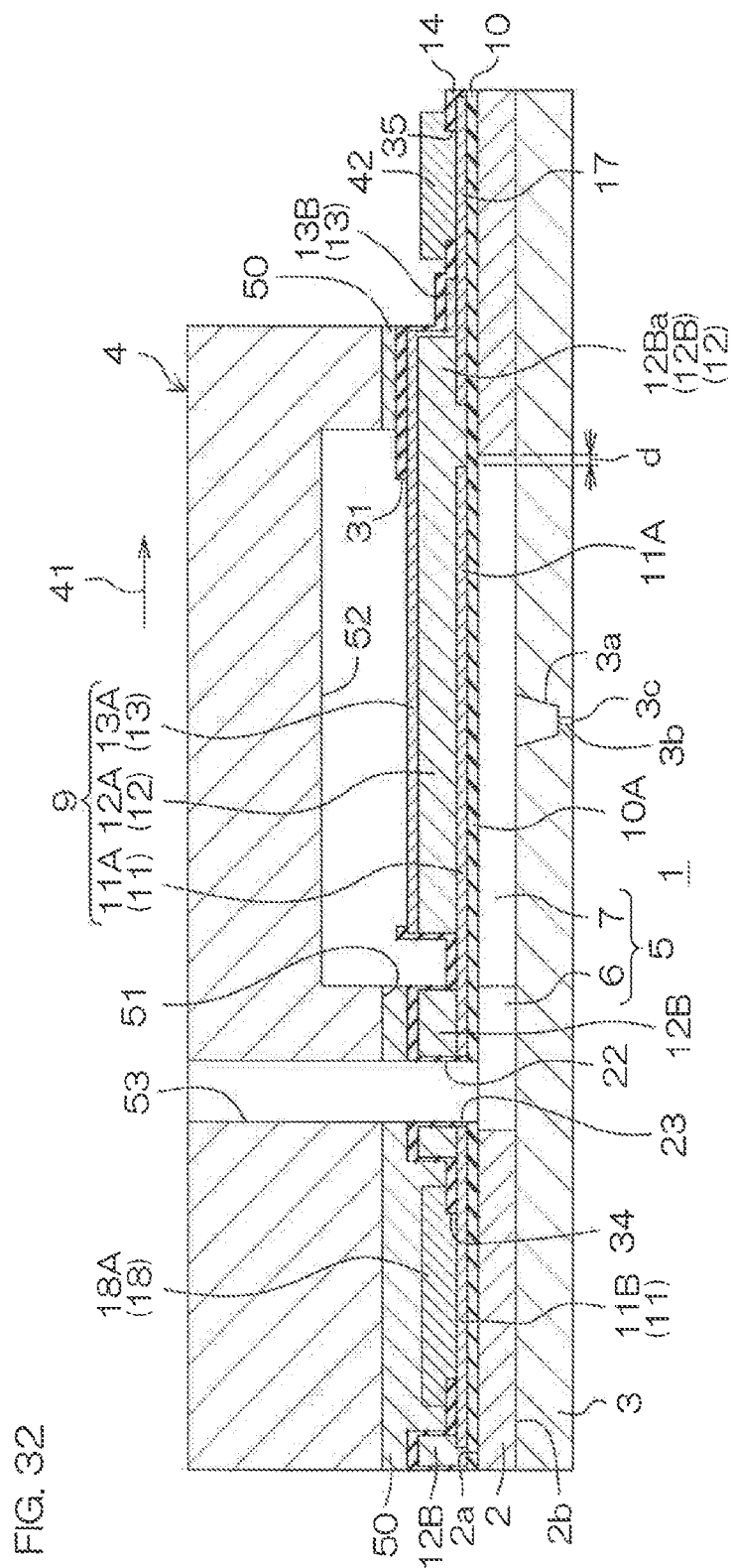
FIG. 32 is an illustrative sectional view taken along line XXXII-XXXII in FIG. 31A.
Figure 33:
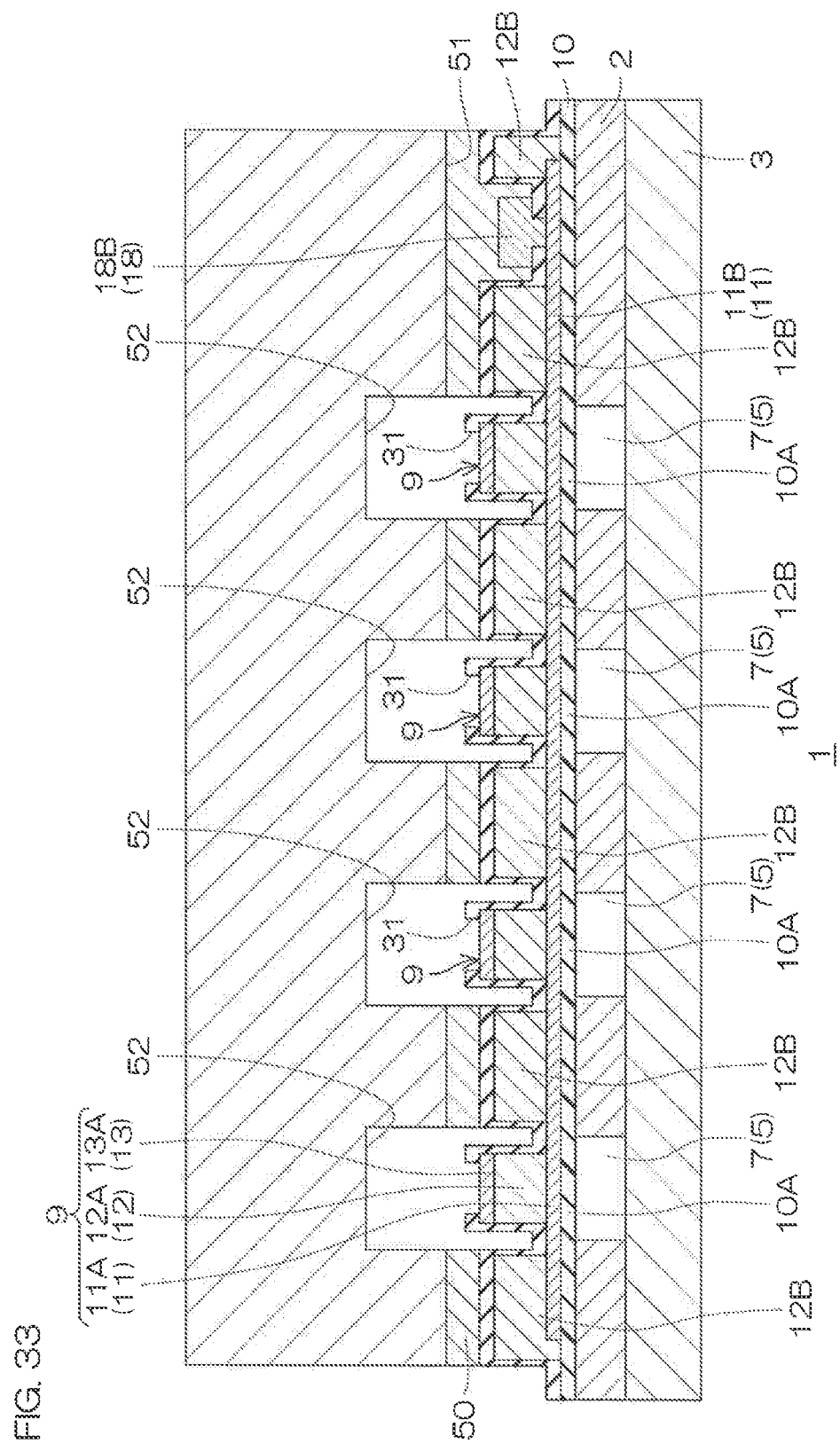
FIG. 33 is an illustrative enlarged sectional view of a portion of a section taken along line XXXIII-XXXIII in FIG. 31A.
Figure 34:
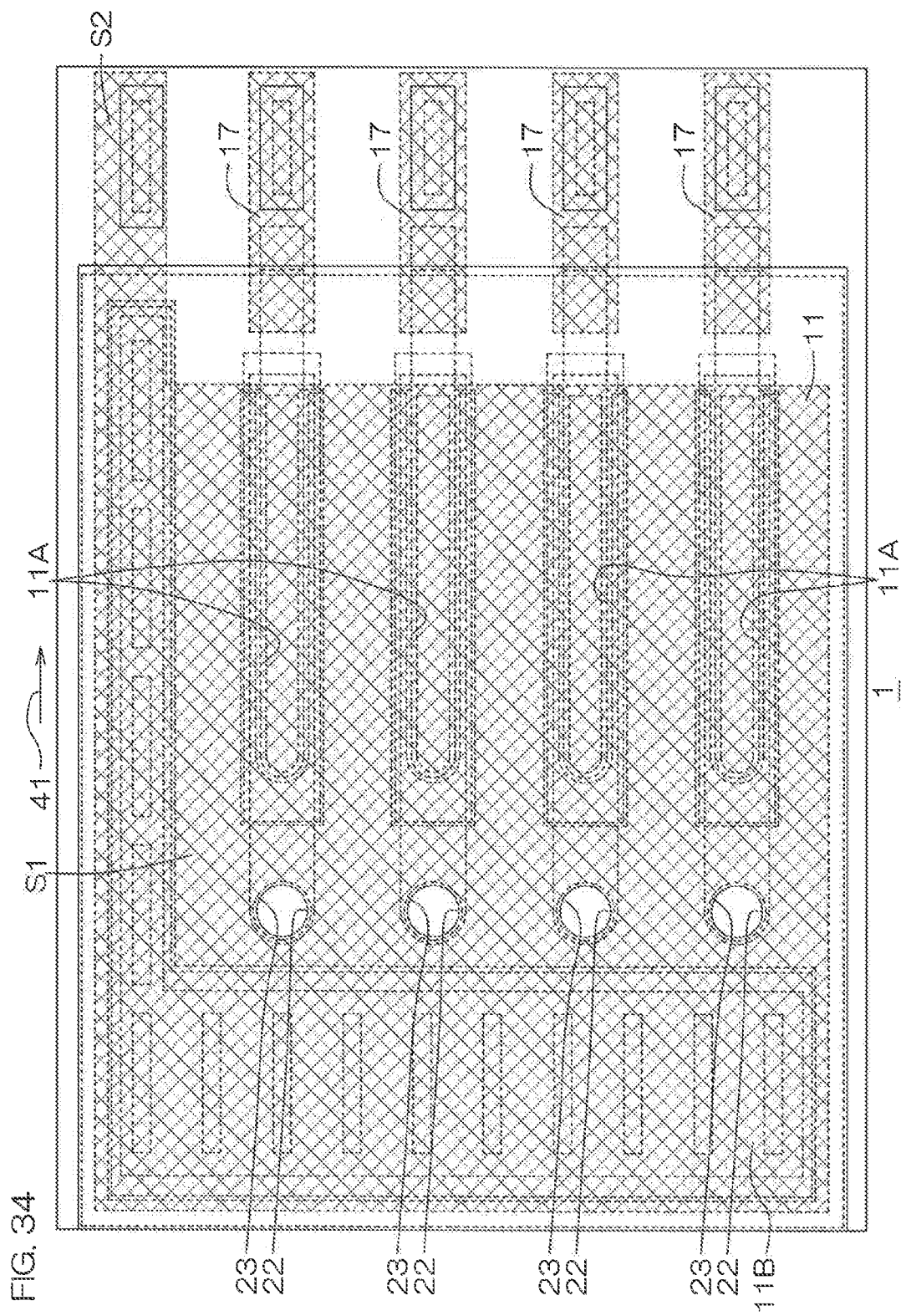
FIG. 34 is an illustrative plan view of a pattern example of a lower electrode and a first upper wiring of the inkjet printing head of FIG. 31A.
Figure 35:
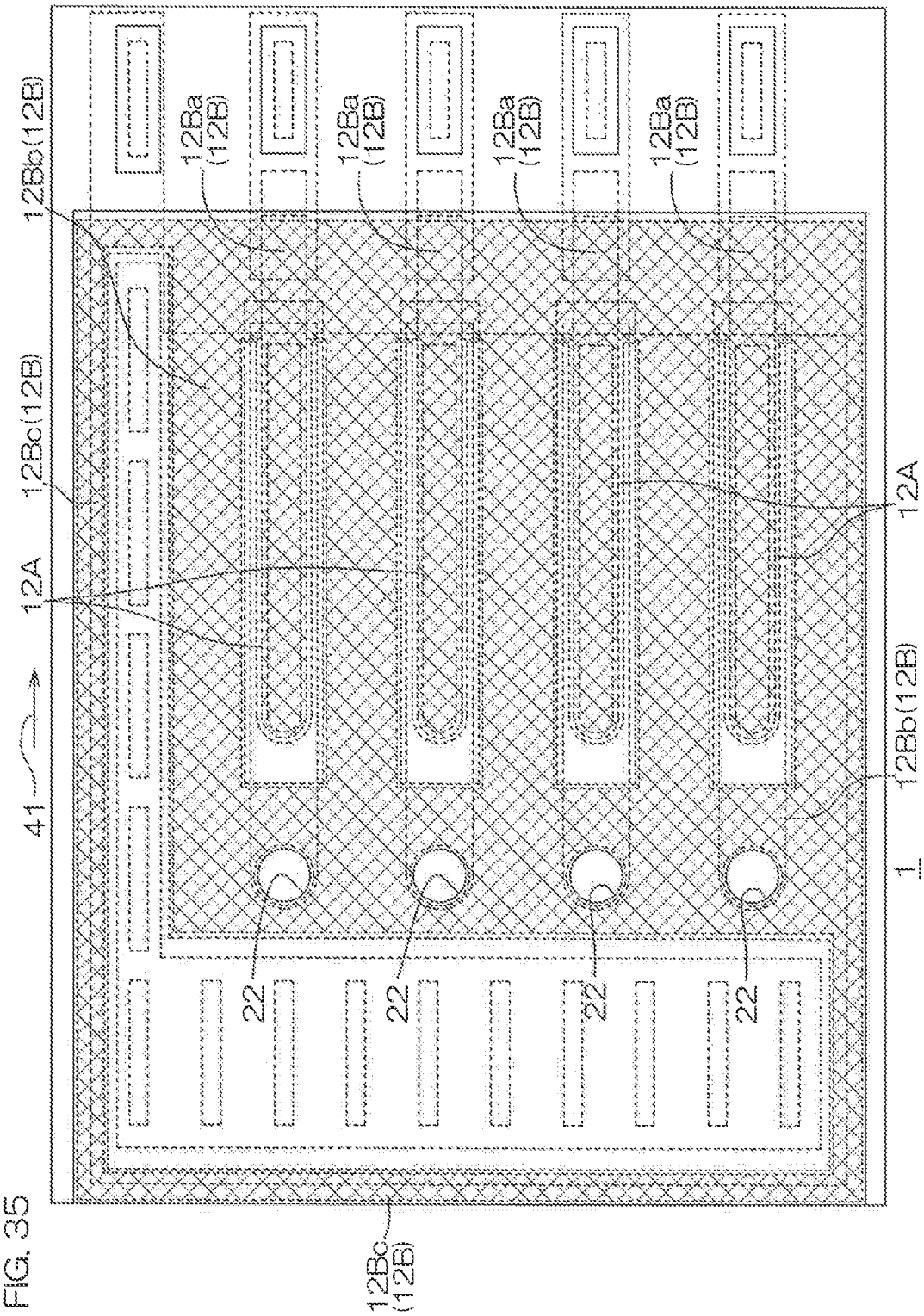
FIG. 35 is an illustrative plan view of a pattern example of a piezoelectric film of the inkjet printing head of FIG. 31A.
Figure 36:
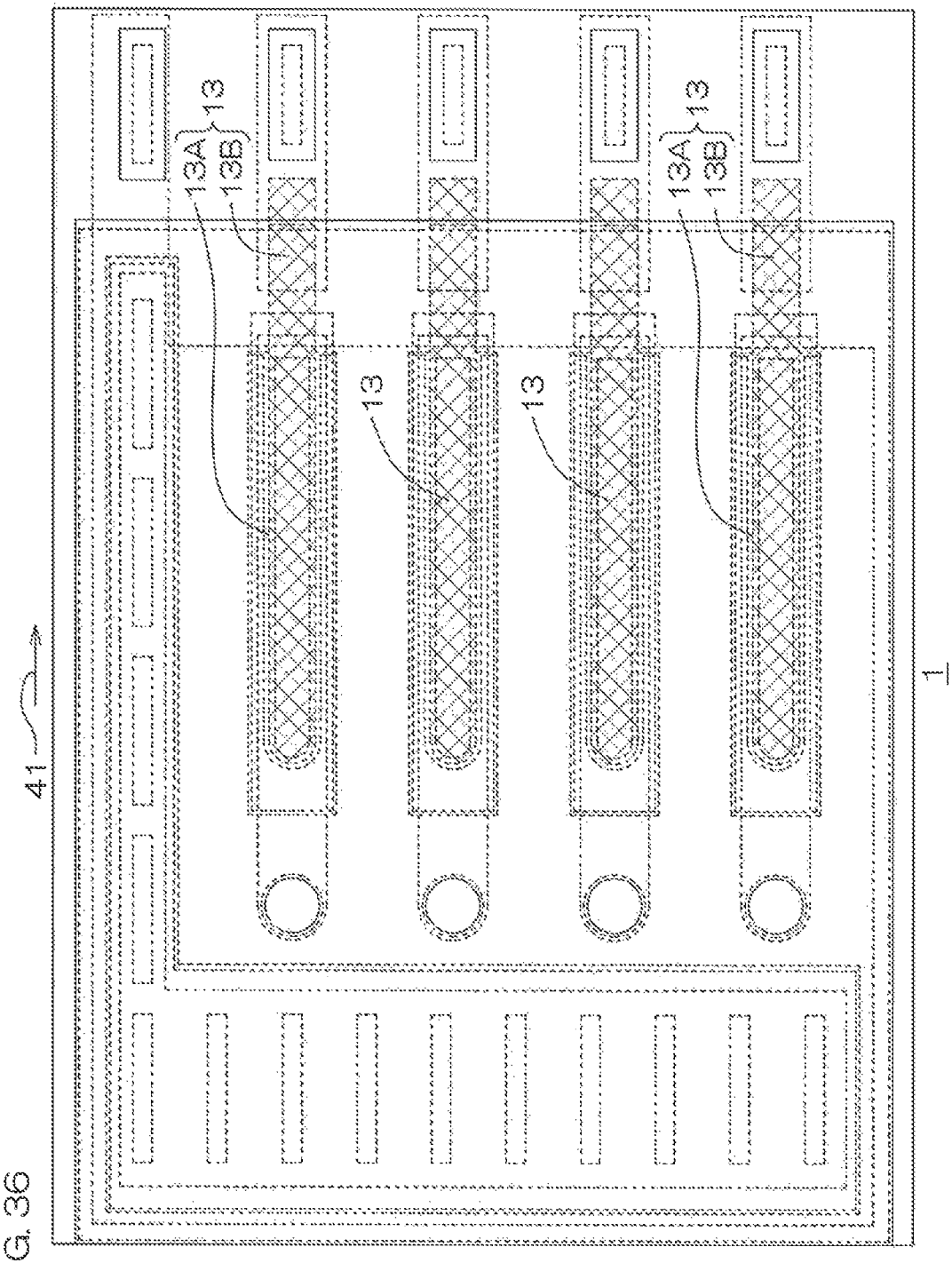
FIG. 36 is an illustrative plan view of a pattern example of an upper electrode of the inkjet printing head of FIG. 31A.

FIG. 31A is an illustrative plan view for describing the arrangement of a main portion of an inkjet printing head according to a preferred embodiment of a fourth invention. FIG. 31B is an illustrative plan view of the main portion of the inkjet printing head 1 of FIG. 31A and is a plan view with a protective substrate omitted. FIG. 32 is an illustrative sectional view taken along line XXXII-XXXII in FIG. 31A. FIG. 33 is an illustrative enlarged sectional view of a portion of a section taken along line XXXIII-XXXIII in FIG. 31A. FIG. 34 is an illustrative plan view of a pattern example of a lower electrode and a first upper wiring of the inkjet printing head of FIG. 31A. FIG. 35 is an illustrative plan view of a pattern example of a piezoelectric film of the inkjet printing head of FIG. 31A. FIG. 36 is an illustrative plan view of a pattern example of an upper electrode of the inkjet printing head of FIG. 31A.

The arrangement of an inkjet printing head 1 shall now be described in outline with reference to FIG. 32.

The inkjet printing head 1 includes an actuator substrate 2, a nozzle substrate 3, and a protective substrate 4. A movable film formation layer 10 is laminated on a front surface of the actuator substrate 2. In the actuator substrate 2, ink flow passages (ink reservoirs) 5 are formed. In the present preferred embodiment, the ink flow passages 5 are formed to penetrate through the actuator substrate 2. Each ink flow passage 5 is formed to be elongate along an ink flow direction 41, which is indicated by an arrow FIG. 32. Each ink flow passage 5 is constituted of an ink inflow portion 6 at an upstream side end portion (left end portion in FIG. 32) in the ink flow direction 41 and a pressure chamber 7 (cavity) in communication with the ink inflow portion 6. In FIG. 32, a boundary between the ink inflow portion 6 and the pressure chamber 7 is indicated by an alternate long and two short dashes line.

The nozzle substrate 3 is constituted, for example, of a silicon substrate. The nozzle substrate 3 is adhered to a rear surface 2b of the actuator substrate 2. The nozzle substrate 3, together with the actuator substrate 2 and the movable film formation layer 10, defines the ink flow passages 5. More specifically, the nozzle substrate 3 defines bottom surface portions of the ink flow passages 5. The nozzle substrate 3 has recess portions 3a each facing a pressure chamber 7 and an ink discharge passage 3b is formed in a bottom surface of each recess portion 3a. Each ink discharge passage 3b penetrates through the nozzle substrate 3 and has a discharge port 3c at an opposite side from the pressure chamber 7. Therefore, when a volume change occurs in a pressure chamber 7, the ink retained in the pressure chamber 7 passes through the ink discharge passage 3b and is discharged from the discharge port 3c.

Each portion of the movable film formation layer 10 that is a top roof portion of a pressure chamber 7 constitutes a movable film 10A. The movable film 10A (movable film formation layer 10) is constituted, for example, of a silicon oxide ($SiO_2$) film formed above the actuator substrate 2. The movable film 10A (movable film formation layer 10) may be constituted of a laminated film, for example, of a silicon (Si) film formed above the actuator substrate 2, a silicon oxide ($SiO_2$) film formed above the silicon film, and a silicon nitride (SiN) film formed above the silicon oxide film. In the present specification, the movable film 10A refers to a top roof portion of the movable film formation layer 10 that defines the top surface portion of the pressure chamber 7. Therefore, portions of the movable film formation layer 10 besides the top roof portions of the pressure chambers 7 do not constitute the movable film 10A.

Each movable film 10A has a thickness of, for example, 0.4 μm to 2 μm. If the movable film 10A is constituted of a silicon oxide film, the thickness of the silicon oxide film may be approximately 1.2 μm. If the movable film 10A is constituted of a laminated film of a silicon film, a silicon oxide film, and a silicon nitride film, the thickness of each of the silicon film, the silicon oxide film, and the silicon nitride film may be approximately 0.4 µm.

Each pressure chamber 7 is defined by a movable film 10A, the actuator substrate 2, and the nozzle substrate 3 and is formed to a substantially rectangular parallelepiped shape in the present preferred embodiment. The pressure chamber 7 may, for example, have a length of approximately 800 µm and a width of approximately 55 µm. Each ink inflow portion 6 is in communication with one end portion in a long direction of a pressure chamber 7.

Piezoelectric elements 9 and first upper wirings 17 are disposed on a front surface of the movable film formation layer 10. Each piezoelectric element 9 is disposed above a movable film 10A that is a top roof of a pressure chamber 7. With respect to the pressure chambers 7, the first upper wirings 17 are disposed at downstream sides in the ink flow direction 41.

The piezoelectric elements 9 include a lower electrode 11 formed above the movable film formation layer 10, a piezoelectric film 12 formed above the lower electrode 11, and upper electrodes 13 formed above the piezoelectric film 12. In other words, the piezoelectric elements 9 are arranged by sandwiching the piezoelectric film 12 from above and below by the upper electrodes 13 and the lower electrode 11. In plan view, each piezoelectric element 9 is constituted of a portion at which the lower electrode 11, the piezoelectric film 12, and an upper electrode 13 overlap.

The lower electrode 11 has, for example, a two-layer structure with a Ti (titanium) film and a Pt (platinum) film being laminated successively from the movable film formation layer 10 side. Besides this, the lower electrode 11 may be formed of a single film that is an Au (gold) film, a Cr (chromium) layer, or an Ni (nickel) layer, etc. The lower electrode 11 has main electrode portions 11A, constituting the piezoelectric elements 9, and an extension portion 11B extending along the front surface of the movable film formation layer 10 from the main electrode portions 11A. The lower electrode 11 may have a thickness, for example, of approximately 0.2 µm.

As the piezoelectric film 12, for example, a PZT (PbZr$_x$Ti$_{1-x}$O$_3$: lead zirconate titanate) film formed by a sol-gel method or a sputtering method may be applied. Such a piezoelectric film 12 is constituted of a sintered body of a metal oxide crystal. The piezoelectric film 12 includes active portions 12A, respectively in contact with upper surfaces of the main electrode portions 11A of the lower electrode 11, and an inactive portion 12B extending along a front surface of the movable film formation layer 10 from portions of peripheral walls of the active portions 12A. The inactive portion 12B includes first inactive portions 12Ba, each extending from a portion of the peripheral wall of an active portion 12A to an outer side of a peripheral edge of a pressure chamber 7. The piezoelectric film 12 has a thickness of approximately 1 µm. The overall thickness of each movable film 10A is preferably approximately the same as the thickness of the piezoelectric film 12 or approximately ⅔ the thickness of the piezoelectric film 12.

Each upper electrode 13 may be a single film of platinum (Pt) or may have a laminated structure, for example, in which a conductive oxide film (for example, an IrO$_2$ (iridium oxide) film) and a metal film (for example, an Ir (iridium) film) are laminated. Each upper electrode 13 may have a thickness, for example, of approximately 0.2 µm. Each upper electrode 13 has a main electrode portion 13A, in contact with an upper surface of an active portion 12A, and an extension portion 13B, passing above a first inactive portion 12Ba from the main electrode portion 13A and extending to an outer side of the peripheral edge of a pressure chamber 7. A tip portion of each extension portion 13B extends to above a first upper wiring 17 and is connected to the first upper wiring 17. That is, the extension portion 13B of each upper electrode 13 constitutes a second upper wiring arranged to connect the main electrode portion 13A of the upper electrode 13 to a first upper wiring 17.

A hydrogen barrier film 14, covering the first upper wirings 17, the lower electrode 11, the piezoelectric film 12, and the upper electrodes 13, is formed above the movable film formation layer 10. The hydrogen barrier film 14 is constituted, for example, of Al$_2$O$_3$ (alumina). The hydrogen barrier film 14 has a thickness of approximately 50 nm to 100 nm. The hydrogen barrier film 14 is provided to prevent degradation of characteristics of the piezoelectric film 12 due to hydrogen reduction.

A metal film 18, upper pads 42, and a lower pad 43 (see FIG. 31A) are formed above the hydrogen barrier film 14. The metal film 18 and the lower pad 43 are connected to the lower electrode 11. The upper pads 42 are connected to the first upper wirings 17. The metal film 18, the upper pads 42, and the lower pad 43 are constituted, for example, of gold (Au). The metal film 18, the upper pads 42, and the lower pad 43 have a thickness, for example, of approximately 1000 nm (1 µm). The metal film 18 includes a first rectangular portion 18A of rectangular shape in plan view that is disposed above the extension portion 11B of the lower electrode 11 at an opposite side from the pressure chambers 7 with respect to the ink inflow portions 6 of the ink flow passages 5. A plurality of contact holes 34, penetrating through the hydrogen barrier film 14, are formed between the first rectangular portion 18A and the extension portion 11B of the lower electrode 11. The first rectangular portion 18A enters into the contact holes 34 and is connected to the extension portion 11B of the lower electrode 11 inside the contact holes 34.

Pad openings 35 that expose portions of the first upper wirings 17 are formed in the hydrogen barrier film 14. Pads 42, made of gold (Au), that cover the pad openings 35 are formed above the hydrogen barrier film 14. The pads 42 enter into the pad openings 35 and are connected to the first upper wirings 17 inside the pad openings 35.

Ink supply penetrating holes 22, penetrating through the hydrogen barrier film 14, the piezoelectric film 12, the lower electrode 11, and the movable film formation layer 10 are formed at positions corresponding to end portions of the ink flow passages 5 at the ink inflow portion 6 sides. Penetrating holes 23, each including an ink supply penetrating hole 22 and being larger than the ink supply penetrating hole 22, are formed in the lower electrode 11 and the piezoelectric film 12. The hydrogen barrier film 14 enters into gaps between the penetrating holes 23, in the lower electrode 11 and the piezoelectric film 12, and the ink supply penetrating holes 22. The ink supply penetrating holes 22 are in communication with the ink inflow portions 6.

The protective substrate 4 is constituted, for example, of a silicon substrate. The protective substrate 4 is disposed above the actuator substrate 2 so as to cover the piezoelectric elements 9. The protective substrate 4 is bonded to the actuator substrate 2 via an adhesive 50. The protective substrate 4 has housing recesses 52 in a facing surface 51 that faces a front surface 2a of the actuator substrate 2. The piezoelectric elements 9 are housed inside the housing recesses 52. Further, the protective substrate 4 has formed therein ink supply passages 53 that are in communication with the ink supply penetrating holes 22. The ink supply passages 53 penetrate through the protective substrate 4. An ink tank (not shown) storing ink is disposed above the protective substrate 4.

Each piezoelectric element 9 is formed at a position facing a pressure chamber 7 across a movable film 10A. That is, the piezoelectric element 9 is formed to contact a front surface of the movable film 10A at the opposite side from the pressure chamber 7. Each pressure chamber 7 is filled with ink by the ink being supplied from the ink tank to the pressure chamber 7 through an ink supply passage 53, an ink supply penetrating hole 22, and an ink inflow portion 6. The movable film 10A defines a top surface portion of the pressure chamber 7 and faces the pressure chamber 7. The movable film 10A is supported by portions of the actuator substrate 2 at a periphery of the pressure chamber 7 and has flexibility enabling deformation in a direction facing the pressure chamber 7 (in other words, in the thickness direction of the movable film 10A).

The first upper wirings 17 and the lower electrode 11 are connected to a drive circuit (not shown). Specifically, the pads 42 of the upper wirings 17 and the drive circuit are connected via a connecting metal member (not shown). The pad 43 (see FIG. 31A) of the lower electrode 11 and the drive circuit are connected via a connecting metal member (not shown). When a drive voltage is applied from the drive circuit to a piezoelectric element 9, the piezoelectric film 12 deforms due to an inverse piezoelectric effect. The movable film 10A is thereby made to deform together with the piezoelectric element 9 to bring about a volume change of the pressure chamber 7 and the ink inside the pressure chamber 7 is pressurized. The pressurized ink passes through the ink discharge passage 3b and is discharged as microdroplets from the discharge port 3c.

The arrangement of the inkjet printing head 1 shall now be described in more detail with reference to FIG. 31A to FIG. 36.

A plurality of the ink flow passages 5 (pressure chambers 7) are formed as stripes extending parallel to each other in the actuator substrate 2. The piezoelectric element 9 is disposed respectively in each of the plurality of ink flow passages 5. The ink supply penetrating holes 22 are provided respectively for each of the plurality of ink flow passages 5. The housing recesses 52 and the ink supply passages 53 in the protective substrate 4 are provided respectively for each of the plurality of ink flow passages 5.

The plurality of ink flow passages 5 are formed at equal intervals that are minute intervals (for example, of approximately 30 μm to 350 μm) in a width direction thereof. Each ink flow passage 5 is elongate along the ink flow direction 41. Each ink flow passage 5 is constituted of an ink inflow portion 6 in communication with an ink supply penetrating hole 22 and the pressure chamber 7 in communication with the ink inflow portion 6. In plan view, the pressure chamber 7 has an oblong shape that is elongate along the ink flow direction 41. That is, the top surface portion of the pressure chamber 7 has two side edges along the ink flow direction 41 and two end edges along a direction orthogonal to the ink flow direction 41. In plan view, the ink inflow portion 6 has substantially the same width as the pressure chamber 7. An inner surface of an end portion of the ink inflow portion 6 at an opposite side from the pressure chamber 7 is formed to a semicircle in plan view. The ink supply penetrating hole 22 is circular in plan view (see especially FIG. 31B).

Each piezoelectric element 9 has, in plan view, a rectangular shape that is long in a long direction of a pressure chamber 7 (movable film 10A). A length in a long direction of the piezoelectric element 9 is shorter than a length in the long direction of the pressure chamber 7 (movable film 10A). As shown in FIG. 31B, respective end edges along a short direction of the piezoelectric element 9 are disposed at inner sides at predetermined intervals respectively from respective corresponding end edges of the movable film 10A. Also, a width in the short direction of the piezoelectric element 9 is narrower than a width in a short direction of the movable film 10A. Respective side edges along the long direction of the piezoelectric element 9 are disposed at inner sides at predetermined intervals from respective corresponding side edges of the movable film 10A.

With reference to FIG. 34, the lower electrode 11 is constituted of a main body region S1 of rectangular shape in plan view formed on a main portion of the front surface of the movable film formation layer 10 with the exception of a portion at a downstream side in the ink flow direction 41, and a pad formation region S2 extending downstream from one side portion of the main body region S1 at a downstream side end in the ink flow direction 41. An upstream side end in the ink flow direction 41 of the main body region S1 is at a side opposite the pressure chambers 7 with respect to the ink inflow portions 6. The downstream side end in the ink flow direction 41 of the main body region S1 is positioned further upstream than downstream side ends in the ink flow direction 41 of the pressure chambers 7 by just a predetermined interval d.

The lower electrode 11 is a common electrode used in common for the plurality of piezoelectric elements 9. The lower electrode 11 includes the main electrode portions 11A of rectangular shape in plan view that constitute the piezoelectric elements 9 and the extension portion 11B led out from the main electrode portions 11A in directions along the front surface of the movable film formation layer 10 to extend outside the peripheral edges of the top surface portions of the pressure chambers 7. A length in a long direction of each main electrode portion 11A is shorter than the length in the long direction of each movable film 10A. Respective end edges of the main electrode portion 11A are disposed at inner sides at predetermined intervals respectively from the respective corresponding end edges of the movable film 10A. Also, a width in a short direction of the main electrode portion 11A is narrower than the width of the movable film 10A in the short direction. Respective side edges of the main electrode portion 10A are disposed at inner sides at predetermined intervals from the respective corresponding side edges of the movable film 10A.

The extension portion 11B is a region of the entire region of the lower electrode 11 excluding the main electrode portions 11A. In the lower electrode 11 in plan view, each region located at an inner side of the peripheral edge of the top surface portion of a pressure chamber 7 may be referred to at times as the "inner electrode region" and a region located at outer sides of the peripheral edges of the top surface portions of the pressure chambers 7 may be referred to at times as the "outer electrode region." The main electrode portions 11A are included in the inner electrode regions. The extension portion 11B is constituted of the outer electrode region and portions of the inner electrode regions other than the main electrode portions 11A.

With reference to FIG. 35, the active portions 12A of the piezoelectric film 12 are formed to rectangular shapes of the same pattern as the main electrode portions 11A of the lower electrode 11A in plan view. As shown in FIG. 35, the inactive portion 12B of the piezoelectric film 12 includes the first inactive portions 12Ba, each extending from a downstream side end in the ink flow direction 41 of an active portion 12A to the outer side across the corresponding one end of a pressure chamber 7, in plan view. The inactive portion 12B of the piezoelectric film 12 includes a second inactive portion 12Bb, which, in plan view, is formed in a region extending from the first inactive portions 12Ba and surrounding the respective housing recesses 52 of the facing surface 51 of the protective substrate 4. In the second inactive portion 12Bb, the ink supply penetrating holes 22 are formed at positions facing the ink supply passages 53 of the protective substrate 4. Further, the inactive portion 12B of the piezoelectric film 12 includes a third inactive portion 12Bc, which, in plan view, is formed to extend around a peripheral edge portion of the facing surface 51 of the protective substrate 4 from a portion of the second inactive portion 12Bb at the side of the pad formation region S2 of the lower electrode 11 at a downstream side end in the ink flow direction 41.

With reference to FIG. 32 and FIG. 36, the main electrode portions 13A of the upper electrodes 13 are formed to rectangular shapes of the same pattern as the main electrode portions 11A of the lower electrode 11 in plan view. The main electrode portions 13A of the upper electrodes 13 are formed on the upper surfaces of the active portions 12A. The extension portion 13B of each upper electrode 13 passes above surfaces of an upper surface and an end surface of a first inactive portion 12Ba from a downstream side end in the ink flow direction 41 of a main electrode portion 13A and extends to above a first upper wiring 17. The first inactive portion 12Ba is interposed between the extension portion 13B of the upper electrode 13 and the lower electrode 11 and insulation between the extension portion 13B of the upper electrode 13 and the lower electrode 11 is thus maintained.

With reference to FIG. 31B and FIG. 34, the first upper wirings 17 are disposed, respectively according to the piezoelectric elements 9, at downstream sides in the ink flow direction 41 of the piezoelectric elements 9. In the hydrogen barrier film 14 are formed the pad openings 35 respectively exposing central portions of tip portion front surfaces of the respective first upper wirings 17. Pads 42 are provided above the hydrogen barrier film 14 so as to cover the pad openings 35. The pads 42 are connected to the first upper wirings 17 inside the pad openings 35.

As mentioned above, the downstream side end in the ink flow direction 41 of the main body region S1 of the lower electrode 11 is positioned further upstream than the downstream side ends in the ink flow direction 41 of the pressure chambers 7 by just a predetermined interval d. Therefore, in plan view, outside the downstream side ends in the ink flow direction 41 of the top surface portions of the pressure chambers 7, the lower electrode 11 is not present below the extension portions 13B (second upper wirings) of the upper electrodes 13. Insulation between the extension portions 13B (second upper wirings) of the upper electrodes 13 and the lower electrode 11 is thereby maintained more satisfactorily.

The metal film 18 is disposed above the outer electrode region of the extension portion 11B of the lower electrode 11 in plan view. With reference to FIG. 31B and FIG. 32, specifically, the metal film 18 includes the first rectangular portion 18A of rectangular shape in plan view that is disposed at the side opposite the pressure chambers 7 with respect to the ink inflow portions 6 of the ink flow passages 5 and extends in a direction orthogonal to the ink flow direction 41. The metal film 18 further includes a second rectangular portion 18B of rectangular shape in plan view that is connected to one end portion of the first rectangular portion 18A and extends along the ink flow direction 41. A plurality of the contact holes 34, penetrating through the hydrogen barrier film 14, are also formed between the second rectangular portion 18B and the extension portion 11B (outer electrode region) of the lower electrode 11. The second rectangular portion 18B enters into the plurality of contact holes 34 and are connected to the extension portion 11B (outer electrode region) of the lower electrode 11 inside the contact holes 34. The metal film 18 is formed to reduce electrical resistance of the lower electrode 11.

A pad opening 36 (see FIG. 31B), exposing a portion of a tip portion front surface of the pad formation region S2 of the lower electrode 11, is formed in the hydrogen barrier film 14. A pad 43 covering the pad opening 36 is formed above the hydrogen barrier film 14. The pad 43 enters into the pad opening 36 and is connected to the pad formation region S2 of the lower electrode 11 inside the pad opening 36.

FIG. 38 is a bottom view of a main portion of the protective substrate as viewed from the actuator substrate side of the inkjet printing head.

As shown in FIG. 33, and FIG. 38, in the facing surface 51 of the protective substrate 4, the plurality of housing recesses 52 are formed in parallel at intervals in a direction orthogonal to the ink flow direction 41. In plan view, the plurality of housing recesses 52 are disposed at positions facing the plurality of pressure chambers 7. With respect to the respective housing recesses 52, the ink supply passages 53 are disposed at upstream sides in the ink flow direction 41. In plan view, each housing recess 52 is formed to a rectangular shape slightly larger than the pattern of the upper electrode 13 of the corresponding piezoelectric element 9. The corresponding piezoelectric element 9 is housed in each housing recess 52.

In plan view, the ink supply passages 53 of the protective substrate 4 have circular shapes of the same pattern as the ink supply penetrating holes 22 at the actuator substrate 2 side. In plan view, the ink supply passages 53 are matched with the ink supply penetrating holes 22.

FIG. 37 is an illustrative plan view of a pattern example of the hydrogen barrier film of the inkjet printing head.

In the present preferred embodiment, above the actuator substrate 2, the hydrogen barrier film 14 is formed across substantially an entirety of a region at outer sides of the housing recesses 52 of the protective substrate 4 in plan view. However, in this region, the ink supply penetrating holes 22, the contact holes 34, and the pad openings 35 and 36 are formed in the hydrogen barrier film 14.

In regions at inner sides of the housing recesses 52 of the protective substrate 4, the hydrogen barrier film 14 is formed in entireties of exposed surfaces of upper surfaces of the main electrode portions 13A of the upper electrode 13 excluding central portions thereof. That is, the hydrogen barrier film 14 has openings 31 of rectangular shape in plan view formed therein at the upper surface central portions of the main electrode portions 13A of the upper electrodes 13. In other words, the hydrogen barrier film 14 is not formed at the upper surface central portions of the main electrode portions 13A of the upper electrodes 13.

FIG. 39A to FIG. 39K are sectional views of an example of a manufacturing process of the inkjet printing head 1 and show a section corresponding to FIG. 32A. FIG. 40A to FIG. 40H are plan views of the example of the manufacturing process of the inkjet printing head 1 and show a plan corresponding to FIG. 31A.

Figure 39A:
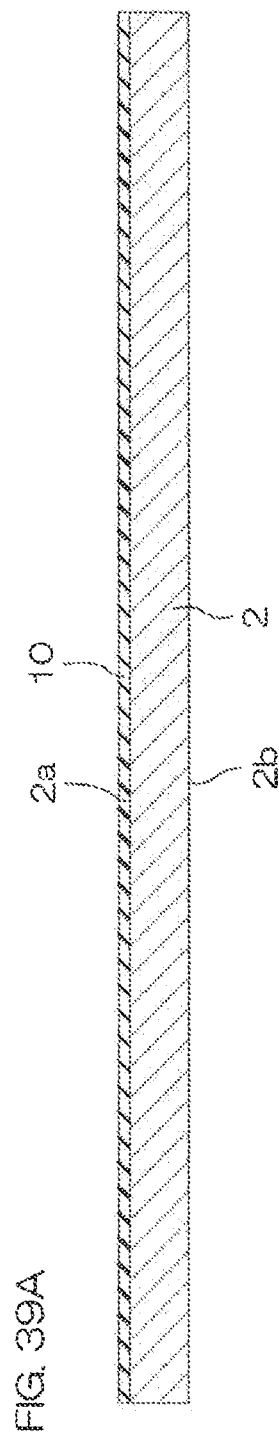
FIG. 39A is a sectional view of an example of a manufacturing process of the inkjet printing head of FIG. 31A.

First, as shown in FIG. 39A, the movable film formation layer 10 is formed on the front surface 2a of the actuator substrate 2. However, as the actuator substrate 2, that which is thicker than the thickness of the actuator substrate 2 at the final stage is used. Specifically, a silicon oxide film (for example, of 1.2 µm thickness) is formed on the front surface of the actuator substrate 2. If the movable film formation layer 10 is constituted of a laminated film of a silicon film, a silicon oxide film, and a silicon nitride film, the silicon film (for example, of 0.4 µm thickness) is formed on the front surface of the actuator substrate 2, the silicon oxide film (for example, of 0.4 µm thickness) is formed above the silicon film, and the silicon nitride film (for example, of 0.4 µm thickness) is formed above the silicon oxide film.

A base oxide film, for example, of $Al_2O_3$, MgO, or $ZrO_2$, etc., may be formed on the front surface of the movable film formation layer 10. Such base oxide films prevent metal atoms from escaping from the piezoelectric film 12 to be formed later. When metal atoms escape, the piezoelectric film 12 may degrade in piezoelectric characteristics. Also, when metal atoms that have escaped become mixed in the silicon layer constituting each movable film 10A, the movable film 10A may degrade in durability.

Next, an electrode/wiring film, which is a material layer of the lower electrode 11 and the upper wirings 17, is formed above the movable film formation layer 10 (above the base oxide film in the case where the base oxide film is formed). The electrode/wiring film is constituted, for example, of a Pt/Ti laminated film having a Ti film (for example, of 10 nm to 40 nm thickness) as a lower layer and a Pt film (for example, of 10 nm to 400 nm thickness) as an upper layer. Such an electrode/wiring film may be formed by the sputtering method. Thereafter, a resist mask with a pattern of the lower electrode 11 and the upper wirings 17 is formed by photolithography. Then, as shown in FIG. 39B and FIG. 40A, the electrode/wiring film is etched using the resist mask as a mask to form the lower electrode 11 of the predetermined pattern and the upper wirings 17 of the predetermined pattern. The lower electrode 11, constituted of the main electrode portions 11A and the extension portion 11B having the penetrating holes 23, is thereby formed. The plurality of upper wirings 17 are also formed.

Next, after peeling off the resist mask, a material film (piezoelectric material film) 81 of the piezoelectric film 12 is formed on an entire surface. Specifically, for example, the piezoelectric material film of 1 µm to 3 µm thickness is formed by a sol-gel method. Such a piezoelectric material film 81 is constituted of a sintered body of metal oxide crystal grains. Thereafter, a resist mask with an intermediate pattern of the piezoelectric material film 81 is formed by photolithography. Then, as shown in FIG. 39C and FIG. 40B, the piezoelectric material film 81 is etched using the resist mask as a mask to form the piezoelectric material film 81 of the intermediate pattern. The piezoelectric material film 81 of rectangular shape in plan view that covers an entirety of the main body region S1 of the lower electrode 11, an upstream side end portion in the ink flow direction of the pad formation region S2 of the lower electrode 11, and upstream side end portions in the ink flow direction of the upper wirings 17 is thereby formed.

Next, after peeling off the resist mask, an upper electrode film, which is a material of the upper electrodes 13, is formed on the entire surface. The upper electrode film may, for example, be a single film of platinum (Pt). The upper electrode film may, for example, be an $IrO_2$/Ir laminated film having an $IrO_2$ film (for example, of 40 nm to 160 nm thickness) as a lower layer and an Ir film (for example, of 40 nm to 160 nm thickness) as an upper layer. Such an upper electrode film may be formed by the sputtering method.

Figure 39D:
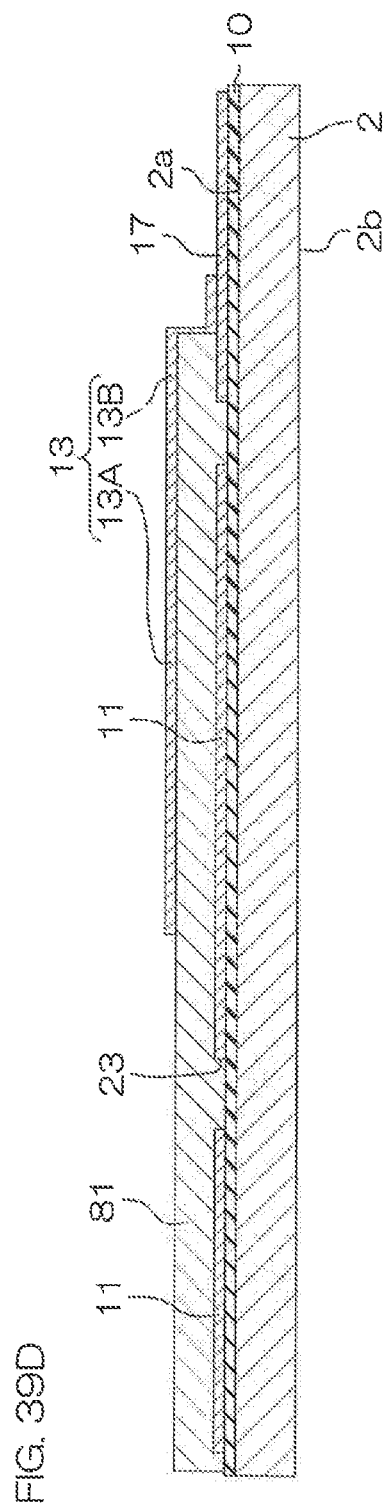
FIG. 39D is a sectional view of a step subsequent to that of FIG. 39C.

Next, a resist mask with a pattern of the upper electrodes 13 is formed by photolithography. Then, as shown in FIG. 39D and FIG. 40C, the upper electrode film is etched using the resist mask as a mask to form the upper electrodes 13 of the predetermined pattern. The upper electrodes 13, each constituted of a main electrode portion 13A and an extension portion 13B, are thereby formed.

Figure 40D:
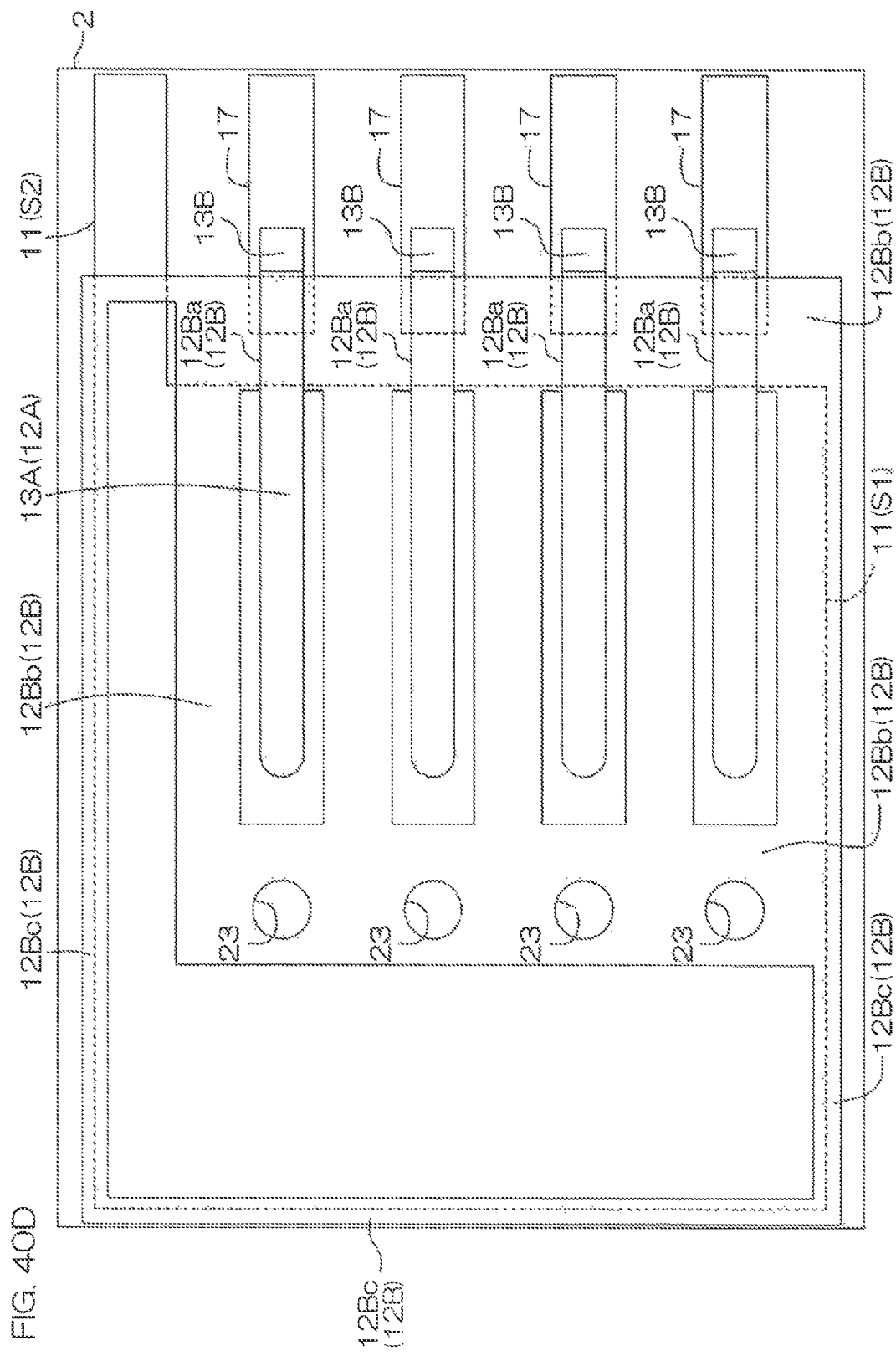
FIG. 40D is a plan view of a step subsequent to that of FIG. 40C.

Next, after peeling off the resist mask, a resist mask with a pattern of the piezoelectric film 12 is formed by photolithography. Then, as shown in FIG. 39E and FIG. 40D, the piezoelectric material film 81 is etched using the resist mask as a mask to form the piezoelectric film 12 of the predetermined pattern. The piezoelectric film 12, constituted of the active portions 12A and the inactive portion 12B (12Ba, 12Bb, and 12Bc) having the penetrating holes 23, is thereby formed. The piezoelectric elements 9, each constituted of a main electrode portion 11A of the lower electrode 11, an active portion 12A of the piezoelectric film 12, and the main electrode portion 13A of an upper electrode 13, are thereby formed.

Figure 39F:
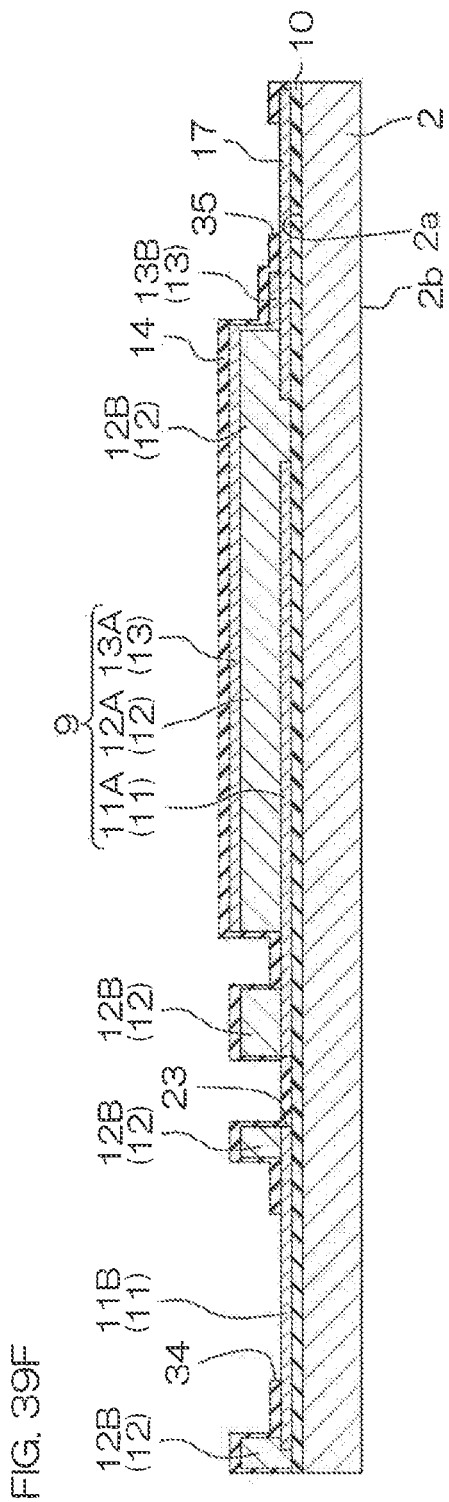
FIG. 39F is a sectional view of a step subsequent to that of FIG. 39E.

Next, after peeling off the resist mask, the hydrogen barrier film 14 that covers the entire surface is formed as shown in FIG. 39F and FIG. 40F. The hydrogen barrier film 14 may be an $Al_2O_3$ film formed by the sputtering method and its film thickness may be 50 nm to 100 nm. Thereafter, a resist mask having openings corresponding to the contact holes 34 and the pad openings 35 and 36 is formed by photolithography and the hydrogen barrier film 14 is etched using the resist mask as a mask. The contact holes 34 and the pad openings 35 and 36 are thereby formed in the hydrogen barrier film 14.

Figure 39G:
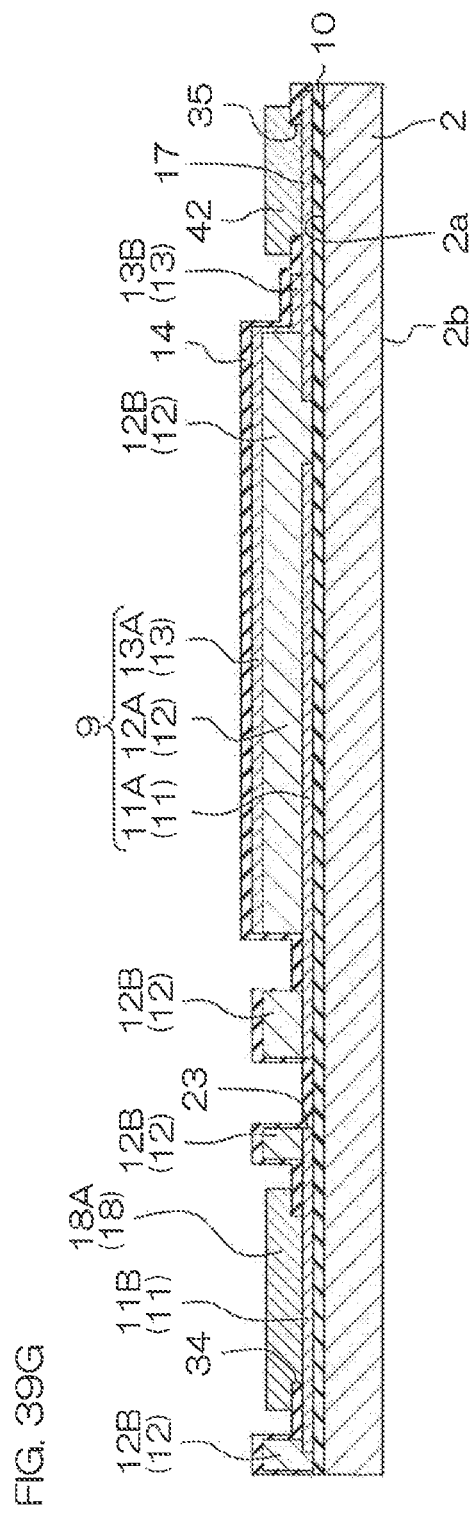
FIG. 39G is a sectional view of a step subsequent to that of FIG. 39F.
Figure 39:
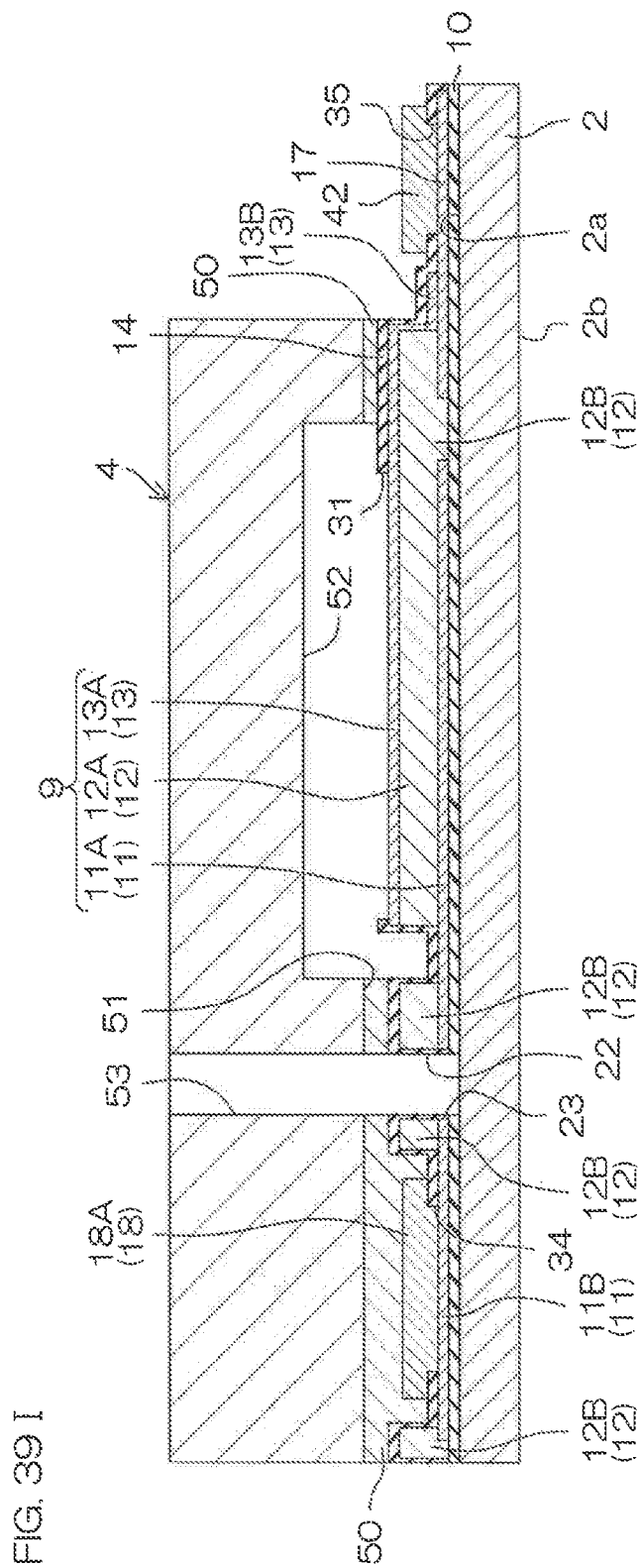
FIG. 39B is a sectional view of a step subsequent to that of FIG. 39A.
FIG. 39C is a sectional view of a step subsequent to that of FIG. 39B.
FIG. 39E is a sectional view of a step subsequent to that of FIG. 39D.
FIG. 39H is a sectional view of a step subsequent to that of FIG. 39G.
FIG. 39I is a sectional view of a step subsequent to that of FIG. 39H.
FIG. 39J is a sectional view of a step subsequent to that of FIG. 39I.
FIG. 39K is a sectional view of a step subsequent to that of FIG. 39J.

Next, as shown in FIG. 39G and FIG. 40F, an Au film, constituting the metal film 18, the upper pads 42 and the lower pad 43, is formed by the sputtering method above the hydrogen barrier film 14, including the interiors of the contact holes 34 and the interiors of the pad openings 35 and 36. Thereafter, the Au film is patterned by photolithography and etching to form the metal film 18, the upper pads 42, and the lower pad 43 at the same time.

Next, as shown in FIG. 39H and FIG. 40G, a resist mask having openings corresponding to the openings 31 and the ink supply penetrating holes 22 is formed by photolithography and the hydrogen barrier film 14 is etched using the resist mask as a mask. The openings 31 and the ink supply penetrating holes 22 are thereby formed in the hydrogen barrier film 14. Next, the resist mask is peeled off. A resist mask having openings corresponding to the ink supply penetrating holes 22 is then formed by photolithography and the movable film formation layer 10 is etched using the resist mask as a mask. The ink supply penetrating holes 22 are thereby formed in the movable film formation layer 10.

Figure 40H:
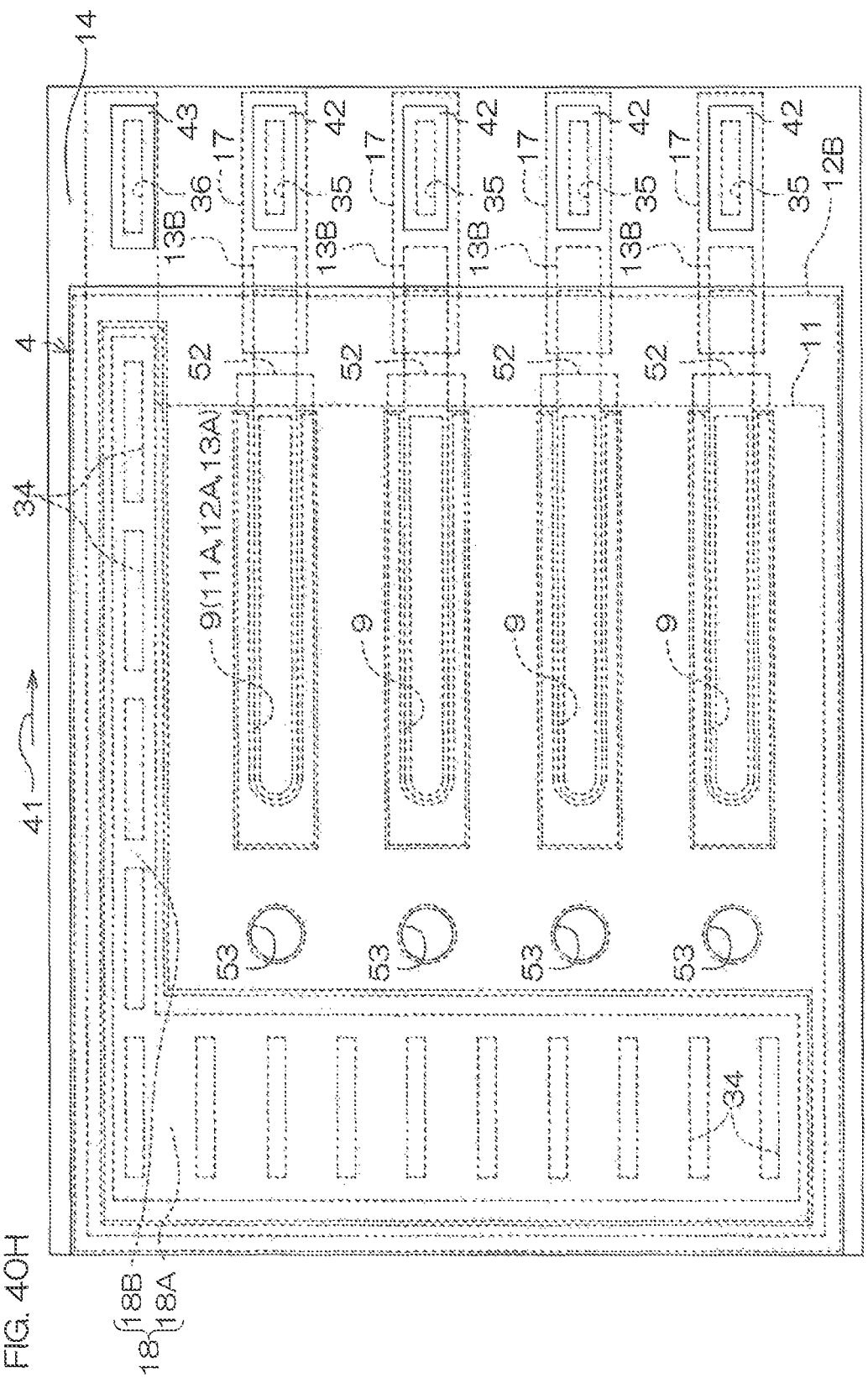
FIG. 40H is a plan view of a step subsequent to that of FIG. 40G.

Next, as shown in FIG. 39I and FIG. 40H, the adhesive 50 is coated onto the facing surface 51 of the protective substrate 4 and the protective substrate 4 is fixed onto the actuator substrate 2 so that the ink supply passages 53 and the ink supply penetrating holes 22 are matched.

Next, as shown in FIG. 39J, rear surface grinding for thinning the actuator substrate 2 is performed. The actuator substrate 2 is made thin by the actuator substrate 2 being ground from the rear surface 2b. For example, the actuator substrate 2 with a thickness of approximately 670 µm in the initial state may be thinned to a thickness of approximately 300 µm. Next, etching (dry etching or wet etching) from the rear surface of the actuator substrate 2 is performed on the actuator substrate 2 to form the ink flow passages 5 (the ink inflow portions 6 and the pressure chambers 7).

In the etching process, the base oxide film formed on the front surface of the movable film formation layer 10 prevents the escaping of metal elements (Pb, Zr, and Ti in the case of PZT) from the piezoelectric film 12 and keeps the piezoelectric characteristics of the piezoelectric film 12 in a satisfactory state. Also as mentioned above, the base oxide film formed on the front surface of the movable film formation layer 10 contributes to maintaining the durability of the silicon layer that forms each movable film 10A.

Figure 39K:
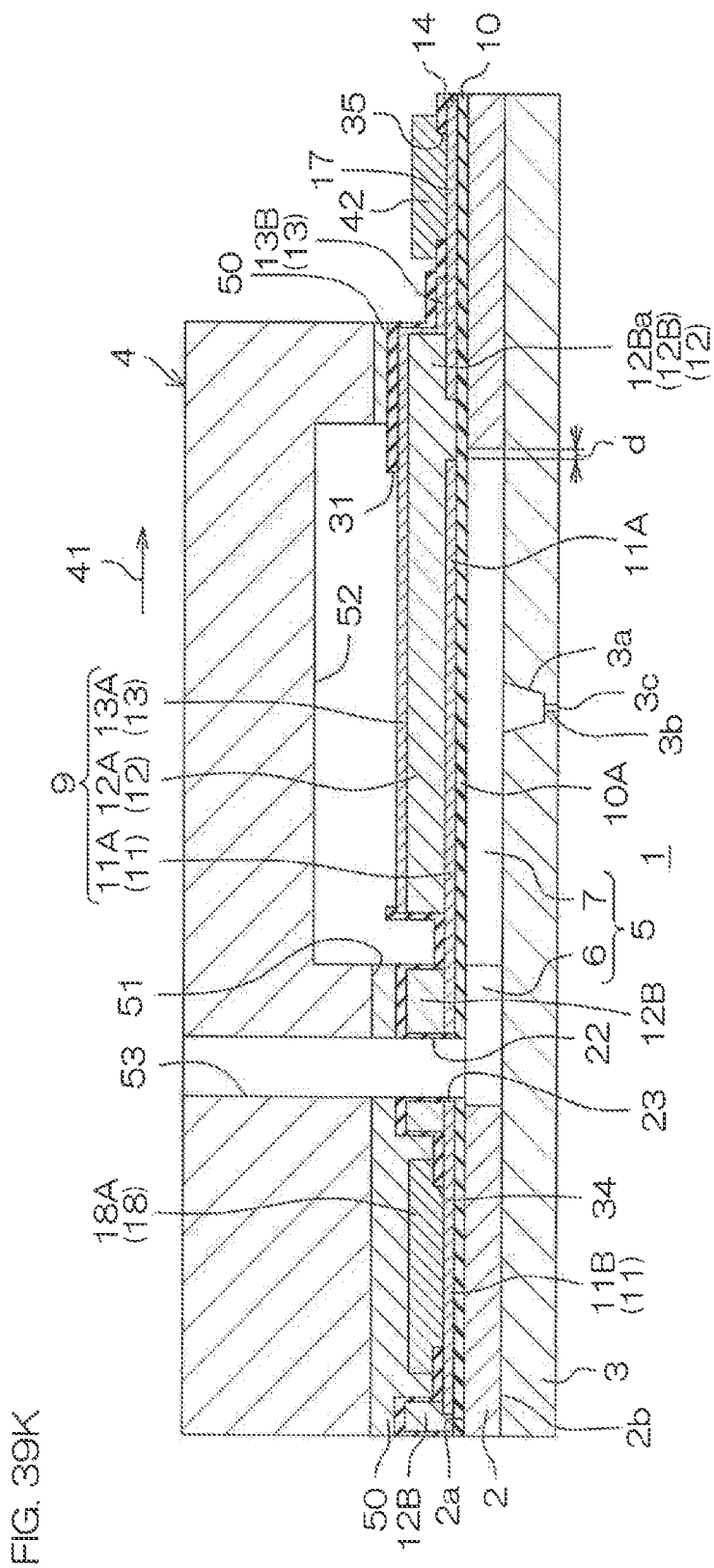

Thereafter, as shown in FIG. 39K, the nozzle substrate 3 is adhered onto the rear surface of the actuator substrate 2 and the inkjet printing head 1 is thereby obtained.

In the preferred embodiment of the present invention, the upper electrodes 13 include the main electrode portions 13A that constitute the piezoelectric elements 9 and the extension portions 13B that are led out from the main electrode portions 13A and extend as second upper wirings connected to the first upper wirings 17. The upper wirings, constituted of the first upper wirings 17 and the extension portions (second upper wirings) 13B of the upper electrodes 13, can thus be formed by forming the lower electrode 11 and the first upper wirings 17 above the movable film formation layer 10 and thereafter forming the piezoelectric elements 9 above the movable film formation layer 10. Forming of the upper wirings is thus made easy.

Although a preferred embodiment of the present invention has been described above, the present invention may be implemented in yet other preferred embodiments. Although in the preferred embodiment described above, the metal film 18 is provided to reduce the electrical resistance of the lower electrode 11, the metal film 18 does not have to be provided. Also, although with the preferred embodiment described above, PZT was cited as an example of the material of the piezoelectric film, a piezoelectric material besides this that is constituted of a metal oxide as represented by lead titanate ($PbPO_3$), potassium niobate ($KNbO_3$), nothium niobate ($LiNbO_3$), lithium tantalate ($LiTaO_3$), etc., may be applied instead.

Also, although with the preferred embodiment described above, a case where the present invention is applied to an inkjet printing head was described, the present invention may also be applied to a piezoelectric microphone, pressure sensor, etc., that uses a piezoelectric element.

The present application corresponds to Japanese Patent Application No. 2015-164921, Japanese Patent Application No. 2015-164922, Japanese Patent Application No. 2015-164923, and Japanese Patent Application No. 2015-164924 filed on Aug. 24, 2015 in the Japan Patent Office, and Japanese Patent Application No. 2016-120978 filed on Jun. 17, 2016 in the Japan Patent Office, and the entire disclosures of these applications are incorporated herein by reference.

While preferred embodiments of the present invention have been described above, it is to be understood that variations and modifications will be apparent to those skilled in the art without departing the scope and sprit of the present invention. The scope of the present invention, therefore, is to be determined solely by the following claims.

What is claimed is:

1. A device using a piezoelectric element comprising:
   a substrate having a cavity;
   a movable film formation layer including a movable film disposed above the cavity and defining a top surface portion of the cavity; and
   a piezoelectric element formed above the movable film, wherein the piezoelectric element includes a lower electrode formed above the movable film, a piezoelectric film formed above the lower electrode, and an upper electrode formed above the piezoelectric film, and
   the piezoelectric film includes an active portion with an upper surface in contact with a lower surface of the upper electrode and an inactive portion led out in a direction along a front surface of the movable film formation layer from an entire periphery of a side portion of the active portion and having a thickness thinner than that of the active portion.

2. The device using the piezoelectric element according to claim 1, wherein the thickness of the inactive portion is not less than $\frac{1}{20}$ and not more than $\frac{1}{10}$ the thickness of the active portion.

3. The device using the piezoelectric element according to claim 1, wherein, in a plan view of viewing from a direction normal to a major surface of the movable film, the upper electrode has a peripheral edge that is receded further toward an interior of the cavity than the movable film.

4. The device using the piezoelectric element according to claim 3, wherein the inactive portion, in the plan view, extends from the entire periphery of the side portion of the active portion to an outer side beyond a peripheral edge of the cavity.

5. The device using the piezoelectric element according to claim 4, further comprising: a wiring, which, in the plan view, has one end portion connected to an upper surface of the upper electrode and another end portion led out to the outer side of the peripheral edge of the cavity.

6. The device using the piezoelectric element according to claim 5, further comprising:
   a hydrogen barrier film, covering at least entireties of side surfaces of the upper electrode and the active portion and covering the upper surface of the inactive portion; and
   an insulating film, formed above the hydrogen barrier film and disposed between the hydrogen barrier film and the wiring,
   wherein a contact hole, exposing a portion of the upper electrode, is formed in the hydrogen barrier film and the insulating film and the one end portion of the wiring is connected to the upper electrode via the contact hole.

7. The device using the piezoelectric element according to claim 6, further comprising:
   a passivation film formed above the insulating film and covering the wiring.

8. The device using the piezoelectric element according to claim 1, wherein the cavity is formed to a rectangular shape in the plan view,
   the movable film is formed to a rectangular shape matching the peripheral edge of the cavity in the plan view,
   each of the upper electrode and the active portion is, in the plan view, a rectangle having a width shorter than a width in a short direction of the movable film and a length shorter than a length in a long direction of the movable film, with both end edges and both side edges thereof being respectively receded further toward an interior of the movable film than both end edges and both side edges of the movable film, and
   in the plan view, the inactive portion extends from the entire periphery of the side portion of the active portion to the outer side beyond the peripheral edge of the cavity.

9. The device using the piezoelectric element according to claim 1, wherein the movable film formation layer is constituted of an $SiO_2$ single film.

10. The device using the piezoelectric element according to claim 1, wherein the movable film formation layer is constituted of a laminated film of an Si film formed above the substrate, an $SiO_2$ film formed above the Si film, and an SiN film formed above the $SiO_2$ film.

11. The device using the piezoelectric element according to claim 1, wherein the piezoelectric film is constituted of a PZT film.

12. The device using the piezoelectric element according to claim 1, wherein the upper electrode is constituted of a Pt single film.

13. The device using the piezoelectric element according to claim 1, wherein the upper electrode is constituted of a laminated film of an $IrO_2$ film formed above the piezoelectric film and an Ir film formed above the $IrO_2$ film.

14. The device using the piezoelectric element according to claim 1, wherein the lower electrode is constituted of a laminated film of a Ti film formed at the movable film side and a Pt film formed above the Ti film.

15. The device using the piezoelectric element according to claim 2, wherein, in a plan view of viewing from a direction normal to a major surface of the movable film, the upper electrode has a peripheral edge that is receded further toward an interior of the cavity than the movable film.

16. The device using the piezoelectric element according to claim 15, wherein the inactive portion, in the plan view, extends from the entire periphery of the side portion of the active portion to an outer side beyond a peripheral edge of the cavity.

17. The device using the piezoelectric element according to claim 16, further comprising: a wiring, which, in the plan view, has one end portion connected to an upper surface of the upper electrode and another end portion led out to the outer side of the peripheral edge of the cavity.

18. The device using the piezoelectric element according to claim 17, further comprising:
  a hydrogen barrier film, covering at least entireties of side surfaces of the upper electrode and the active portion and covering the upper surface of the inactive portion; and
  an insulating film, formed above the hydrogen barrier film and disposed between the hydrogen barrier film and the wiring,
  wherein a contact hole, exposing a portion of the upper electrode, is formed in the hydrogen barrier film and the insulating film and the one end portion of the wiring is connected to the upper electrode via the contact hole.

* * * * *